(12) United States Patent
Inasaki et al.

(10) Patent No.: US 8,574,814 B2
(45) Date of Patent: Nov. 5, 2013

(54) ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE COMPOSITION

(75) Inventors: Takeshi Inasaki, Haibara-gun (JP); Tomotaka Tsuchimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/528,477

(22) Filed: Jun. 20, 2012

(65) Prior Publication Data
US 2013/0004888 A1    Jan. 3, 2013

(30) Foreign Application Priority Data
Jun. 29, 2011   (JP) .................. 2011-144458

(51) Int. Cl.
  *G03F 7/00*    (2006.01)
  *G03F 7/004*   (2006.01)
  *G03F 7/028*   (2006.01)
  *G03F 7/26*    (2006.01)
  *G03F 7/20*    (2006.01)

(52) U.S. Cl.
  USPC ........... 430/270.1; 430/5; 430/913; 430/942; 430/945; 430/966

(58) Field of Classification Search
  USPC .............. 430/270.1, 5, 945, 942, 966, 913
  See application file for complete search history.

(56) References Cited

U.S. PATENT DOCUMENTS

| 5,882,835 A | 3/1999 | Park et al. |
| 6,042,997 A | 3/2000 | Barclay et al. |
| 2004/0091817 A1 | 5/2004 | Komatsu et al. |
| 2012/0171617 A1* | 7/2012 | Bae et al. .................. 430/285.1 |
| 2012/0202153 A1* | 8/2012 | Hatakeyama .............. 430/283.1 |
| 2012/0288794 A1* | 11/2012 | Bae et al. .................. 430/270.1 |

FOREIGN PATENT DOCUMENTS

| JP | 03282550 A | 12/1991 |
| JP | 10115928 A | 5/1998 |
| JP | 2000241975 A | 9/2000 |
| JP | 2004-158287 A | 6/2004 |
| JP | 2005-157401 A | 6/2005 |
| JP | 2005232396 A | 9/2005 |
| JP | 2008-162101 A | 7/2008 |

* cited by examiner

*Primary Examiner* — Amanda C. Walke
(74) *Attorney, Agent, or Firm* — Sughrue Mion, PLLC

(57) ABSTRACT

An object of the present invention is to provide an actinic ray-sensitive or radiation-sensitive resin composition that can form independent line patterns with high resolution and excellent shapes and shows excellent resist performances including roughness characteristics, and to provide an actinic ray-sensitive or radiation-sensitive film and a pattern forming method using the composition.

The actinic ray-sensitive or radiation-sensitive resin composition contains a compound (P) that contains at least one phenolic hydroxyl group and at least one group in which a hydrogen atom of a phenolic hydroxyl group is substituted with a group represented by the following General Formula (1) (the respective symbols in the formula represent the same definitions as in the claims and the specification).

[Chem. 1]

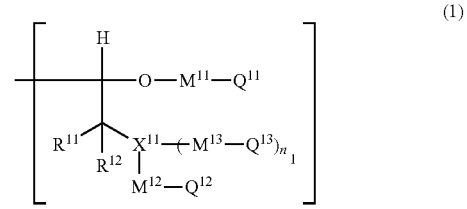

(1)

17 Claims, No Drawings

ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE COMPOSITION

BACKGROUND OF THE INVENTION

1. Field of the Invention

The present invention relates to an actinic ray-sensitive or radiation-sensitive resin composition, and an actinic ray-sensitive or radiation-sensitive film and a pattern forming method using the composition. Particularly, the present invention relates to an actinic ray-sensitive or radiation-sensitive resin composition that is suitably used for a production process of VLSIs and high-capacity microchips, a fabrication process of molds for nanoimprint, an ultramicrolithography process applicable for a production process of high-density information recording media, and other photofabrication processes, and relates to an actinic ray-sensitive or radiation-sensitive film and a pattern forming method using the composition. More specifically, the present invention relates to an actinic ray-sensitive or radiation-sensitive resin composition that is suitably usable for microfabrication of semiconductor devices using an electron beam, X-rays, or EUV light, and relates to an actinic ray-sensitive or radiation-sensitive film and a pattern forming method using the composition.

2. Description of the Related Art

In the microfabrication using a resist composition, ultra-micro patterns are required to be formed since integrated circuits are increasingly highly integrated. Therefore, exposure wavelengths tend to be shortened, and for example, lithography techniques that use an electron beam, X-rays, or EUV light instead of excimer laser light are under development.

In electron beam (EB) lithography, it is known that the influence of electron scattering, that is, the influence of forward scattering in a resist film is diminished by increasing an accelerating voltage of an EB. Consequently, in recent years, the accelerating voltage of the EB has tended to be increased. However, if the accelerating voltage of the EB is increased, while the influence of forward scattering is diminished, the influence of the scattering of electrons reflected in a resist substrate, that is, the influence of backward scattering is increased. The influence of backward scattering is particularly great when an independent line pattern having a large exposure area is formed. Accordingly, for example, if the accelerating voltage of the EB is increased, resolution of the independent line pattern is likely to deteriorate.

Particularly, in a case of forming patterns in photomask blanks used for semiconductor exposure, the lower layer of a resist film includes a light-shielding film that contains heavy atoms such as chromium, molybdenum, and tantalum. In this case, the influence of backward scattering caused by reflection from the lower layer of a resist is more marked compared to a case of coating a resist onto a silicon wafer. Consequently, when the independent line pattern is formed on the photomask blanks, there is a possibility that the pattern will be easily influenced particularly by the backward scattering and that the resolution will deteriorate.

Generally, a chemical amplification type positive resist is a photosensitive composition that contains a compound (photoacid generator) generating a strong acid by being irradiated with light and a compound that is turned into an alkali-soluble substance due to the degradation of a hydrophobic acid labile group caused by the catalytic action of the generated acid. In some cases, this photosensitive composition further contains a basic compound to inhibit a dark reaction in an unexposed portion. Due to this basic compound, the acid generated by the influence of scattered electrons is deactivated by a neutralization reaction, whereby film reduction in an unexposed portion can be inhibited. However, if an acetal group having low activation energy of an acid degradation reaction is used as an acid labile group, the degradation reaction of the acid labile group competes with the neutralization reaction between the generated acid and the basic compound. Accordingly, the film reduction of the unexposed portion cannot be completely inhibited, and particularly, the resolution of the independent line pattern deteriorates.

As a method of improving the resolution of the independent line pattern, the use of a resin containing a group that adjusts the solubility of the resin has been examined (for example, see JP2005-157401A). However, this is not fundamental means for solving the above problems and cannot sufficiently satisfy the resolution of the independent line pattern.

The microfabrication using a resist composition is not only directly used for producing integrated circuits but also has been applied for producing a so-called mold structure for imprint in recent years (for example, see JP2004-158287A, JP2008-162101A, and "Fundamentals of Nanoimprint and Technical Development/Application Deployment-Substrate Technique of Nanoimprint and Latest Application Deployment", edited by Yoshihiko Hirai, Frontier Publishing (June 2006). Accordingly, particularly, even when independent patterns are formed using X-rays, soft X-rays, or an electron beam as an exposure light source, it is important to satisfy high sensitivity, high resolution, and roughness characteristics at the same time, and this is a problem needing to be solved.

SUMMARY OF THE INVENTION

An object of the present invention is to provide an actinic ray-sensitive or radiation-sensitive resin composition that can form independent line patterns with high resolution and excellent shapes and shows other excellent resist performances including roughness characteristics, and to provide an actinic ray-sensitive or radiation-sensitive film and a pattern forming method using the composition.

An embodiment of the present invention is as follows.

(1) An actinic ray-sensitive or radiation-sensitive resin composition containing a compound (P) that contains at least one phenolic hydroxyl group and at least one group in which a hydrogen atom of a phenolic hydroxyl group is substituted with a group represented by the following General Formula (1).

[Chem. 1]

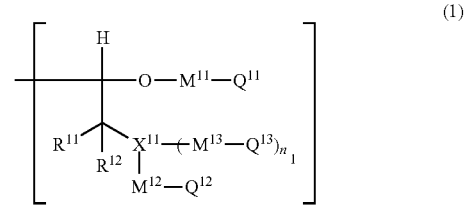

In the formula, each of $R^{11}$ and $R^{12}$ independently represents a hydrogen atom, an alkyl group, a cycloalkyl group, an aryl group, or an aralkyl group;

$n_1$ represents 0 or 1;

$X^{11}$ represents an oxygen atom or a sulfur atom when $n_1$ is 0, and represents a nitrogen atom when $n_1$ is 1;

$M^{11}$ represents a single bond, an alkylene group, a cycloalkylene group, —S—, —O—, —CO—, —CS—, —SO$_2$—, —N(R$_0$)—, or a combination of two or more kinds of the same, herein, R$_0$ represents a hydrogen atom or an alkyl group;

each of $M^{12}$ and $M^{13}$ independently represents a single bond or a divalent linking group;

$Q^{11}$ represents an alkyl group, an aralkyl group, a cycloalkyl group or an aryl group when $M^{11}$ is a group other than a single bond, and represents an alkyl group, an aralkyl group, or a cycloalkyl group when $M^{11}$ is a single bond;

$Q^{12}$ represents an organic group;

$Q^{13}$ represents an organic group or a hydrogen atom; and at least two of $R^{11}$, $R^{12}$, $Q^{12}$, and $Q^{13}$ may form a ring by binding to each other.

(2) The composition according to (1), wherein the compound (P) is a polymer compound containing a repeating unit represented by the following General Formula (2).

[Chem. 2]

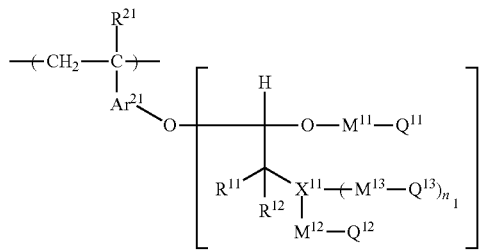

(2)

In the formula, $R^{21}$ represents a hydrogen atom or a methyl group;

$Ar^{21}$ represents an arylene group;

each of $R^{11}$ and $R^{12}$ independently represents a hydrogen atom, an alkyl group, a cycloalkyl group, an aryl group, or an aralkyl group;

$n_1$ represents 0 or 1;

$X^{11}$ represents an oxygen atom or a sulfur atom when $n_1$ is 0, and represents a nitrogen atom when $n_1$ is 1;

$M^{11}$ represents a single bond, an alkylene group, a cycloalkylene group, —S—, —O—, —CO—, —CS—, —SO$_2$—, —N(R$_0$)—, or a combination of two or more kinds of the same, herein, R$_a$ represents a hydrogen atom or an alkyl group;

each of $M^{12}$ and $M^{13}$ independently represents a single bond or a divalent linking group;

$Q^{11}$ represents an alkyl group, an aralkyl group, a cycloalkyl group, or an aryl group when $M^{11}$ is a group other than a single bond, and represents an alkyl group, an aralkyl group, or a cycloalkyl group when $M^{11}$ is a single bond;

$Q^{12}$ represents an organic group;

$Q^{13}$ represents an organic group or a hydrogen atom; and at least two of $R^{11}$, $R^{12}$, $Q^{12}$, and $Q^{13}$ may form a ring by binding to each other.

(3) The composition according to (2), wherein $Ar^{21}$ is a phenylene group.

(4) The composition according to any one of (1) to (3), wherein at least one of $Q^{11}$, $Q^{12}$, and $Q^{13}$ is a group having at least one cyclic structure.

(5) The composition according to any one of (1) to (4), wherein $Q^{12}$ is a methyl group, an ethyl group, an isopropyl group, a phenyl group, a naphthyl group, or an adamantyl group.

(6) The composition according to any one of (1) to (5), wherein a group represented by -$M^{11}$-$Q^{11}$ is an alkyl group, an alkyl group substituted with a cycloalkyl group, a cycloalkyl group, an aralkyl group, or an aryloxyalkyl group.

(7) The composition according to any one of (2) to (6), wherein the compound (P) contains a repeating unit represented by the following General Formula (5).

[Chem. 3]

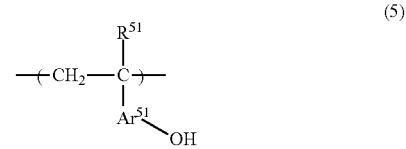

(5)

In the formula, $R^{51}$ represents a hydrogen atom or a methyl group; and $Ar^{51}$ represents an arylene group.

(8) The composition according to any one of (2) to (7), wherein the compound (P) further contains a non-degradable repeating unit represented by the following General Formula (3).

[Chem. 4]

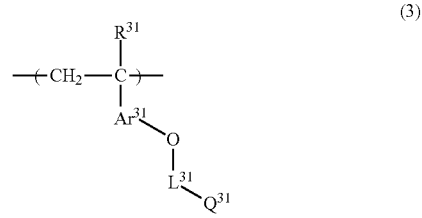

(3)

In the formula, $R^{31}$ represents a hydrogen atom or a methyl group;

$Ar^{31}$ represents an arylene group;

$L^{31}$ represents a single bond or a divalent linking group; and $Q^{31}$ represents a cycloalkyl group or an aryl group.

(9) The composition according to any one of (2) to (8), wherein the compound (P) further contains a repeating unit represented by the following General Formula (4).

[Chem. 5]

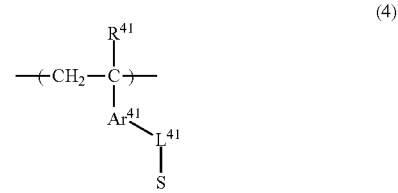

(4)

In the formula, $R^{41}$ represents a hydrogen atom or a methyl group;

$Ar^{41}$ represents an arylene group;

$L^{41}$ represents a single bond or a divalent linking group; and

S represents a structural moiety that generates an acid on a side chain by being degraded by actinic ray irradiation or radiation irradiation.

(10) The composition according to any one of (1) to (9), which is exposed with at least one of an electron beam, X-rays, and EUV light.

(11) An actinic ray-sensitive or radiation-sensitive film formed using the composition according to any one of (1) to (10).

(12) Mask blanks on which the actinic ray-sensitive or radiation-sensitive film according to (11) is formed.

(13) A mask for producing semiconductors that is obtained by exposing and developing the mask blanks according to (12).

(14) A pattern forming method including exposing the film according to (11), and developing the exposed film.

(15) A pattern forming method including exposing the mask blanks according to (12), and developing the exposed mask blanks.

(16) The method according to (14) or (15), wherein the exposing is performed using at least one of an electron beam, X-rays, and EUV light.

According to the present invention, an actinic ray-sensitive or radiation-sensitive resin composition that can form independent line patterns with high resolution and excellent shapes and shows excellent resist performances including roughness characteristics, and an actinic ray-sensitive or radiation-sensitive film and a pattern forming method using the composition can be provided.

DESCRIPTION OF THE PREFERRED EMBODIMENTS

Hereinbelow, embodiments of the present invention will be described in detail.

Regarding the description for a group (atomic group) in the present specification, if a group is not described in regard to whether the group is substituted or unsubstituted, this group includes not only those not having a substituent but also those having a substituent. For example, an "alkyl group" includes not only an alkyl group (unsubstituted alkyl group) not having a substituent but also an alkyl group (substituted alkyl group) having a substituent.

In the present invention, the term "actinic rays" or "radiation" refers to, for example, a bright line spectrum of a mercury lamp, far-ultraviolet rays represented by an excimer laser, extreme ultraviolet rays (EUV light), X-rays, or an electron beam. In addition, the "light" in the present invention refers to the actinic rays or the radiation. The term "exposure" in this specification includes not only the exposure performed using a mercury lamp, far-ultraviolet rays represented by an excimer laser, X-rays, EUV light, and the like, but also drawing performed using particle beams such as an electron beam and an ion beam, unless otherwise specified.

The actinic ray-sensitive or radiation-sensitive resin composition according to the present invention is, for example, a positive composition, and typically is a positive resist composition. The constitution of this composition will be described below.

[1] Compound (P)

The composition according to the present invention contains a compound (P) that contains at least one phenolic hydroxyl group and at least one group in which a hydrogen atom of a phenolic hydroxyl group is substituted with a group (hereinbelow, also referred to as an "acid labile group") represented by the following General Formula (1). The "acid labile group" refers to a group eliminated when a chemical bond is broken by the action of an acid. In addition, the "phenolic hydroxyl group" refers to a hydroxyl group directly binding to an aromatic ring.

[Chem. 6]

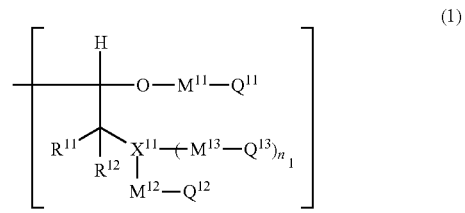

In General Formula (1), each of $R^{11}$ and $R^{12}$ independently represents a hydrogen atom, an alkyl group, a cycloalkyl group, an aryl group, or an aralkyl group;

$n_1$ represents 0 or 1;

$X^{11}$ represents an oxygen atom or a sulfur atom when $n_1$ is 0, and represents a nitrogen atom when $n_1$ is 1;

$M^{11}$ m represents a single bond, an alkylene group, a cycloalkylene group, —S—, —O—, —CO—, —CS—, —SO$_2$—, —N(R$_0$)—, or a combination of two or more kinds of the same, herein, $R_0$ represents a hydrogen atom or an alkyl group;

each of $M^{12}$ and $M^{13}$ independently represents a single bond or a divalent linking group;

$Q^{11}$ represents an alkyl group, an aralkyl group, a cycloalkyl group, or an aryl group when $M^{11}$ is a group other than a single bond, and represents an alkyl group, an aralkyl group, or a cycloalkyl group when $M^{11}$ is a single bond;

$Q^{12}$ represents an organic group;

$Q^{13}$ represents an organic group or a hydrogen atom; and at least two of $R^{11}$, $R^{12}$, $Q^{12}$, and $Q^{13}$ may form a ring by binding to each other.

The General Formula (1) will be described in more detail.

As described above, each of $R^{11}$ and $R^{12}$ independently represents a hydrogen atom, an alkyl group, a cycloalkyl group, an aryl group, or an aralkyl group.

In an embodiment, the alkyl group preferably has 20 or less carbon atoms, and more preferably has 8 or less carbon atoms. Examples of the alkyl group include a methyl group, an ethyl group, a propyl group, an isopropyl group, an n-butyl group, a sec-butyl group, a t-butyl group, a hexyl group, a 2-ethylhexyl group, an octyl group, and a dodecyl group. Among these, a methyl group, an ethyl group, a propyl group, an isopropyl group, and a t-butyl group are particularly preferable.

The cycloalkyl group may be monocyclic or polycyclic. The cycloalkyl group preferably has 3 to 10 carbon atoms. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, and a 2-norbornyl group. Among these, a cyclopentyl group and a cyclohexyl group are preferable.

The aryl group may contain a hetero atom; alternatively, the aryl group may also contain a structure (for example, a biphenyl group or a terphenyl group) in which a plurality of aromatic rings are connected to each other via a single bond. The aryl group preferably has 4 to 20 carbon atoms, and more preferably has 6 to 14 carbon atoms. Examples of the aryl group include a phenyl group, a naphthyl group, an anthranyl group, a biphenyl group, a terphenyl group, a pyrrolyl group, a pyridyl group, a pyrimidyl group, a furanyl group, and a thienyl group. Among these, a phenyl group, a naphthyl group, and a biphenyl group are particularly preferable.

The aralkyl group preferably has 6 to 20 carbon atoms, and more preferably has 7 to 12 carbon atoms. Examples of the aralkyl group include a benzyl group, a phenethyl group, a naphthylmethyl group, and a naphthylethyl group.

The alkyl group, the cycloalkyl group, the aryl group, and the aralkyl group may further have a substituent. Examples of the substituent that the alkyl group may further have include a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group.

Examples of the substituent that the cycloalkyl group may further have include an alkyl group and the respective groups described above as specific examples of the substituent that the alkyl group may further have.

The substituent that the alkyl group and the cycloalkyl group may further have preferably has 8 or less carbon atoms.

Examples of the substituent that the aryl group and the aralkyl group may further have include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

As described above, $X^{11}$ in General Formula (1) represents an oxygen atom or a sulfur atom when $n_1$ is 0, and represents a nitrogen atom when $n_1$ is 1.

As described above, each of $M^{12}$ and $M^{13}$ independently represents a single bond or a divalent linking group. The divalent linking group is, for example, an alkylene group (preferably an alkylene group having 1 to 8 carbon atoms, for example, a methylene group, an ethylene group, a propylene group, a butylene group, a hexylene group, or an octylene group), a cycloalkylene group (preferably a cycloalkylene group having 3 to 15 carbon atoms, for example, a cyclopentylene group or a cyclohexylene group), —S—, —O—, —CO—, —CS—, —SO$_2$—, —N(R$_0$)—, or a combination of two or more kinds of the same. The divalent linking group preferably has 20 or less carbon atoms in total. Herein, R$_0$ is a hydrogen atom or an alkyl group (for example, an alkyl group having 1 to 8 carbon atoms that specifically includes a methyl group, an ethyl group, a propyl group, an n-butyl group, a sec-butyl group, a hexyl group, an octyl group, and the like).

$M^{12}$ and $M^{13}$ are preferably a single bond, an alkylene group, —CO—, —CS—, or a divalent linking group including a combination of an alkylene group with at least one of —O—, —CO—, —CS—, and —N(R$_0$)—, and more preferably a single bond, an alkylene group, —CO—, or —CS—. Herein, R$_0$ has the same definition as R$_0$ described above.

$M^{12}$ and $M^{13}$ may further have a substituent, and the substituent that $M^{12}$ and $M^{13}$ may further have is the same as the above-described substituent that the alkyl group represented by $R^{11}$ may have.

As described above, $Q^{12}$ represents an organic group, and $Q^{13}$ represents an organic group or a hydrogen atom. The organic group herein is a group having at least one carbon atom and preferably is an organic group having a carbon-hydrogen bond portion. When the organic group has 2 or more carbon atoms, the organic group may be a saturated organic group in which a carbon-hydrogen bond is formed only with a single bond, or an unsaturated organic group having a portion in which a carbon-hydrogen bond is formed with a double bond or a triple bond. The organic group may contain a hetero atom such as an oxygen atom, a nitrogen atom, or a sulfur atom.

Examples of the organic group represented by $Q^{12}$ and $Q^{13}$ include an alkyl group, an aralkyl group, a cycloalkyl group, an aryl group, and the like.

The alkyl group represented by $Q^{12}$ and $Q^{13}$ is the same as, for example, the above-described alkyl group represented by $R^{11}$.

The cycloalkyl group represented by $Q^{12}$ and $Q^{13}$ may be monocyclic or polycyclic. This alicyclic group preferably has 3 to 10 carbon atoms. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, an 8-tricyclo[5.2.1.0$^{2,6}$]decyl group, and a 2-bicyclo[2.2.1]heptyl group. Among these, a cyclopentyl group, a cyclohexyl group, a 1-adamantyl group, a 2-adamantyl group, an 8-tricyclo[5.2.1.0$^{2,6}$]decyl group, and a 2-bicyclo[2.2.1]heptyl group are preferable.

Examples of the aryl group represented by $Q^{12}$ and $Q^{13}$ include the above-described aryl groups represented by $R^{11}$. The aryl group preferably has 3 to 18 carbon atoms.

The cycloalkyl group and the aryl group represented by $Q^{12}$ and $Q^{13}$ may have a substituent, and examples thereof include an alkyl group, a cycloalkyl group, a cyano group, a halogen atom, a hydroxyl group, an alkoxy group, a carboxyl group, and an alkoxycarbonyl group.

Specific examples of the aralkyl group represented by $Q^{12}$ and $Q^{13}$ include the same specific examples as described above for the aralkyl group represented by $R^{11}$.

In an embodiment, $Q^{12}$ is preferably a methyl group, an ethyl group, an isopropyl group, a phenyl group, a naphthyl group, or an adamantyl group.

As described above, at least two $R^{11}$, $R^{12}$, $Q^{12}$ and $Q^{13}$ may form a ring by binding to each other.

For example, when $X^{11}$ is a nitrogen atom, $Q^{12}$ and $Q^{13}$ may form a ring by binding to each other. Specific examples of the ring structure containing a nitrogen atom represented by $X^{11}$ include maleimide, phthalimide, succinimide, pyrrolidine, piperidine, imidazole, pyrrole, morpholine, carbazole, and the like.

Likewise, when $X^{11}$ is a nitrogen atom, $Q^{12}$ and $R^{12}$ may form a ring by binding to each other. Specific examples of the ring structure containing a nitrogen atom represented by $X^{11}$ include pyrrolidine, piperidine, and the like.

When $X^{11}$ is an oxygen atom or a sulfur atom, $Q^{12}$ and $R^{12}$ may form a ring by binding to each other. Specific examples of the ring structure include tetrahydrofuran, tetrahydropyran, tetrahydrothiophene, and the like.

Hereinbelow, specific examples of a group represented by the following General Formula (1a) will be described, but the present invention is not limited thereto.

[Chem. 7]
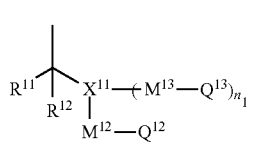
(1a)
[Chem. 8]
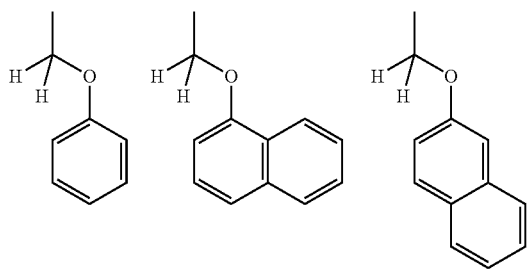
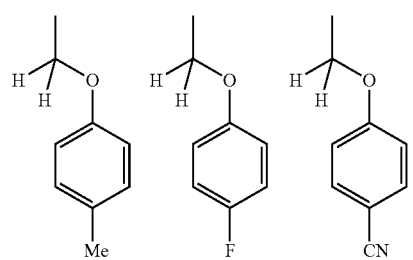
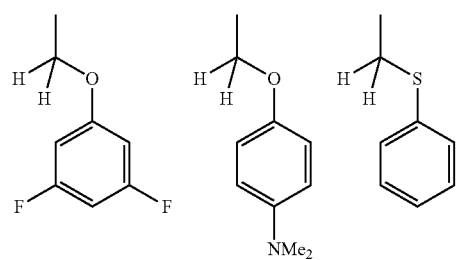
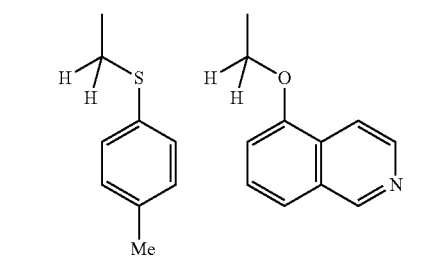
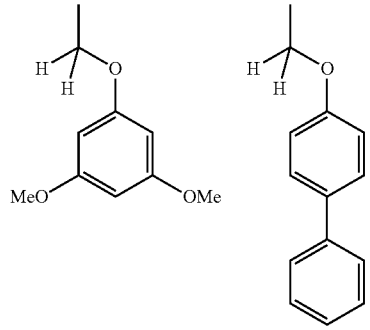
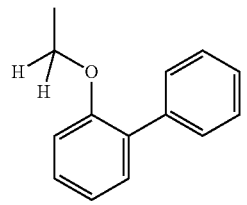
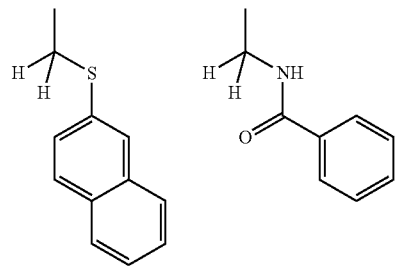
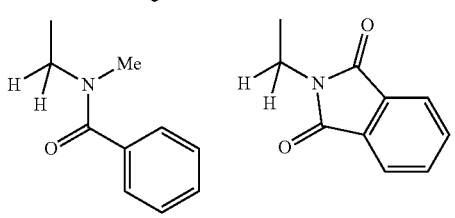
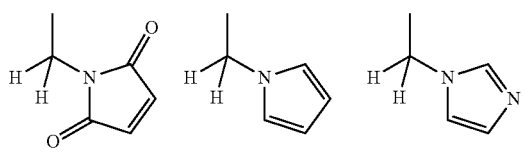
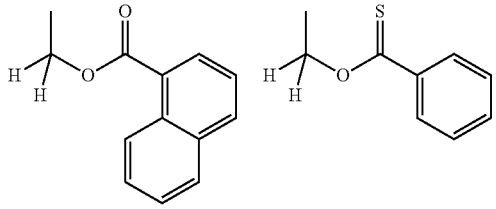
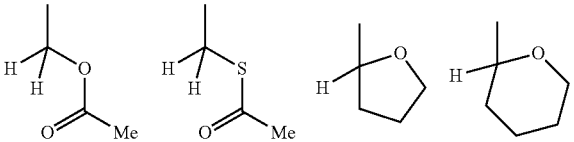

-continued
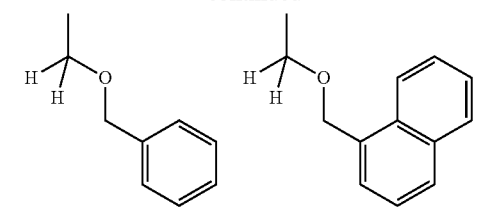
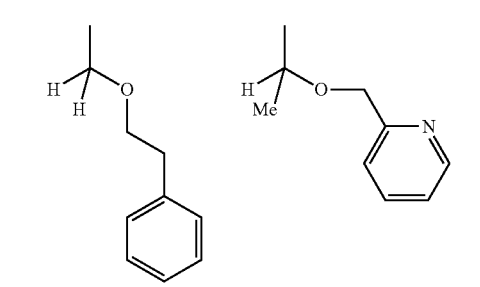
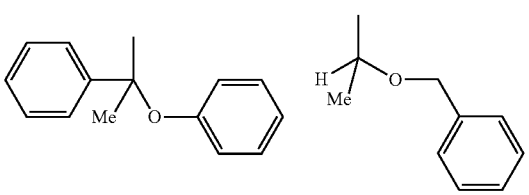
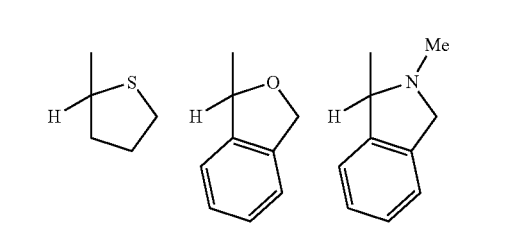
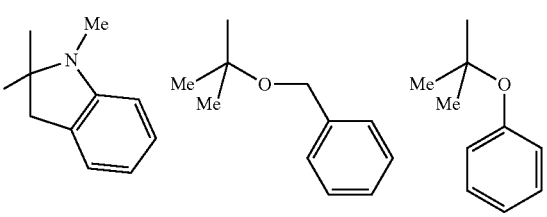
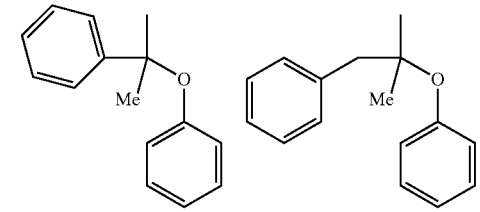
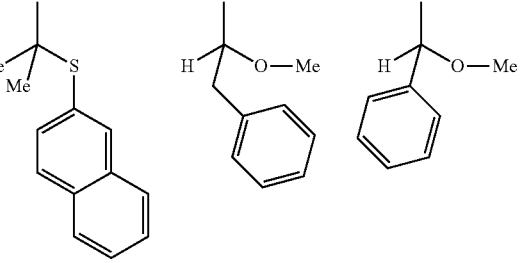
-continued
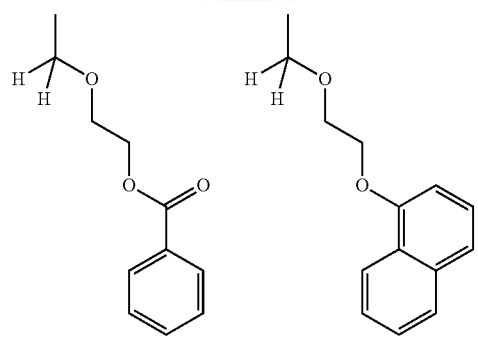
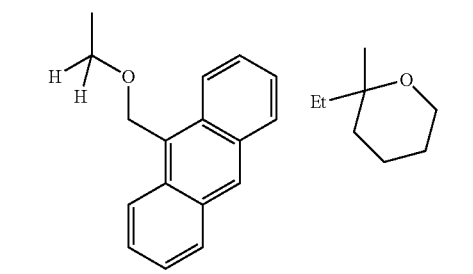
[Chem. 9]
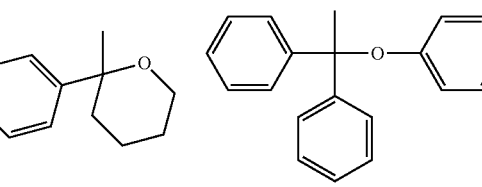
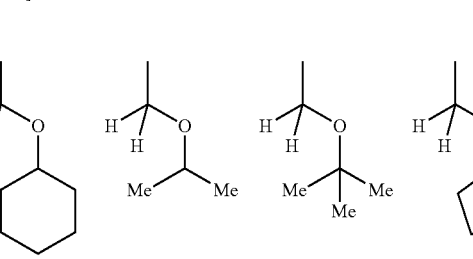
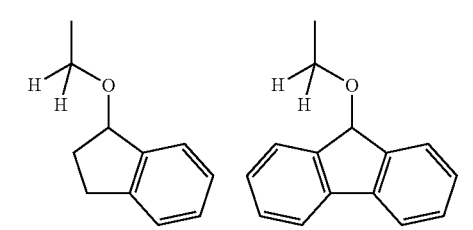
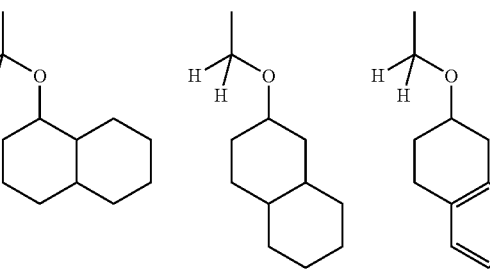

-continued

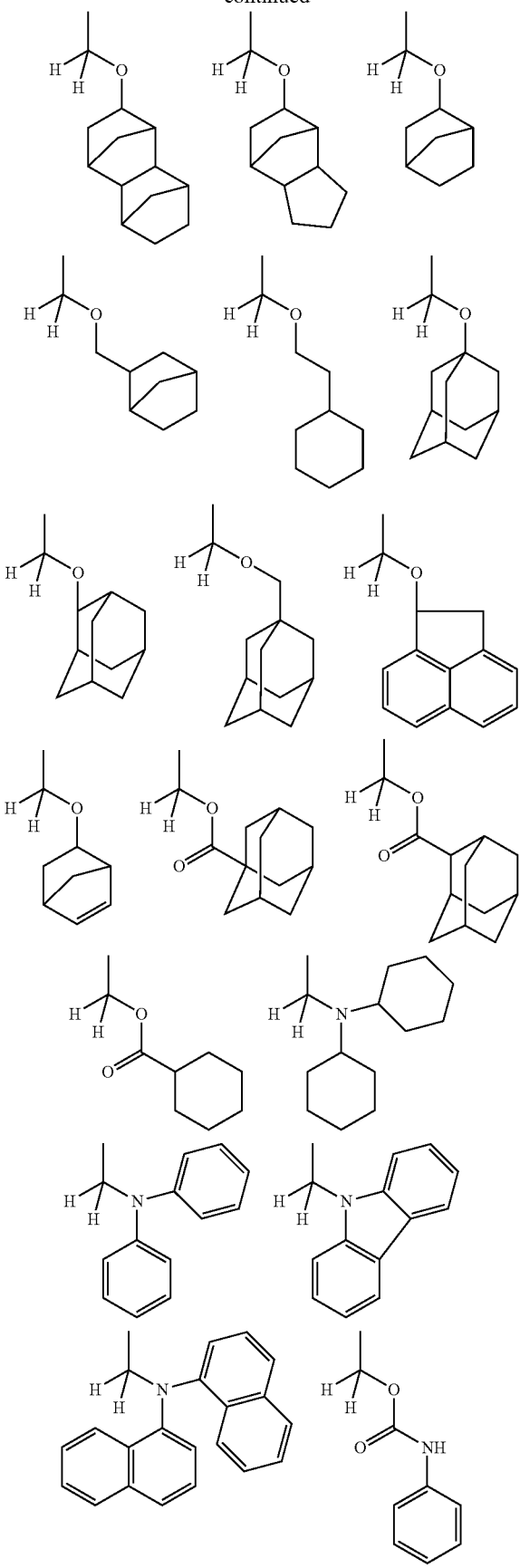

-continued

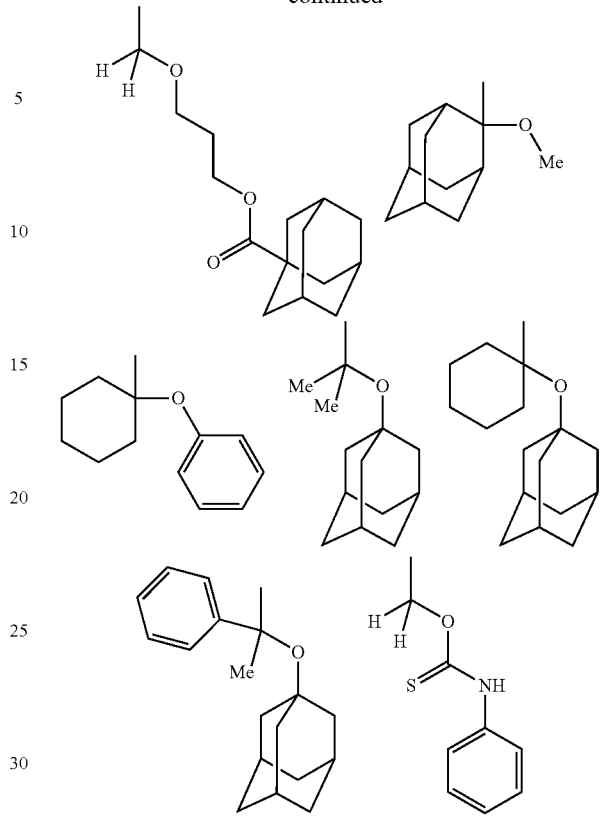

As described above, $M^{11}$ represents a single bond, an alkylene group, a cycloalkylene group, —S—, —O—, —CO—, —CS—, —SO$_2$—, —N(R$_0$)— (R$_0$ is a hydrogen atom or an alkyl group), or a combination of two or more kinds of the same. When being a group other than a single bond, $M^{11}$ preferably has 20 or less carbon atoms in total.

The alkylene group is preferably an alkylene group having 1 to 8 carbon atoms, and examples thereof include a methylene group, an ethylene group, a propylene group, a butylene group, a hexylene group, and an octylene group.

The cycloalkylene group is preferably a cycloalkylene group having 3 to 15 carbon atoms, and examples thereof include a cyclopentylene group and a cyclohexylene group.

$R_0$ in —N(R$_0$)— is a hydrogen atom or an alkyl group. The alkyl group is, for example, an alkyl group having 1 to 8 carbon atoms, and specific examples thereof include a methyl group, an ethyl group, a propyl group, an n-butyl group, a sec-butyl group, a hexyl group, an octyl group, and the like.

$M^{11}$ is preferably a single bond, an alkylene group, or a divalent linking group including a combination of an alkylene group with at least one of —O—, —CO—, —CS—, and —N(R$_0$)—, and more preferably a single bond, an alkylene group, or a divalent linking group including a combination of an alkylene group with —O—. Herein, $R_0$ has the same definition as $R_0$ described above.

$M^{11}$ may further have a substituent, and the substituent that $M^{11}$ may further have is the same as the above-described substituent that the alkyl group represented by $R^{11}$ may have.

As described above, $Q^{11}$ represents an alkyl group, an aralkyl group, a cycloalkyl group, or an aryl group when $M^{11}$ is a group other than a single bond, and represents an alkyl group, an aralkyl group, or a cycloalkyl group when $M^{11}$ is a single bond.

The alkyl group represented by $Q^{11}$ is the same as, for example, the above-described alkyl group represented by $R^{11}$.

The cycloalkyl group represented by $Q^{11}$ may be monocyclic or polycyclic. This alicyclic group preferably has 3 to 10 carbon atoms. Examples of the alicyclic group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, an 8-tricyclo[5.2.1.0$^{2,6}$]decyl group, and a 2-bicyclo[2.2.1]heptyl group. Among these, a cyclopentyl group, a cyclohexyl group, a 2-adamantyl group, an 8-tricyclo[5.2.1.0$^{2,6}$]decyl group, and a 2-bicyclo[2.2.1]heptyl group are preferable.

Examples of the aryl group represented by $Q^{11}$ include the above-described aryl groups represented by $R^{11}$. The aryl group preferably has 3 to 18 carbon atoms. Here, when $M^{11}$ is a single bond, $Q^{11}$ is not an aryl group. When $M^{11}$ is a single bond, if $Q^{11}$ is an aryl group, this is not preferable since the composition easily becomes negative under a condition in which a temperature of post exposure bake is high.

The cycloalkyl group and the aryl group represented by $Q^{11}$ may have a substituent, and examples thereof include an alkyl group, a cycloalkyl group, a cyano group, a halogen atom, a hydroxyl group, an alkoxy group, a carboxyl group, and an alkoxycarbonyl group.

Specific examples of the aralkyl group represented by $Q^{11}$ include the same ones as described above for the aralkyl group represented by $R^{11}$.

In an embodiment, at least one of $Q^{11}$, $Q^{12}$ and $Q^{13}$ is preferably a group having at least one cyclic structure.

Particularly preferable examples of (-$M^{11}$-$Q^{11}$) include an alkyl group, an alkyl group substituted with a cycloalkyl group, a cycloalkyl group, an aralkyl group, an aryloxyalkyl group, and the like. Specific examples thereof include a methyl group, an ethyl group, an isopropyl group, a cyclopentyl group, a cyclohexyl group, a cyclohexylethyl group, a 2-adamantyl group, an 8-tricyclo[5.2.1.0$^{2,6}$]decyl group, and a 2-bicyclo[2.2.1]heptyl group, a benzyl group, a 2-phenethyl group, a 2-phenoxyethyl group, and the like.

Specific examples of the group represented by -($M^{11}$-$Q^{11}$) will be described below, but the present invention is not limited thereto.

[Chem. 10]

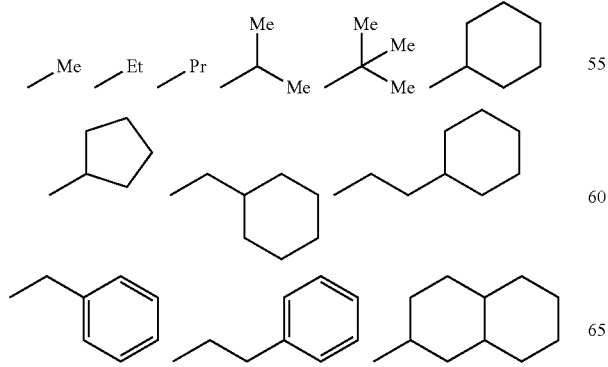

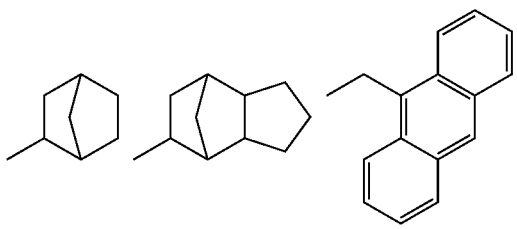

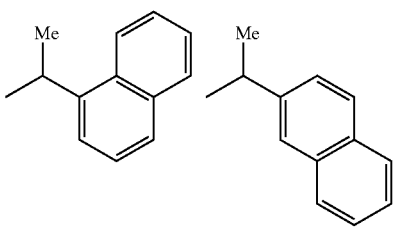

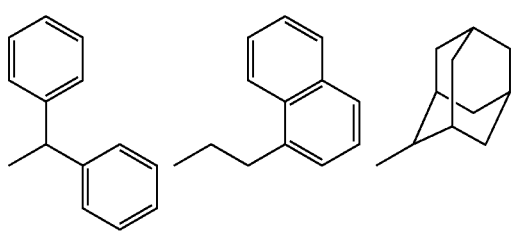

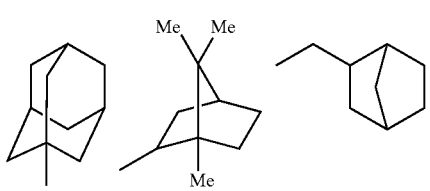

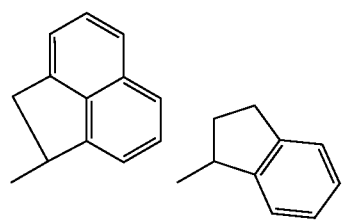

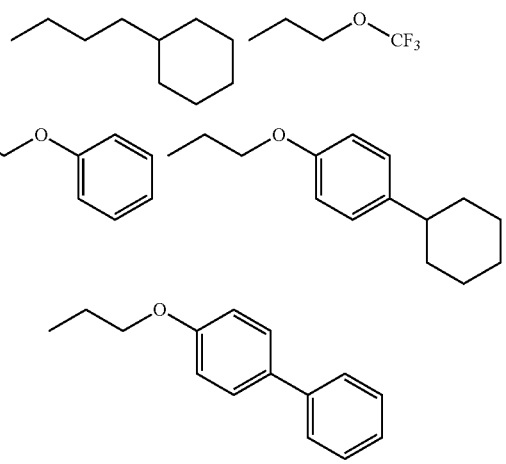

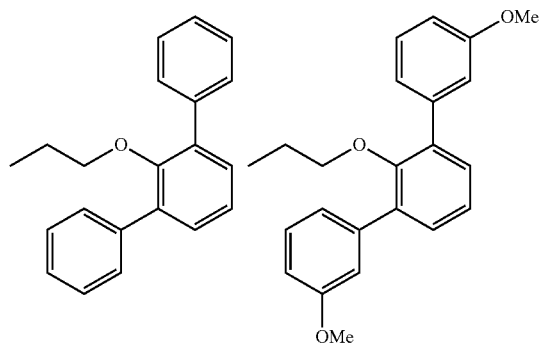
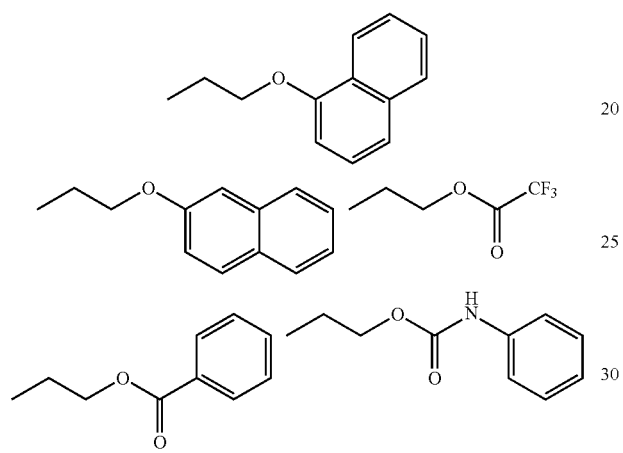
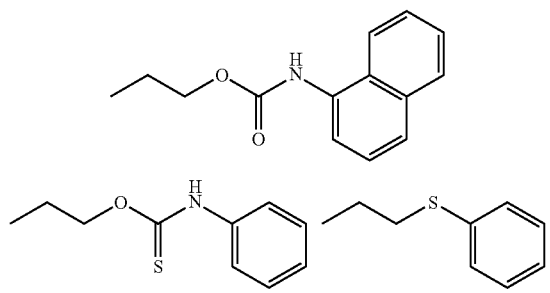
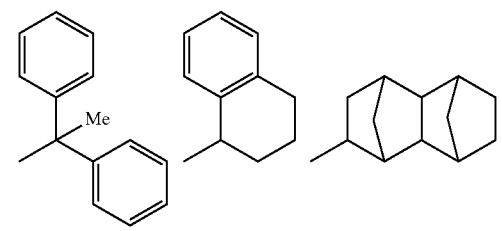
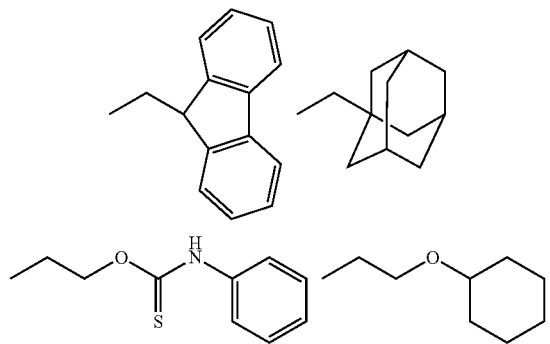

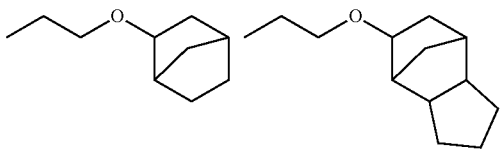

Specific examples of the acid labile group represented by General Formula (1) include groups obtained by combining the above-described specific examples of the group represented by the General Formula (1a) with the above-described specific examples of the group represented by -($M^{11}$-$Q^{11}$), but the present invention is not limited thereto.

Preferable examples of the acid labile group represented by General Formula (1) will be described below.

[Chem. 11]

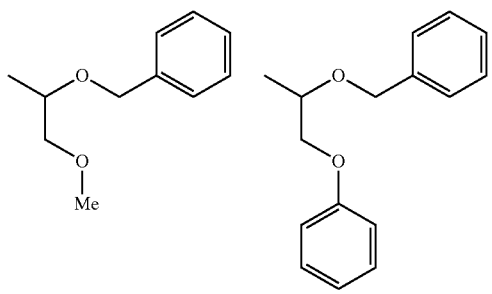
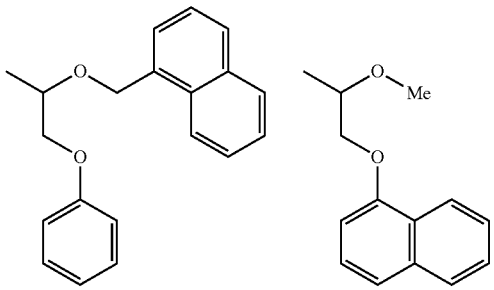
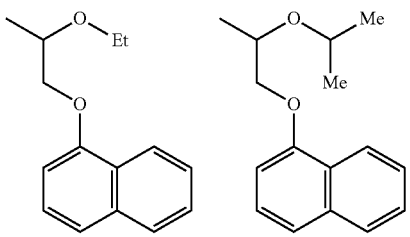
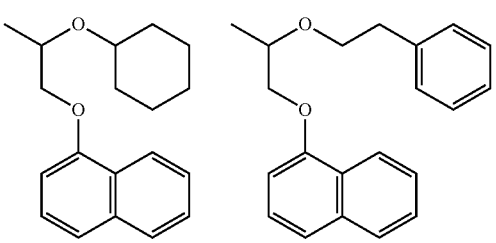

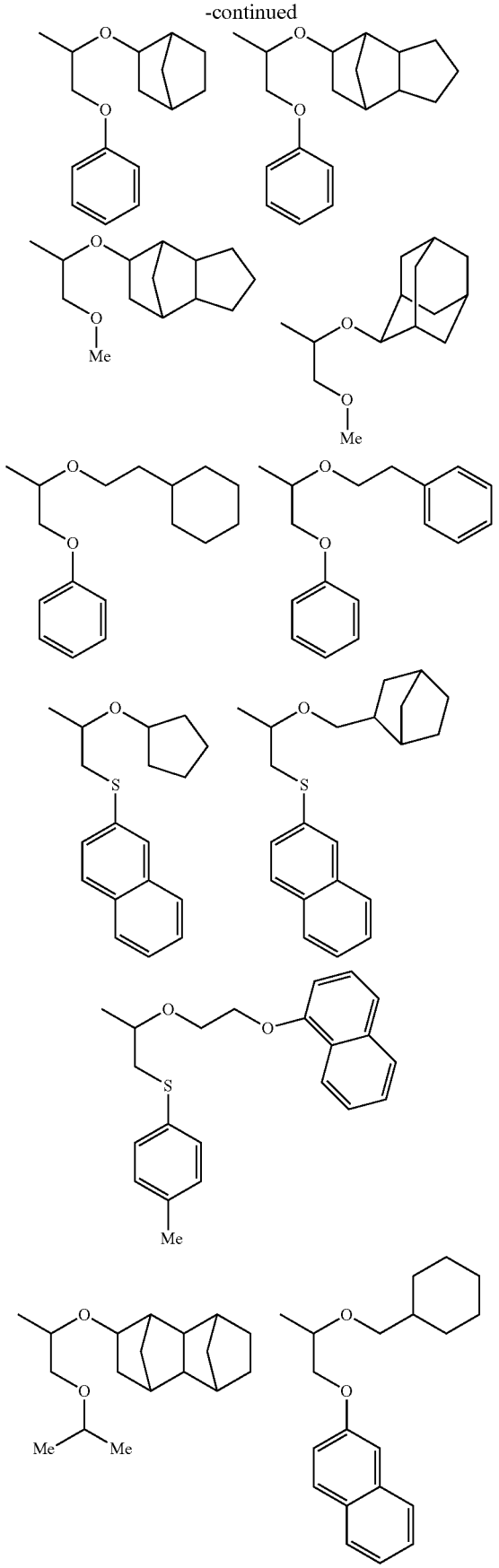
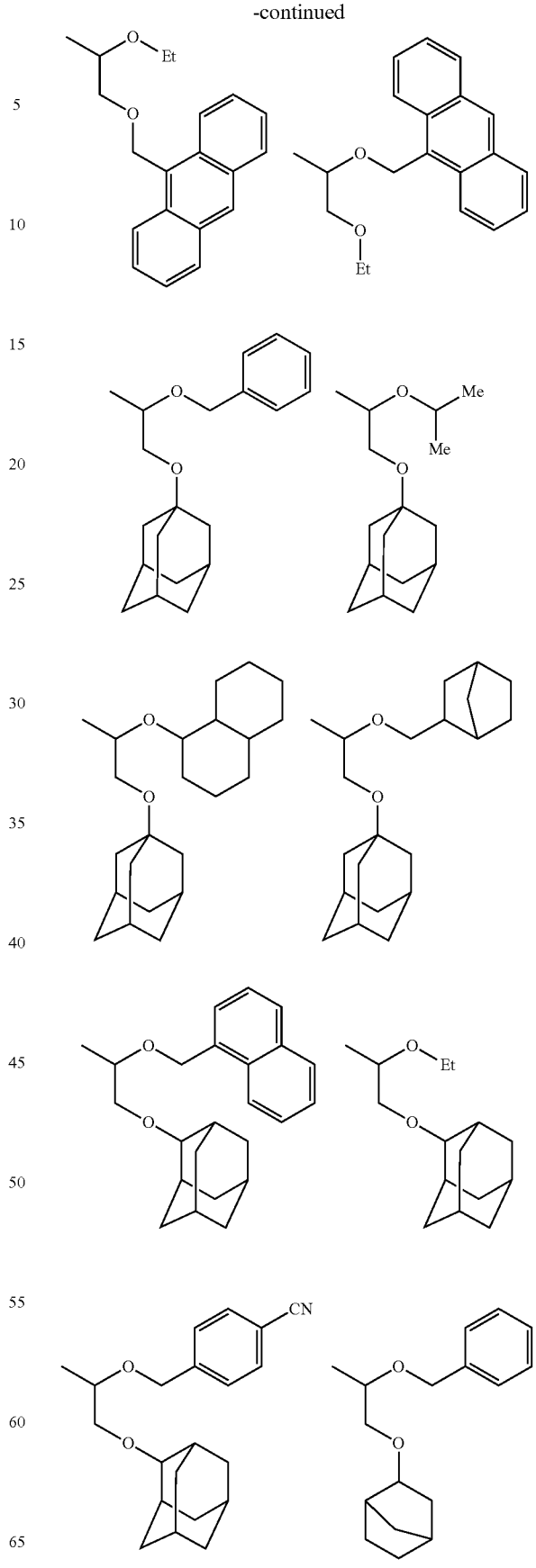

-continued
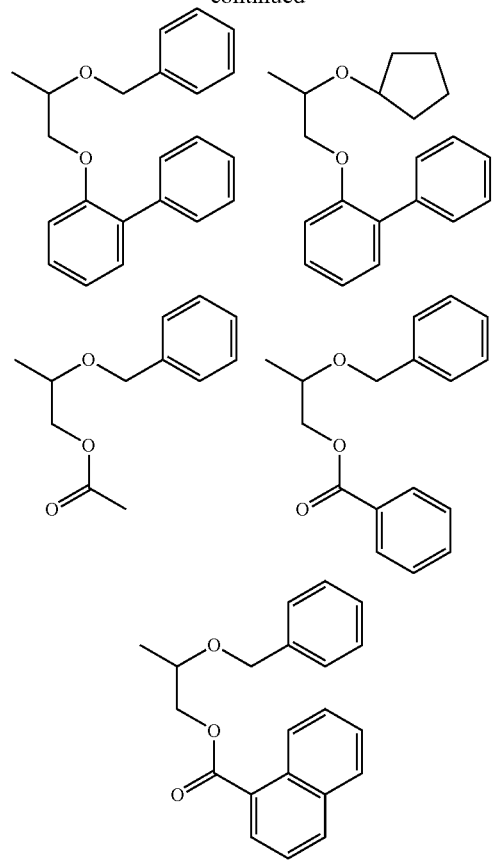
[Chem. 12]
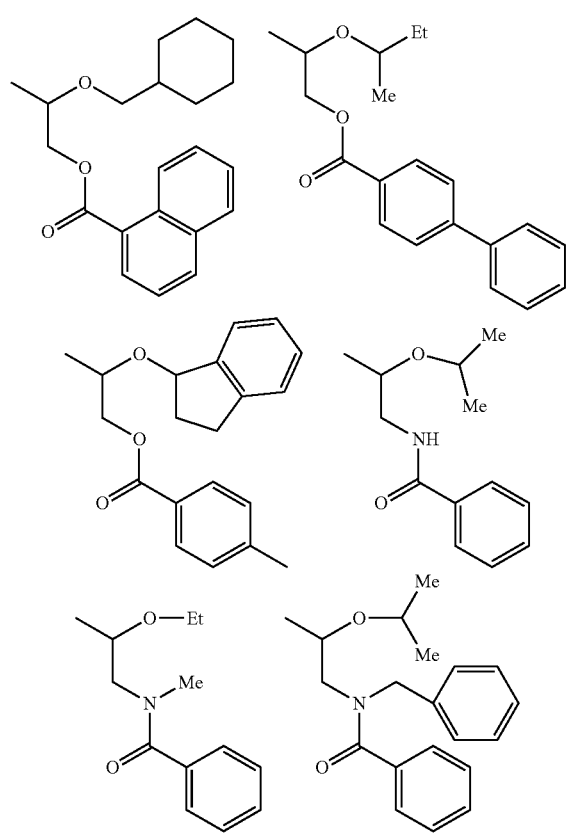
-continued
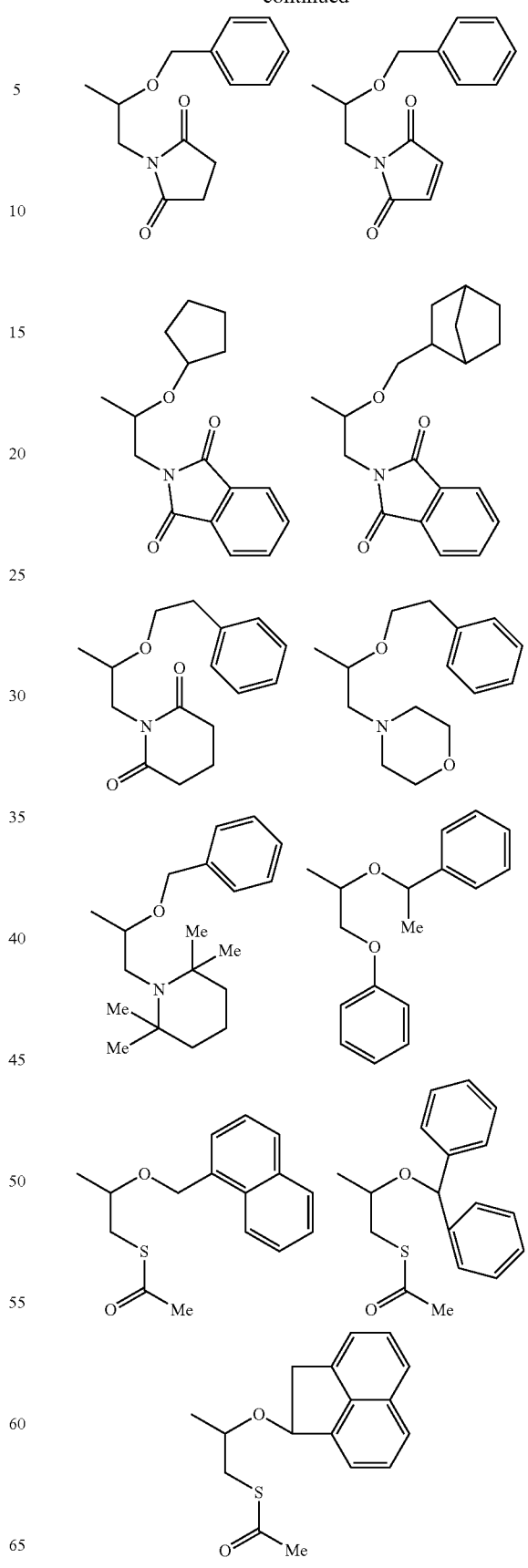

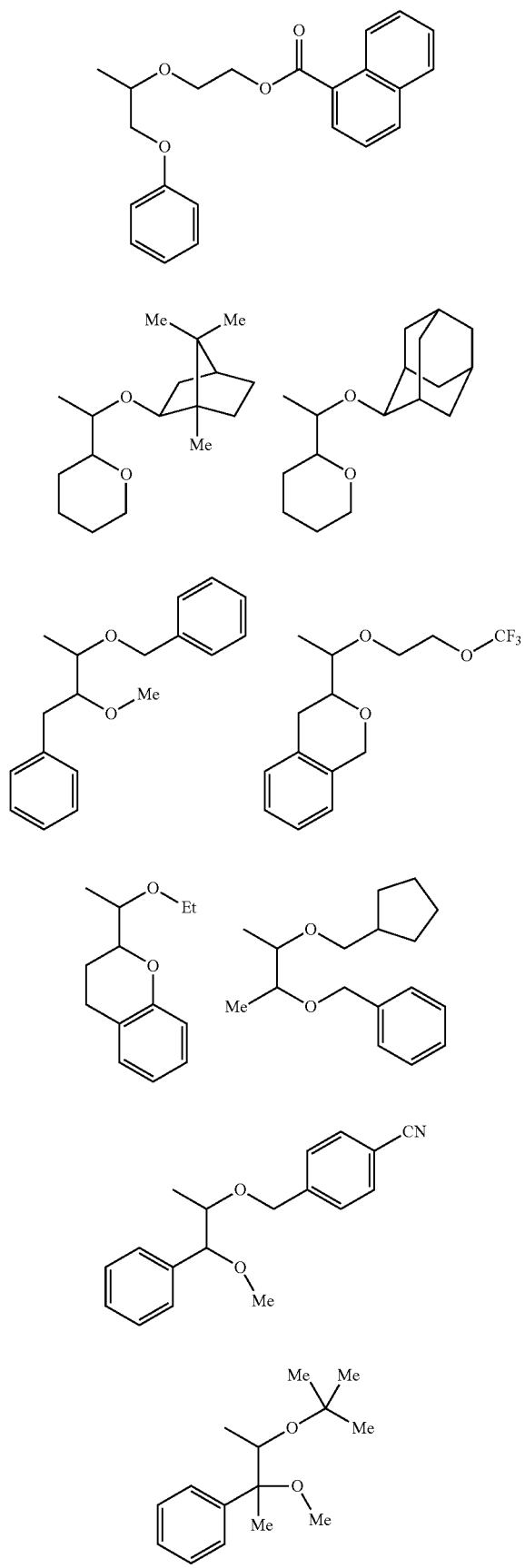
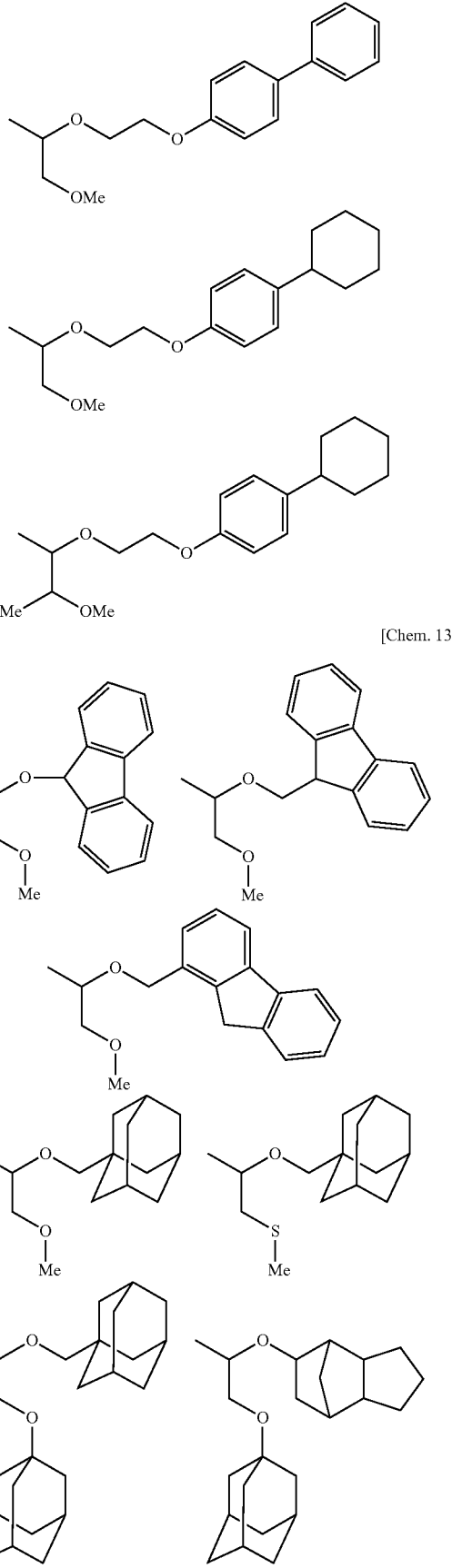

25
-continued
26
-continued
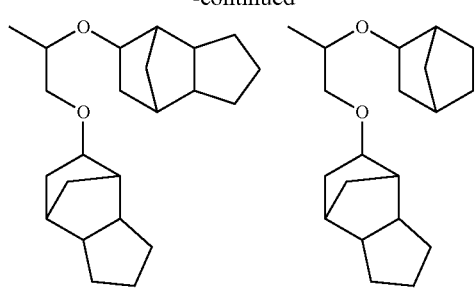
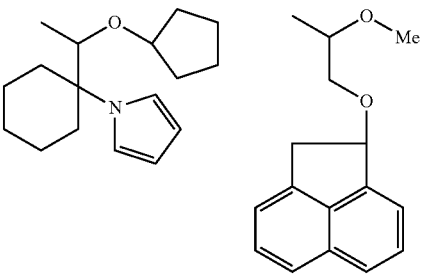
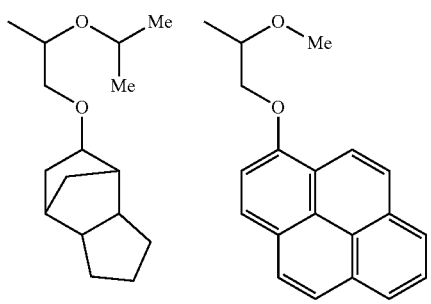
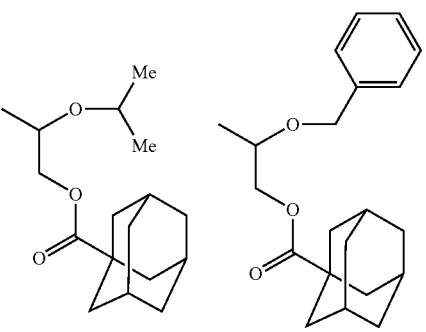
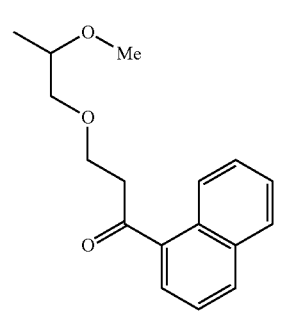
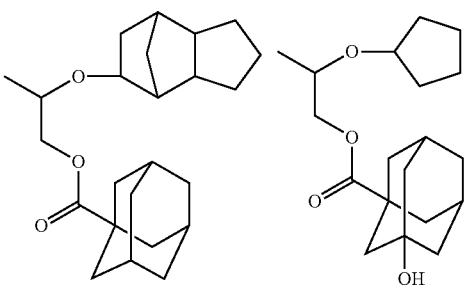
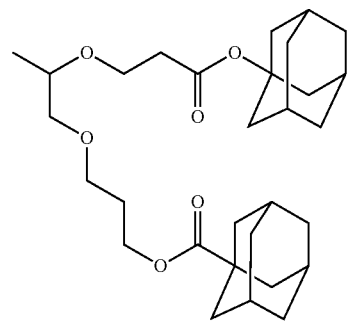
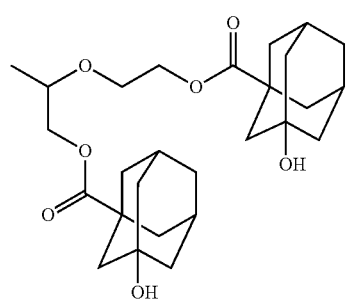
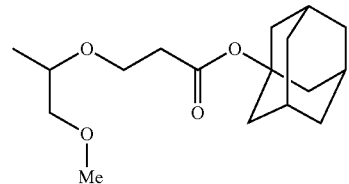
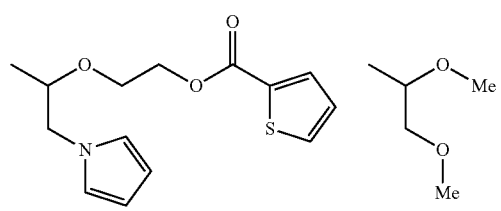
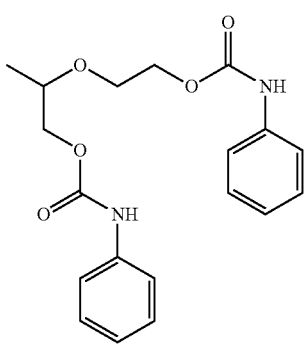

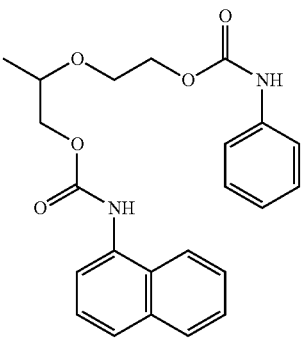
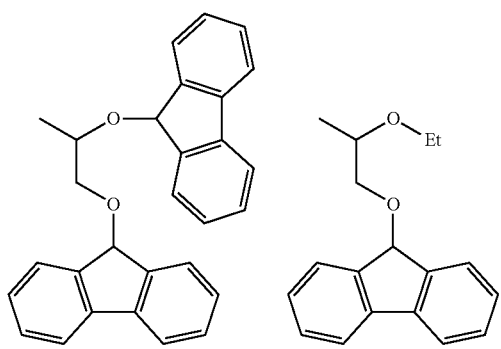
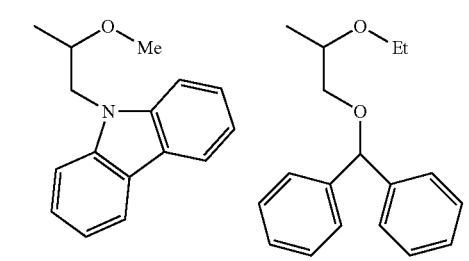

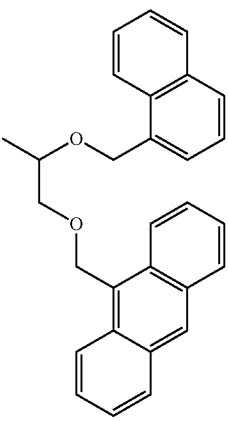

Presumably, since a carbocation intermediate that is generated in the degradation process of the acid labile group represented by General Formula (1) caused by the action of an acid is more unstable compared to, for example, the general acid labile group in which all of $R^{11}$, $R^{12}$, and $[X^{11}(M^{12}\text{-}Q^{12})(M^{13}\text{-}Q^{13})_{n1}]$ have been substituted with a hydrogen atom, the activation energy of the acid degradation reaction is higher.

[Chem. 14]

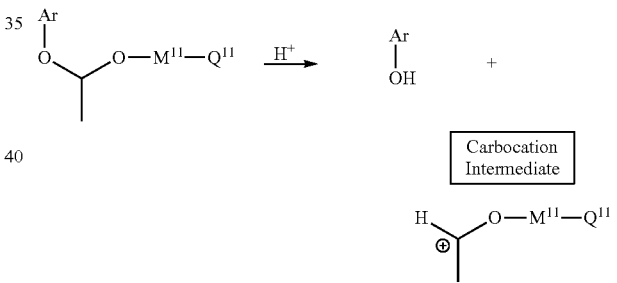
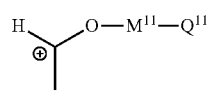
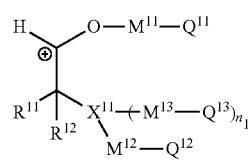

Carbocation is more unsatble since $X^{11}$ has electron-withdrawing properties.

If the activation energy is increased, the degradation reaction of the acid labile group caused at a temperature around room temperature is inhibited. Accordingly, the neutralization reaction of the generated acid in a resist film does not compete with the degradation reaction of the acid labile group, whereby the resolution and the roughness characteristics are improved.

In the compound (P) of the present invention, the amount substituted with the acid labile group represented by General Formula (1) preferably ranges from 1 mol % to 60 mol %, more preferably ranges from 2 mol % to 40 mol %, and particularly preferably ranges from 2 mol % to 30 mol %, based on the total phenolic hydroxyl groups.

In an embodiment, the compound (P) may be a polymer compound containing a repeating unit that contains a phenolic hydroxyl group and a repeating unit that contains a group in which a hydrogen atom of a phenolic hydroxyl group is substituted with the acid labile group represented by General Formula (1). In another embodiment, the compound (P) may be a low-molecular weight compound in which hydrogen atoms of a portion of phenolic hydroxyl groups in a mother nucleus compound having a plurality of phenolic hydroxyl groups have been substituted with the acid labile group represented by General Formula (1).

First, the case where the compound (P) is a polymer compound will be described.

As described above, in an embodiment, the compound (P) may be a polymer compound containing a repeating unit that contains a phenolic hydroxyl group and a repeating unit that contains a group in which a hydrogen atom of a phenolic hydroxyl group is substituted with the acid labile group represented by General Formula (1).

Examples of the repeating unit that contains a phenolic hydroxyl group include repeating units represented by the following General Formula (5) or (6), and among these, the repeating unit represented by General Formula (5) is more preferable.

[Chem. 15]

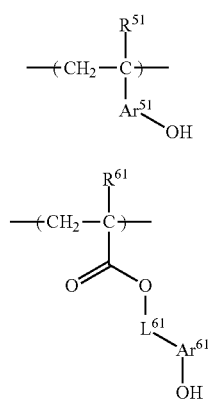

In General Formulae (5) and (6), each of $R^{51}$ and $R^{61}$ independently represents a hydrogen atom or a methyl group, and each of $Ar^{51}$ and $Ar^{61}$ independently represents an arylene group. $L^{61}$ represents a single bond or an alkylene group.

$R^{51}$ is more preferably a hydrogen atom, and $R^{61}$ is more preferably a methyl group.

The arylene group represented by $Ar^{51}$ and $Ar^{61}$ may have a substituent. The arylene group is more preferably an arylene group having 6 to 18 carbon atoms that may have a substituent, even more preferably a phenylene group or a naphthylene group having 6 to 18 carbon atoms that may have a substituent, and most preferably a phenylene group having 6 to 18 carbon atoms that may have a substituent. Examples of the substituent that these groups may have include an alkyl group, a halogen atom, a hydroxyl group, an alkoxy group, a carboxyl group, and an alkoxycarbonyl group.

As described above, $L^{61}$ represents a single bond or an alkylene group. The alkylene group preferably has 1 to 8 carbon atoms, and more preferably has 1 to 4 carbon atoms. Examples of the alkylene group include a methylene group, an ethylene group, a propylene group, a butylene group, a hexylene group, and an octylene group, and among these, a methylene group and an ethylene group are particularly preferable.

Specific examples of the repeating unit represented by General Formula (5) will be described, but the present invention is not limited thereto.

[Chem. 16]

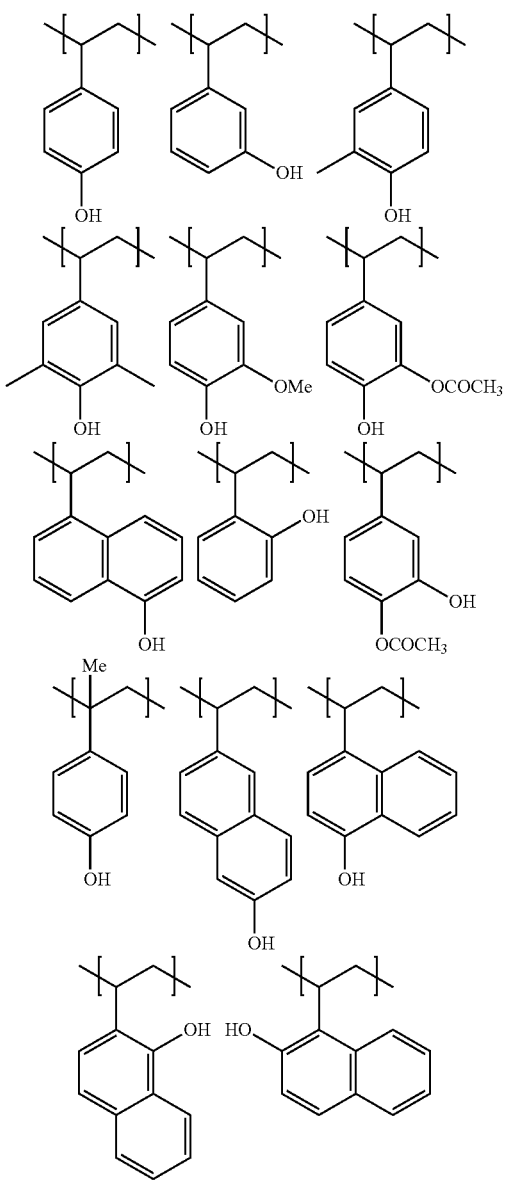

Specific examples of the repeating unit represented by General Formula (6) will be described, but the present invention is not limited thereto.

[Chem. 17]

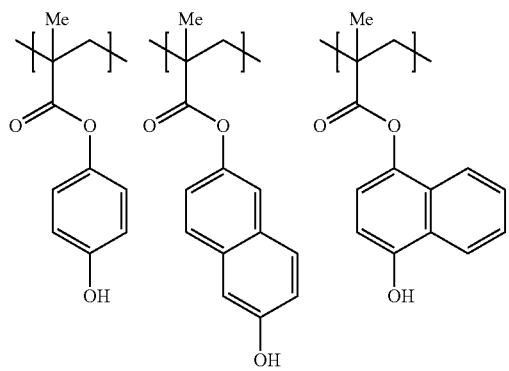
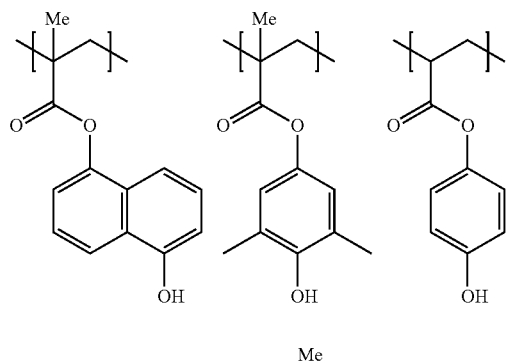
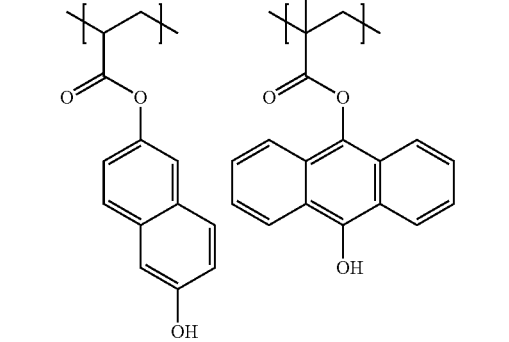
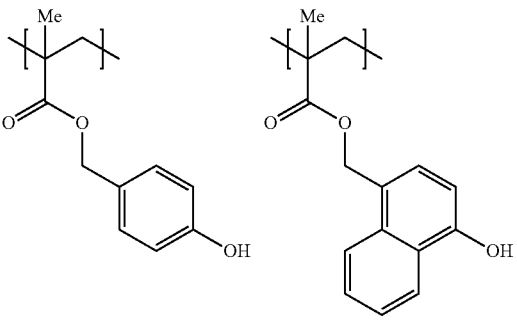
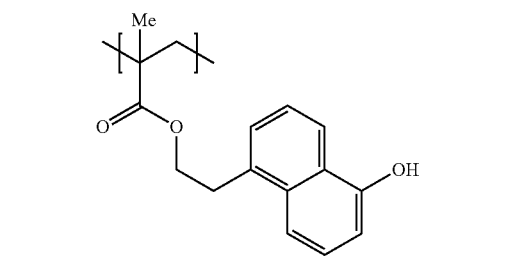

-continued

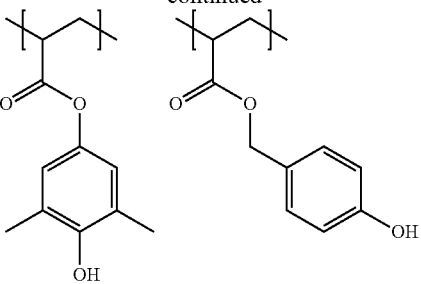

Examples of the repeating unit having a group in which a hydrogen atom of a phenolic hydroxyl group is substituted with the acid labile group represented by General Formula (1) include repeating units represented by the following General Formula (2) or (7), and among these, the repeating unit represented by General Formula (2) is more preferable.

[Chem. 18]

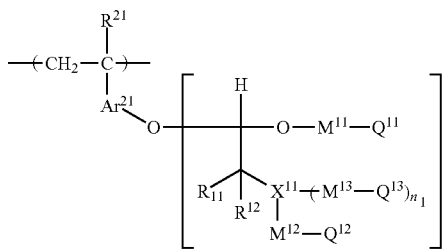

(2)

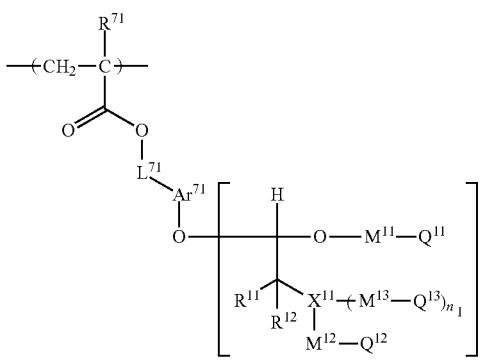

(7)

In General Formulae (2) and (7), each of $R^{21}$ and $R^{71}$ independently represents a hydrogen atom or a methyl group;

each of $Ar^{21}$ and $Ar^{71}$ independently represents an arylene group;

$L^{71}$ represents a single bond or an alkylene group;

each of $R^{11}$ and $R^{12}$ independently represents a hydrogen atom, an alkyl group, a cycloalkyl group, an aryl group, or an aralkyl group;

$n_1$ represents 0 or 1;

$X^{11}$ represents an oxygen atom or a sulfur atom when $n_1$ is 0, and represents a nitrogen atom when $n_1$ is 1;

$M^{11}$ represents a single bond, an alkylene group, a cycloalkylene group, —S—, —O—, —CO—, —CS—, —SO$_2$—, —N(R$_0$)—, or a combination of two or more kinds of the same, herein, R$_0$ represents a hydrogen atom or an alkyl group;

each of $M^{12}$ and $M^{13}$ independently represents a single bond or a divalent linking group;

$Q^{11}$ represents an alkyl group, an aralkyl group, a cycloalkyl group, or an aryl group when $M^{11}$ is a group other than a single bond, and represents an alkyl group, an aralkyl group, or a cycloalkyl group when $M^{11}$ is a single bond;

$Q^{12}$ represents an organic group;

$Q^{13}$ represents an organic group or a hydrogen atom; and at least two of $R^{11}$, $R^{12}$, $Q^{12}$, and $Q^{13}$ may form a ring by binding to each other.

$R^{21}$ is more preferably a hydrogen atom, and $R^{71}$ is more preferably a methyl group.

The arylene group represented by $Ar^{21}$ and $Ar^{71}$ may have a substituent, and specific examples thereof include the same groups as $Ar^{51}$ and $Ar^{61}$ in the General Formulae (5) and (6).

Specific examples of the alkylene group represented by $L^{71}$ include the same groups as $L^{51}$ and $L^{61}$ in the General Formula (6).

$R^{11}$, $R^{12}$, $X^{11}$, $M^{11}$, $M^{12}$, $M^{13}$, $Q^{11}$, $Q^{12}$, and $Q^{13}$ have the same definition as the respective groups in the General Formula (1) described above.

Specific examples of the repeating unit represented by General Formulae (2) and (7) include groups in which a hydrogen atom of the phenolic hydroxyl group in the specific examples of the repeating units represented by General Formulae (5) and (6) described above is substituted with the specific examples of the acid labile group represented by General Formula (1) described above.

the compound (P) of the present invention may further contain a non-degradable repeating unit represented by the following General Formula (3).

[Chem. 19]

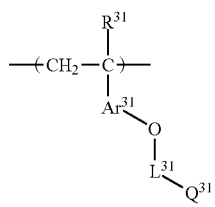

(3)

In General Formula (3), $R^{31}$ represents a hydrogen atom or a methyl group;

$Ar^{31}$ represents an arylene group;

$L^{31}$ represents a single bond or a divalent linking group; and $Q^{31}$ represents a cycloalkyl group or an aryl group.

Herein, "non-degradable" means that a chemical bond is not broken by the action of an acid generated by exposure, an alkaline developer, and the like.

As described above, $R^{31}$ represents a hydrogen atom or a methyl group, and more preferably represents a hydrogen atom. As described above, $Ar^{31}$ represents an arylene group, and specific examples and a preferable range thereof are the same as the specific examples and the preferable range of $Ar^{21}$ in the General Formula (2).

Examples of the divalent linking group represented by $L^{31}$ include an alkylene group, an alkenylene group, —O—, —CO—, —$NR^{32}$—, —S—, —CS—, and a combination of the same. Herein, $R^{32}$ represents a hydrogen atom, an alkyl group, a cycloalkyl group, an aryl group, or an aralkyl group.

The divalent linking group represented by $L^{31}$ preferably has 1 to 15 carbon atoms in total, and more preferably has 1 to 10 carbon atoms in total.

The above alkylene group preferably has 1 to 8 carbon atoms, and more preferably has 1 to 4 carbon atoms. Examples of the alkylene group include a methylene group, an ethylene group, a propylene group, a butylene group, a hexylene group, and an octylene group.

The above alkenylene group preferably has 2 to 8 carbon atoms, and more preferably has 2 to 4 carbon atoms.

Specific examples and preferable ranges of the alkyl group, the cycloalkyl group, the aryl group, and the aralkyl group represented by $R^{32}$ are the same as the specific examples and the preferable ranges of the alkyl group, the cycloalkyl group, the aryl group, and the aralkyl group represented by $R^{11}$ in the General Formula (1).

The group represented by $L^{31}$ is preferably a carbonyl group, a methylene group, *—CO—$NR^{32}$—, *—CO—$(CH_2)_n$—O—, *—CO—$(CH_2)_n$—O—CO—, *—$(CH_2)_n$—COO—, *—$(CH_2)_n$—$CONR^{32}$—, or *—CO—$(CH_2)_n$—$NR^{32}$—, particularly preferably a carbonyl group, a methylene group, *—CO—$NR^{32}$—, *—$CH_2$—COO—, *—CO—$CH_2$—O—, *—CO—$CH_2$—O—CO—, *—$CH_2$—$CONR^{32}$—, or *—CO—$CH_2$—$NR^{32}$—, and most preferably a carbonyl group, a methylene group, *—CO—$NR^{32}$—, or *—$CH_2$—COO—. Herein, the n represents an integer of from 1 to 10, and * represents a linking site of a main chain, that is, a site linked to an O atom in the formula.

As described above, $Q^{31}$ represents a cycloalkyl group or an aryl group, and specific examples and a preferable range thereof are the same as the specific examples and the preferable range of $Q^{11}$ in the General Formula (1).

Specific examples of a repeating unit represented by General Formula (3) will be described, but the present invention is not limited thereto.

[Chem. 20]

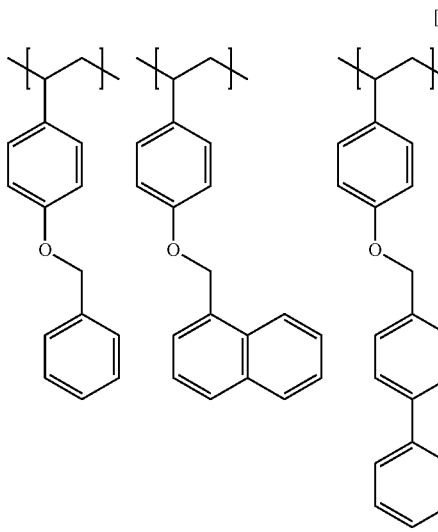

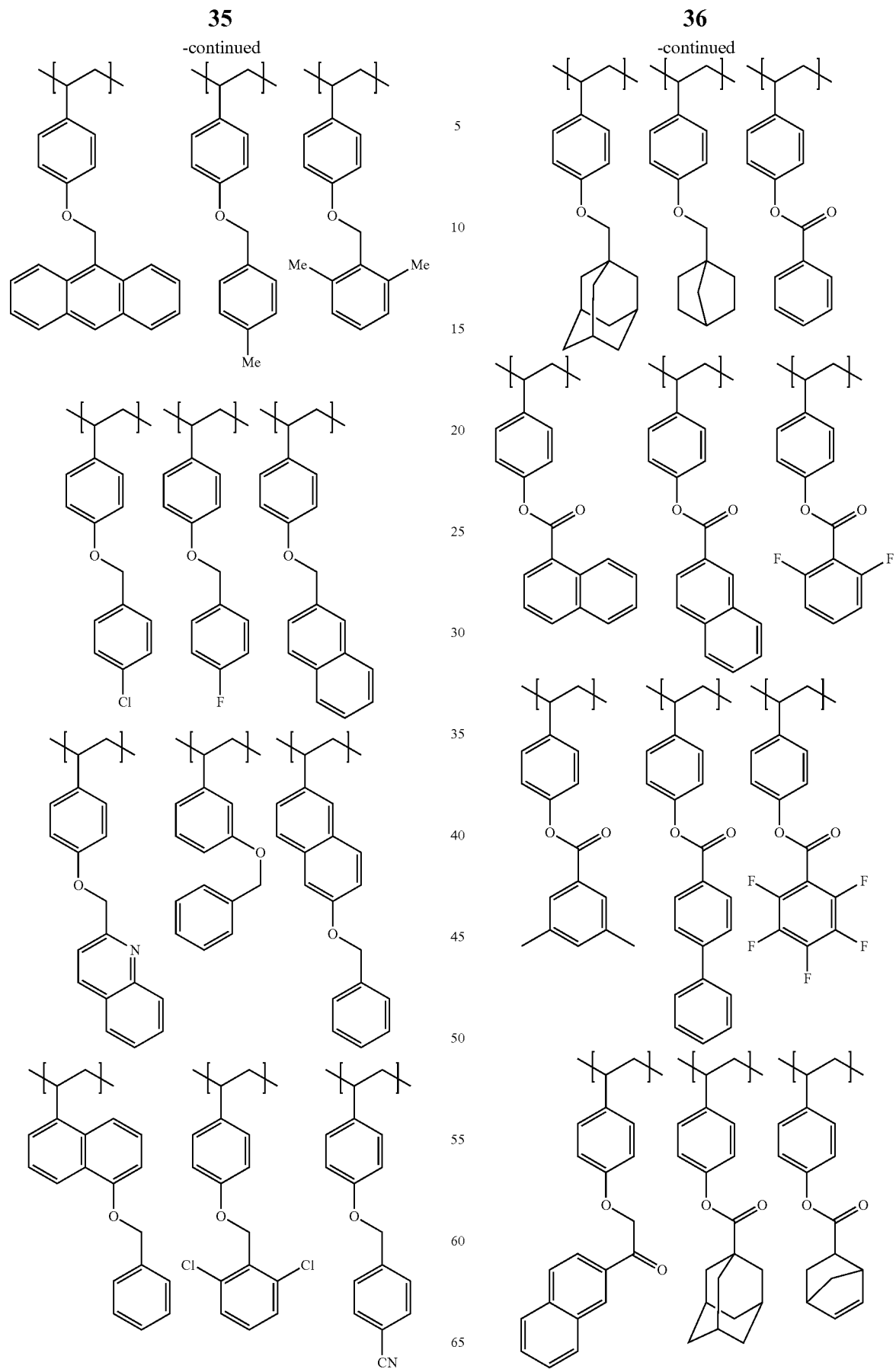

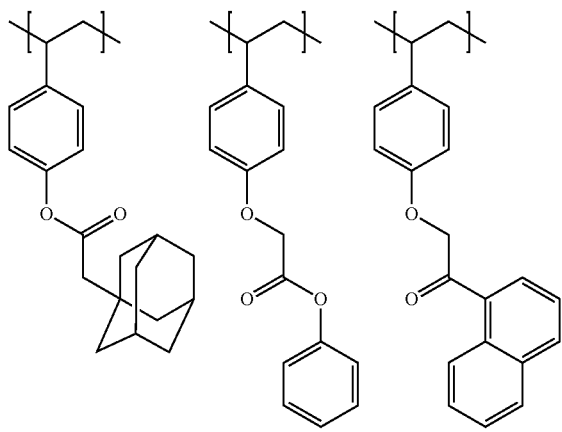

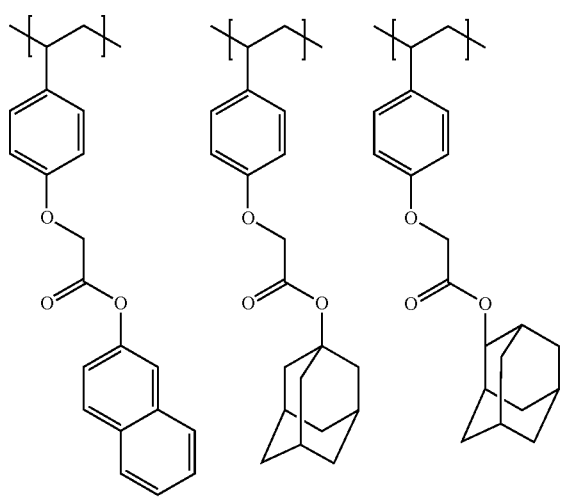

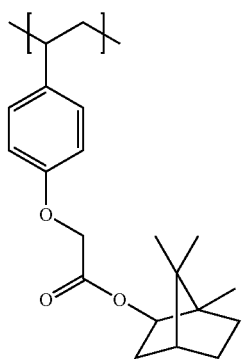

When a mother nucleus is a polymer compound, the content of the repeating units represented by General Formula (3) in the compound (P) of the present invention preferably ranges from 1 mol % to 30 mol %, more preferably ranges from 2 mol % to 20 mol %, and particularly preferably ranges from 2 mol % to 10 mol %, based on the total repeating units of the compound (P).

The compound (P) of the present invention may further contain a repeating unit represented by the following General Formula (4)

[Chem. 21]

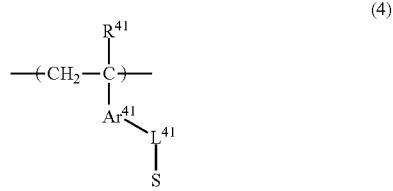

(4)

$R^{41}$ represents a hydrogen atom or a methyl group; $Ar^{41}$ represents an arylene group; $L^{41}$ represents a single bond or a divalent linking group; and S represents a structural moiety that generates an acid on a side chain by being degraded with actinic ray irradiation or radiation irradiation.

As described above, $R^{41}$ represents a hydrogen atom or a methyl group, and more preferably represents a hydrogen atom. As described above, $Ar^{41}$ represents an arylene group, and specific examples and a preferable range thereof are the same as the specific examples and the preferable range of $Ar^{21}$ in the General Formula (2).

$L^{41}$ represents a single bond or a divalent linking group. When $L^{41}$ is a divalent linking group, examples thereof include an alkylene group, a cycloalkylene group, an arylene group, —O—, —SO$_2$—, —CO—, —N(R)—, —S—, —CS—, and a combination of two or more kinds of the same, and these groups preferably have 20 or less carbon atoms in total. Herein, R represents an aryl group, an alkyl group, or a cycloalkyl group.

When the resin (P) contains the repeating unit represented by General Formula (4), for example, at least one of resolution, roughness characteristics, and EL (Exposure Latitude) is further improved.

Preferable examples of the alkylene group represented by $L^{41}$ include a methylene group, an ethylene group, a propylene group, a butylene group, a hexylene group, an octylene group, a dodecanylene group, and the like having 1 to 12 carbon atoms.

Preferable examples of the cycloalkylene group represented by $L^{41}$ include a cyclopentylene group, a cyclohexylene group, and the like having 5 to 8 carbon atoms.

Preferable examples of the arylene group represented by $L^{41}$ include a phenylene group, a naphthylene group, and the like having 6 to 14 carbon atoms.

This alkylene group, this cycloalkylene group, and this arylene group may further have a substituent. Examples of the substituent include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group.

S represents a structural moiety that generates an acid on a side chain by being degraded with actinic ray irradiation or radiation irradiation. S is preferably a structural moiety that generates an acid anion on a side chain of the resin by being degraded with actinic ray irradiation or radiation irradiation. More preferably, S is, for example, a structural moiety of a photoinitiator of cationic photopolymerization, a photoinitiator of radical photopolymerization, a photodecolorant of dyes, a photodiscoloring agent, or a known compound that is used for a micro resist or the like and generates an acid due to light. The structural moiety is even more preferably an ionic structural moiety.

S is more preferably an ionic structural moiety that contains a sulfonium salt or an iodonium salt. More specifically, S is preferably a group represented by the following General Formula (PZT) or (PZII).

[Chem. 22]

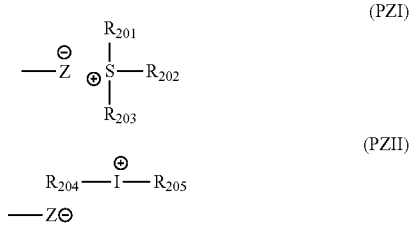

In the General Formula (PZI), each of $R_{201}$ to $R_{203}$ independently represents an organic group.

The organic group represented by $R_{201}$ to $R_{203}$ generally has 1 to 30 carbon atoms, and preferably has 1 to 20 carbon atoms.

Two of $R_{201}$ to $R_{203}$ may form a ring structure by binding to each other, and an oxygen atom, a sulfur atom, an ester bond, an amide bond, or a carbonyl group may be included in the ring. Examples of the group that two of $R_{201}$ to $R_{203}$ form by binding to each other include an alkylene group (for example, a butylene group or a pentylene group). It is preferable to use the repeating unit in which a ring structure is formed by two of $R_{201}$ to $R_{203}$ binding to each other, since it is expected that the exposing machine can be prevented from being contaminated with degradation products during exposure.

$Z^-$ represents an acid anion generated by the degradation caused by actinic ray irradiation or radiation irradiation, and is preferably a non-nucleophilic anion. Examples of the non-nucleophilic anion include a sulfonic acid anion, a carboxylic acid anion, a sulfonylimide anion, a bis(alkylsulfonyl)imide anion, a tris(alkylsulfonyl)methyl anion, and the like.

The non-nucleophilic anion is an anion with a very low ability for causing a nucleophilic reaction, which is an anion that can inhibit temporal degradation caused by an intramolecular nucleophilic reaction. Due to this property, the temporal stability of the resin is improved, and the temporal stability of the composition is also improved.

Examples of the organic group represented by $R_{201}$ to $R_{203}$ include an aryl group, an alkyl group, a cycloalkyl group, a cycloalkenyl group, an indolyl group, and the like. Herein, in the cycloalkyl group and the cycloalkenyl group, at least one of carbon atoms forming a ring may be a carbonyl carbon.

Preferably, at least one of $R_{201}$ to $R_{203}$ is an aryl group, and more preferably, all of three are aryl groups.

The aryl group in $R_{201}$, $R_{202}$, and $R_{203}$ is preferably a phenyl group or a naphthyl group, and more preferably a phenyl group.

Preferable examples of the alkyl group, the cycloalkyl group, and the cycloalkenyl group in $R_{201}$, $R_{202}$, and $R_{203}$ include a linear or branched alkyl group (for example, a methyl group, an ethyl group, a propyl group, a butyl group, or a pentyl group) having 1 to 10 carbon atoms, a cycloalkyl group (for example, a cyclopentyl group, a cyclohexyl group, or a norbornyl group) having 3 to 10 carbon atoms, and a cycloalkenyl group (for example, a pentadienyl group or a cyclohexenyl group) having 3 to 10 carbon atoms.

The organic groups represented by $R_{201}$, $R_{202}$, and $R_{203}$, such as an aryl group, an alkyl group, a cycloalkyl group, a cycloalkenyl group, and an indolyl group may further have a substituent. Examples of the substituent include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxyalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), a cycloalkenylalkyl group (preferably having 4 to 20 carbon atoms), and the like, but the present invention is not limited thereto.

In the cycloalkyl group and the cycloalkenyl group as the substituent that the respective groups of $R_{201}$, $R_{202}$, and $R_{203}$ may have, at least one of carbon atoms forming a ring may be a carbonyl carbon.

The substituent that the respective groups of $R_{201}$, $R_{202}$, and $R_{203}$ may have may further have a substituent. Examples of substituents that the substituent further have include the same ones as the above-described examples of the substituent that the respective groups of $R_{201}$, $R_{202}$, and $R_{203}$ may have, and among the examples, an alkyl group and a cycloalkyl group are preferable.

When at least one of $R_{201}$ to $R_{203}$ is not an aryl group, examples of preferable structures include cationic structures of compounds exemplified as Formulae (I-1) to (I-70) in Paragraphs [0046] and [0047] of JP2004-233661A, Paragraphs [0040] to [0046] of JP2003-35948A, and US2003/0224288A, compounds exemplified as Formulae (IA-1) to (IA-54) and Formulae (IB-1) to (IB-24) in US2003/0077540A, and the like.

In the General Formula (PZII), each of $R_{204}$ and $R_{205}$ independently represents an aryl group, an alkyl group, or a cycloalkyl group. This aryl group, this alkyl group, and this cycloalkyl group are the same as the aryl group, the alkyl group, and the cycloalkyl group of $R_{201}$ to $R_{203}$ in the compound (PZI).

The aryl group represented by $R_{204}$ and $R_{205}$ may be an aryl group having a heterocyclic structure that contains an oxygen atom, a nitrogen atom, a sulfur atom, or the like. Examples of the aryl group having a heterocyclic structure include a pyrrole residue (a group formed when pyrrole loses one hydrogen atom), a furan residue (a group formed when furan loses one hydrogen atom), a thiophene residue (a group formed when thiophene loses one hydrogen atom), an indole residue (a group formed when indole loses one hydrogen atom), a benzofuran residue (a group formed when benzofuran loses one hydrogen atom), a benzothiophene residue (a group formed when benzothiophene loses one hydrogen atom), and the like.

The aryl group, the alkyl group, and the cycloalkyl group represented by $R_{204}$ and $R_{205}$ may have a substituent. Examples of the substituent include the substituents that the aryl group, the alkyl group, and the cycloalkyl group represented by $R_{201}$ to $R_{203}$ in the compound (PZI) may have.

$Z^-$ represents an acid anion that is generated by degradation caused by actinic ray irradiation or radiation irradiation. $Z^-$ is preferably a non-nucleophilic anion, and examples thereof include the same ones as described for $Z^-$ in General Formula (PZI).

Specific preferable examples of S will be described below, but the present invention is not particularly limited thereto. In addition, the symbol * represents a direct link to $L^{41}$.

[Chem. 23]

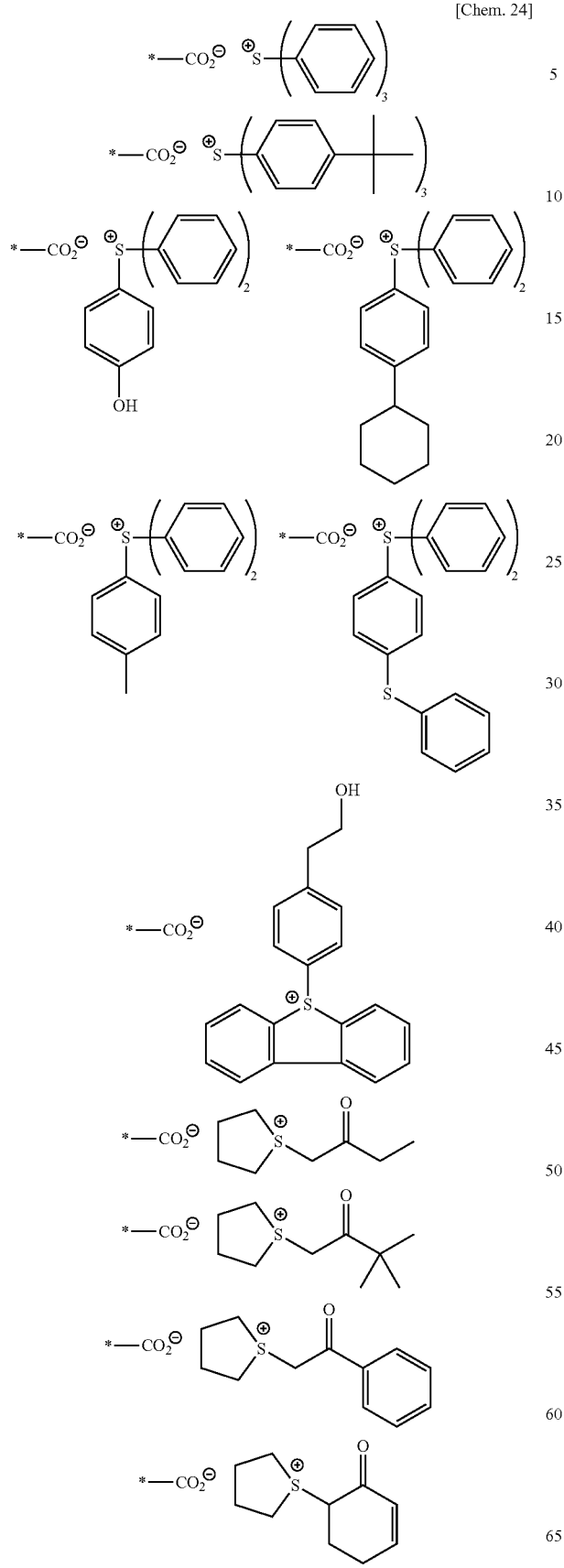
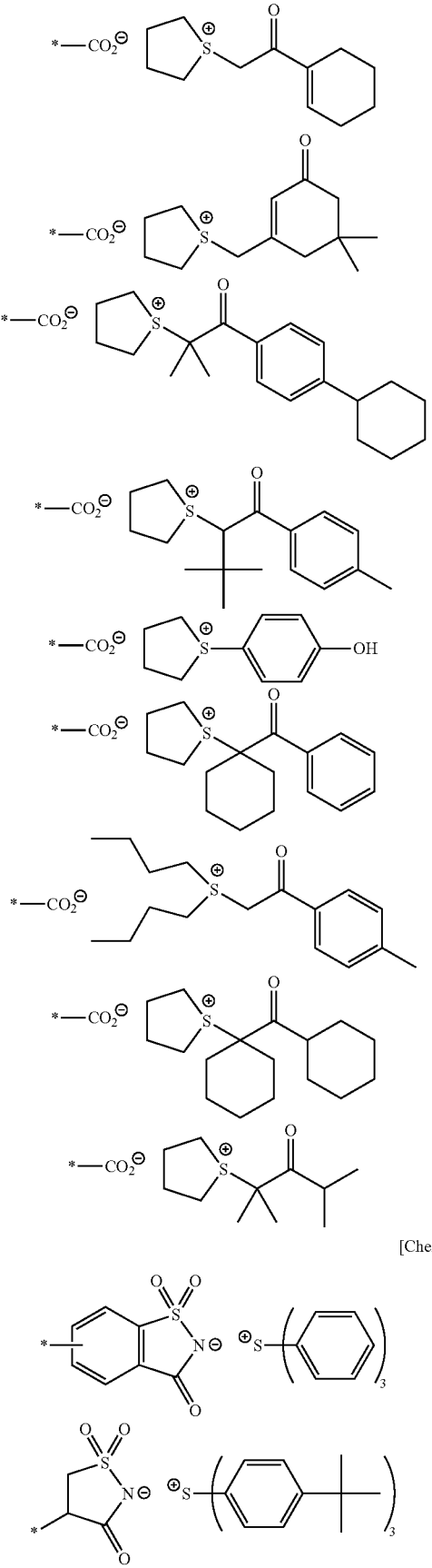

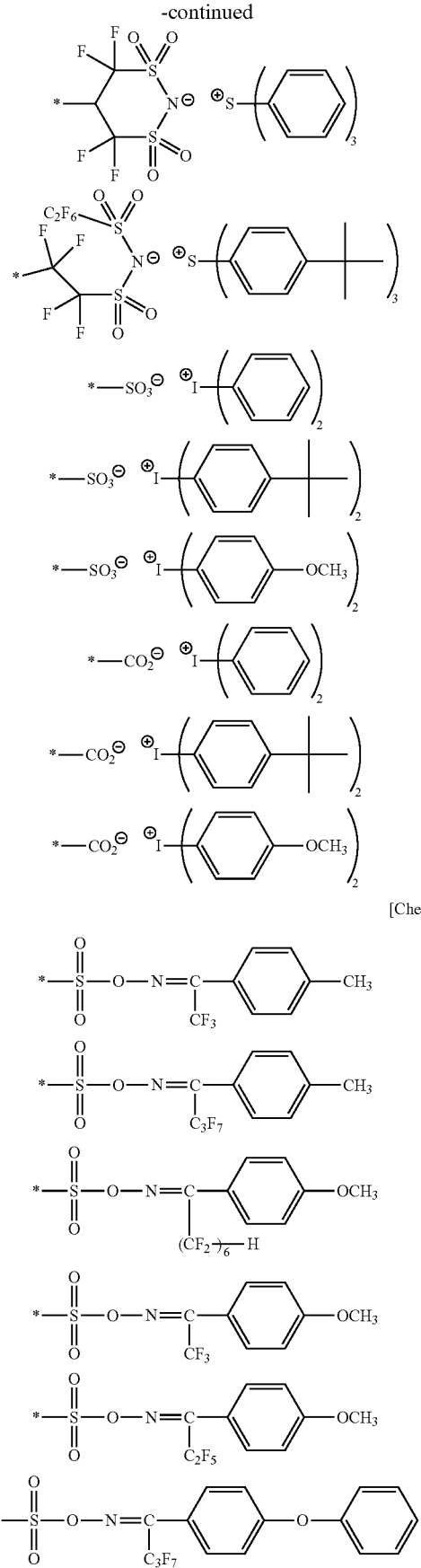
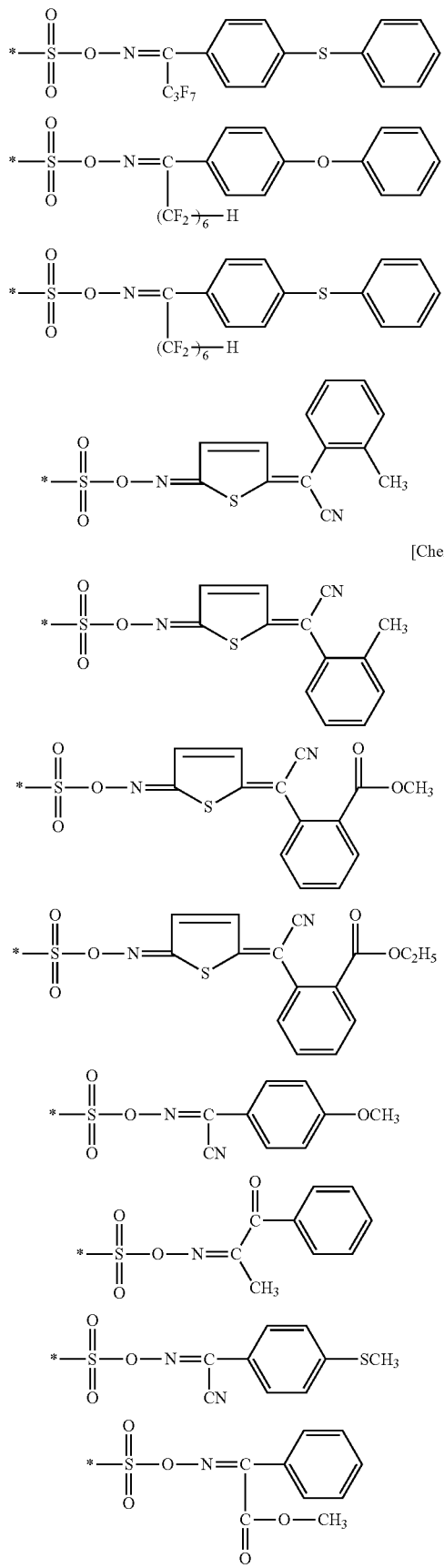

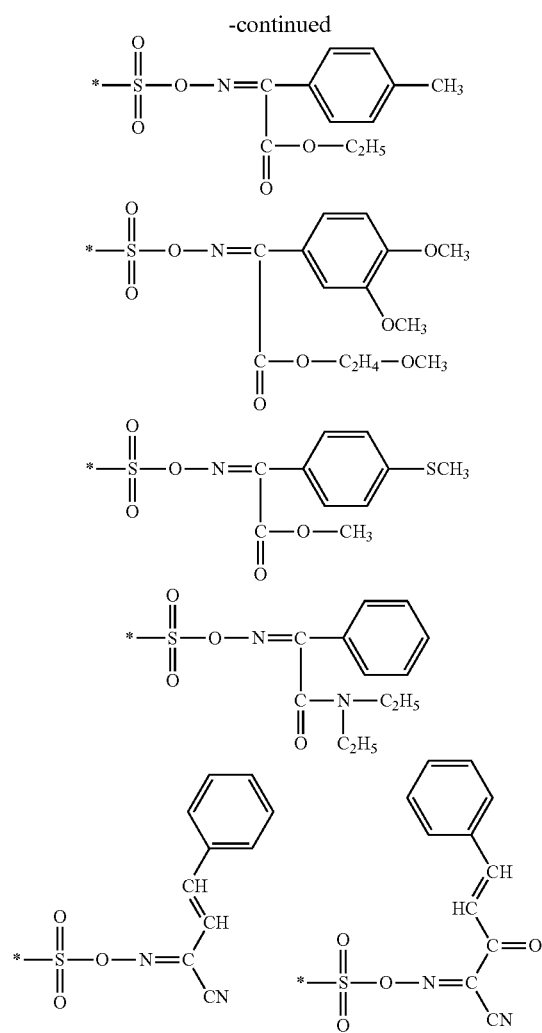

The moiety corresponding to (-L$^{41}$-S) of the repeating unit represented by General Formula (4) is more preferably represented by the following General Formula (6).

[Chem. 28]

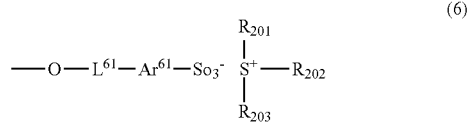

In the formula, L$^{61}$ represents a divalent organic group, and Ar$^{61}$ represents an arylene group.

Examples of the divalent organic group represented by L$^{61}$ include an alkylene group, a cycloalkylene group, —O—, —SO$_2$—, —CO—, —N(R)—, —S—, —CS—, and a combination of the same. Herein, R has the same definition as R in L$^{41}$ of Formula (4). The divalent organic group represented by L$^{61}$ preferably has 1 to 15 carbon atoms in total, and more preferably has 1 to 10 carbon atoms in total.

The alkylene group and the cycloalkylene group represented by L$^{61}$ are the same as the alkylene group and the cycloalkylene group represented by L$^{41}$ of Formula (4), and the preferable examples are also the same.

L$^{61}$ is preferably a carbonyl group, a methylene group, *—CO—(CH$_2$)$_n$—O—, *—CO—(CH$_2$)$_n$—O—CO—, *—(CH$_2$)$_n$—COO—, *—(CH$_2$)$_n$—CONR—, or *—CO—(CH$_2$)$_n$—NR—, and particularly preferably a carbonyl group, *—CH$_2$—COO—, *—CO—CH$_2$—O—, *—CO—CH$_2$—O—CO—, *—CH$_2$—CONR—, or *—CO—CH$_2$—NR—. Herein, the n represents an integer of from 1 to 10. n is preferably an integer of from 1 to 6, more preferably an integer of from 1 to 3, and most preferably 1. * represents a linking site of a main chain, that is, a site linked to an O atom in the formula.

Ar$^{61}$ represents an arylene group and may have a substituent. Examples of the substituent that Ar$^{61}$ may have include an alkyl group (preferably having 1 to 8 carbon atoms, and more preferably having 1 to 4 carbon atoms), an alkoxy group (preferably having 1 to 8 carbon atoms, and more preferably having 1 to 4 carbon atoms), and a halogen atom (preferably a fluorine atom, a chlorine atom, a bromine atom, an iodine atom, and more preferably a fluorine atom). An aromatic ring of Ar$^{61}$ may be an aromatic hydrocarbon ring (for example, a benzene ring or a naphthalene ring) or an aromatic heterocycle (for example, a quinoline ring). The aromatic ring preferably has 6 to 18 carbon atoms, and more preferably has 6 to 12 carbon atoms.

Ar$^{61}$ is preferably an unsubstituted arylene group or an arylene group substituted with an alkyl group or a fluorine atom, and more preferably a phenylene group or a naphthylene group.

A method of synthesizing a monomer corresponding to the repeating unit represented by General Formula (4) is not particularly limited. In a case of an onium structure, examples of the method include a method that synthesizes the monomer by exchanging an acid anion having a polymerizable unsaturated bond corresponding to the repeating unit and a halide of a known onium salt.

More specifically, a metal ion salt (for example, a sodium ion, a potassium ion, or the like) or an ammonium salt (ammonium, triethylammonium salt, or the like) of an acid having a polymerizable unsaturated bond corresponding to the repeating unit and an onium salt having a halogen ion (a halide ion, a bromide ion, an iodide ion, or the like) are stirred in the presence of water or methanol to cause an anion exchange reaction, followed by liquid separation and washing by using an organic solvent such as dichloromethane, chloroform, ethyl acetate, methyl isobutyl ketone, or tetrahydrofuran and water, whereby a target monomer corresponding to the repeating unit represented by General Formula (4) can be synthesized.

In addition, the acid anion and the onium salt are stirred in the presence of an organic solvent that can be separated from water, such as dichloromethane, chloroform, ethyl acetate, methyl isobutyl ketone, or tetrahydrofuran, and water to cause an anion exchange reaction, followed by liquid separation and washing by using water, whereby the monomer can be synthesized.

The repeating unit represented by General Formula (4) can also be synthesized by introducing an acid anion moiety to a side chain through a polymer reaction and introducing an onium salt through salt exchange.

Specific examples of the repeating unit represented by General Formula (4) will be shown below, but the present invention is not limited thereto.

[Chem. 29]
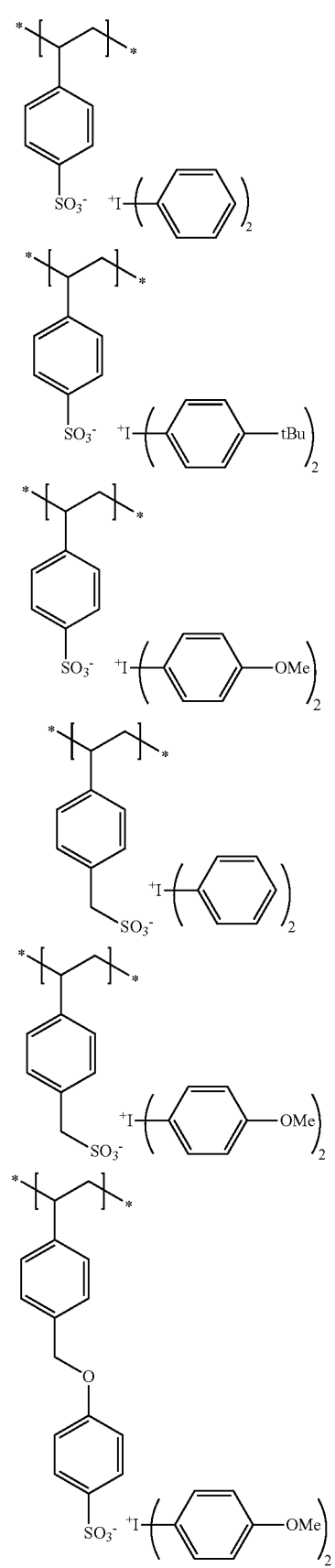
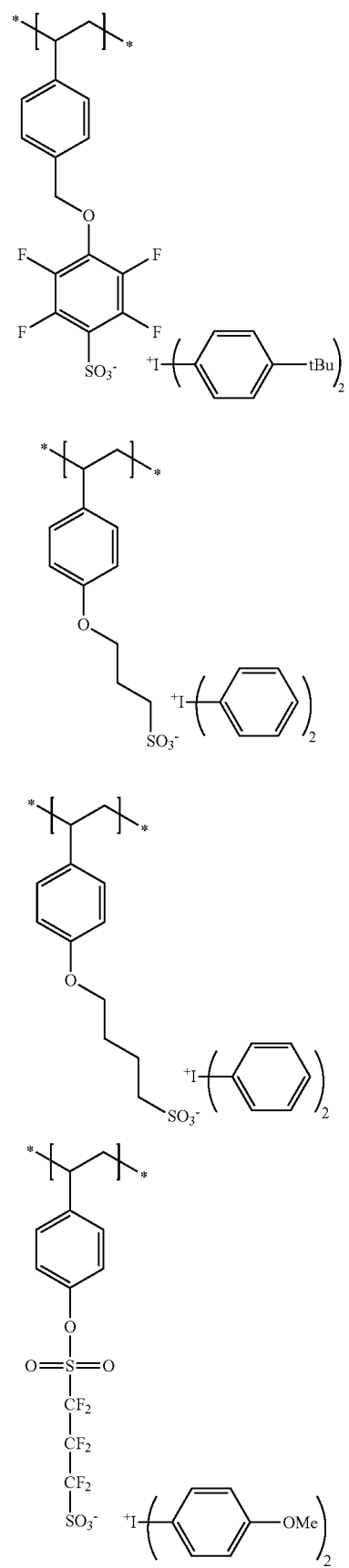

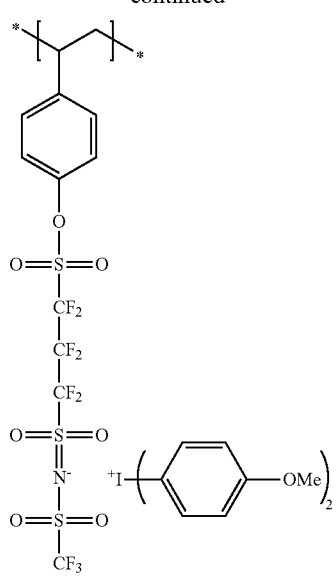
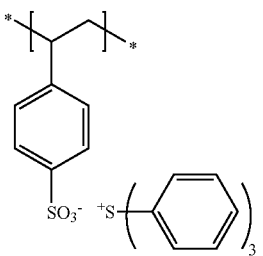
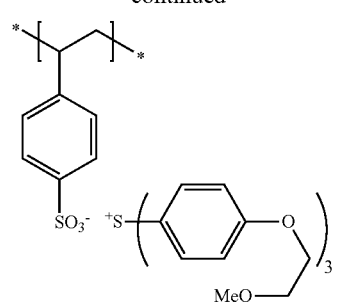
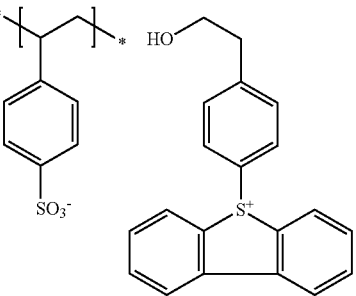
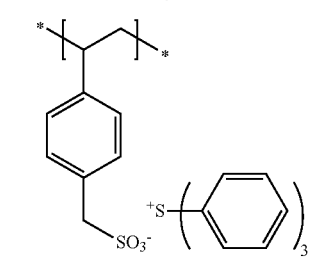
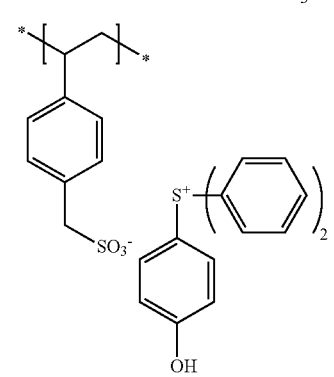
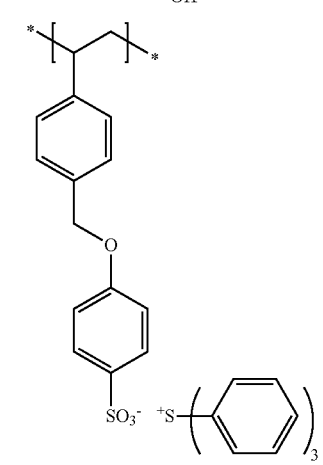
[Chem. 30]

53
-continued
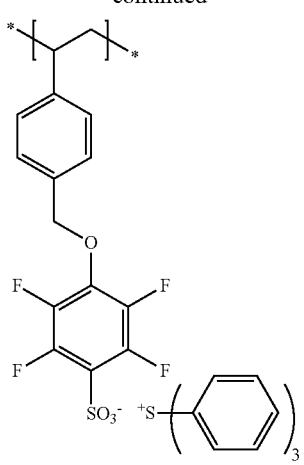
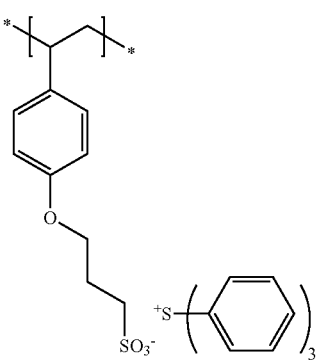
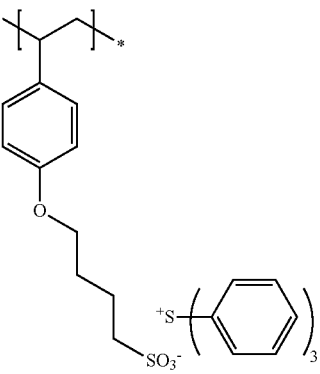
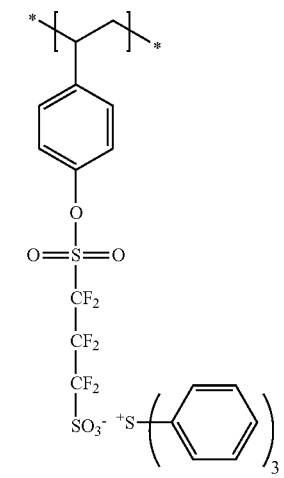
54
-continued
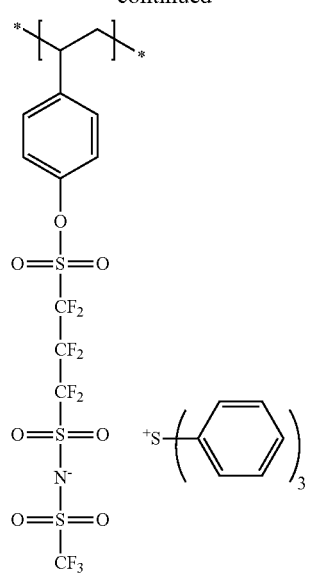
[Chem. 31]
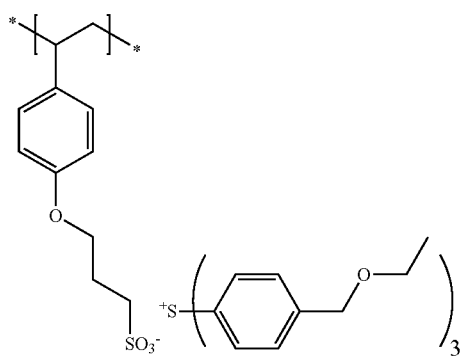
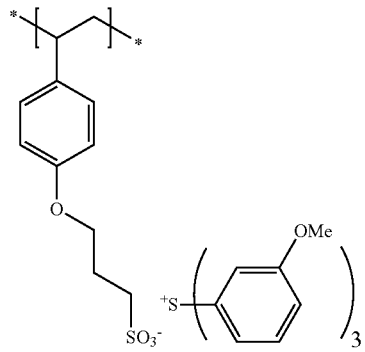

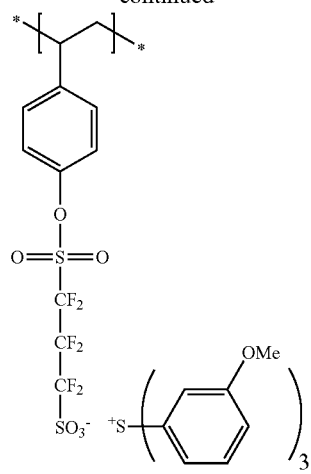
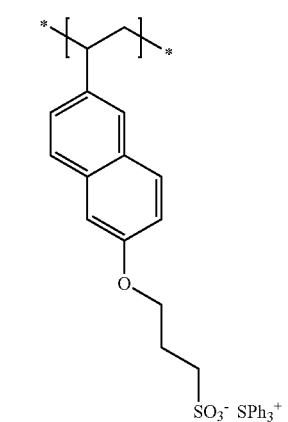
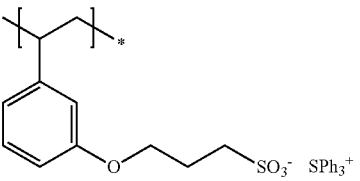
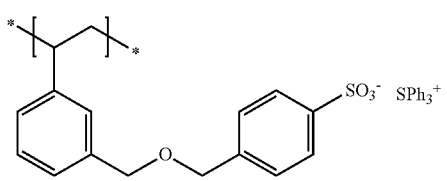
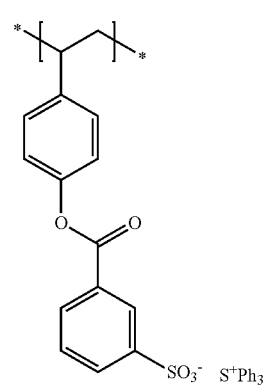
[Chem. 32]
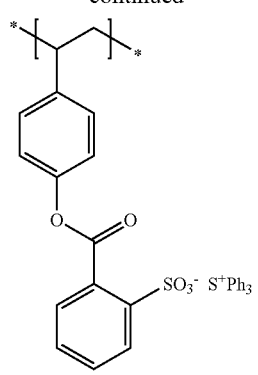
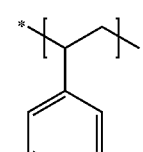
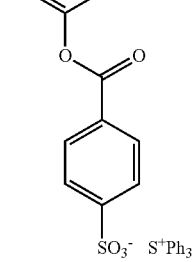
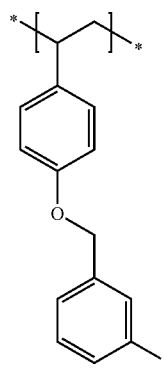
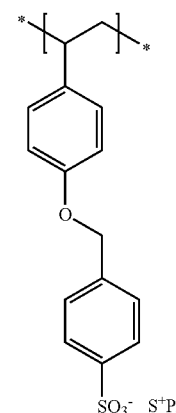

57
-continued
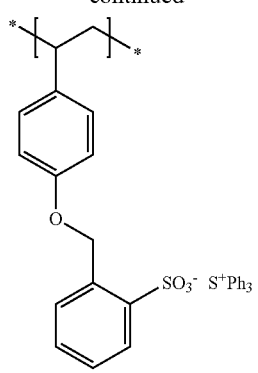
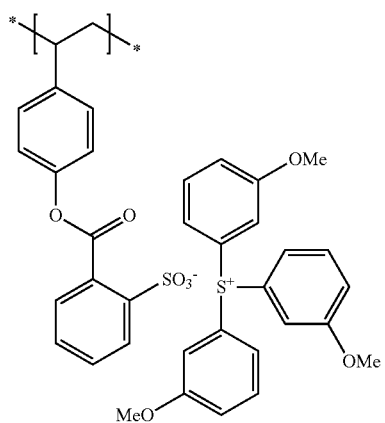
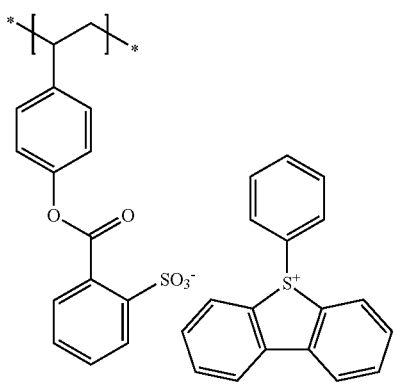
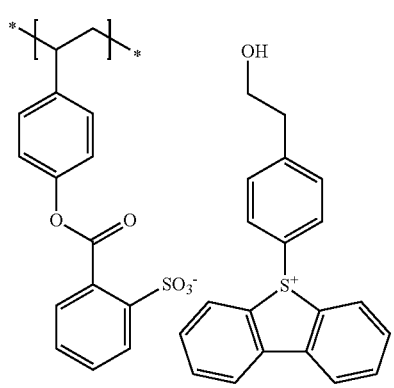
58
-continued
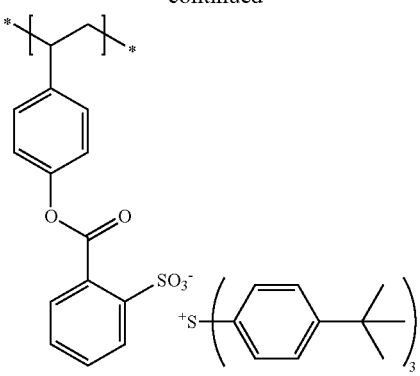
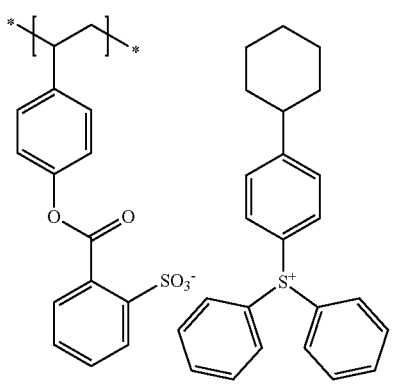
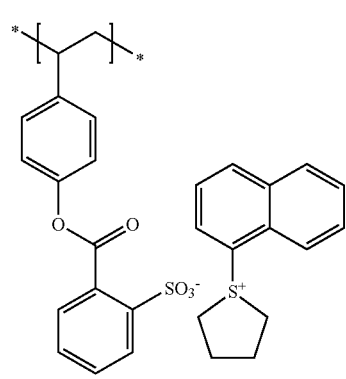
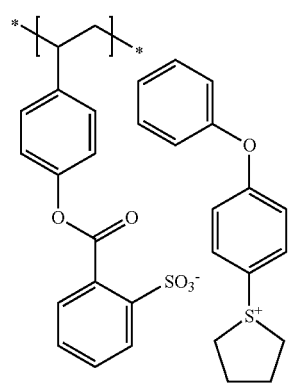

59
-continued
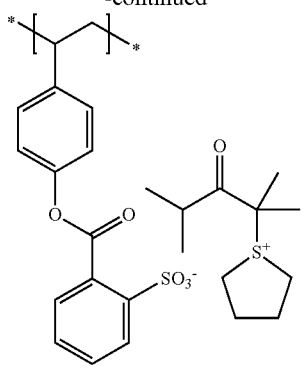
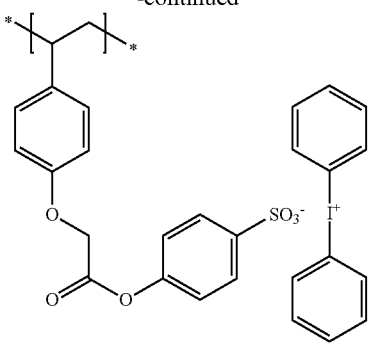
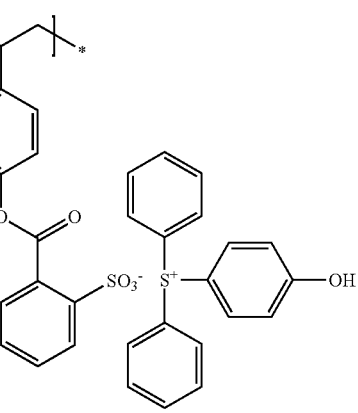
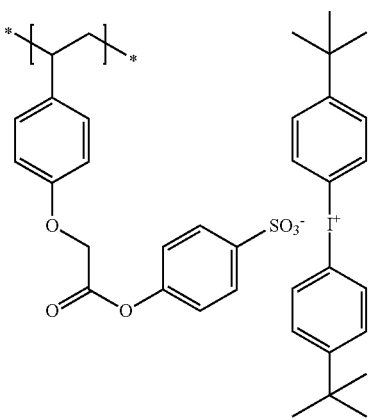
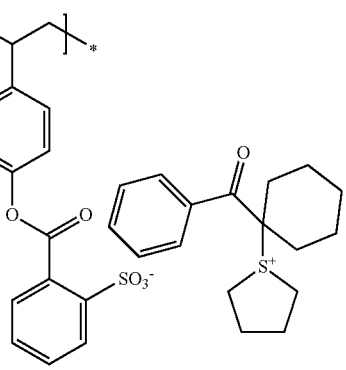
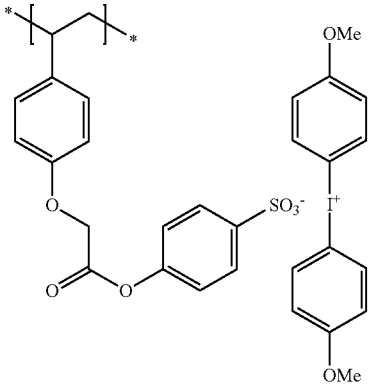
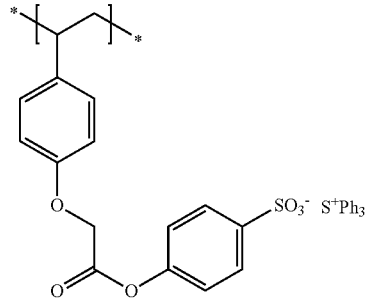
60
-continued
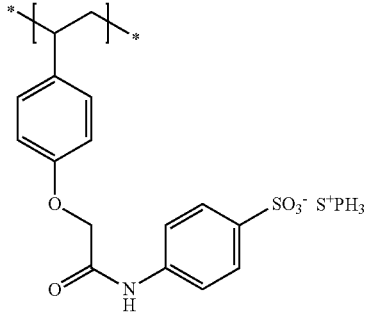

61
-continued
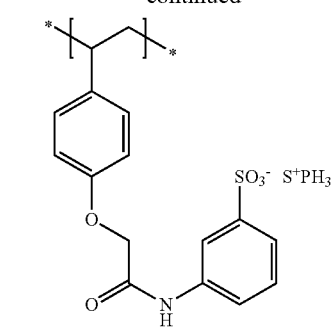
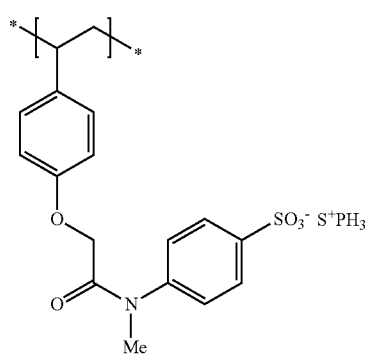
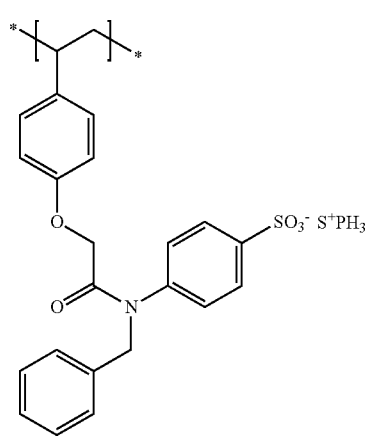
[Chem. 33]
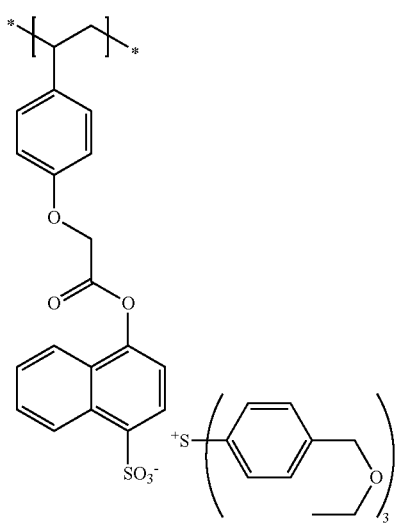
62
-continued
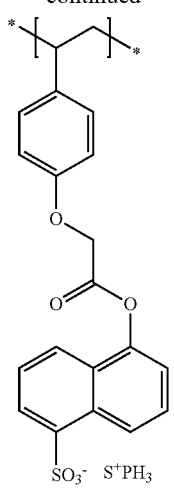
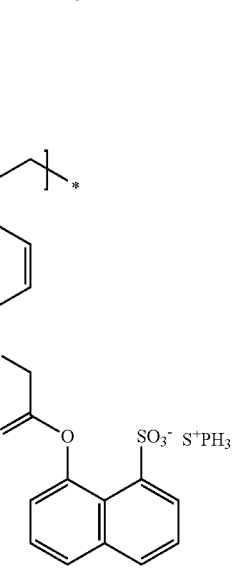
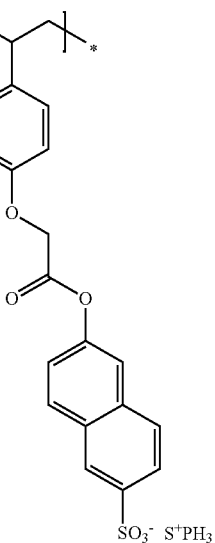

63
-continued
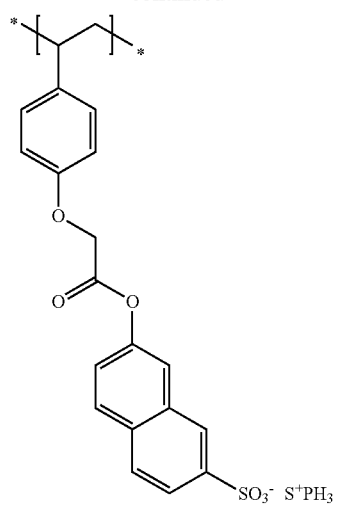
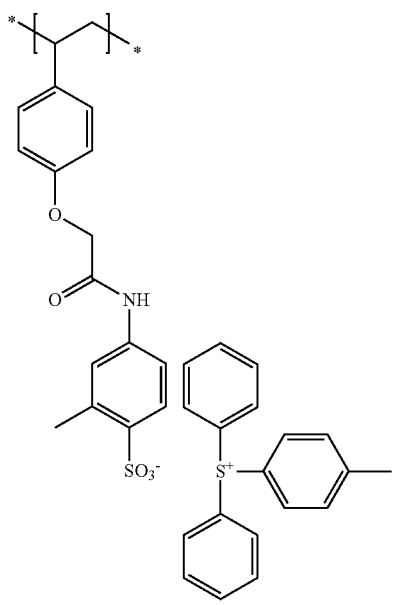
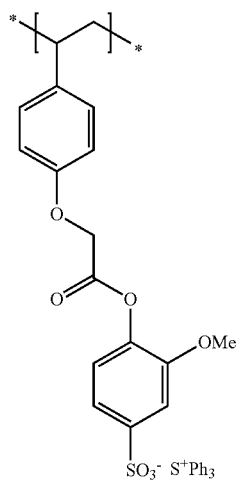
64
-continued
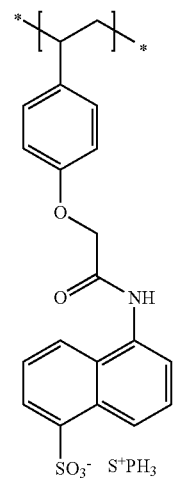
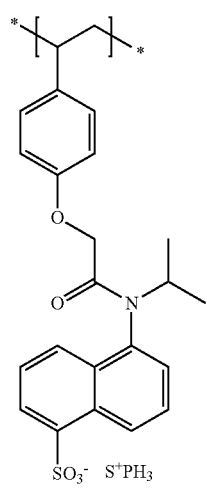
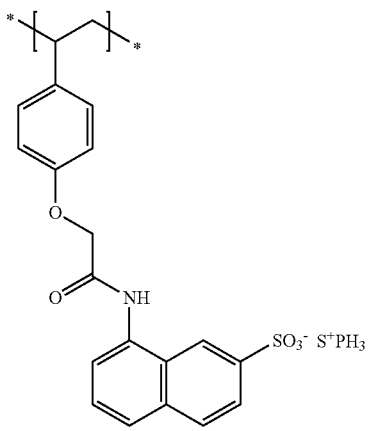

65
-continued
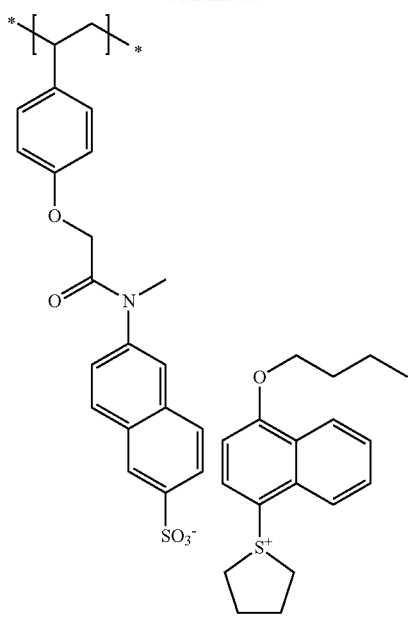
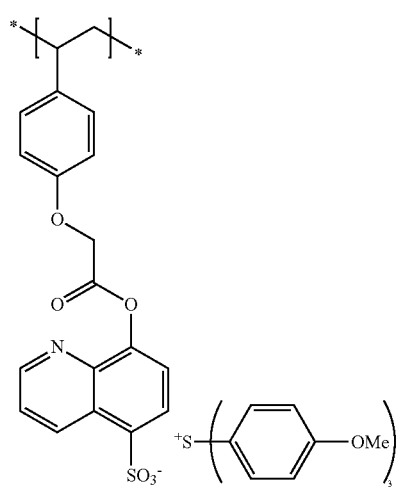
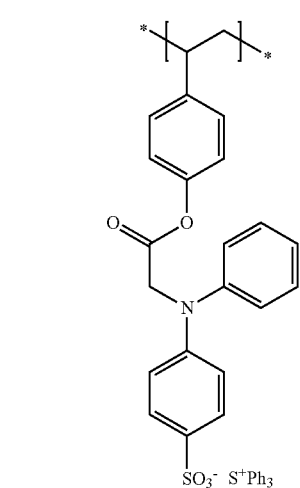
66
-continued
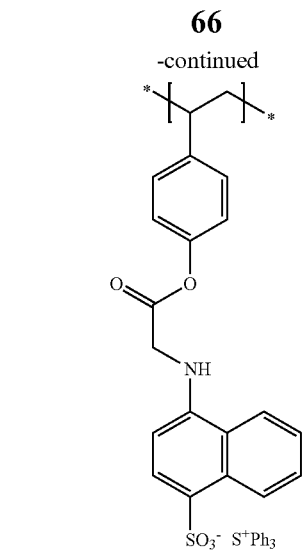
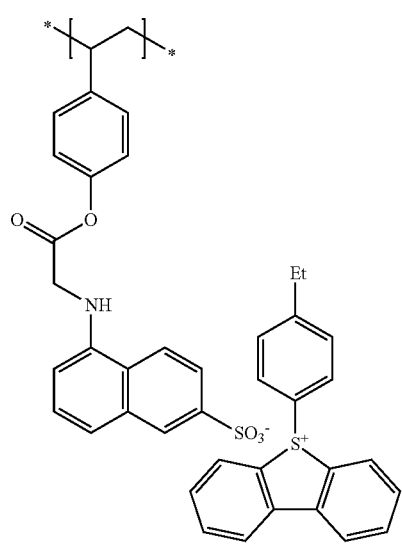
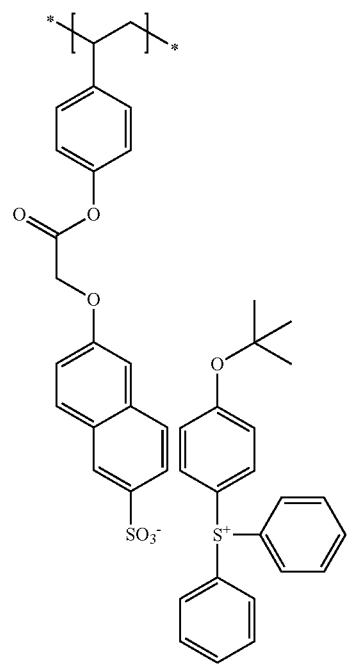

67
-continued
68
-continued
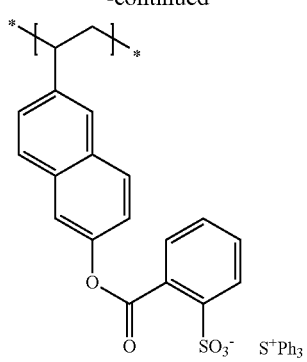
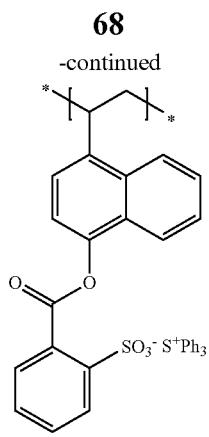
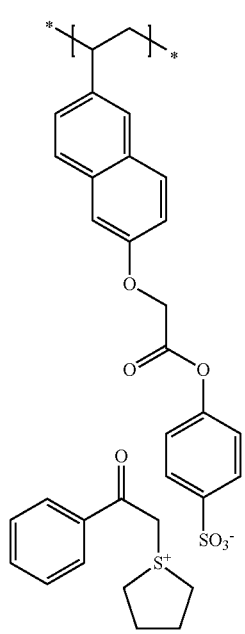
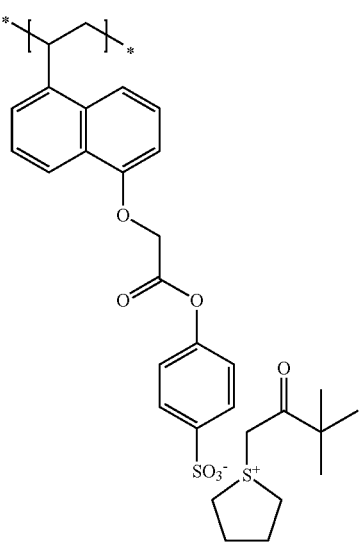
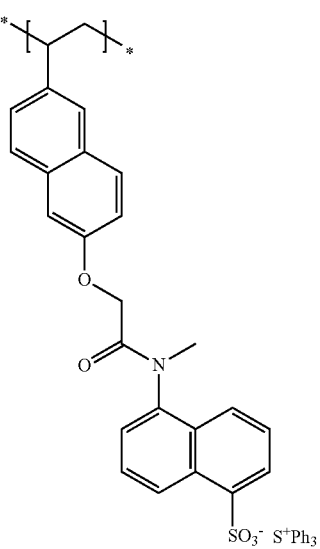
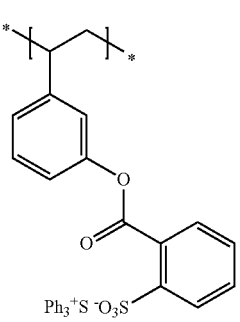
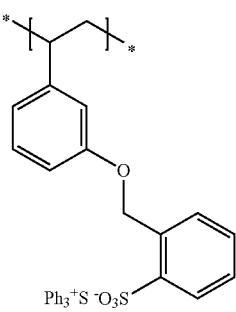

69
-continued
70
-continued
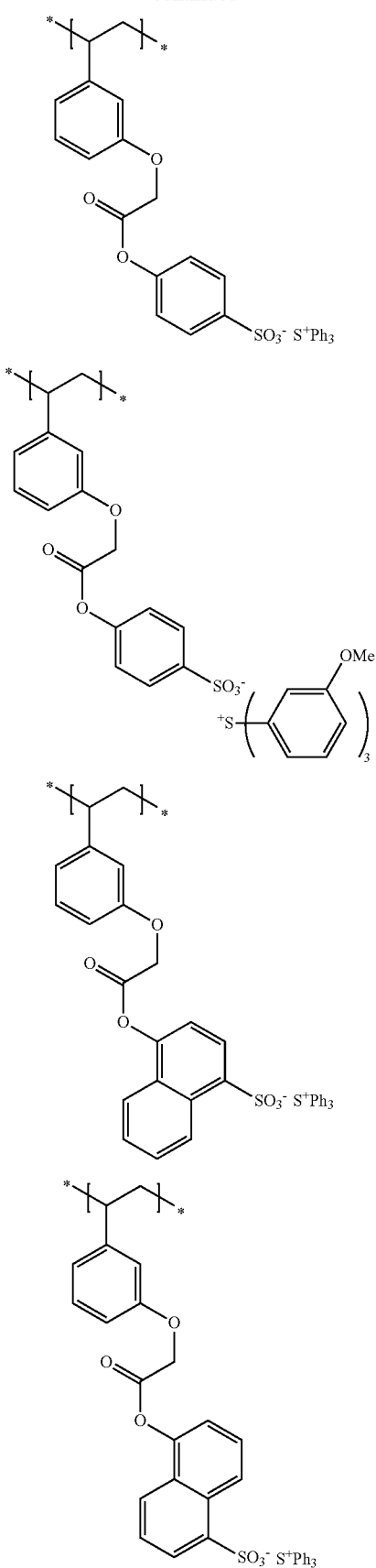
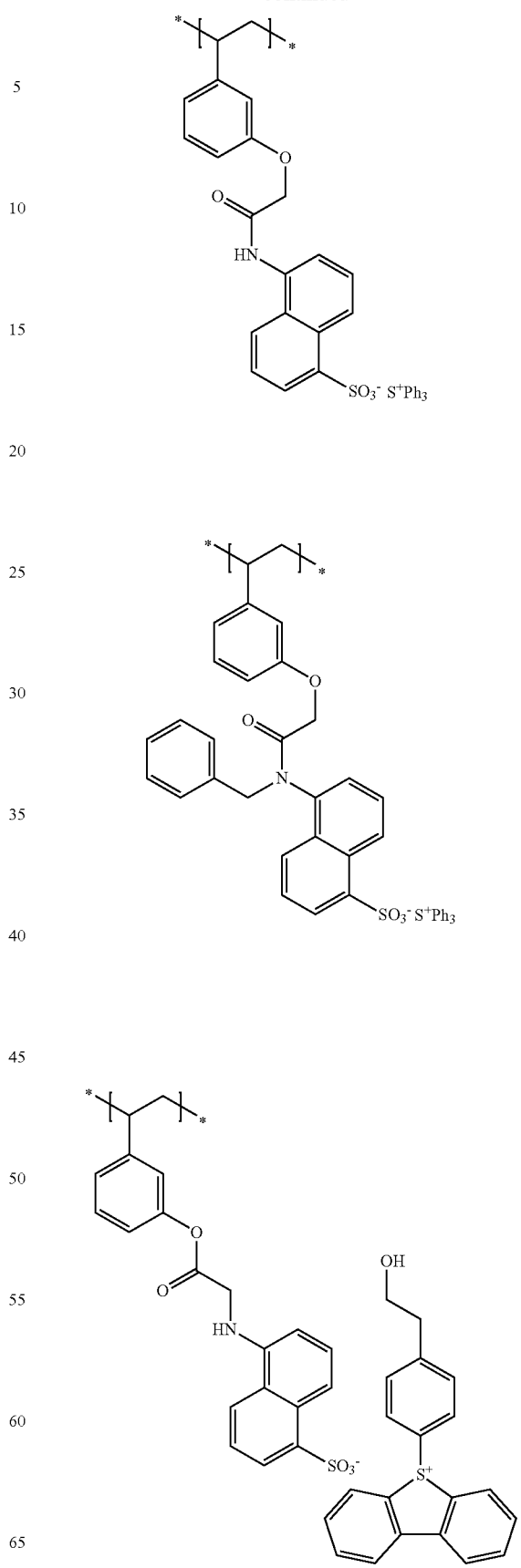

71
-continued
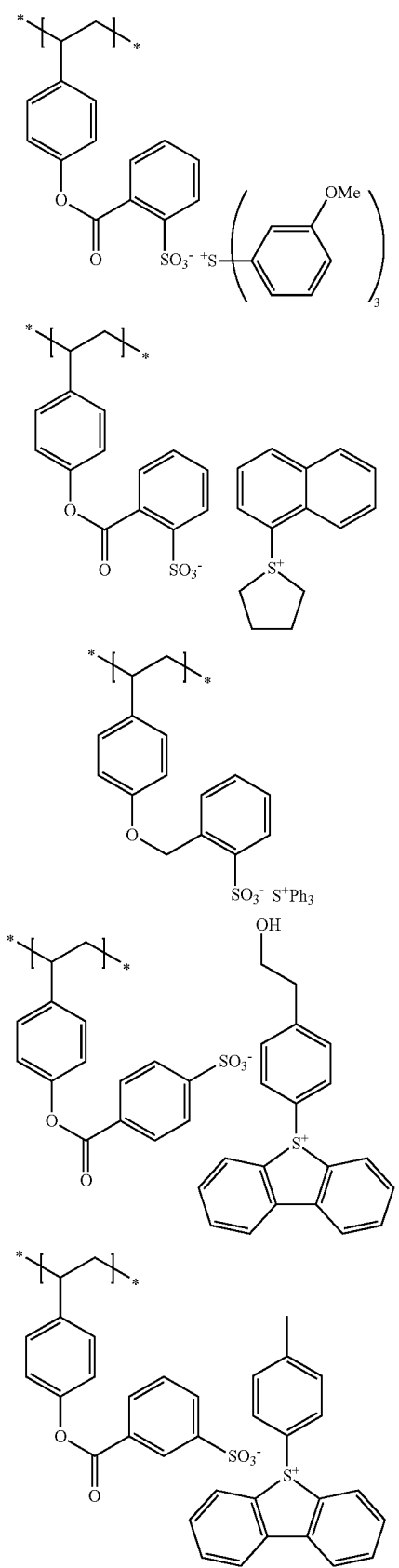
72
-continued
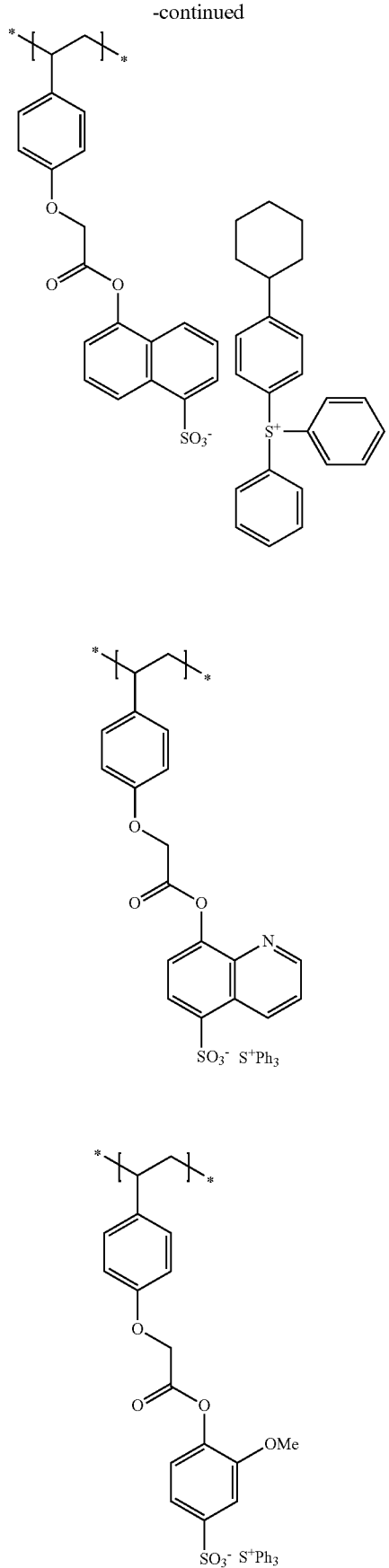

73
-continued
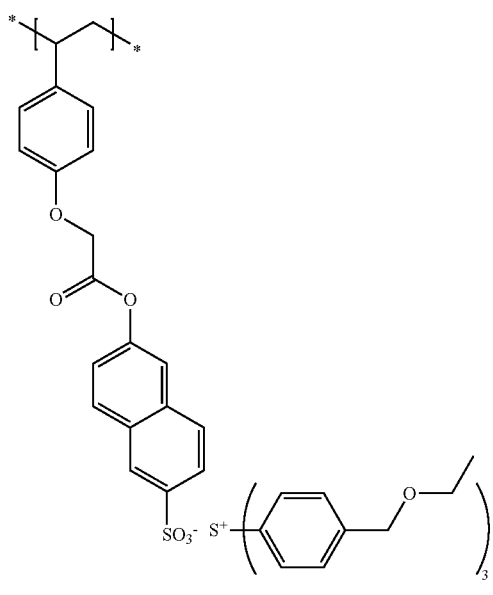
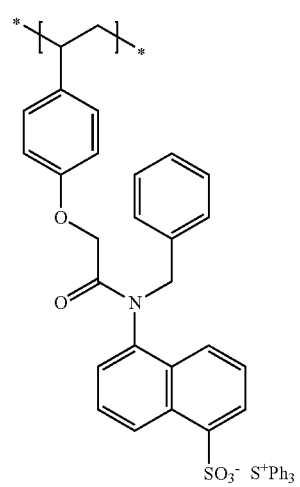
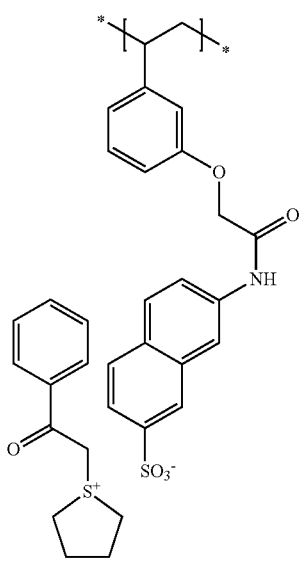
74
-continued
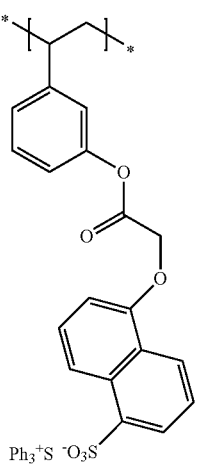
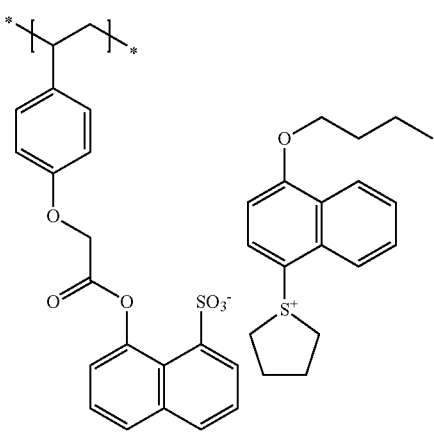
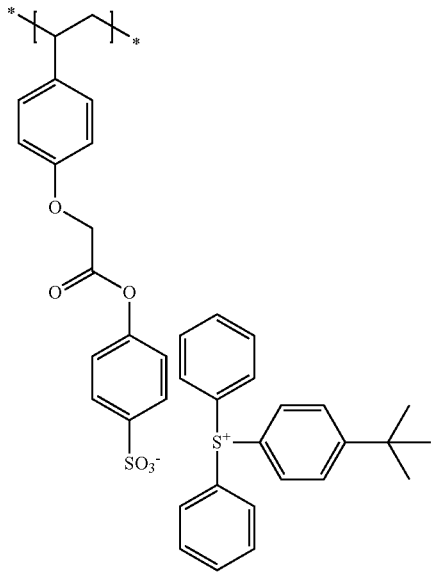

75
-continued
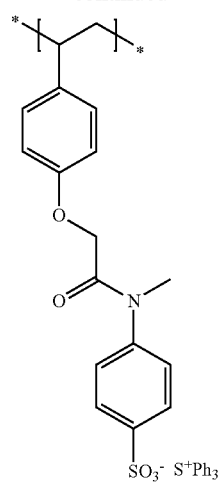
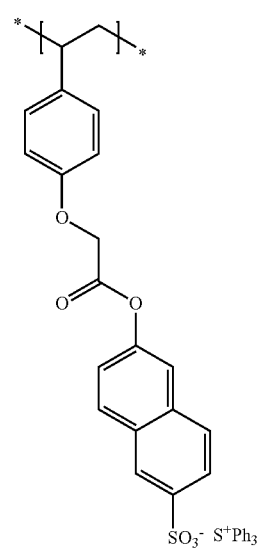
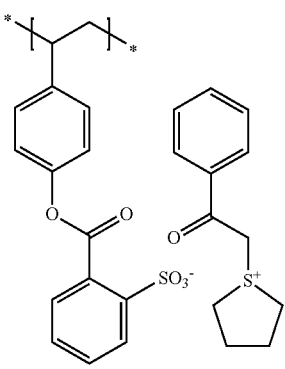
76
-continued
[Chem. 35]
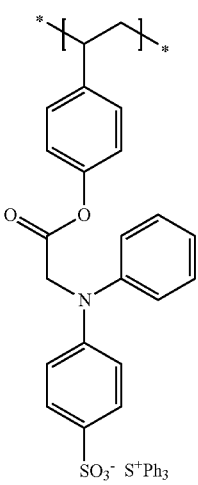
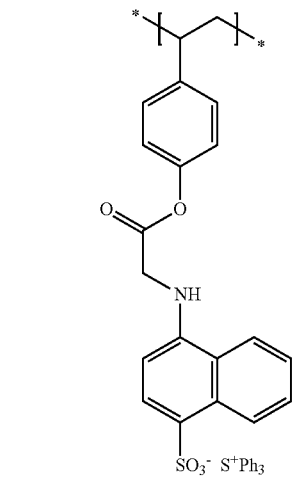
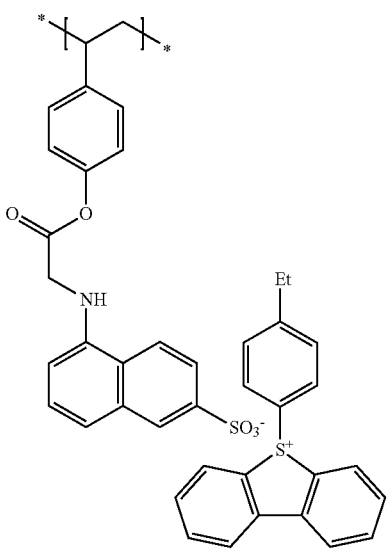

77
-continued
78
-continued
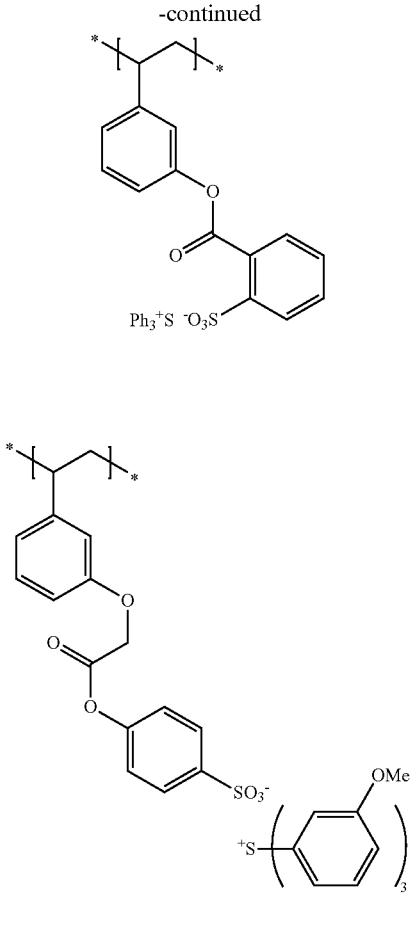
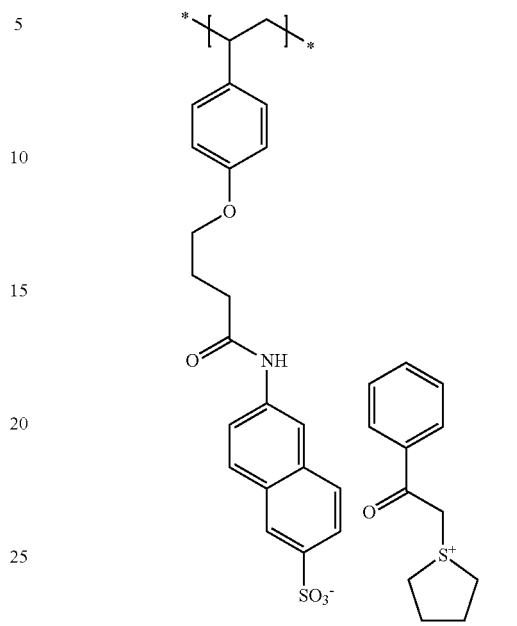
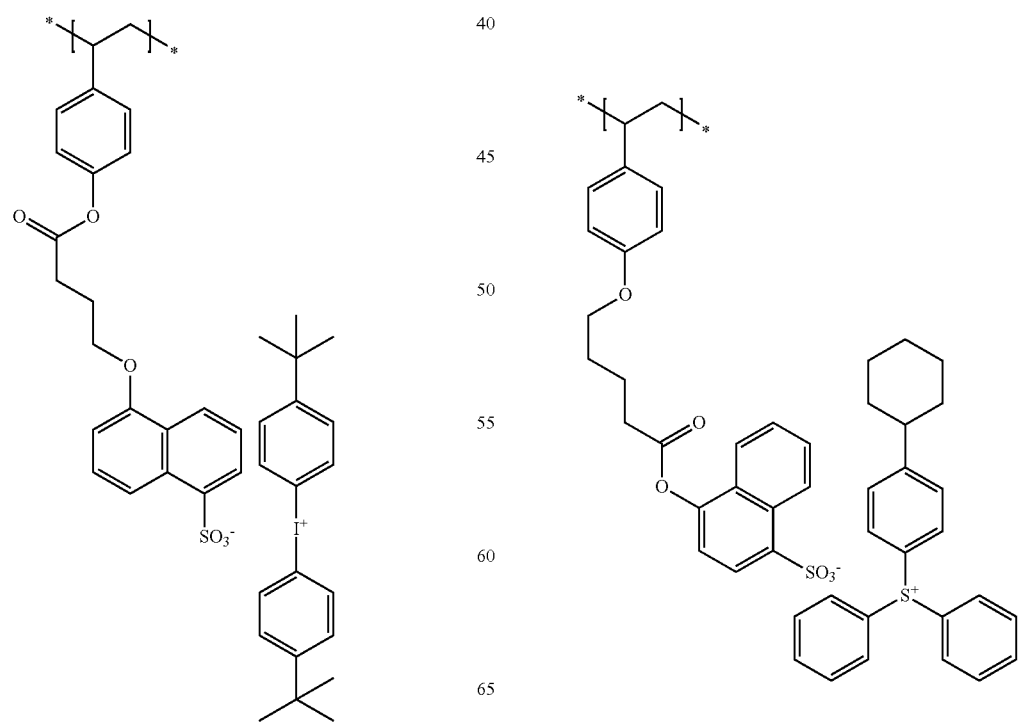

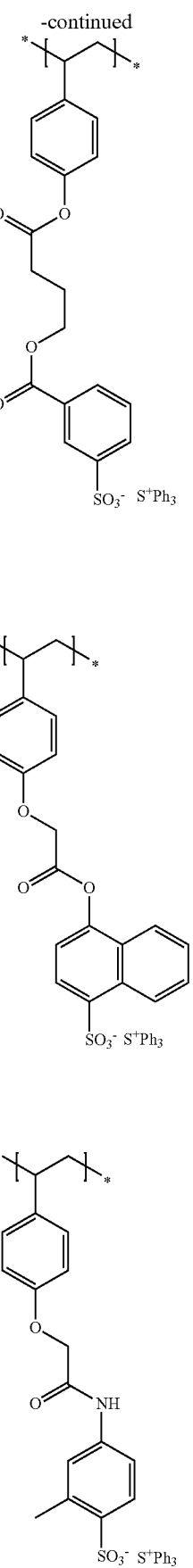
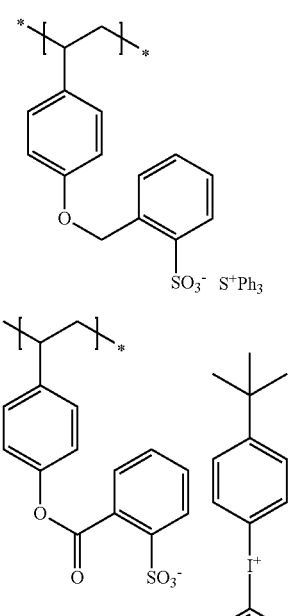

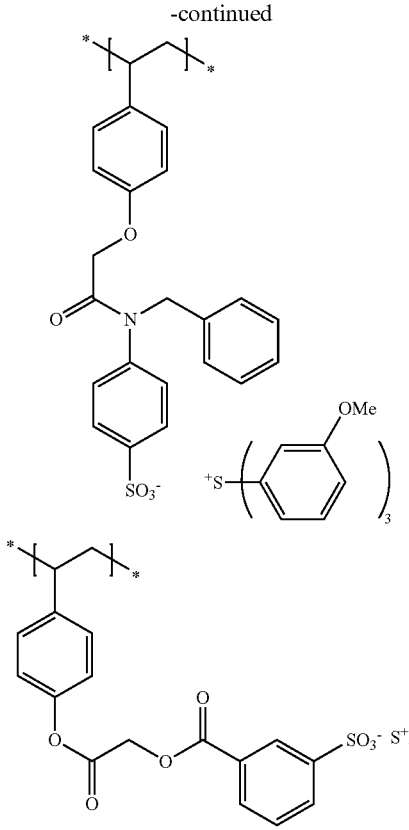

When the mother nucleus is a polymer compound, the content of the repeating units represented by General Formula (4) in the compound (P) of the present invention preferably ranges from 1 mol % to 30 mol %, more preferably ranges from 2 mol % to 15 mol %, and particularly preferably ranges from 2 mol % to 10 mol %, based on the total repeating units of the compound (P).

When the mother nucleus is a polymer compound, the compound (P) used in the present invention preferably further contains a repeating unit described below as another repeating unit.

For example, the compound (P) may further contain a repeating unit having a group of which a dissolution rate in an alkaline developer is increased due to the degradation of the group caused by the action of the alkaline developer. Examples of such a group include a group having a lactone structure, a group having a phenyl ester structure, and the like. As the repeating unit having a group of which a dissolution rate in an alkaline developer is increased due to the degradation of the group caused by the action of the alkaline developer, a repeating unit represented by the following General Formula (AII) is more preferable.

[Chem. 36]

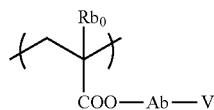

(AII)

In General Formula (An), V represents a group of which a dissolution rate in an alkaline developer is increased due to the degradation of the group caused by the action of the alkaline developer, $Rb_0$ represents a hydrogen atom or a methyl group, and Ab represents a single bond or a divalent organic group.

V as a group degraded by the action of an alkaline developer is groups having an ester bond, and among these, a group having a lactone structure is more preferable. As the group having a lactone structure, any group can be used as long as the group has a lactone structure, but the lactone structure is preferably a 5- to 7-membered lactone structure. It is preferable that another ring structure be condensed with the 5- to 7-membered lactone structure while forming a bicyclo structure or a spiro structure.

Ab is preferably a single bond or a divalent linking group represented by -AZ—$CO_2$— (AZ is an alkylene group or an aliphatic ring group). AZ is preferably a methylene group, an ethylene group, a cyclohexylene group, an adamantylene group, or a norbornylene group.

Specific examples thereof are shown below. In the formulae, Rx represents H or $CH_3$.

[Chem. 37]

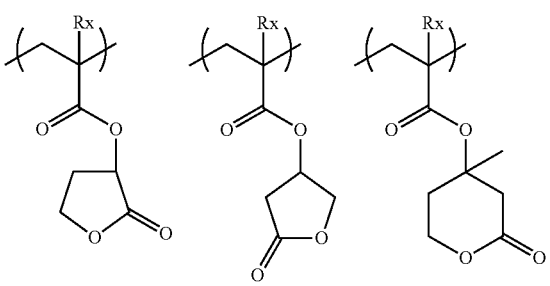

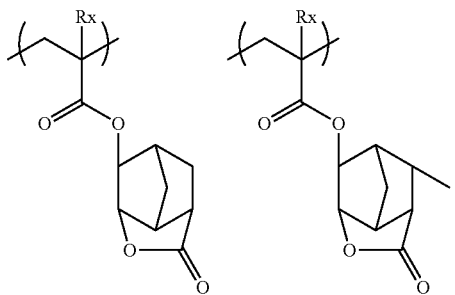

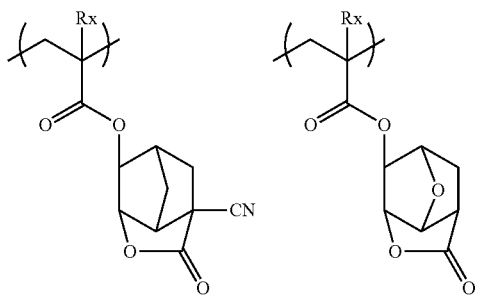

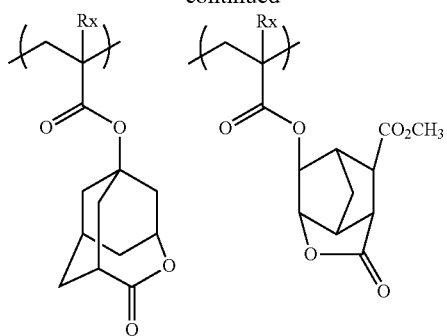
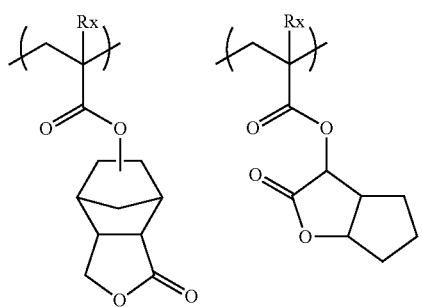
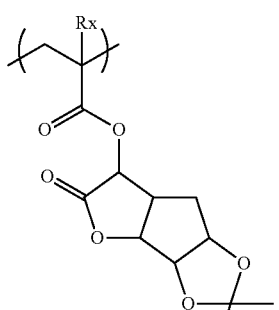
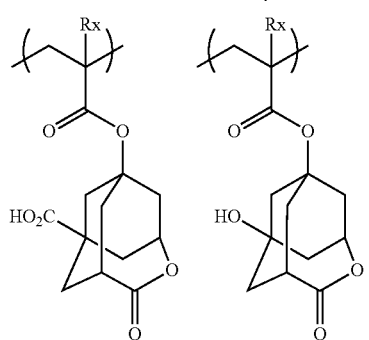
[Chem. 38]
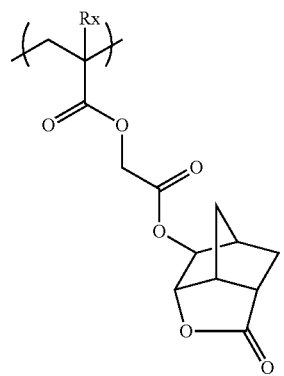
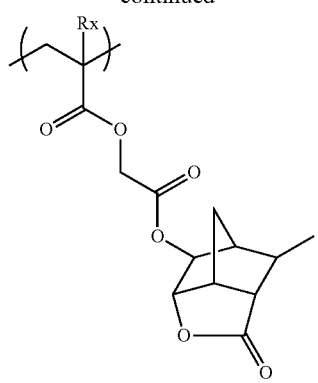
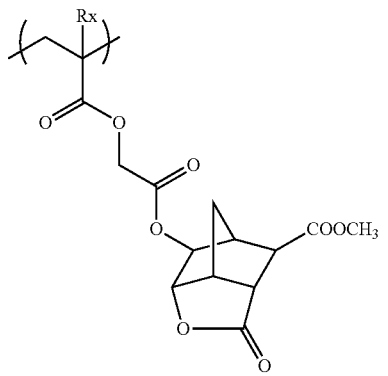
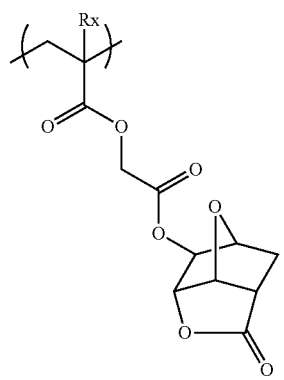
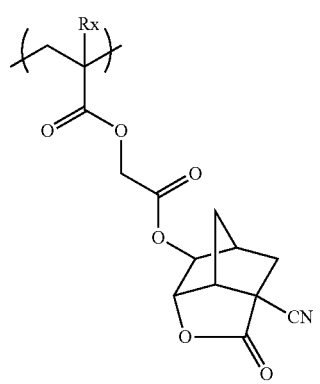

85
-continued
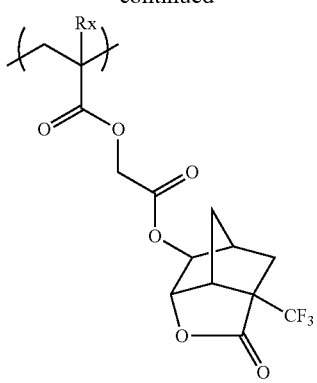
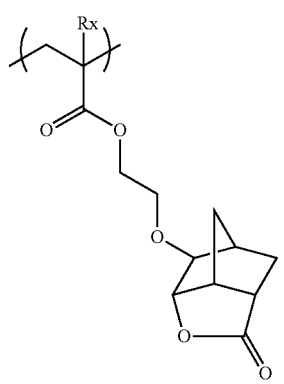
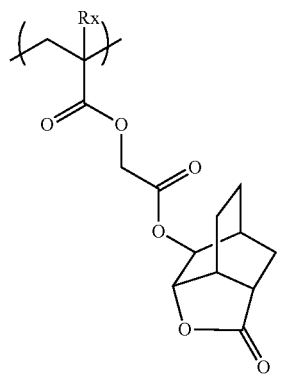
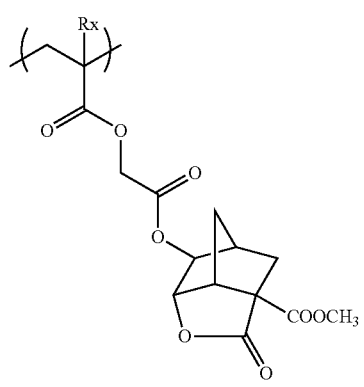
86
-continued
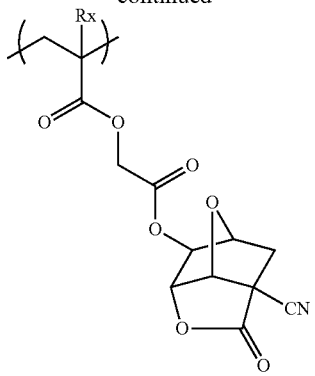
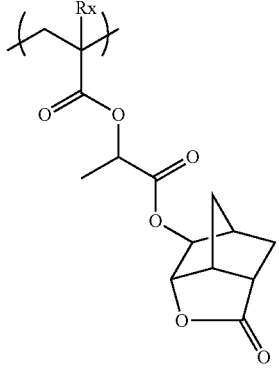
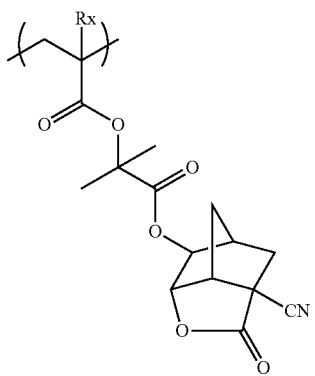
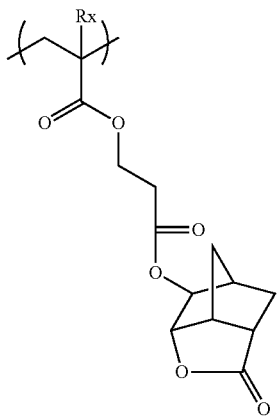

-continued

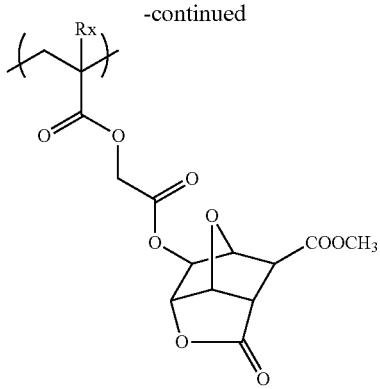

The compound (P) may or may not contain a repeating unit having a group of which a dissolution rate in an alkaline developer is increased due to the degradation of the group caused by the action of the alkaline developer. When compound (P) contains the repeating unit, the content of the repeating units having such a group preferably ranges from 10 mol % to 60 mol %, more preferably ranges from 15 mol % to 50 mol %, and even more preferably ranges from 15 mol % to 40 mol %, based on the total repeating units in the compound (P).

Examples of the polymerizable monomer for forming a repeating unit other than the above repeating unit in the compound (P) of the present invention include styrene, alkyl-substituted styrene, alkoxy-substituted styrene, O-alkylated styrene, O-acylated styrene, hydrogenated hydroxystyrene, maleic anhydride, an acrylic acid derivative (acrylic acid, acrylic acid ester, or the like), a methacrylic acid derivative (methacrylic acid, methacrylic acid ester, or the like), N-substituted maleimide, acrylonitrile, methacrylonitrile, vinyl naphthalene, vinyl anthracene, acenaphthylene, indene which may have a substituent, and the like. As substituted styrene, 4-(1-naphthylmethoxy)styrene, 4-benzyloxystyrene, 4-(4-chlorobenzyloxy)styrene, 3-(1-naphthylmethoxy) styrene, 3-benzyloxystyrene, 3-(4-chlorobenzyloxy)styrene, and the like are preferable.

The compound (P) may or may not contain these repeating units. When the compound (P) contains these repeating units, the content of these repeating units in the compound (P) generally ranges from 1 mol % to 20 mol %, and preferably ranges from 2 mol % to 10 mol %, based on the total repeating units constituting the compound (P).

When the mother nucleus is a polymer compound, the compound (P) of the present invention can be synthesized by, for example, polymerizing an unsaturated monomer corresponding to the respective repeating units through radical polymerization, cationic polymerization, or anionic polymerization. In addition, an unsaturated monomer corresponding to a precursor of the respective repeating unit may be used to polymerize a polymer, and then the synthesized polymer may be modified with a low-molecular weight compound so as to be converted into the desired repeating unit, whereby the compound (P) can be synthesized. In any case, it is preferable to use living polymerization such as living anionic polymerization since the molecular weight distribution of the obtained polymer compound becomes uniform.

The weight average molecular weight of the compound (P) used in the present invention is preferably from 1000 to 200,000, more preferably from 2000 to 50,000, and even more preferably from 2000 to 15,000. A preferable dispersity (molecular weight distribution) (Mw/Mn) of the compound (P) is from 1.0 to 1.7, and more preferably from 1.0 to 1.3. The weight average molecular weight and the dispersity of the compound (P) are defined as values that are measured by GPC and expressed in terms of polystyrene. For example, the weight average molecular weight and the dispersity can be obtained by using an HLC-8120 (manufactured by TOSOH CORPORATION), a TSK gel Multipore HXL-M (manufactured by TOSOH CORPORATION, 7.8 mm ID×30.0 cm) as a column, and THF (tetrahydrofuran) as an eluent.

Specific examples of the compound (P) used in the present invention will be shown below, but the present invention is not limited thereto.

[Chem. 39]

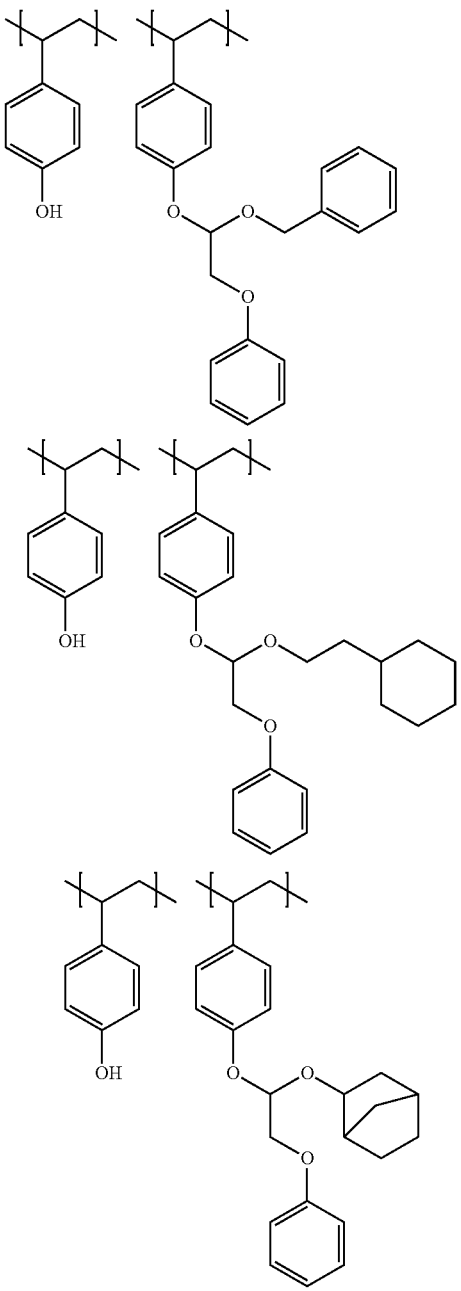

89
-continued
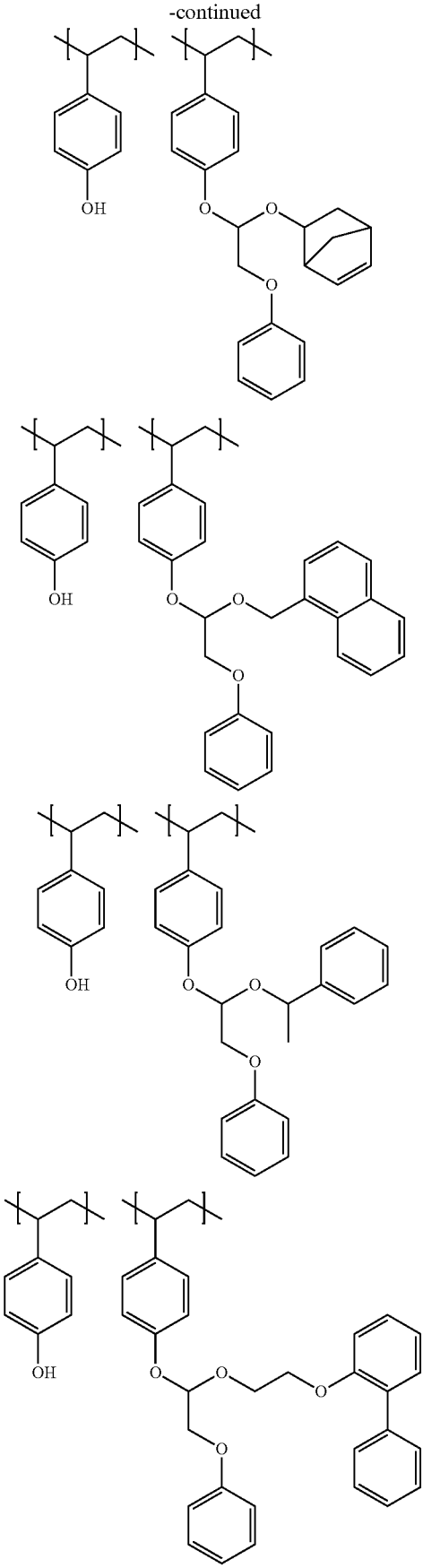
90
-continued
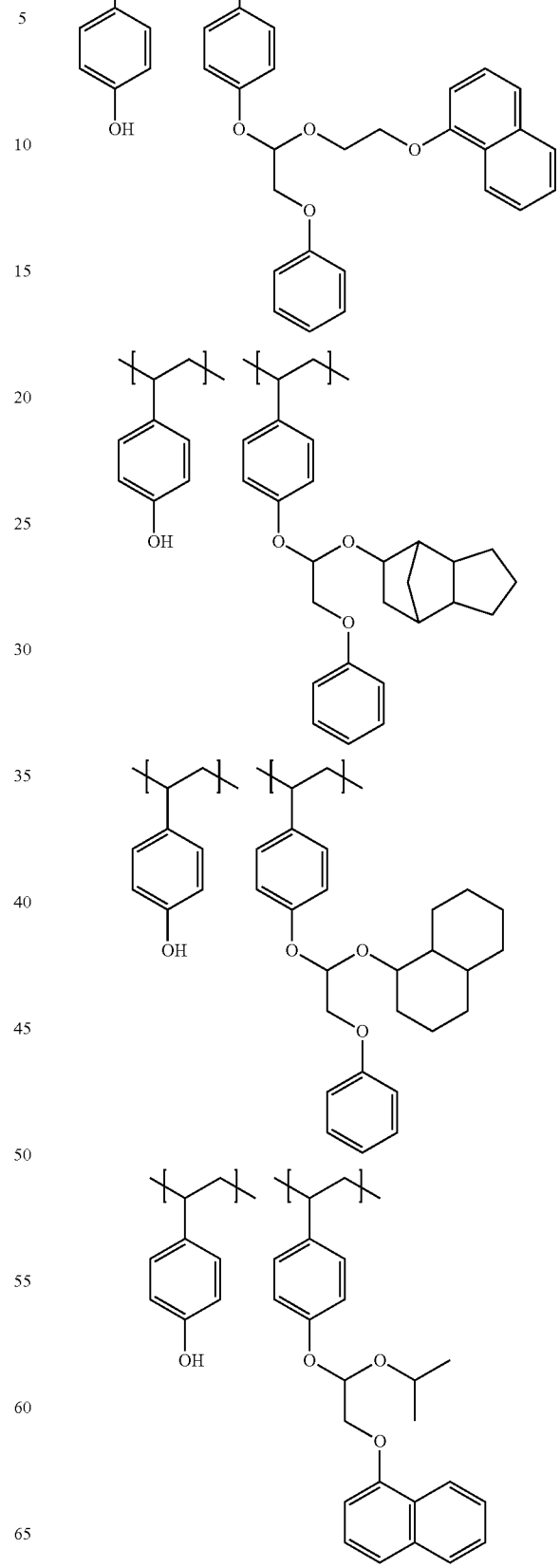

91
-continued
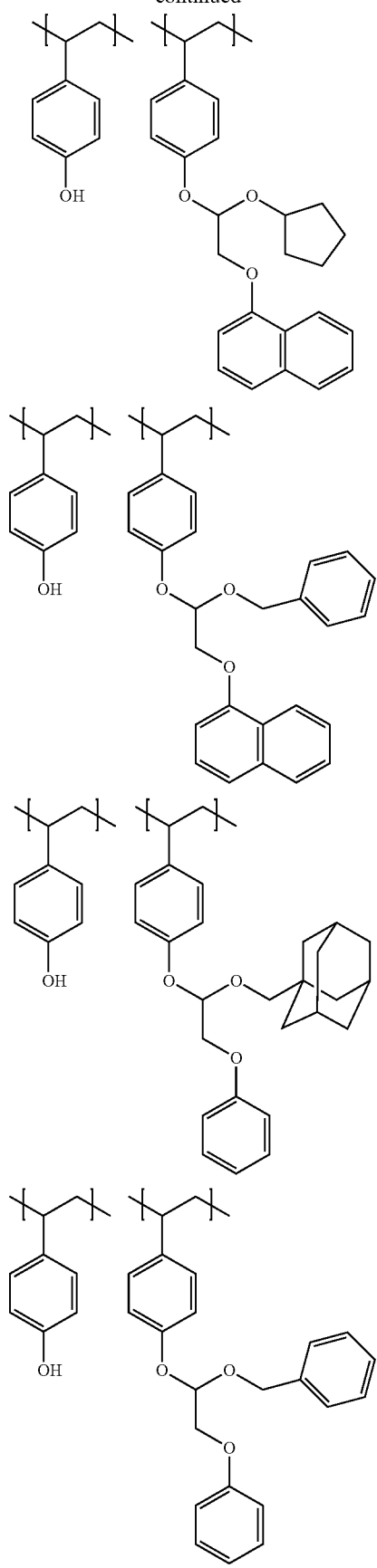
92
-continued
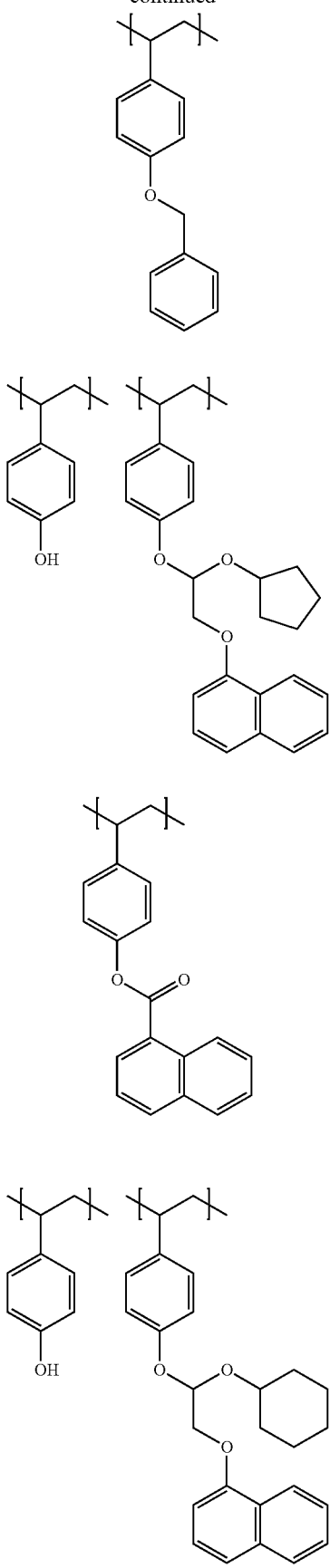

93
-continued
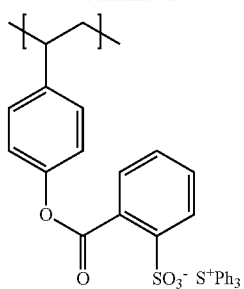
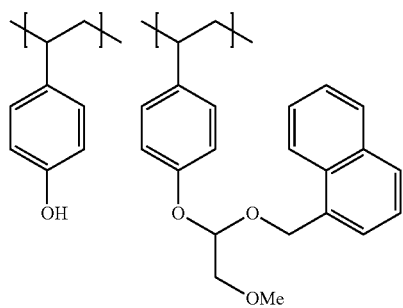
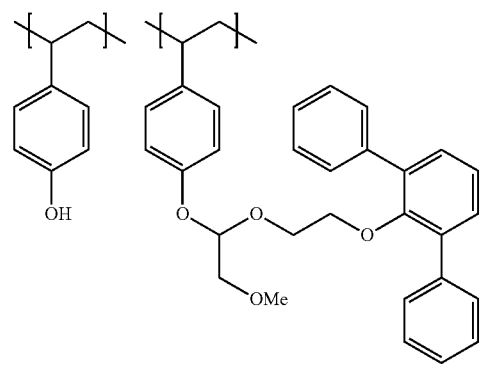
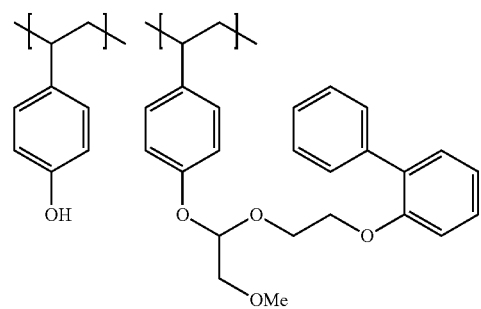
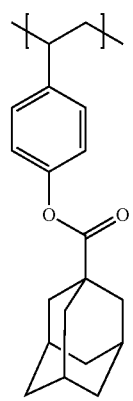
94
-continued
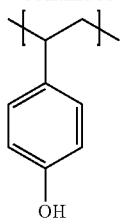
[Chem. 40]
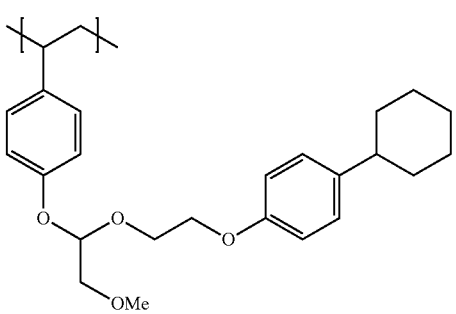
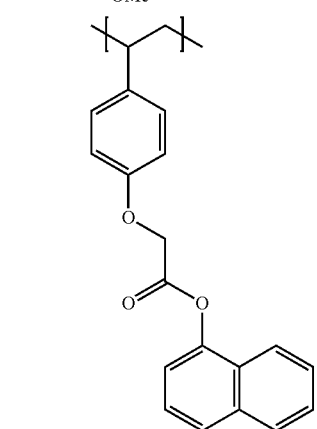
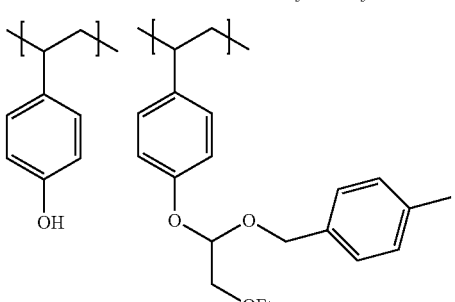
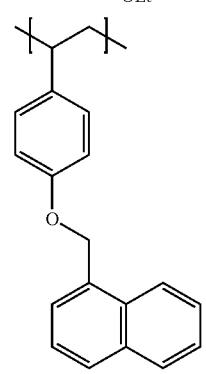

95
-continued
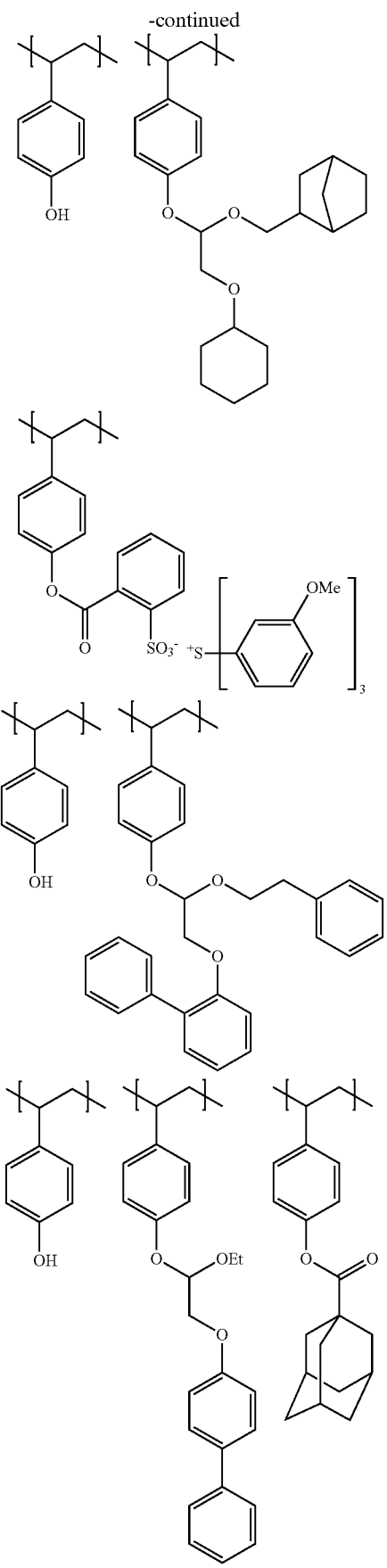
96
-continued
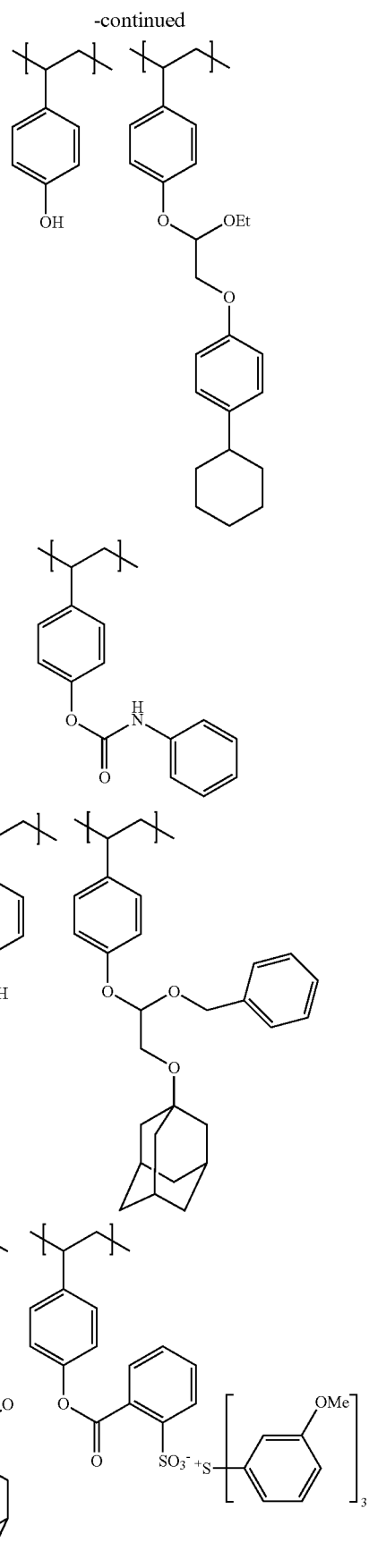

97
-continued
98
-continued
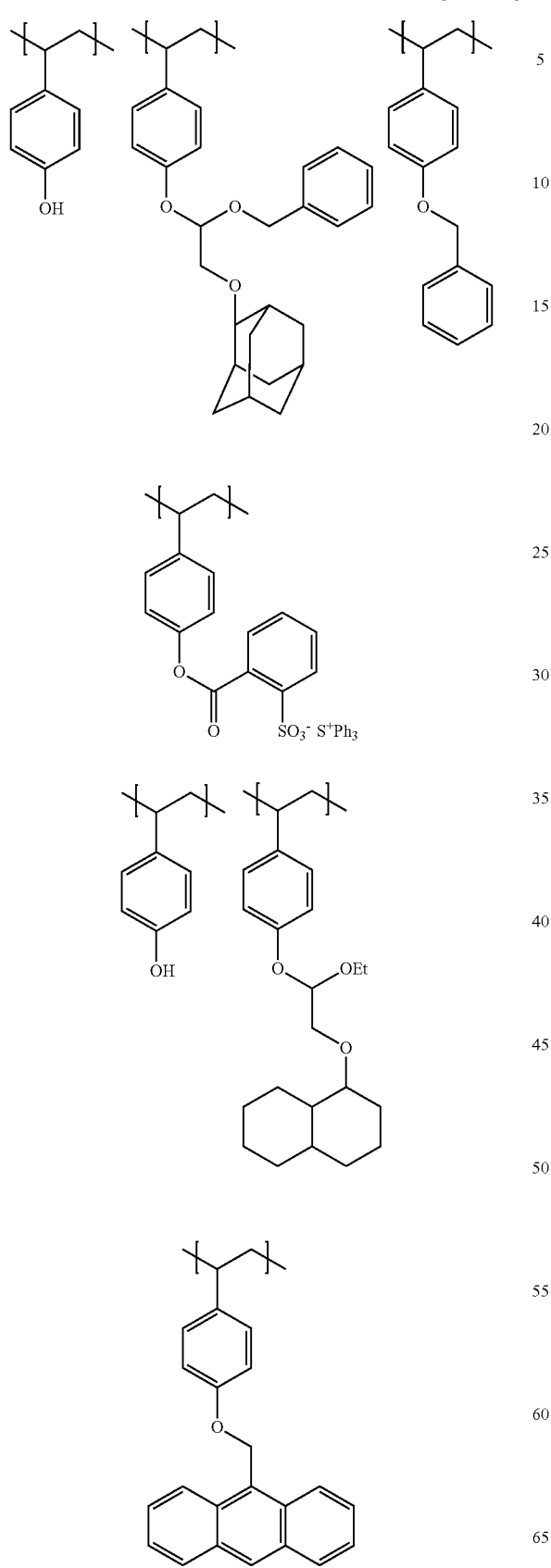
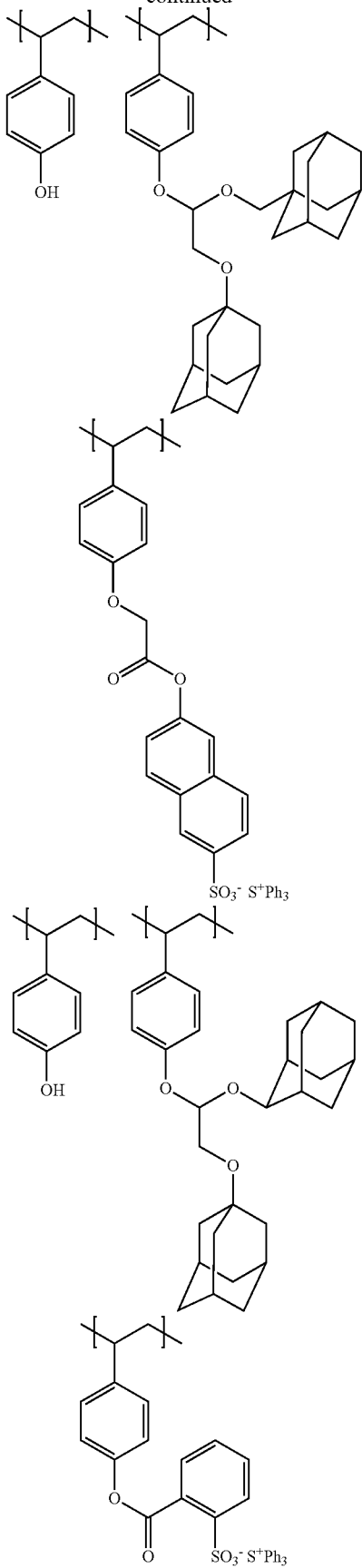

99
-continued
100
-continued
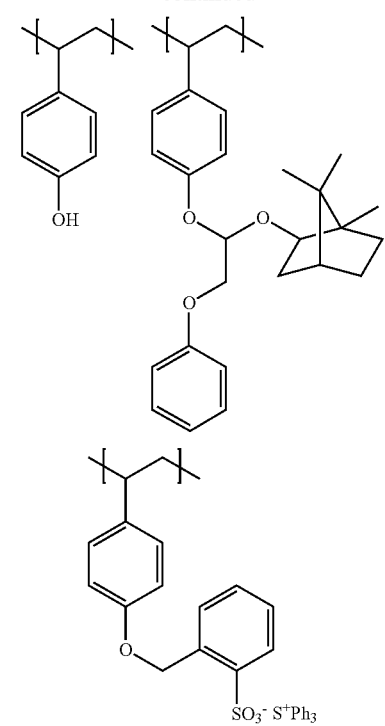
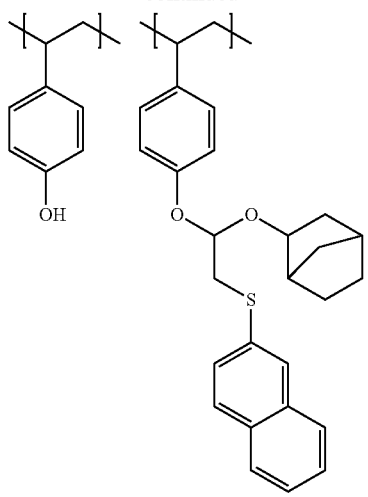
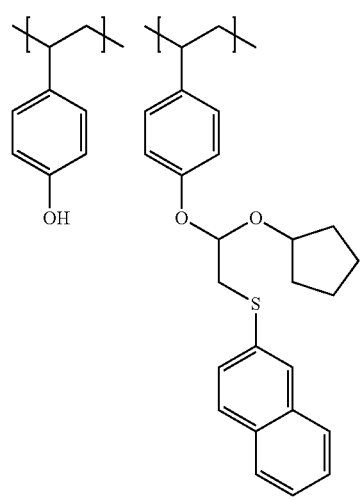
[Chem. 42]
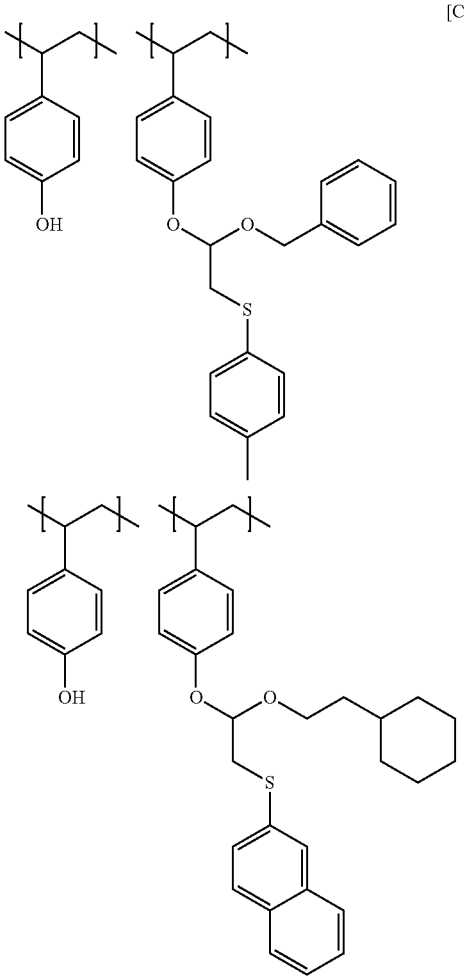
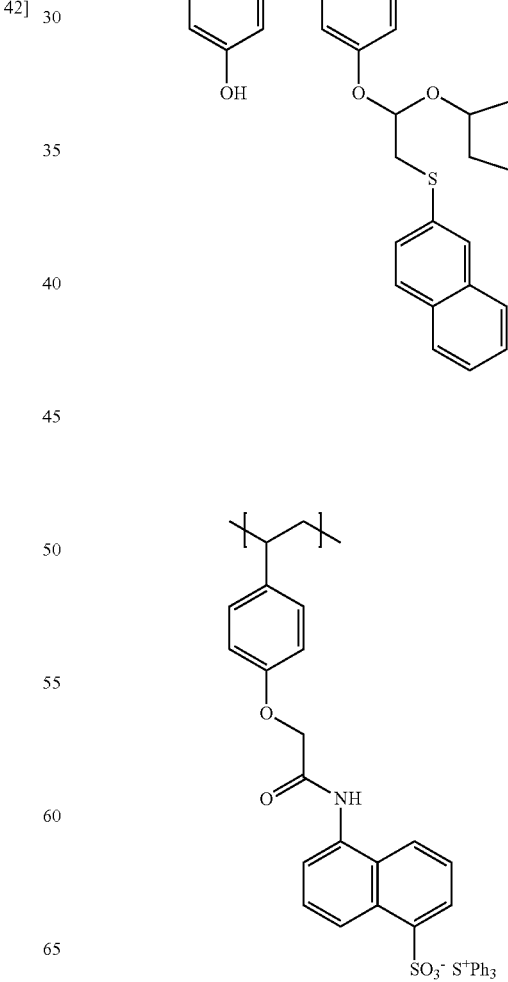

101
-continued
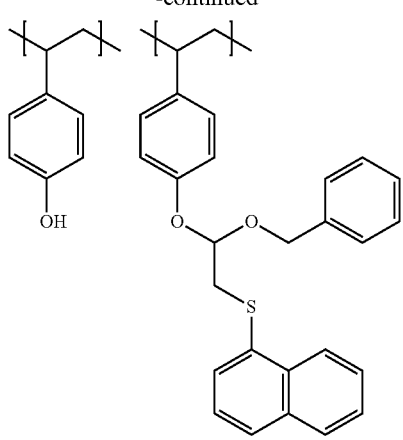
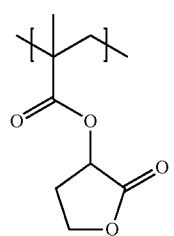
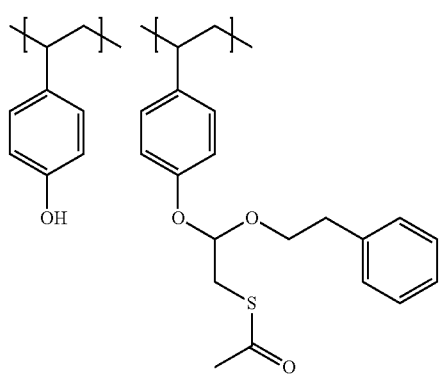
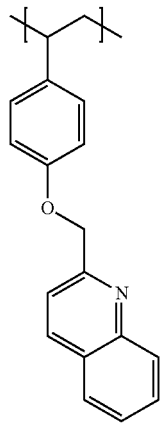
102
-continued
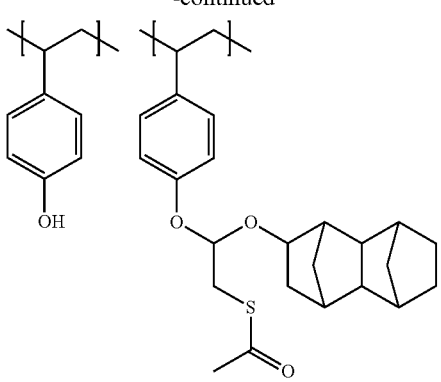
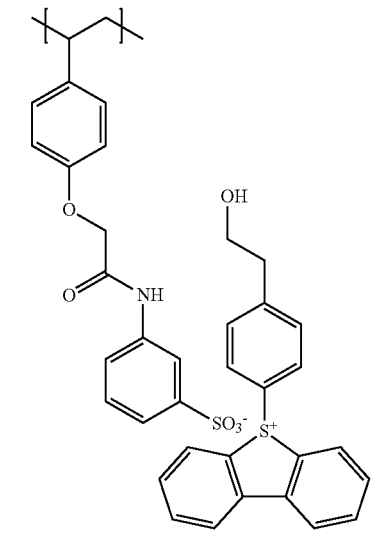
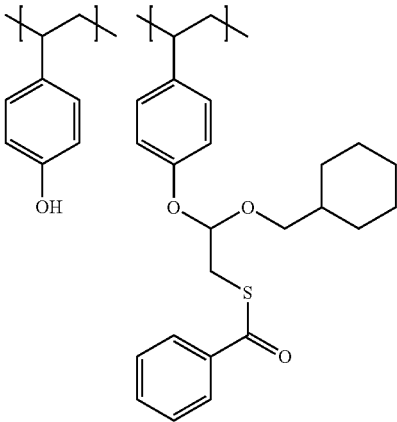

103
-continued
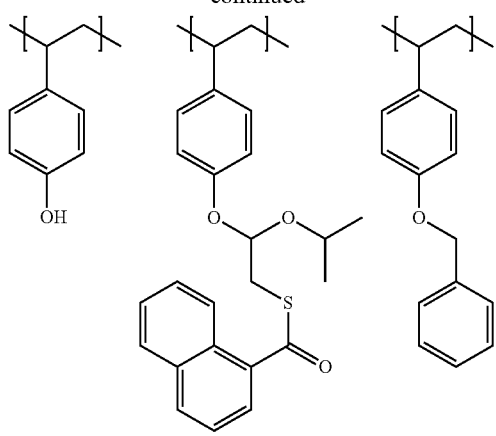
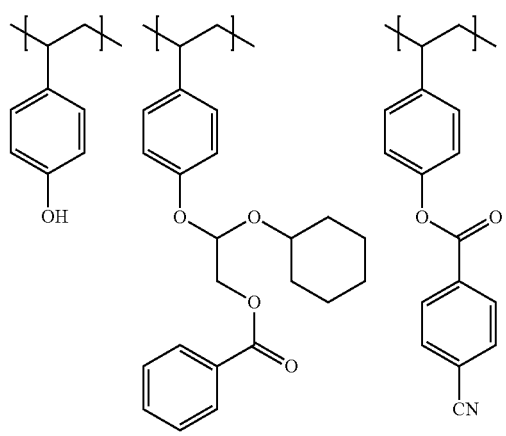
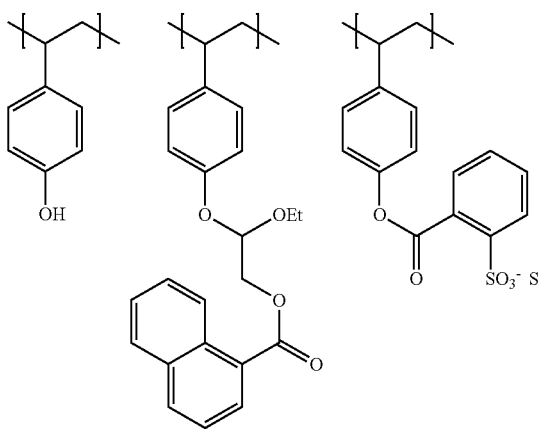
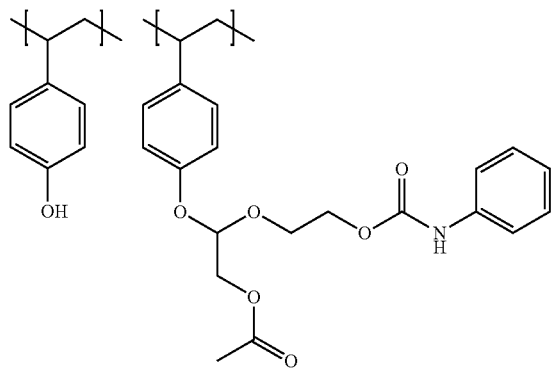
104
-continued
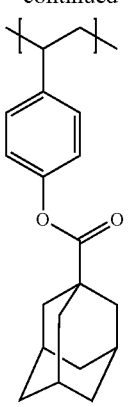
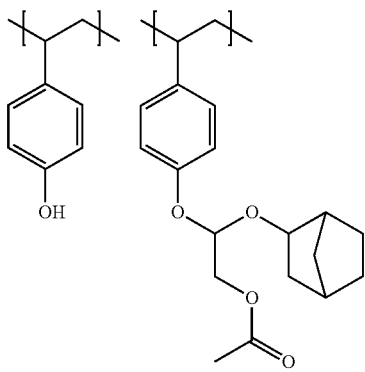
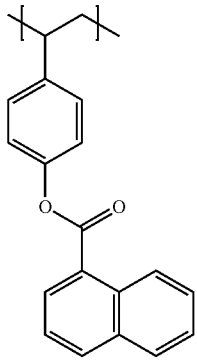
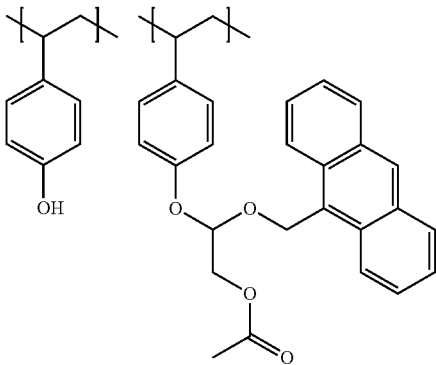

105
-continued
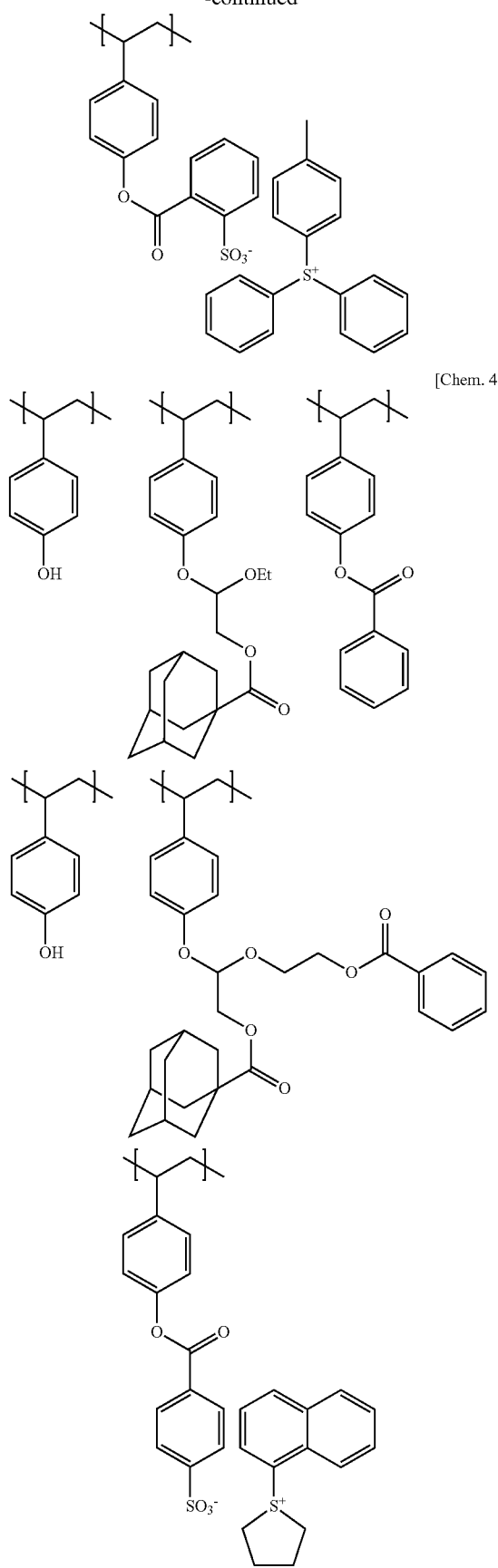
106
-continued
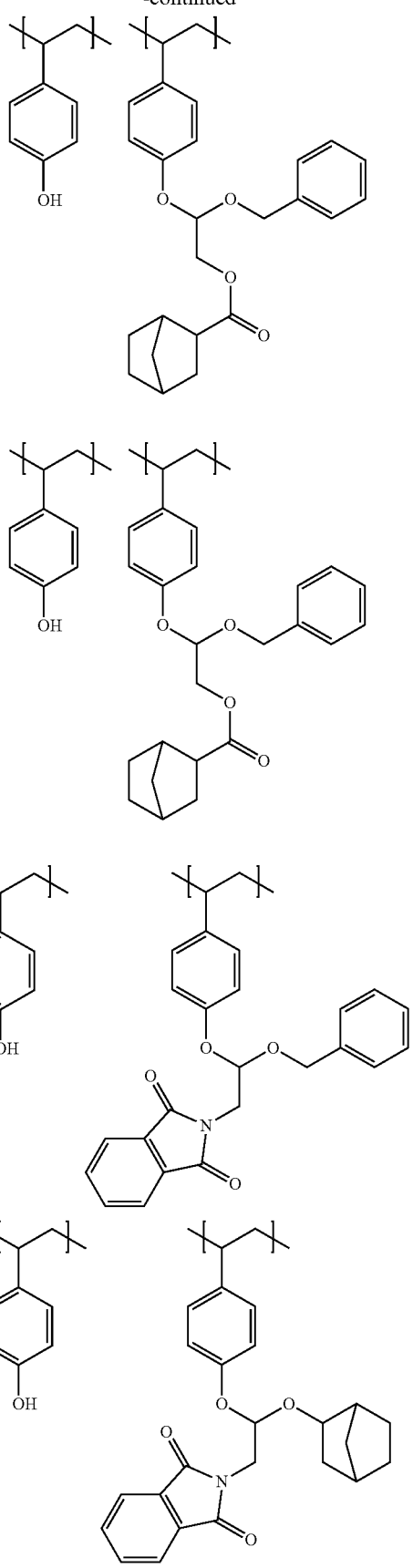
[Chem. 43]

107
-continued
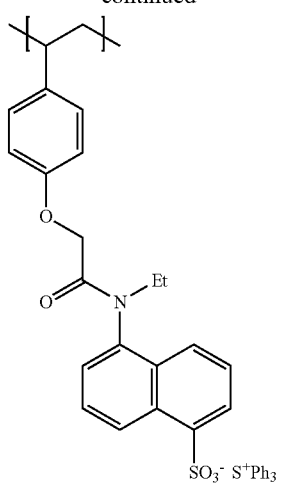
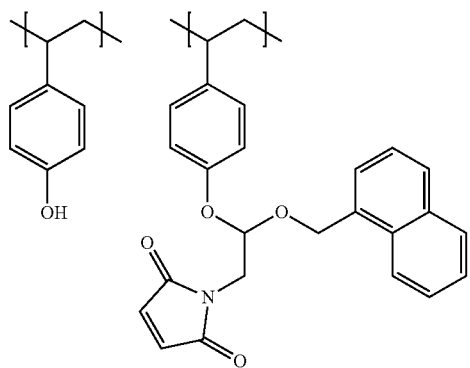
108
-continued
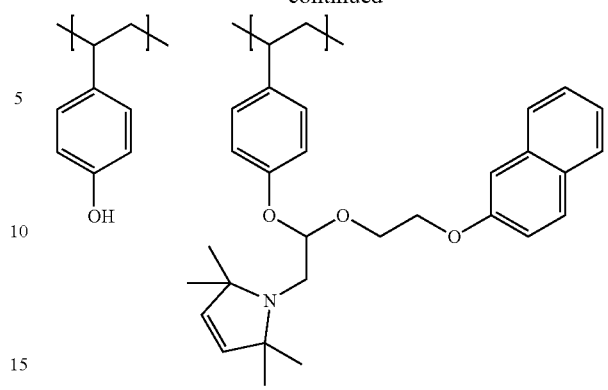
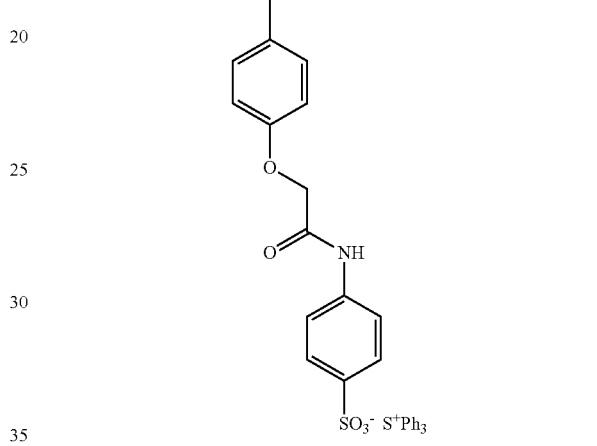
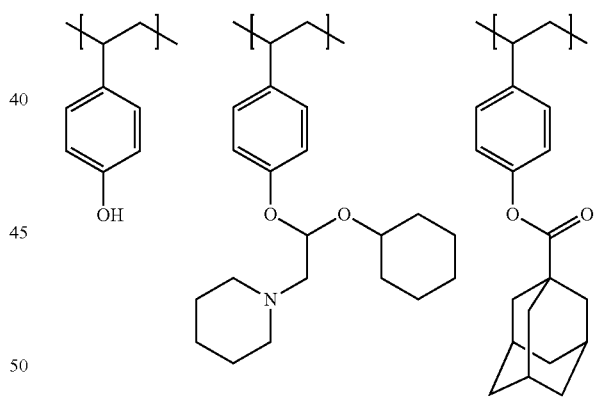
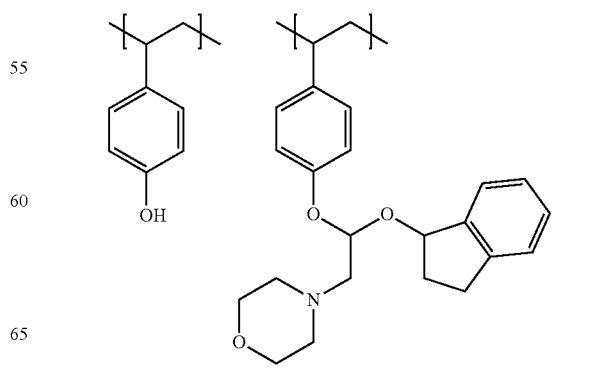

109
-continued
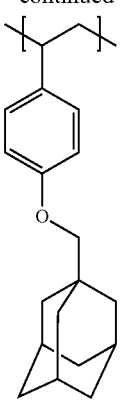
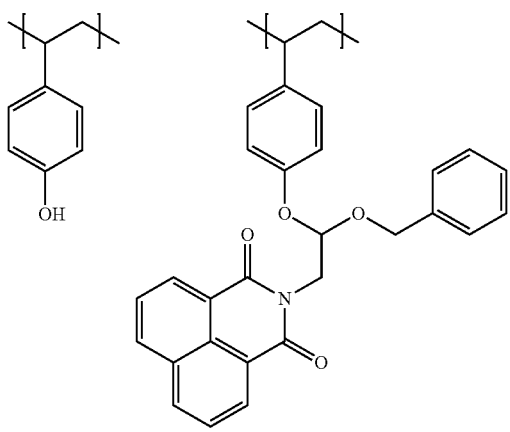
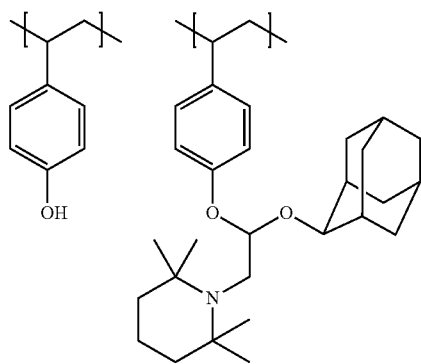
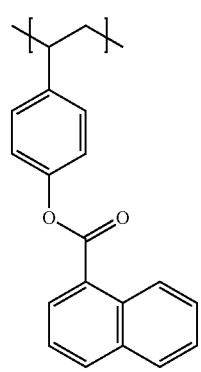
110
-continued
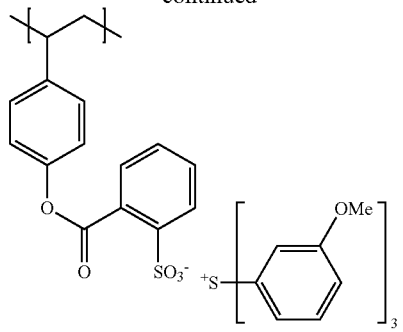
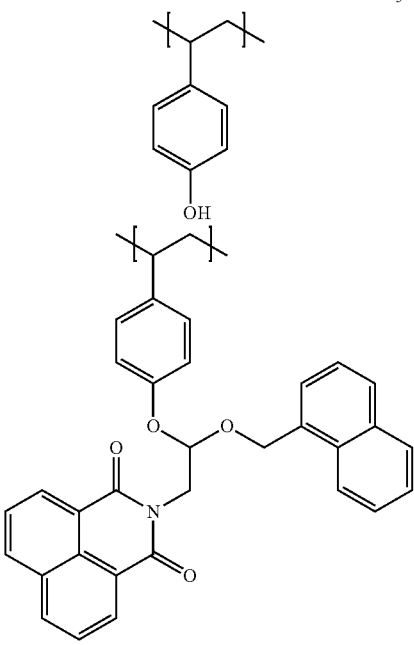
[Chem. 44]
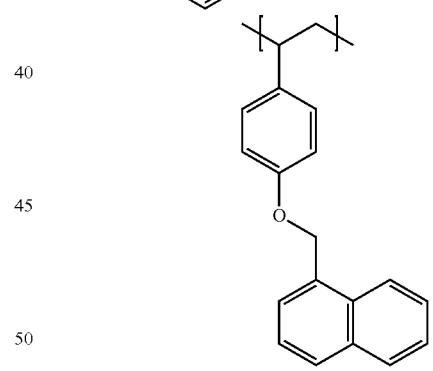
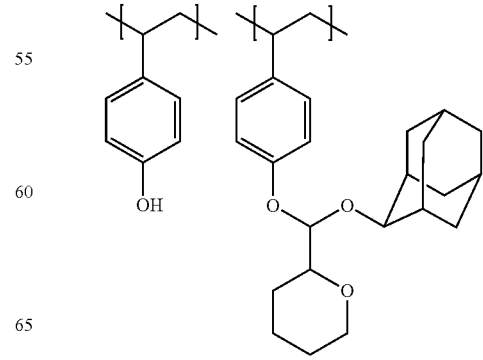

111
-continued
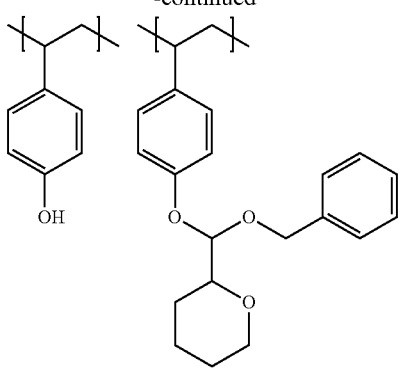
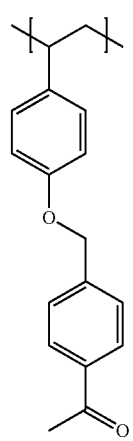
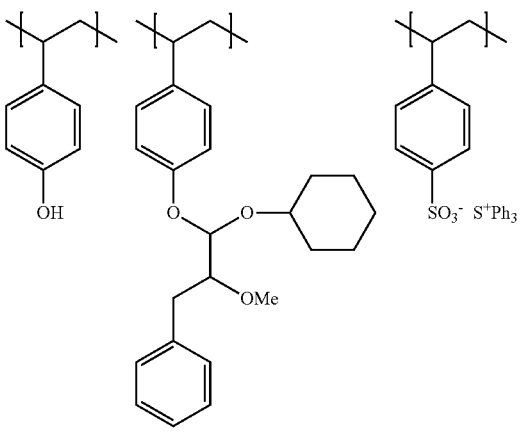
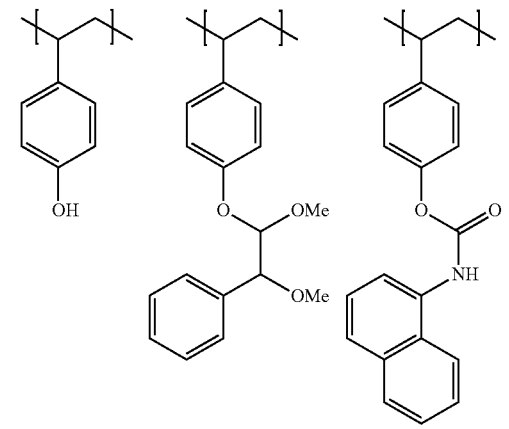
112
-continued
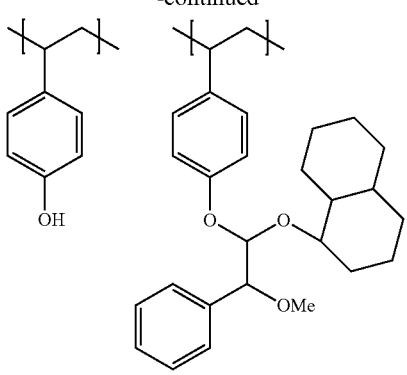
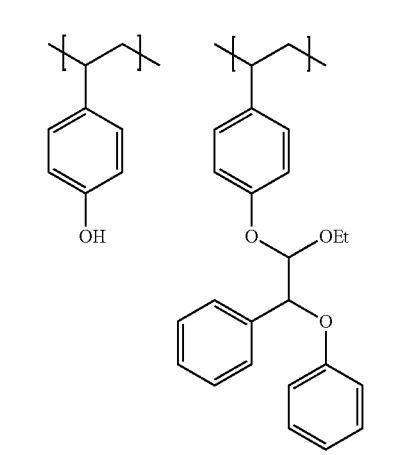
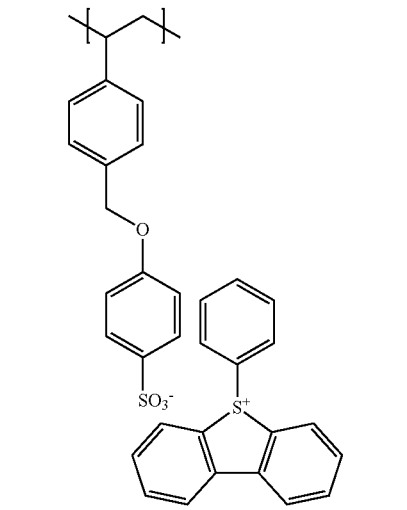
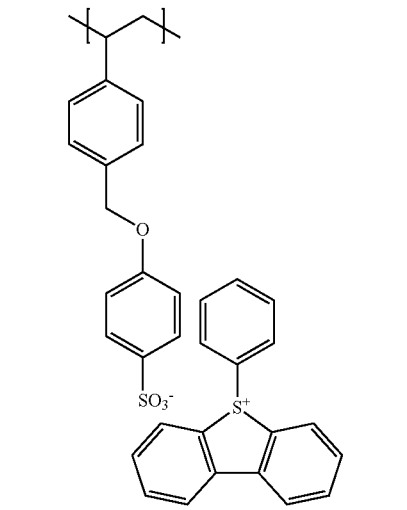

113
-continued
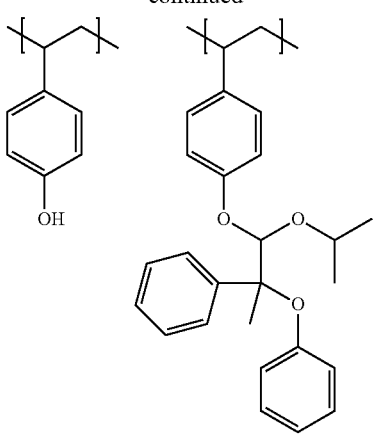
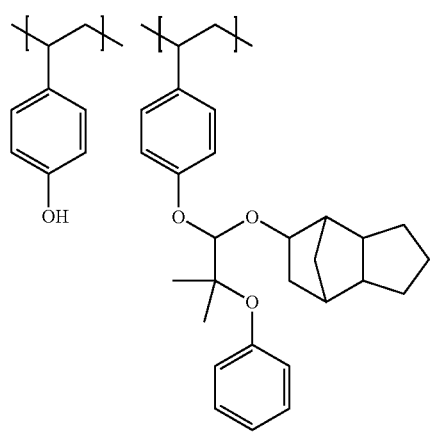
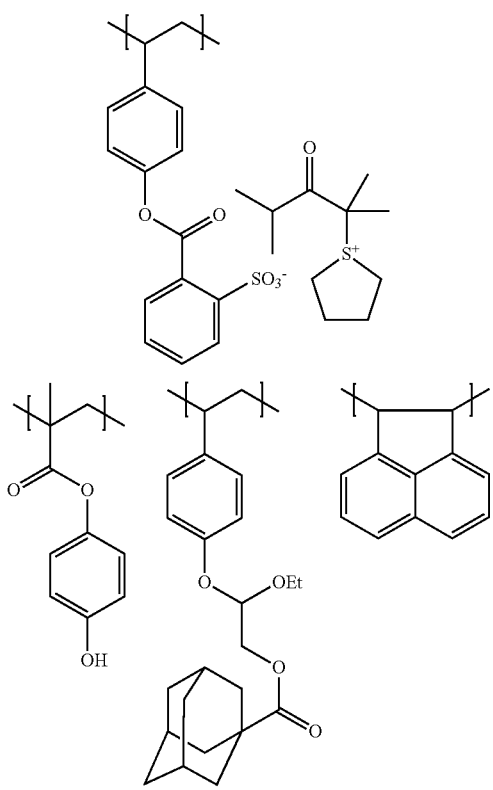
114
-continued
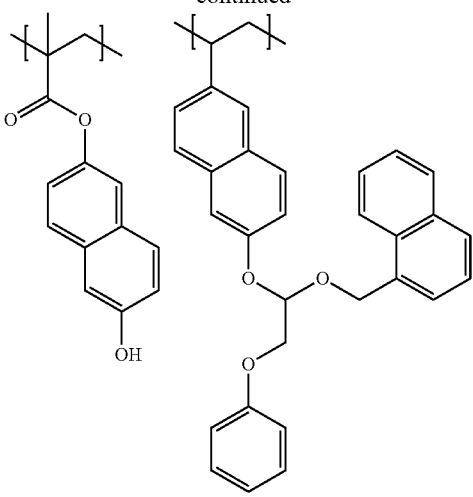
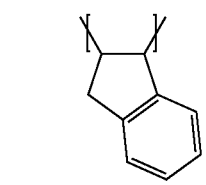
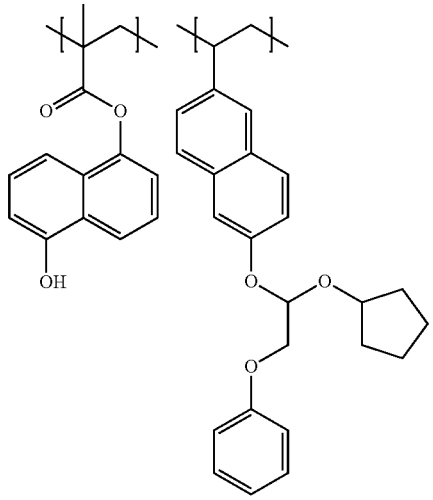
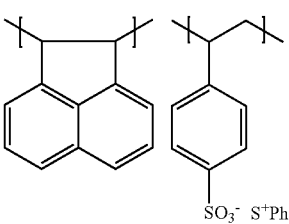

115
-continued
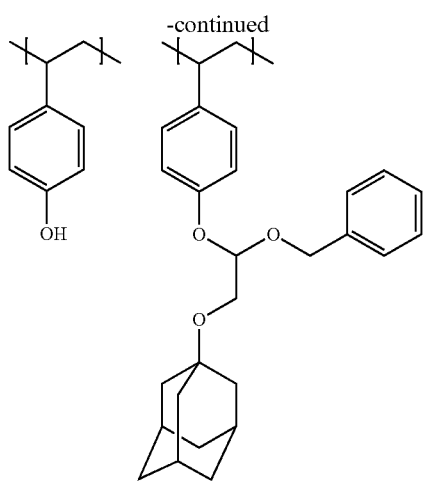
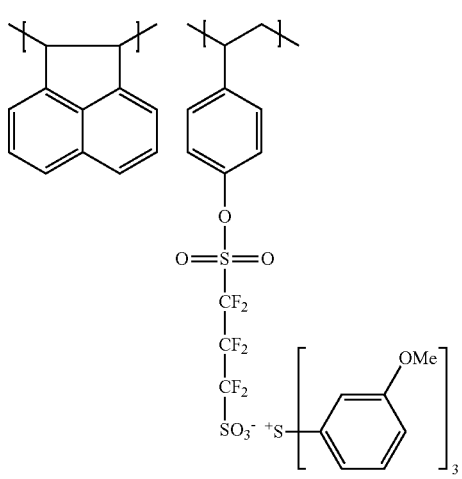
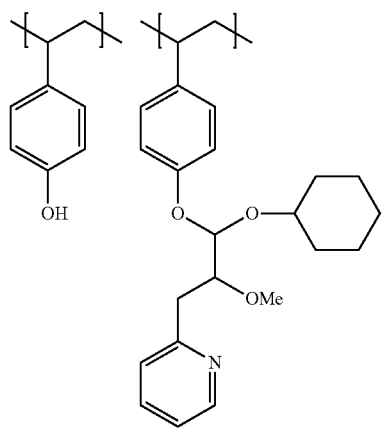
116
-continued
[Chem. 45]
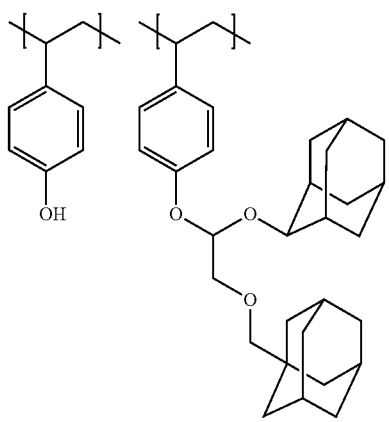
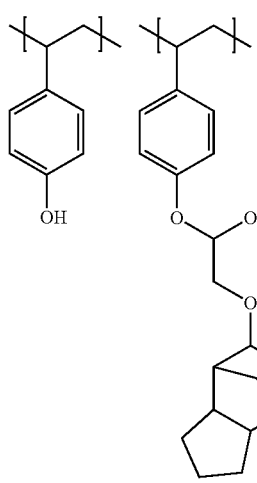
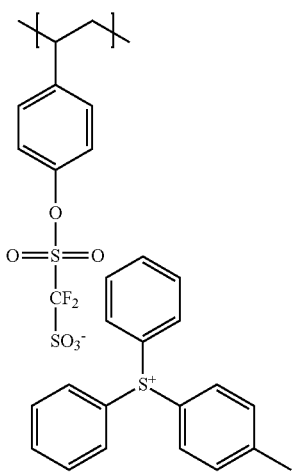

117
-continued
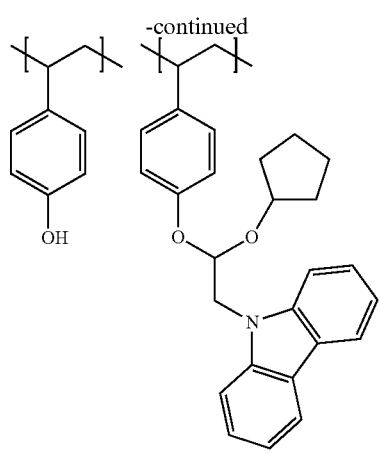
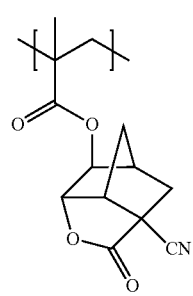
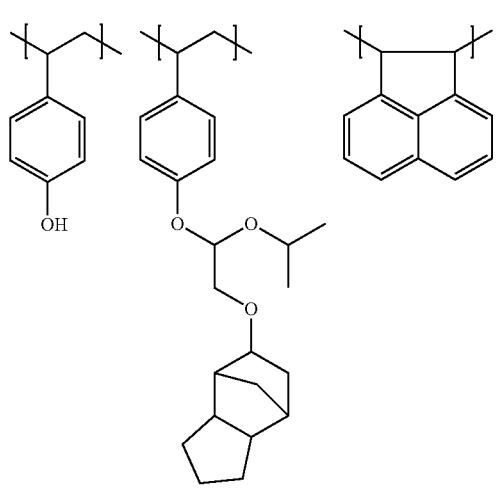
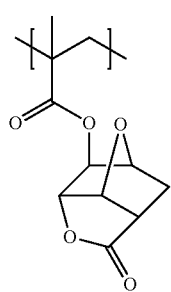
118
-continued
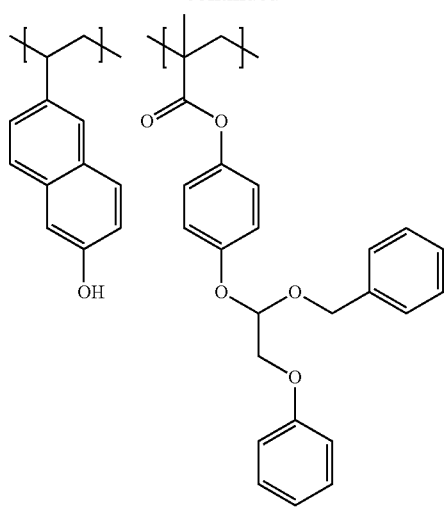
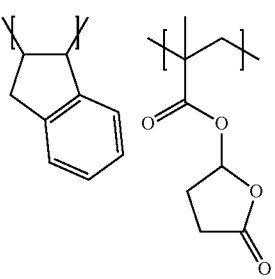
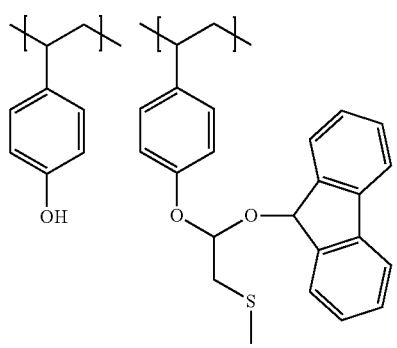
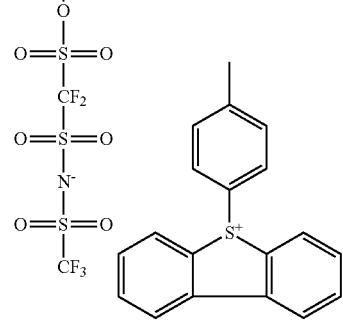

-continued

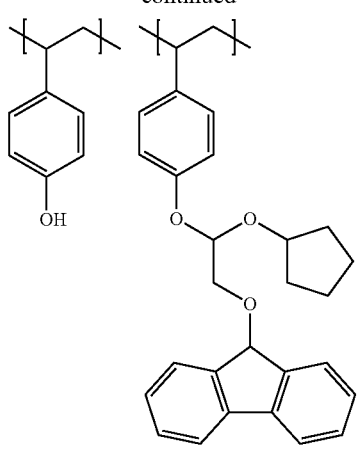

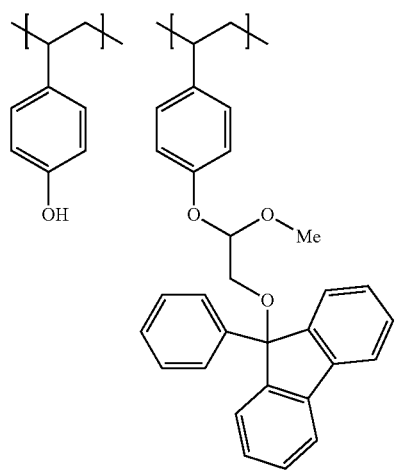

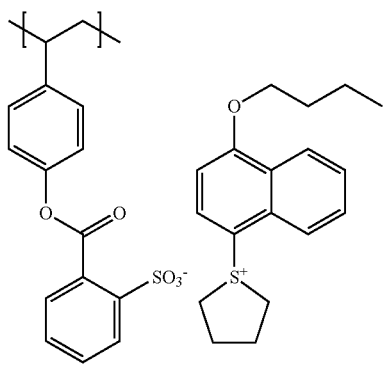

-continued

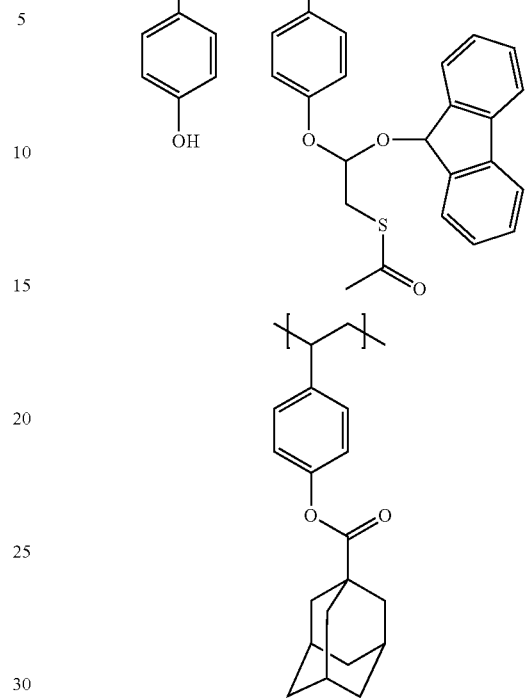

Next, a case where the compound (P) is a low-molecular weight compound will be described.

As described above, the compound (P) may be a low-molecular weight compound in which a hydrogen atom of a portion of phenolic hydroxyl groups in a mother nucleus compound having a plurality of phenolic hydroxyl groups is substituted with an acid labile group represented by General Formula (1). Herein, the "low-molecular weight compound" refers to, for example, a compound containing less than 10 repeating units derived from a polymerizable monomer, and the molecular weight of the compound is, for example, 3000 or less, preferably from 300 to 2000, and more preferably from 500 to 1500.

In an embodiment, the low-molecular weight compound (P) has a structure represented by the following General Formula (T-I) or (T-II).

[Chem. 46]

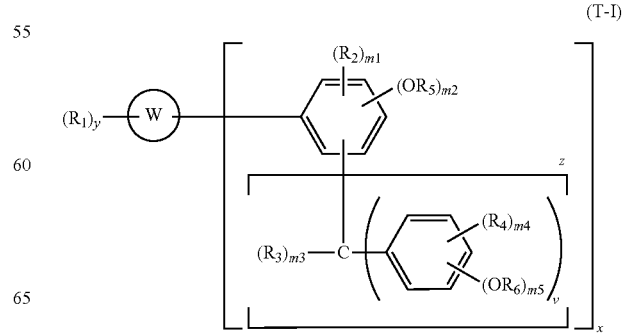

(T-I)

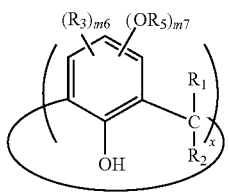

(T-II)

In General Formulae (T-I) and (T-II), each of $R_1$, $R_2$, $R_3$, and $R_4$ independently represents a hydrogen atom, an alkyl group, or a cycloalkyl group, a plurality of $R_1$s may form a ring by binding to each other, a plurality of $R_2$s may form a ring by binding to each other, a plurality of $R_3$s may form a ring by binding to each other, a plurality of $R_4$s may form a ring by binding to each other, and the plurality of $R_1$, $R_2$, $R_3$, and $R_4$ may be the same as or different from each other;

each of $R_5$ and $R_6$ independently represents a hydrogen atom or an organic group, a plurality of $R_5$s and $R_6$s may be the same as or different from each other, and at least one of the plurality of $R_5$s and $R_6$s is a group represented by General Formula (1);

W represents a single bond, an alkylene group, an arylene group, or a group including an arbitrary combination of the same;

x represents a positive integer;

y represents an integer of 0 or greater, and when W is a single bond, y is 0;

z represents an integer of 0 or greater;

v represents an integer of 0 or greater;

m1, m3, m4, and m6 represent a positive integer; and m2, m5, and m7 represent an integer of 0 or greater, here, m1+m2+z=5, m3+v=3, m4+m5=5, m2+m5≥2, and m6+m7=4;

The compound (P) represented by General Formula (T-I) is preferably a compound represented by any one of the General Formulae (T-III) to (T-V).

A phenolic hydroxyl group of a compound to be a mother nucleus (mother nucleus compound) such as a polyvalent phenol compound is allowed to react with a protection reaction agent so as to protect the phenolic hydroxyl group of the mother nucleus compound with the group represented by General Formula (1), whereby the compound (P) can be synthesized. The protection reaction agent herein refers to a compound used for causing a reaction for introducing a protecting group. In addition, the ratio of the phenolic hydroxyl groups protected with an acid-degradable group to the total number of the phenolic hydroxyl groups contained in the mother nucleus compound is called protection rate.

Specific examples of the mother nucleus compound of the compound (P) represented by General Formula (T-I) will be shown below, but the present invention is not limited thereto.

[Chem. 47]

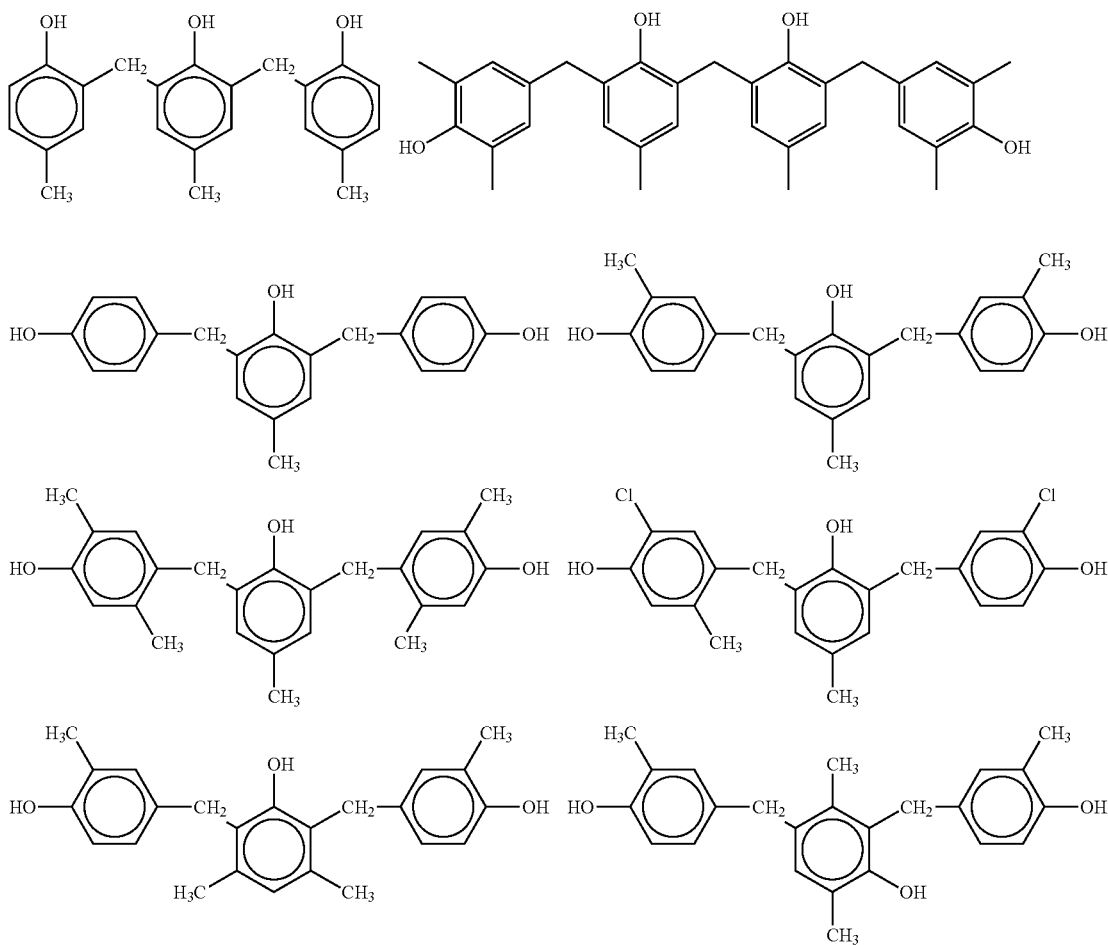

123
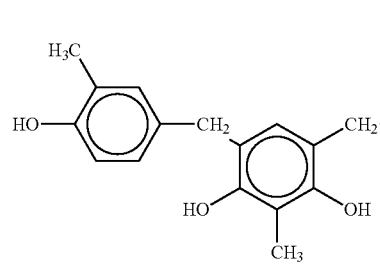
124
-continued
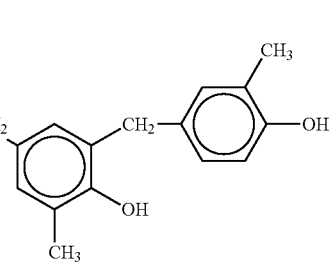
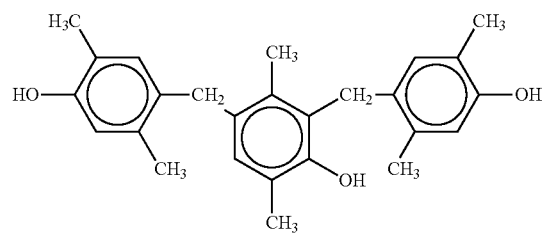
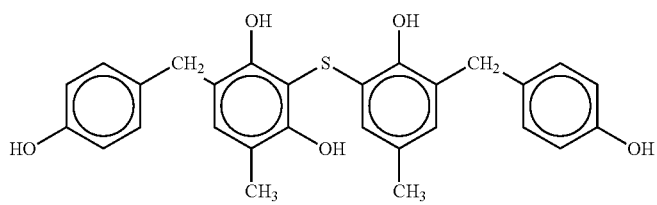
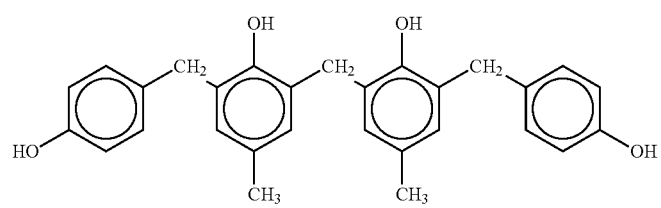
[Chem. 48]
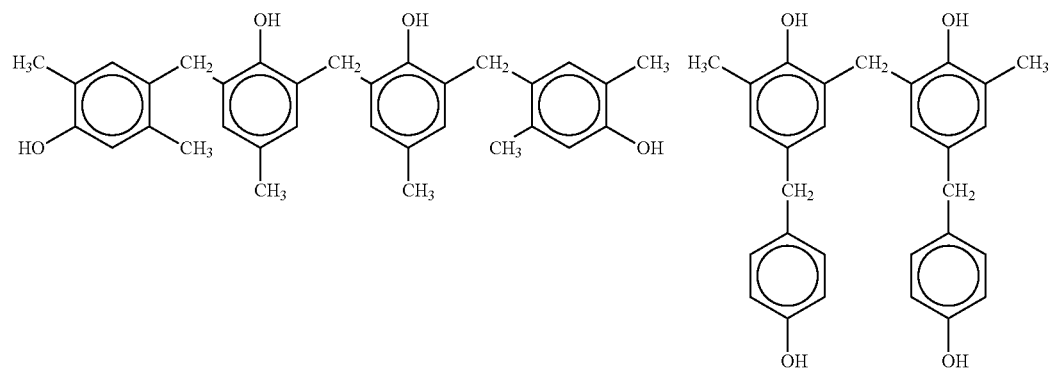
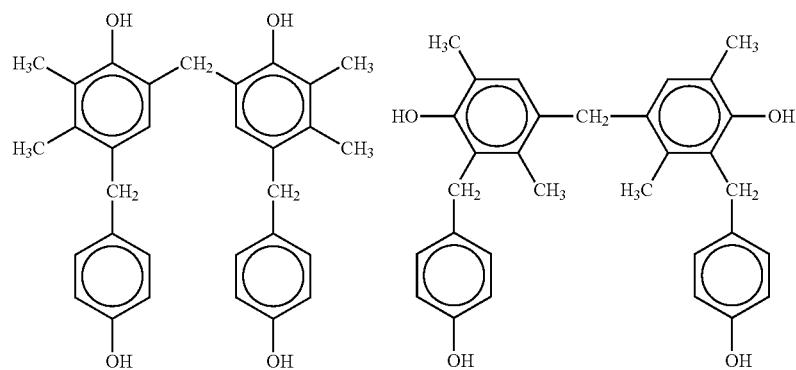

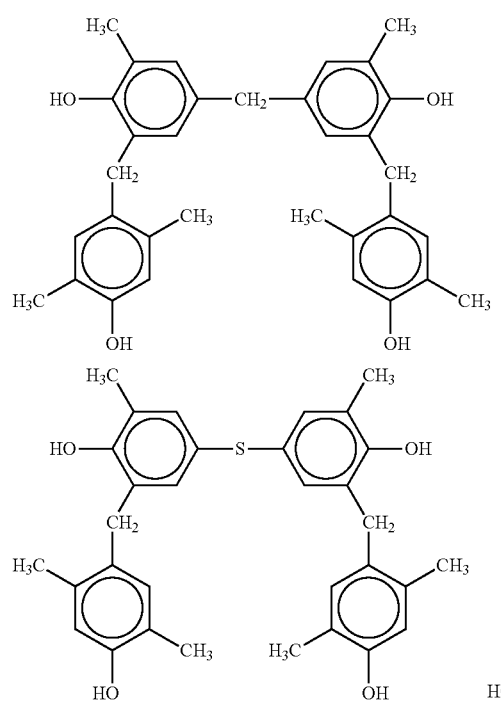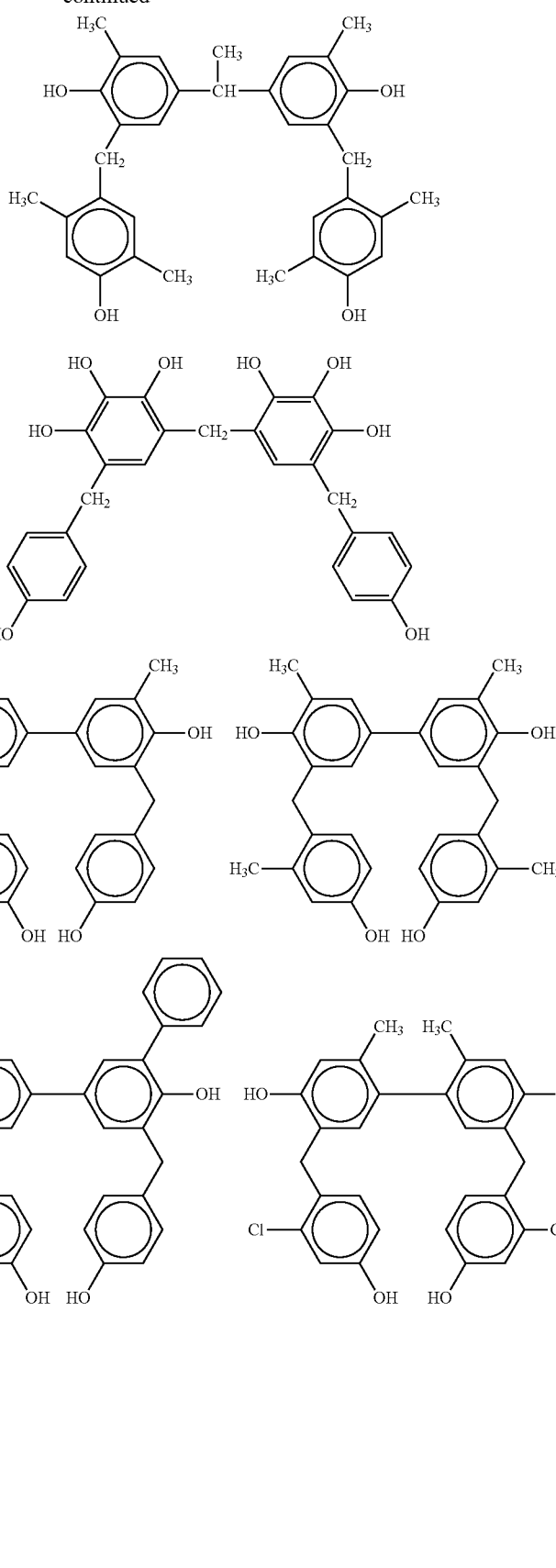

-continued
[Chem. 49]
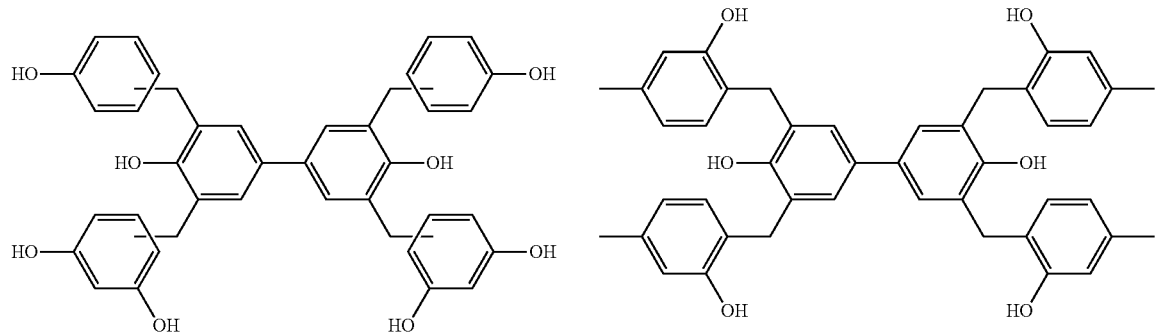
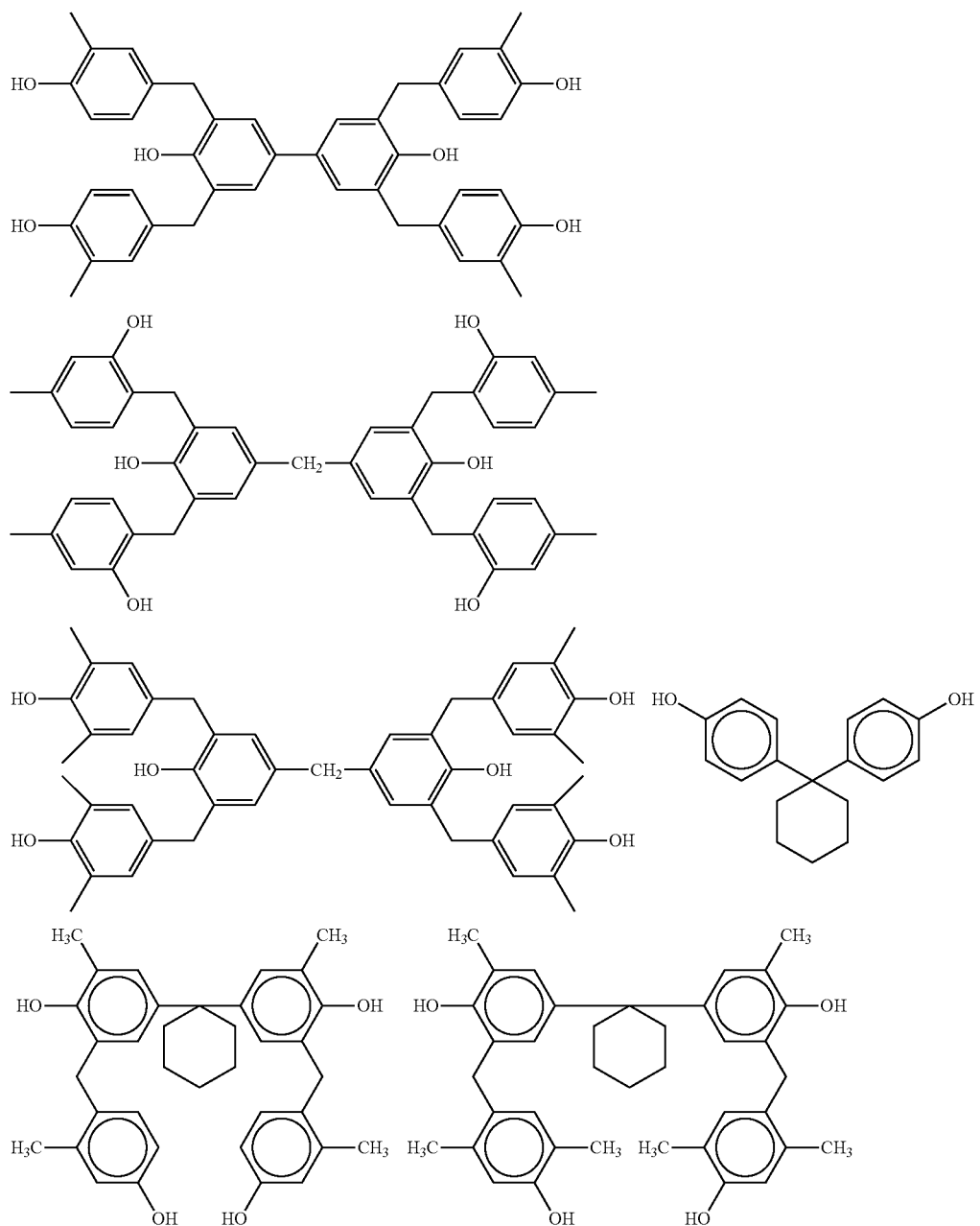

-continued
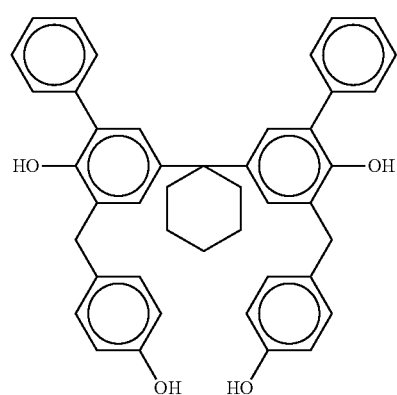
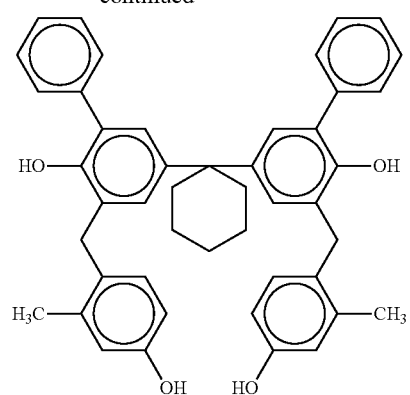
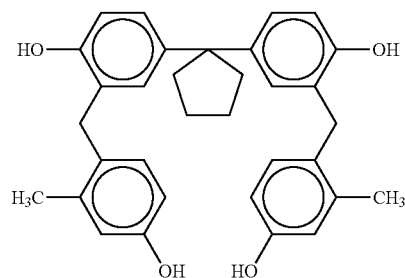
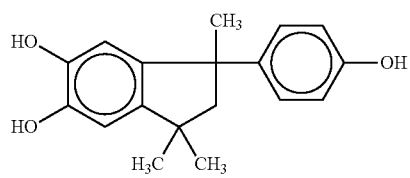
[Chem. 50]
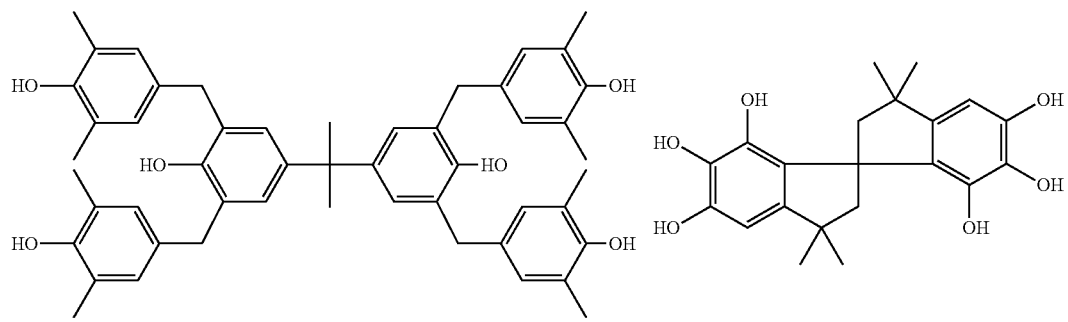
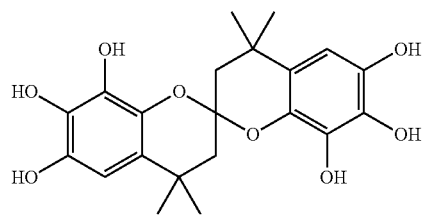
[Chem. 51]
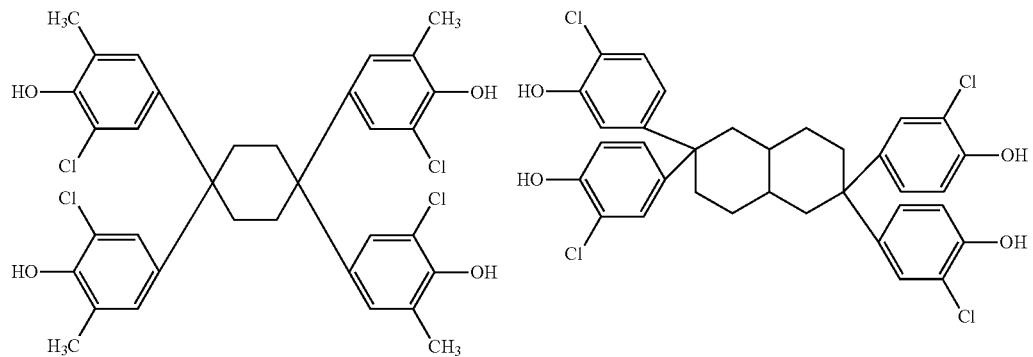

-continued
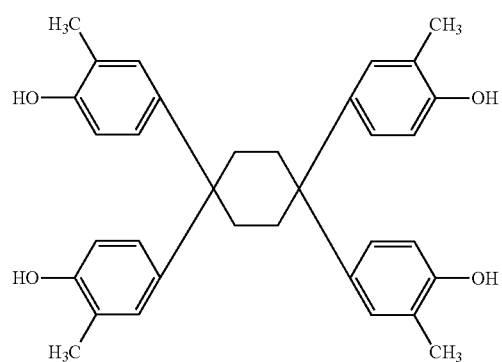
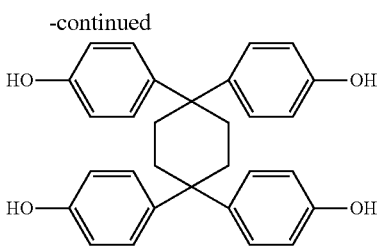
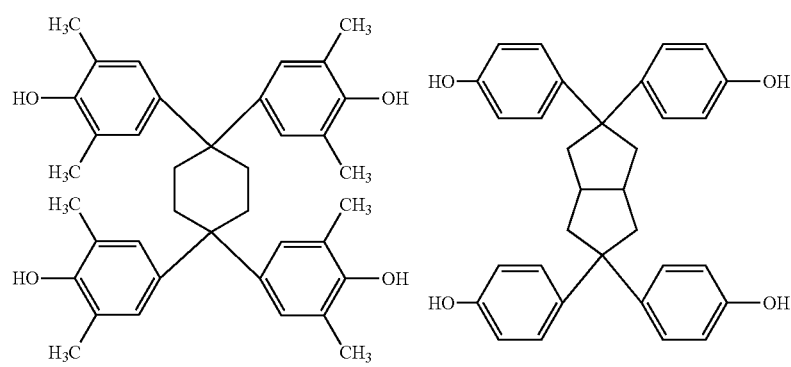
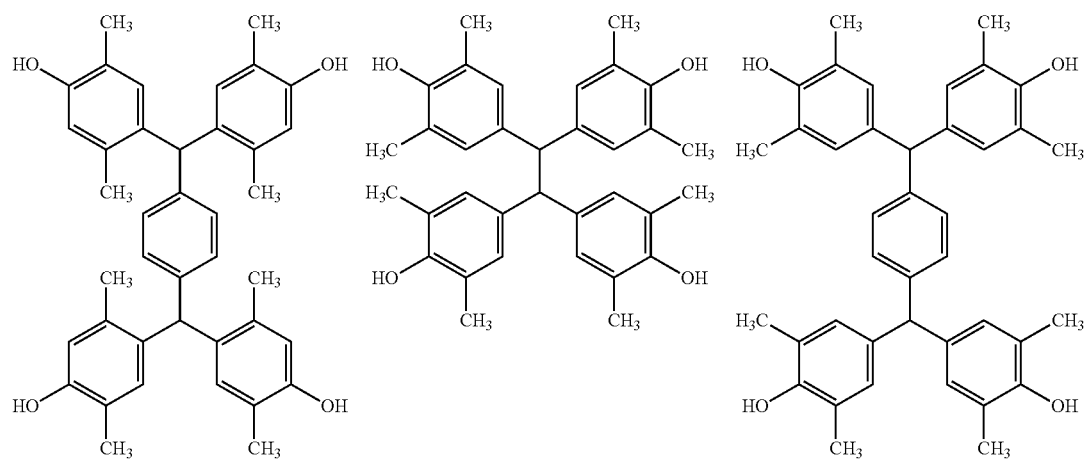
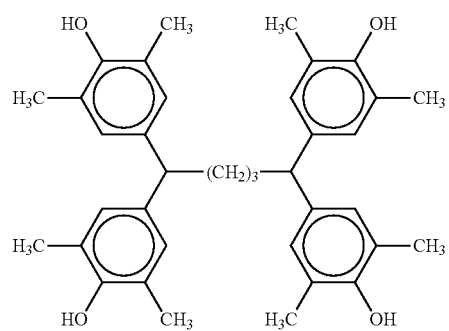

-continued
[Chem. 52]
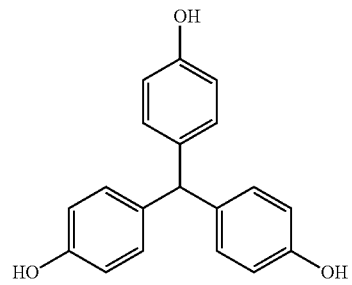
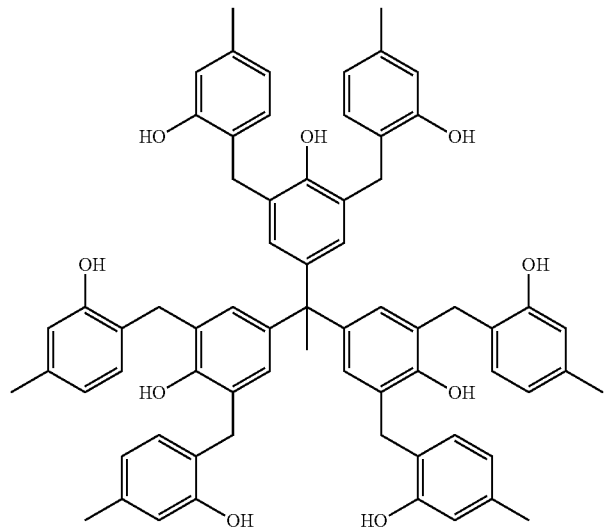
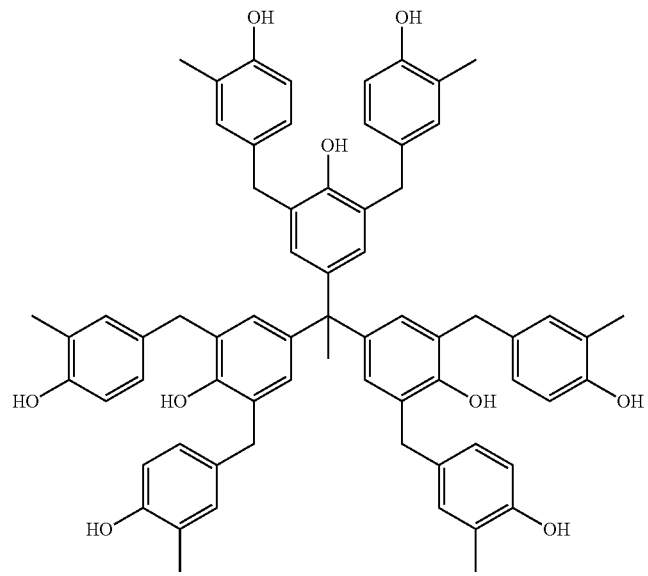
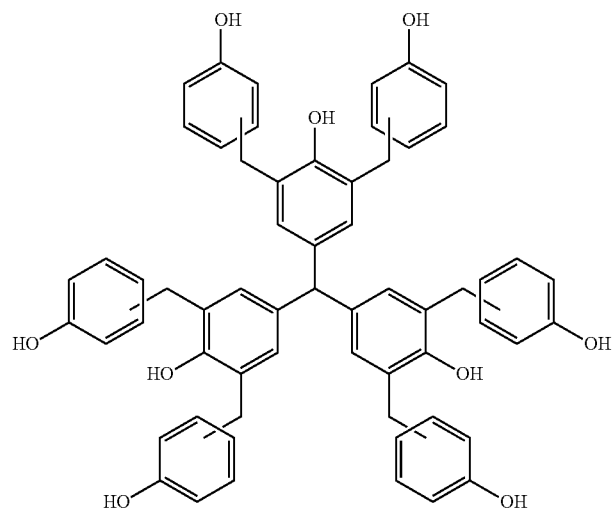
Mixture of ortho-substituted
and para-substituted
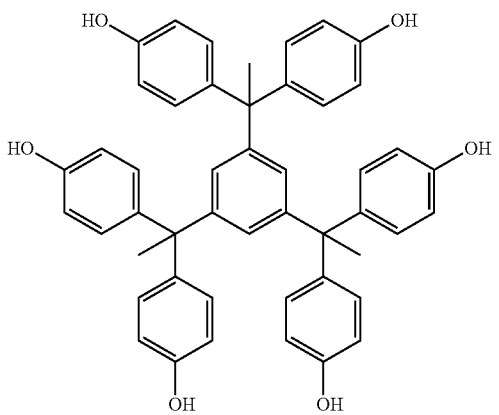

-continued
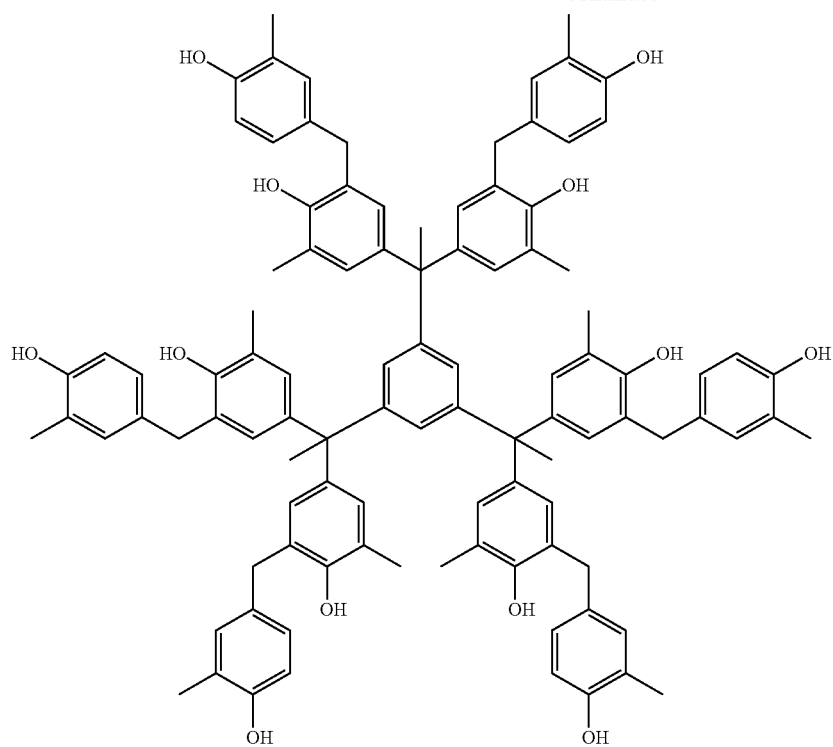
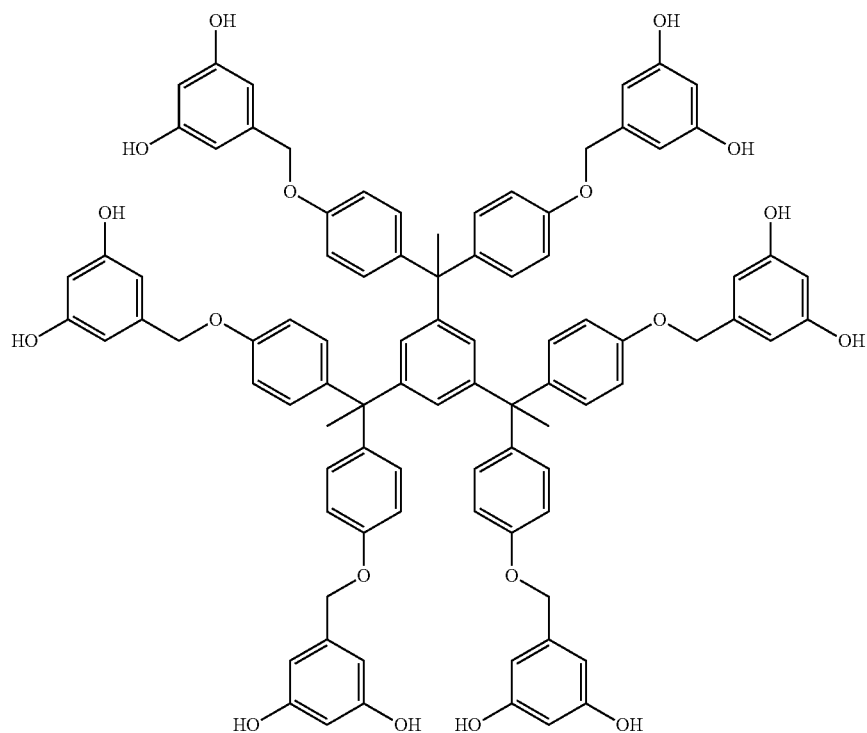

-continued
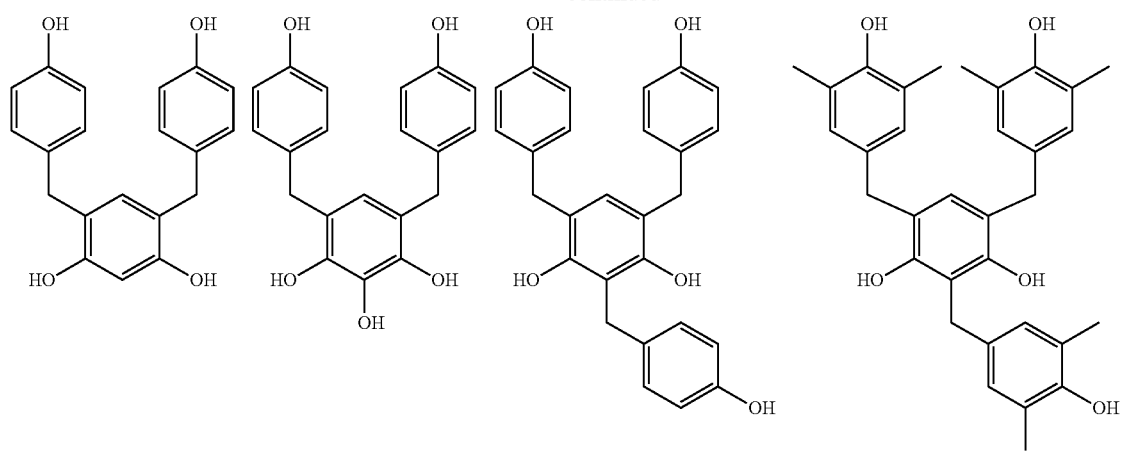
[Chem. 53]
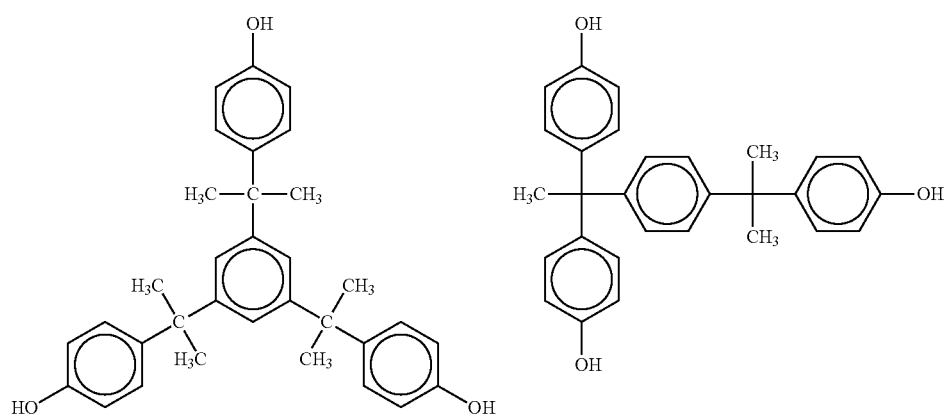
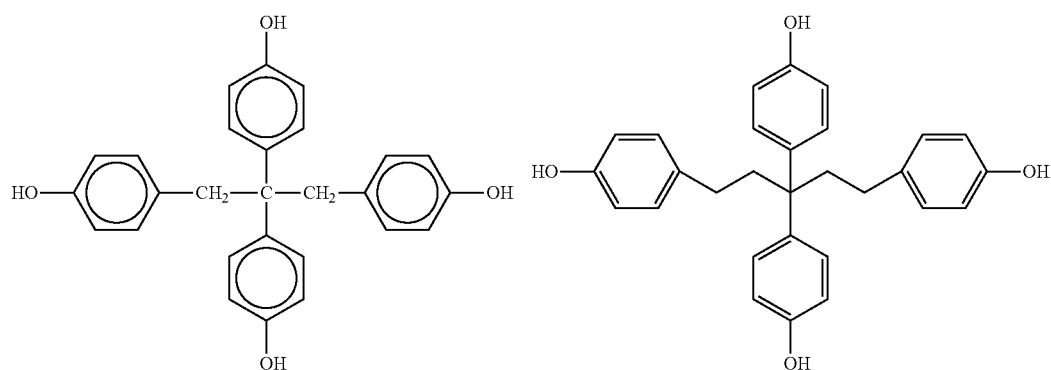
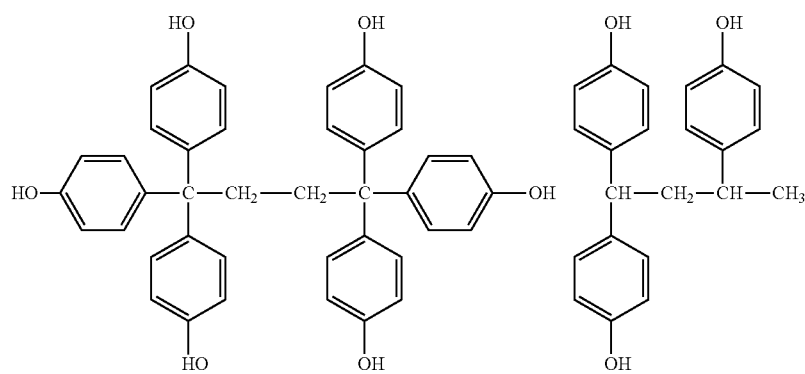

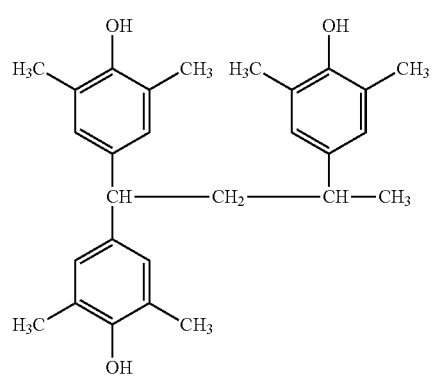
[Chem. 54]
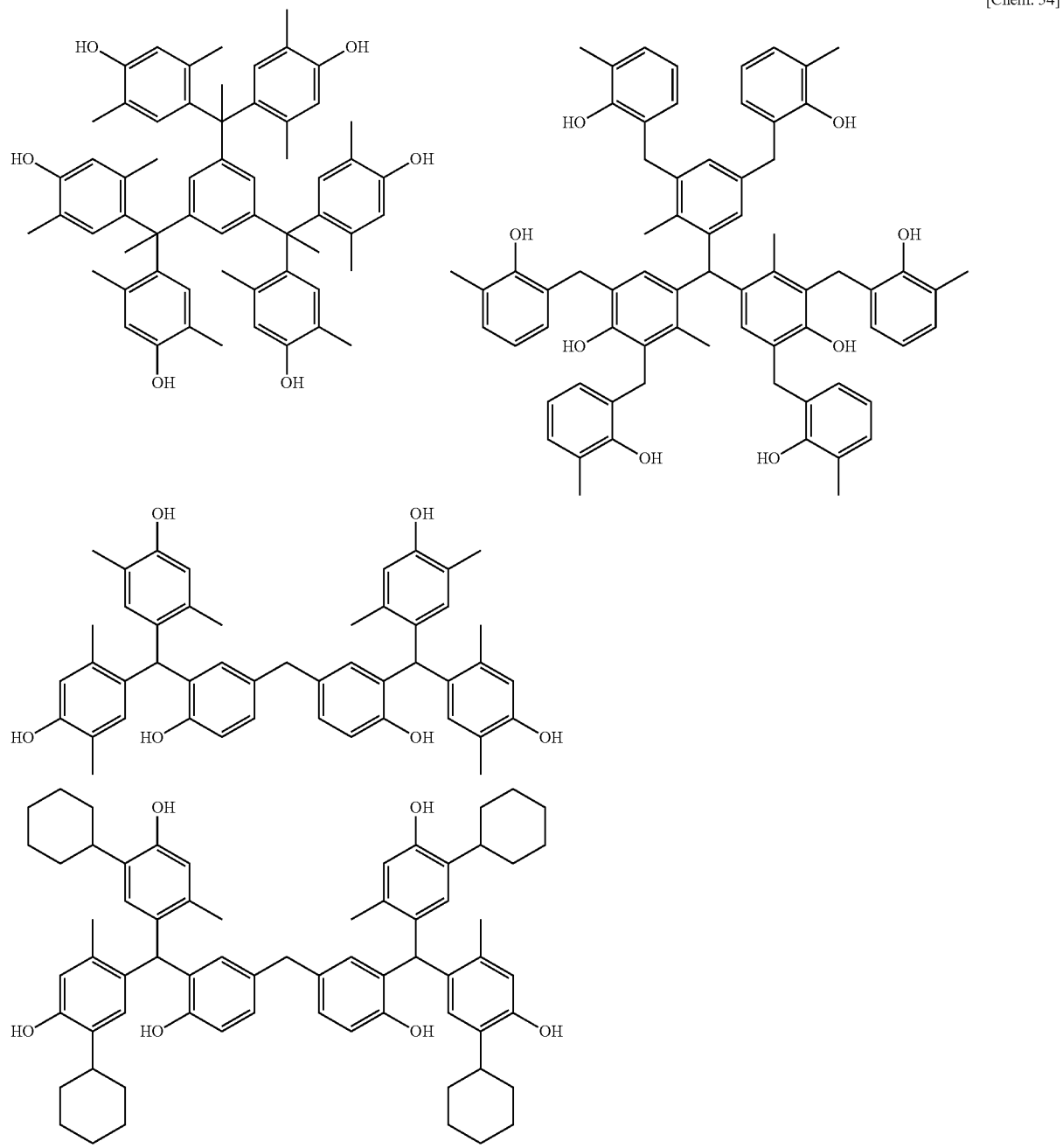

Next, specific examples of the mother nucleus compound of the compound (P) represented by General Formula (T-II) will be shown, but the present invention is not limited thereto.

[Chem. 55]

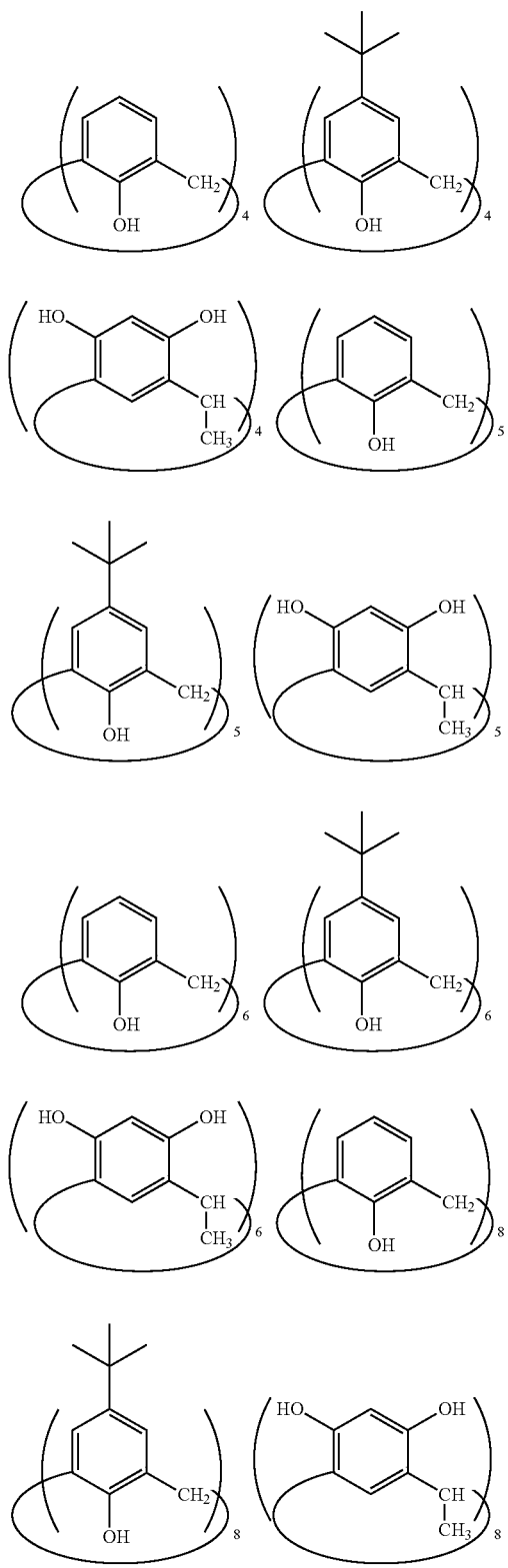

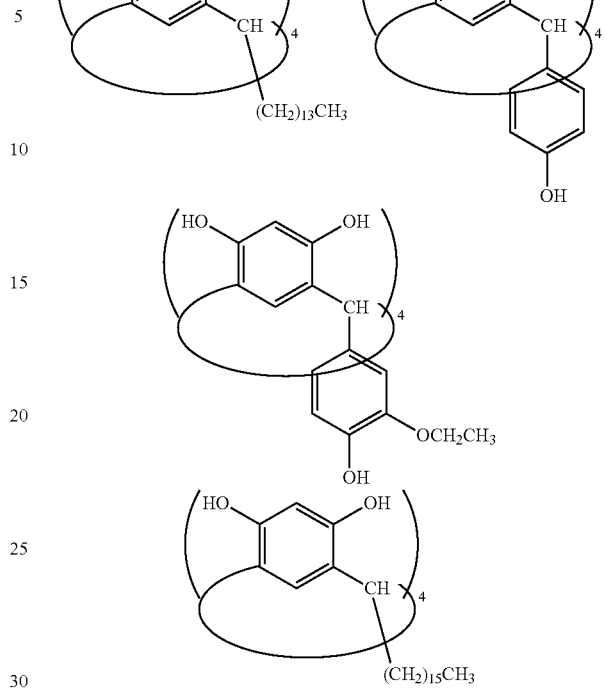

<Other Components>

The composition according to the present invention may further contain a basic compound, an acid-degradable resin, a photoacid generator, an organic solvent, a surfactant, an acid-degradable dissolution inhibiting compound, a dye, a plasticizer, a photosensitizer, a compound accelerating dissolution in a developer, a compound having a proton acceptor functional group, and the like.

[2] Basic Compound

The composition according to the present invention may further contain a basic compound. If the composition further contains a basic compound, the change in performance caused over time from exposure to bake can be further reduced, and the acid generated by exposure can be inhibited from being diffused into a film.

The basic compound is preferably a nitrogen-containing organic compound. The usable compound is not particularly limited, and for example, compounds classified into the following (1) to (4) can be used.

(1) Compound Represented by the Following General Formula (BS-1)

[Chem. 56]

(BS-1)

In General Formula (BS-1),
each R independently represents a hydrogen atom or an organic group. Here, at least one of three Rs is an organic group. This organic group is a linear or branched alkyl group, a monocyclic or polycyclic cycloalkyl group, an aryl group, or an aralkyl group.

Though not particularly limited, the number of carbon atoms that the alkyl group represented by R has is generally from 1 to 20 and preferably from 1 to 12.

Though not particularly limited, the number of carbon atoms that the cycloalkyl group represented by R has is generally from 3 to 20 and preferably from 5 to 15.

Though not particularly limited, the number of carbon atoms that the aryl group represented by R has is generally from 6 to 20, and preferably from 6 to 10. Specific examples of the aryl group include a phenyl group, a naphthyl group, and the like.

Though not particularly limited, the number of carbon atoms that the aralkyl group represented by R has is generally from 7 to 20 and preferably from 7 to 11. Specific examples of the aralkyl group include a benzyl group and the like.

In the alkyl group, the cycloalkyl group, the aryl group, and the aralkyl group represented by R, a hydrogen atom may be substituted with a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group, and the like.

In the compound represented by General Formula (BS-1), at least two of Rs are preferably organic groups.

Specific examples of the compound represented by General Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecyl amine, N,N-dimethyldodecylamine, methyldioctadecylamine, N,N-dibutylaniline, N,N-dihexylaniline, 2,6-diisopropylaniline, and 2,4,6-tri(t-butyl)aniline.

Examples of preferable basic compounds represented by General Formula (BS-1) include a compound in which at least one R is an alkyl group substituted with a hydroxyl group. Specific examples thereof include triethanolamine and N-dihydroxyethylaniline.

The alkyl group represented by R may have an oxygen atom in an alkyl chain. That is, an oxyalkylene chain may be formed. The oxyalkylene chain is preferably —$CH_2CH_2O$—. Specific examples thereof include tris(methoxyethoxyethyl) amine and compounds exemplified from Line 60 of Column 3 in U.S. Pat. No. 6,040,112A.

(2) Compound Having Nitrogen-Containing Heterocyclic Structure

The nitrogen-containing heterocycle may or may not be aromatic, and may have a plurality of nitrogen atoms. This heterocycle may also contain hetero atoms other than nitrogen. Specific examples thereof include compounds having an imidazole structure (2-phenylbenzimidazole, 2,4,5-triphenylimidazole, and the like), compounds having a piperidine structure (N-hydroxyethylpiperidine, bis(1,2,2,6,6-pentamethyl-4-piperidyl)sebacate, and the like), compounds having a pyridine structure (4-dimethylaminopyridine and the like), and compounds having an antipyrine structure (antipyrine, hydroxyantipyrine, and the like).

In addition, compounds having two or more ring structures are preferably used, and specific examples thereof include 1,5-diazabicyclo[4.3.0]nona-5-ene and 1,8-diazabicyclo[5.4.0]-undeca-7-ene.

(3) Amine Compound Having Phenoxy Group

An amine compound having a phenoxy group is a compound that has a phenoxy group at an end positioned opposite to an N atom of an alkyl group contained in an amine compound. The phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group.

This compound more preferably has at least one oxyalkylene chain between a phenoxy group and a nitrogen atom. The number of the oxyalkylene chain in a single molecule is preferably from 3 to 9, and more preferably from 4 to 6. Among the oxyalkylene chains, —$CH_2CH_2O$— is particularly preferable.

Specific examples of the compound include 2-[2-{2-(2,2-dimethoxy-phenoxyethoxy)ethyl}-bis-(2-methoxyethyl)]-amine and compounds (C1-1) to (C3-3) exemplified in Paragraph [0066] of US2007/0224539A1.

(4) Ammonium Salt

An ammonium salt can also be appropriately used. This ammonium salt is preferably a hydroxide or a carboxylate. More specifically, the ammonium salt is preferably a tetraalkylammonium hydroxide such as tetrabutyl ammonium hydroxide.

In addition, examples of compounds usable for the composition of the present invention include compounds synthesized in examples of JP2002-363146A, compounds disclosed in Paragraph [0108] of JP2007-298569A, and the like.

As the basic compound, a photosensitive basic compound may also be used. As the photosensitive basic compound, compounds disclosed in, for example, JP2003-524799A and J. Photopolym. Sci & Tech. Vol. 8, pp. 543-553 (1995) can be used.

The molecular weight of the basic compound is preferably from 250 to 2000 and more preferably from 400 to 1000.

These basic compounds may be used alone, or two or more kinds thereof may be used in combination.

When the composition according to the present invention further contains the basic compound, the content of the basic compound is generally from 0.001% by mass to 10% by mass, and preferably from 0.01% by mass to 5% by mass, based on the total solid contents of the composition.

The molar ratio of the photoacid generator described later to the basic compound is preferably from 1.5 to 300. That is, from the viewpoint of improving sensitivity and resolution, the molar ratio is preferably 1.5 or higher, and from the viewpoint of inhibiting resolution deterioration caused by pattern thickening that occurs before a post exposure bake, the molar ratio is preferably 300 or lower. The molar ratio is more preferably from 2.0 to 200, and even more preferably from 2.5 to 150.

When the compound (P) contains the repeating unit represented by the General Formula (4) described above, the photoacid generator in the above molar ratio is based on the total amount of the repeating unit and the photoacid generator described later.

[3] Acid Degradable Resin

The composition according to the present invention may further contain a resin of which a dissolution rate in an alkaline developer is increased due to the degradation of the resin caused by the action of an acid, that is, an acid-degradable resin, in addition to the compound (P).

The acid-degradable resin typically has a group (hereinbelow, also referred to as an acid-degradable group) that is degraded by the action of an acid and generates an alkali-soluble group. This resin may have the acid-degradable group on one of or both the main chain and side chain. It is preferable that the resin have the acid-degradable group on the side chain.

As disclosed in EP254853B, JP1990-25850A (JP-H02-25850A), JP1991-223860A (JP-H03-223860A), and JP1992-251259A (JP-H04-251259A), the acid-degradable group can be obtained by, for example, causing a precursor of a group that is eliminated by the action of an acid to react with an alkali-soluble resin or copolymerizing an alkali-soluble resin monomer binding to a group eliminated by the action of an acid with various monomers.

As the acid-degradable group, groups obtained by substituting a hydrogen atom of alkali-soluble groups such as —COOH and —OH with a group eliminated by the action of an acid are preferable.

Specific and preferable examples of the acid-degradable group include the same ones as "OY$^1$" of General Formula (3) in the resin (P) and "COOY$^2$" in General Formula (4).

The alkali-soluble resin is not particularly limited, but examples thereof include a resin containing a phenolic hydroxyl group and a resin containing a repeating unit having a carboxyl group such as (meth)acrylic acid and norbornene carboxylic acid.

Preferable examples of the resin containing a phenolic hydroxyl group include poly(o-hydroxystyrene), poly(m-hydroxystyrene), poly(p-hydroxystyrene), and a copolymer of the same; hydrogenated poly(hydroxystyrene); poly(hydroxystyrene)s having a substituent represented by the following structure; a styrene-hydroxystyrene copolymer; an α-methylsytrene-hydroxystyrene copolymer; and an alkali-soluble resin having a hydroxystyrene structural unit, such as a hydrogenated novolac resin.

[Chem. 57]

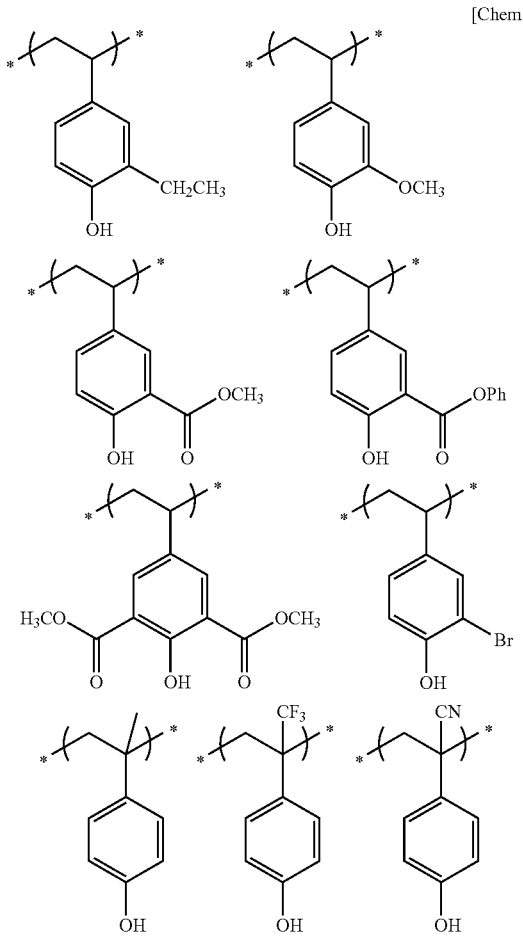

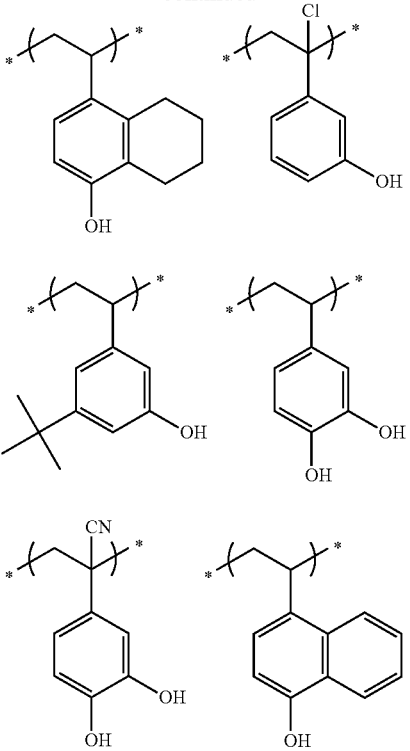

-continued

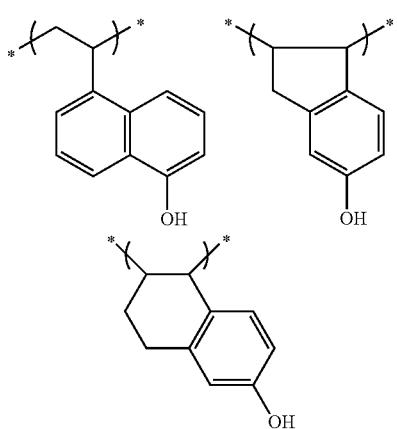

When measured at 23° C. by using 2.38% by mass tetramethylammonium hydroxide (TMAH), an alkali dissolution rate of these alkali-soluble resins is preferably 170 Å/sec or higher, and more preferably 330 Å/sec or higher. More specifically, only an alkali-soluble resin is dissolved in a solvent such as propylene glycol monomethyl ether acetate (PG-MEA) so as to prepare a composition with a solid content concentration of 4% by mass, this composition is coated onto a silicon wafer to form a coating film (film thickness of 100 nm), and the time (sec) taken for this coating film to be completely dissolved in an aqueous TMAH solution is measured, whereby the alkali dissolution rate can be obtained.

Examples of monomers that can be employed as the raw material of these resins include an alkylcarbonyloxystyrene (for example, t-butoxycarbonyloxystyrene), an alkoxystyrene (for example, 1-alkoxyethoxystyrene or t-butoxystyrene), and a (meth)acrylic acid tertiary alkyl ester (for example, t-butyl (meth)acrylate, 2-alkyl-2-adamantyl (meth)acrylate, or dialkyl(1-adamantyl)methyl (meth)acrylate).

When the composition according to the present invention is irradiated with a KrF excimer laser light, an electron beam, X-rays, or high energy rays (for example, EUV) having a wavelength of 50 nm or less, the acid-degradable resin preferably contains a repeating unit having an aromatic group. Particularly, the acid-degradable resin preferably contains hydroxystyrene as a repeating unit. Examples of such a resin include a copolymer of hydroxystyrene and hydroxystyrene protected with a group eliminated by the action of an acid, and a copolymer of hydroxystyrene and a (meth)acrylic acid tertiary alkyl ester.

As the acid-degradable resin, a resin having a repeating unit represented by the General Formula (3) is particularly preferable.

The acid-degradable resin may have a repeating unit derived from other monomers. Examples of other monomers include those described above as other polymerizable monomers that the resin (P) may contain. The content of the repeating units derived from other polymerizable monomers is generally 50 mol % or less and preferably 30 mol % or less, based on the total repeating units.

The acid-degradable resin may contain a repeating unit having an alkali-soluble group such as a hydroxyl group, a carboxyl group, and a sulfonic acid group, and in this case, the content of the repeating units having an alkali-soluble group is preferably from 1 mol % to 99 mol %, more preferably from 3 mol % to 95 mol %, and particularly preferably from 5 mol % to 90 mol %, based on the total repeating units constituting the acid-degradable resin.

The content of the repeating units having an acid-degradable group is preferably from 3 mol % to 95 mol %, more preferably from 5 mol % to 90 mol %, and particularly preferably from 10 mol % to 85 mol %, based on the total repeating units constituting the acid-degradable resin.

The weight average molecular weight of the acid-degradable resin is preferably 50,000 or less, more preferably from 1,000 to 20,000, and particularly preferably from 1,000 to 10,000 expressed in terms of polystyrene by a GPC method (solvent: THF).

The dispersity (Mw/Mn) of the acid-degradable resin is preferably from 1.0 to 3.0, more preferably from 1.05 to 2.0, and even more preferably from 1.1 to 1.7.

The acid-degradable resin may be used in combination of two or more kinds thereof.

Preferable specific examples of the acid-degradable resin are shown below, but the present invention is not limited thereto.

[Chem. 58]

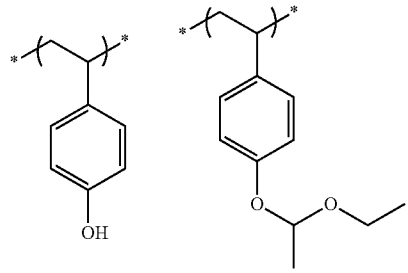

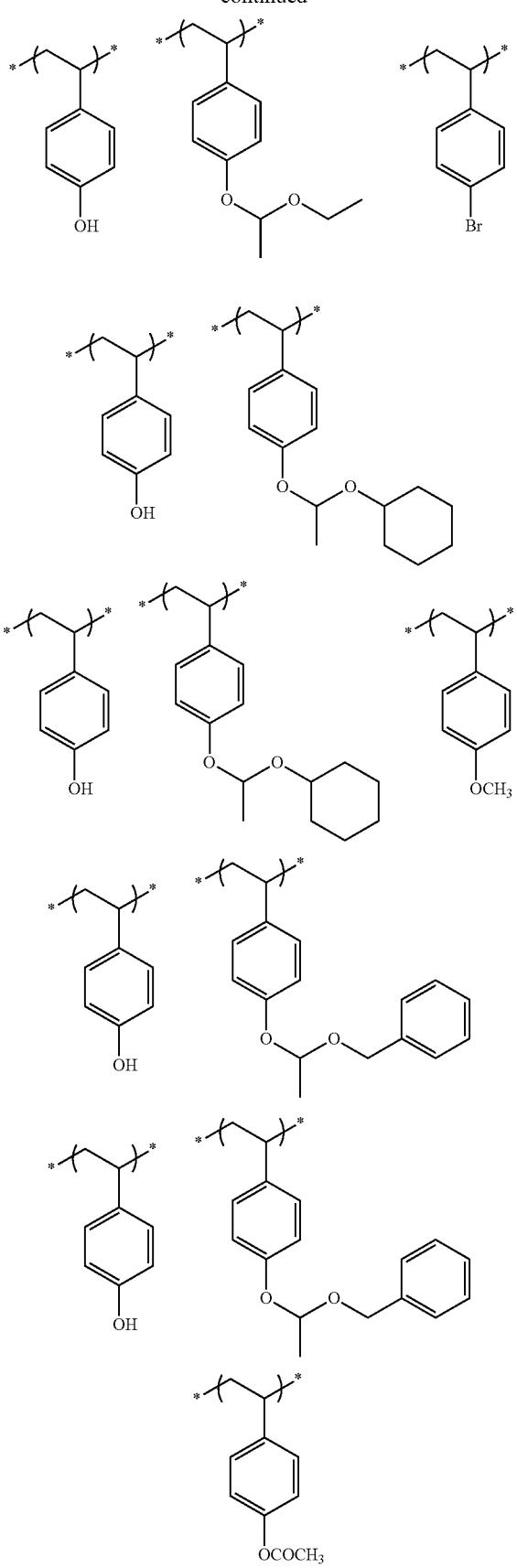

149
-continued
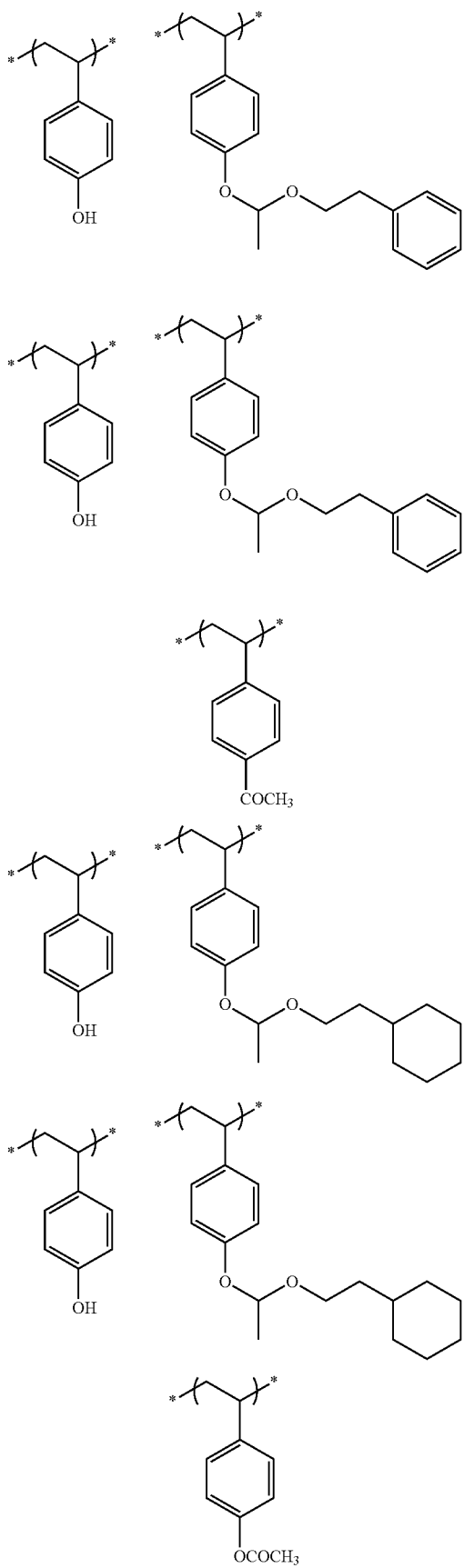
150
-continued
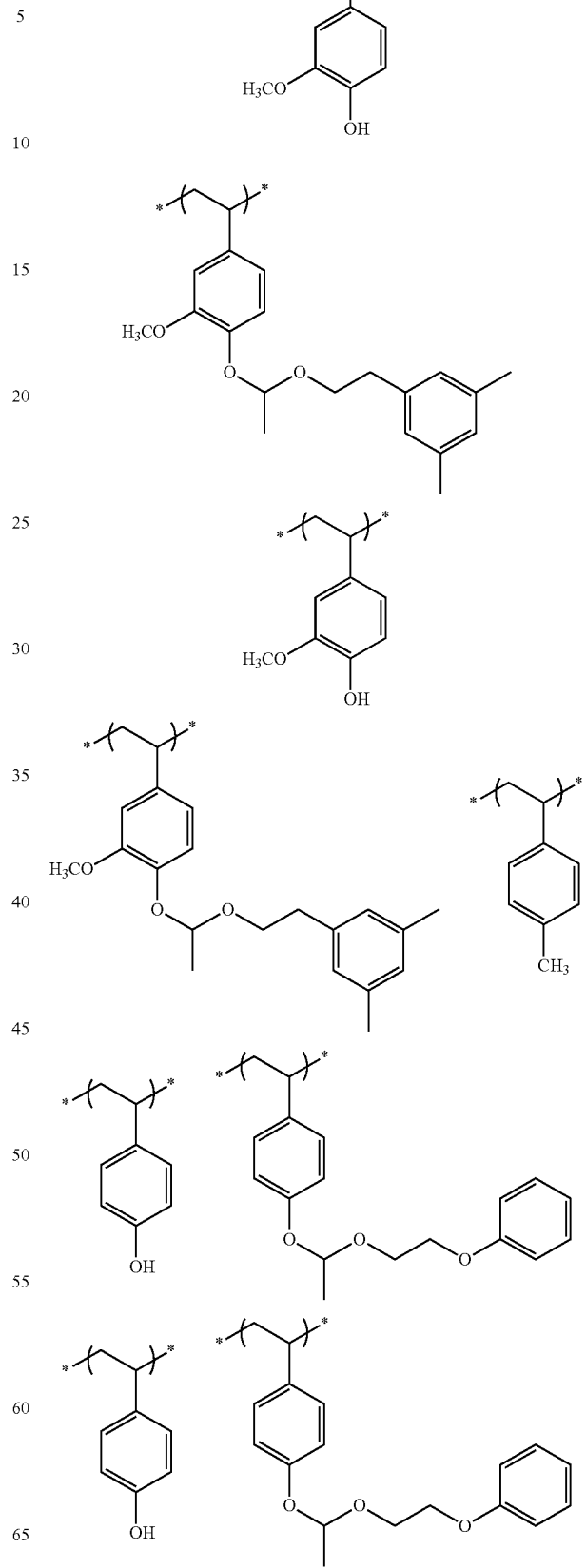

151
-continued
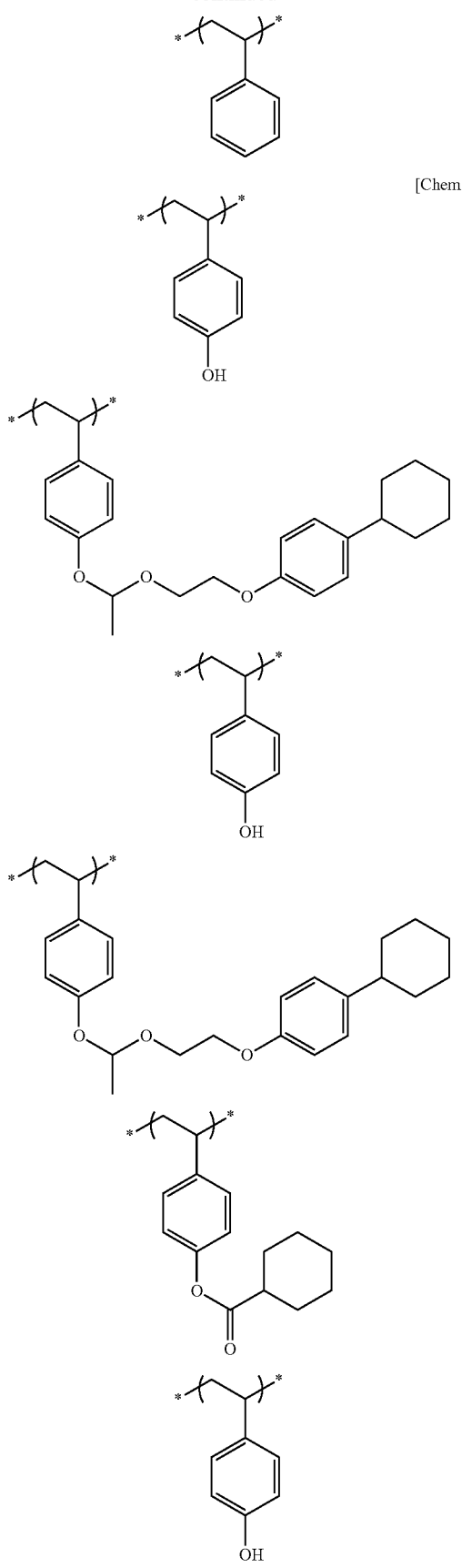
[Chem. 59]
152
-continued
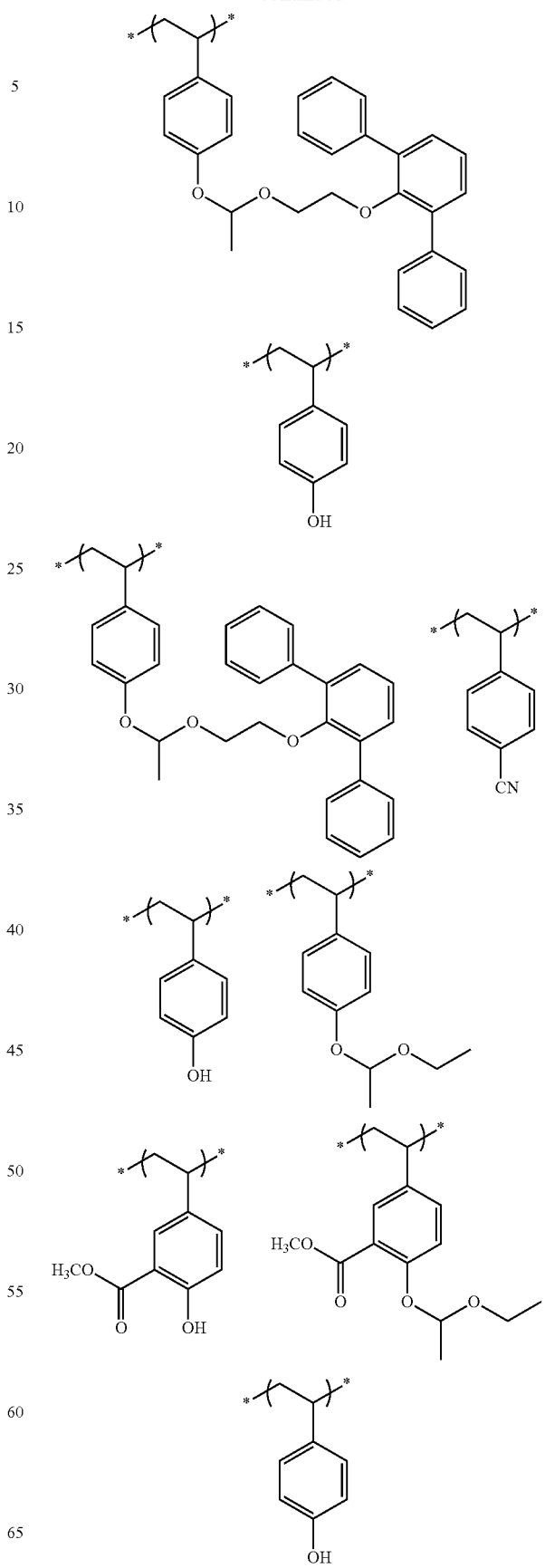

153
-continued
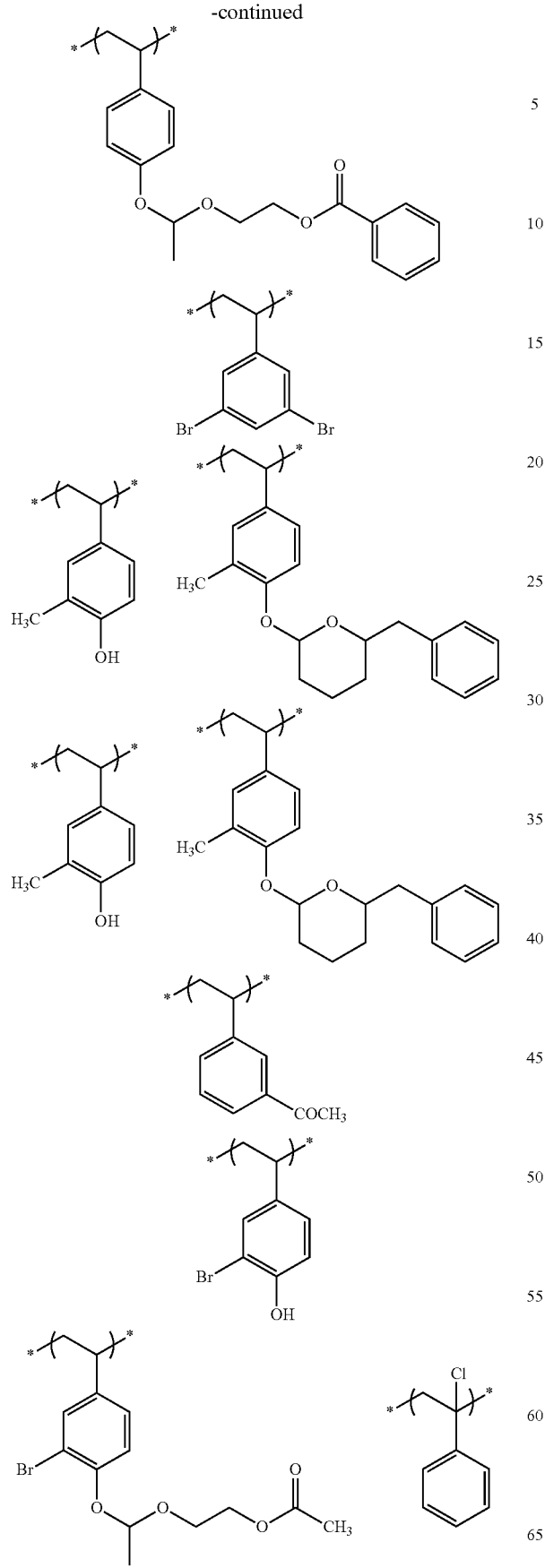
154
-continued
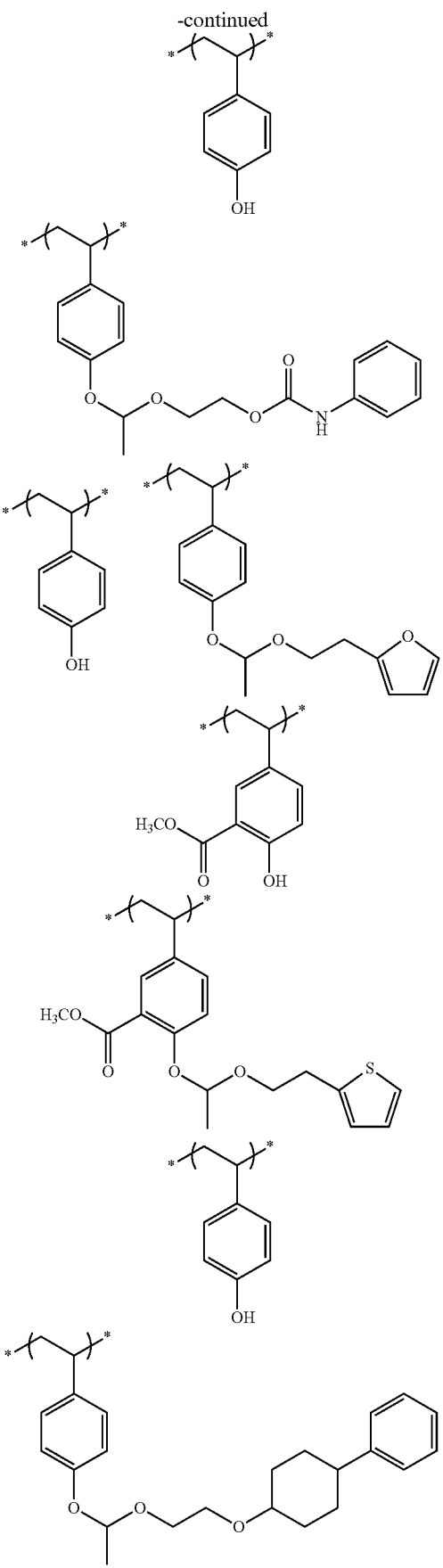

-continued

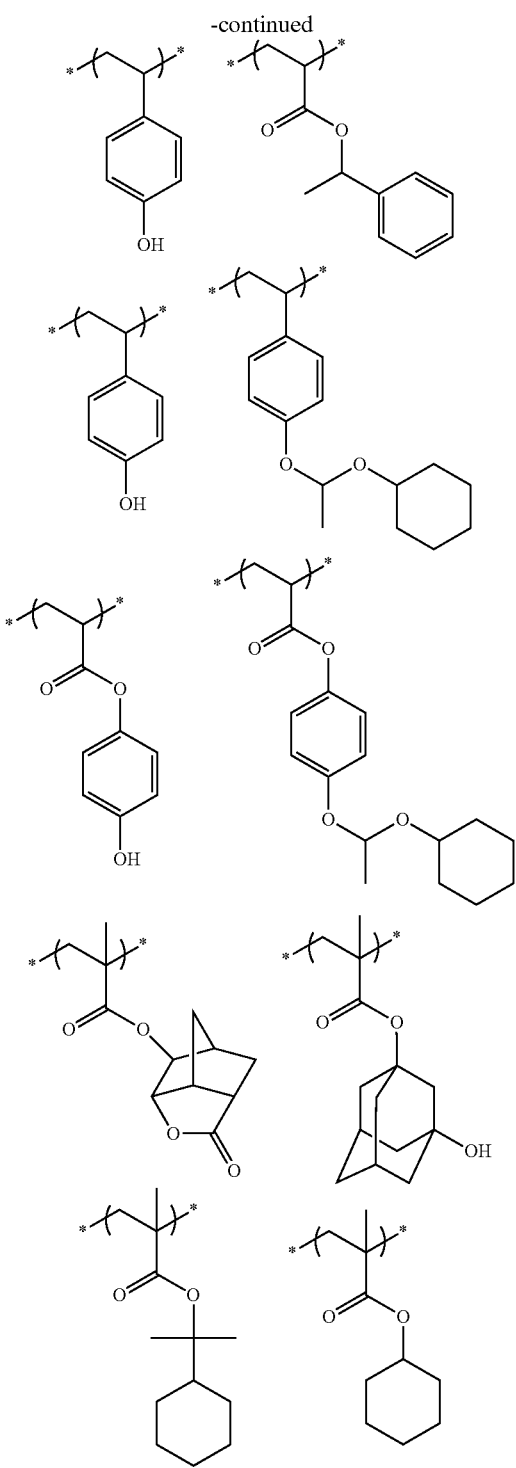

When the composition according to the present invention further contains a resin other than the compound (P), the content of the resin is preferably from 0.5% by mass to 80% by mass, more preferably from 5% by mass to 50% by mass, and even more preferably from 10% by mass to 30% by mass, based on the total solid contents of the composition.

The composition according to the present invention may use a resin that contains a repeating unit generating an acid by actinic ray irradiation or radiation irradiation and a repeating unit containing a group of which solubility in an alkaline developer is increased by degradation caused by the action of an acid, in addition to the compound (P). Examples of resins preferably used as such a resin include resins exemplified in JP1997-325497A (JP-H09-325497A), JP2009-93137A, JP2010-85971A, JP2011-256856A, and the like.

[4] Photoacid Generator

A photoacid generator is a compound that generates an acid by being irradiated with actinic rays or radiation. As the photoacid generator, a photoinitiator of cationic photopolymerization, a photoinitiator of radical photopolymerization, a photodecolorant of dyes, a photodiscoloring agent, a known compound that is used for a micro resist or the like and generates an acid by being irradiated with actinic rays or radiation, and a mixture of the same can be appropriately selected and used. Examples of the photoacid generator include a sulfonium salt, an iodonium salt, bis(alkylsulfonyl)diazomethane, and the like.

Preferable examples of the photoacid generator include compounds represented by the following General Formulae (ZI), (ZII), and (ZIII).

[Chem. 60]

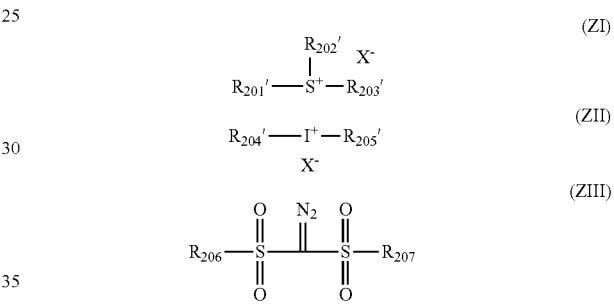

In the General Formula (ZI), each of $R_{201}'$, $R_{202}'$, and $R_{203}'$ independently represents an organic group. The organic group represented by $R_{201}'$, $R_{202}'$, or $R_{203}'$ has, for example, 1 to 30 carbon atoms, and preferably has 1 to 20 carbon atoms.

Two of $R_{201}'$ to $R_{203}'$ may form a ring by binding to each other via a single bond or a linking group. In this case, examples of the linking group include an ether bond, a thioether bond, an ester bond, an amide bond, a carbonyl group, a methylene group, and an ethylene group. Examples of the group that two of $R_{201}'$ to $R_{203}'$ form by binding to each other include an alkylene group such as a butylene group and a pentylene group.

Specific examples of $R_{201}'$, $R_{202}'$, and $R_{203}'$ include the corresponding groups in a compound (ZI-1), (ZI-2) or (ZI-3) described later.

$X^-$ represents a non-nucleophilic anion. Examples of $X^-$ include a sulfonic acid anion, a bis(alkylsulfonyl)amide anion, a tris(alkylsulfonyl)methide anion, $BF_4^-$, $PF_6^-$, and $SbF_6^-$. $X^-$ is preferably an organic anion containing a carbon atom. Examples of preferable organic anions include organic anions represented by the following AN1 to AN3.

[Chem. 60]

-continued

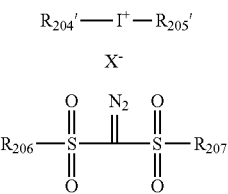

In Formulae AN1 to AN3, each of $Rc_1$ to $Rc_3$ independently represents an organic group. Examples of the organic group include organic groups having 1 to 30 carbon atoms. The organic group is preferably an alkyl group, an aryl group, or a group formed of a plurality of alkyl groups or aryl groups connected to each other via a single bond or a linking group. Examples of the linking group include —O—, —$CO_2$—, —S—, —$SO_3$—, and —$SO_2N(Rd_1)$—. Herein, $Rd_1$ represents a hydrogen atom or an alkyl group and may form a ring together with the alkyl group or the aryl group binding to $Rd_1$.

The organic groups represented by $Rc_1$ to $Rc_3$ may be either alkyl groups in which the first position is substituted with a fluorine atom or a fluoroalkyl group or phenyl groups substituted with a fluorine atom or a fluoroalkyl group. If the organic group contains a fluorine atom or a fluoroalkyl group, the acidity of an acid generated by light irradiation can be increased. Consequently, the sensitivity of the actinic ray-sensitive or radiation-sensitive resin composition can be improved. In addition, $Rc_1$ to $Rc_3$ may form a ring by binding to another alkyl group, aryl group, and the like.

Examples of preferable $X^-$ include a sulfonic acid anion representd by the following General Formula (SA1) or (SA2).

[Chem. 62]

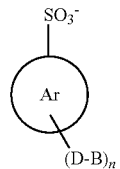

In Formula (SA1),

Ar represents an aryl group which may further have a substituent other than a sulfonic acid anion and a -(D-B) group;

n represents an integer of 0 or greater, and n is preferably from 1 to 4, more preferably from 2 to 3, and most preferably 3;

D represents a single bond or a divalent linking group, and examples of the divalent linking group include an ether group, a thioether group, a carbonyl group, a sulfoxide group, a sulfone group, a sulfonic acid ester group, an ester group, groups including a combination of two or more kinds of these groups, and the like; and B represents a hydrocarbon group.

[Chem. 63]

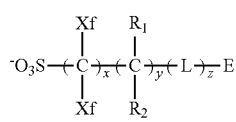

In Formula (SA2), each Xf independently represents a fluorine atom or an alkyl group substituted with at least one fluorine atom;

each of $R_1$ and $R_2$ independently represents a hydrogen atom, a fluorine atom, or an alkyl group, and when there is a plurality of $R_1$s and $R_2$s, each of $R_1$s and $R_2$s may be the same as or different from each other;

L represents a divalent linking group, and when there is a plurality of Ls, Ls may be the same as or different from each other;

E represents a cyclic organic group;

x represents an integer of from 1 to 20;

y represents an integer of from 0 to 10; and z represents an integer of from 0 to 10.

First, the sulfonic acid anion represented by Formula (SA1) will be described in detail.

In Formula (SA1), Ar is preferably an aromatic ring having 6 to 30 carbon atoms. Specifically, Ar is, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring. Among these, from the viewpoint of making roughness improvement compatible with sensitivity increase, a benzene ring, a naphthalene ring, or an anthracene ring is preferable, and a benzene ring is more preferable.

When Ar further has a substituent other than a sulfonic acid anion and a -(D-B) group, examples of the substituent include a halogen atom such as a fluorine atom, a chlorine atom, a bromine atom, and an iodine atom; a hydroxyl group; a carboxyl group; and a sulfonic acid group.

In Formula (SA1), D is preferably a single bond, an ether group, or an ester group, and more preferably a single bond.

In Formula (SA1), B is, for example, an alkyl group, an alkenyl group, an alkynyl, group, an aryl group, or a cycloalkyl group. B is preferably an alkyl group or a cycloalkyl group, and more preferably a cycloalkyl group. The alkyl group, the alkenyl group, the alkynyl group, the aryl group, or the cycloalkyl group represented by B may have a substituent.

The alkyl group represented by B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

Examples of the alkenyl group represented by B include a vinyl group, a propenyl group, and a hexenyl group.

Examples of the alkynyl group represented by B include a propynyl group, a hexynyl group, and the like.

Examples of the aryl group represented by B include a phenyl group and a p-tolyl group.

The cycloalkyl group represented by B may be a monocyclic or polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoryl group, a dicyclohexyl group, and a pinenyl group.

When the alkyl group, the alkenyl group, the alkynyl group, the aryl group, or the cycloalkyl group represented by B has a substituent, examples of the substituent include the following. That is, the examples include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkylthioxy group such as a methylthioxy group, an ethylthioxy group, and a tert-butylthioxy group; arylthioxy groups such as a phenylthioxy group and a p-tolylthioxy group; alkoxycarbonyl groups such as a methoxycarbonyl group, an butoxycarbonyl group, and a phenoxycarbonyl group; acetoxy groups; linear alkyl groups such as a methyl group, an ethyl group, a propyl group, a butyl group, a heptyl group, a hexyl group, a dodecyl group, and a 2-ethylhexyl group; branched alkyl groups; cycloalkyl groups such as a cyclohexyl group; alkenyl groups such as a vinyl group, a propenyl group, and a hexenyl group; acetylene groups; alkynyl groups such as a propynyl group and a hexynyl group; aryl groups such as a phenyl group and a tolyl group; hydroxyl groups; carboxyl groups; sulfonic acid groups; carbonyl groups; and the like. Among these, from the viewpoint of making roughness improvement compatible with sensitivity increase, linear and branched alkyl groups are preferable.

Next, the sulfonic acid anion represented by Formula (SA2) will be described in detail.

In Formula (SA2), Xf is a fluorine atom or an alkyl group which is substituted with at least one fluorine atom. This alkyl group preferably has 1 to 10 carbon atoms, and more preferably has 1 to 4 carbon atoms. The alkyl group substituted with a fluorine atom is preferably a perfluoroalkyl group.

Xf is preferably a fluorine atom or a perfluoroalkyl group which has 1 to 4 carbon atoms, Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$. Among these, a fluorine atom or $CF_3$ is preferable, and a fluorine atom is most preferable.

In Formula (SA2), each of $R_1$ and $R_2$ independently represents a hydrogen atom, a fluorine atom, or an alkyl group. The alkyl group may have a substituent (preferably a fluorine atom) and preferably has 1 to 4 carbon atoms. As the alkyl group represented by $R_1$ and $R_2$ that may have a substituent, a perfluoroalkyl group having 1 to 4 carbon atoms is preferable. Specifically, examples of the alkyl group represented by $R_1$ and $R_2$ that may have a substituent include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

In Formula (SA2), x is preferably from 1 to 8 and more preferably from 1 to 4. y is preferably from 0 to 4 and more preferably 0. z is preferably from 0 to 8 and more preferably from 0 to 4.

In Formula (SA2), L represents a single bond or a divalent linking group. Examples of the divalent linking group include —COO—, —OCO—, —CO—, —O—, —S—, —SO—, —SO$_2$—, an alkylene group, a cycloalkylene group, an alkenylene group, and a combinaction of two or more kinds of the same, and the divalent linking group preferably has 20 or less carbon atoms in total. Among these, —COO—, —OCO—, —CO—, —O—, —S—, —SO—, or —SO$_2$— is preferable, and —COO—, —OCO—, or —SO$_2$— is more preferable.

In Formula (SA2), E represents a cyclic organic group. Examples of E include a cyclic aliphatic group, an aryl group, and a heterocyclic group.

The cyclic aliphatic group represented by E may have a monocyclic structure or a polycyclic structure. As the cyclic aliphatic group having a monocyclic structure, monocyclic cycloalkyl groups such as a cyclopentyl group, a cyclohexyl group, and a cyclooctyl group are preferable. As the cyclic aliphatic group having a polycyclic structure, polycyclic cycloalkyl groups such as a norbornyl group, a tricyclodecanyl group, a tetracyclodecanyl group, a tetracyclododecanyl group, and an adamantyl group are preferable. Particularly, when a cyclic aliphatic group having a bulky structure constituted by a 6- or more membered ring is employed as E, this group is inhibited from being diffused into the film in a PEB (Post Exposure Bake) step, and the resolution and EL (Exposure Latitude) can be further improved.

The aryl group represented by E is, for example, a benzene ring, naphthalene ring, a phenanthrene ring, or an anthracene ring.

The heterocyclic group represented by E may or may not be aromatic. As a hetero atom contained in this group, a nitrogen atom or an oxygen atom is preferable. Specific examples of the heterocyclic structure include a furan ring, a thiophene ring, a benzofuran ring, a benzothiophene ring, a dibenzofuran ring, a dibenzothiophene ring, a pyridine ring, a piperidine ring, a morpholine ring, and the like. Among these, a furan ring, a thiophene ring, a pyridine ring, a piperidine ring, and a morpholine ring are preferable.

E may have a substituent, and examples of the substituent include an alkyl group (any of linear, branched, cyclic alkyl groups preferably having 1 to 12 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group.

As the photoacid generator, a compound having a plurality of structures represented by General Formula (ZI) may be used. For example, the photoacid generator may be a compound having a structure in which at least one of $R_{201}'$ to $R_{203}'$ of the compound represented by General Formula (ZI) binds to at least one of $R_{201}'$ to $R_{203}'$ of another compound represented by General Formula (ZI).

Examples of more preferable (ZI) components include compounds (ZI-1) to (ZI-4) described below.

In the compound (ZI-1), at least one of $R_{201}'$ to $R_{203}'$ of the General Formula (ZI) is an aryl group. That is, the compound (ZI-1) is an arylsulfonium compound, in other words, a compound containing arylsulfonium as a cation.

In the compound (ZI-1), all of $R_{201}'$ to $R_{203}'$ may be aryl groups; alternatively, a portion of $R_{201}'$ to $R_{203}'$ may be aryl groups, and the remaining portion may be alkyl groups. When the compound (ZI-1) contains a plurality of aryl groups, these aryl groups may be the same as or different from each other.

Examples of the compound (ZI-1) include a triaryl sulfonium compound, diarylalkyl sulfonium compound, and an aryldialkyl sulfonium compound.

As the aryl group in the compound (ZI-1), a phenyl group, a naphthyl group, or heteroaryl groups such as an indole residue and a pyrrole residue are preferable, and a phenyl group, a naphthyl group, or an indole residue is particularly preferable.

As the alkyl group that the compound (ZI-1) optionally contains, linear or branched cycloalkyl groups having 1 to 15 carbon atoms are preferable, and examples thereof include a methyl group, an ethyl group, a propyl group, an n-butyl group, a sec-butyl group, a t-butyl group, a cyclopropyl group, a cyclobutyl group, and a cyclohexyl group.

This aryl group and this alkyl group may have a substituent. Examples of the substituent include an alkyl group (preferably having 1 to 15 carbon atoms), an aryl group (preferably having 6 to 14 carbon atoms), an alkoxy group (preferably having 1 to 15 carbon atoms), a halogen atom, a hydroxyl group, and a phenylthio group.

Examples of preferable substituents include a linear, branched, or cyclic alkyl group having 1 to 12 carbon atoms and a linear, branched, or cyclic alkoxy group having 1 to 12 carbon atoms. Examples of particularly preferable substituents include an alkyl group having 1 to 6 carbon atoms and an alkoxy group having 1 to 6 carbon atoms. The substituent may be substituted on any one or all of three of $R_{201}'$ to $R_{203}'$. When $R_{201}'$ to $R_{203}'$ are phenyl groups, the substituent is preferably substituted at a p-position by an aryl group.

An embodiment is also preferable in which one or two of $R_{201}'$, $R_{202}'$, and $R_{203}'$ are aryl groups which may have a substituent and the remaining groups are a linear, branched, or cyclic alkyl group. Specific examples of such a structure include the structures disclosed in Paragraphs [0141] to [0153] of JP2004-210670A.

At this time, the above-described aryl group is specifically the same as the aryl group represented by $R_{201}'$, $R_{202}'$, and $R_{203}'$, and is preferably a phenyl group or a naphthyl group. This aryl group preferably has any one of a hydroxyl group, an alkoxy group, and an alkyl group as a substituent. The substituent is more preferably an alkoxy group having 1 to 12 carbon atoms, and even more preferably an alkoxy group having 1 to 6 carbon atoms.

The linear, branched, or cyclic alkyl group as the above-described remaining group is preferably an alkyl group having 1 to 6 carbon atoms. These groups may further have a substituent. When there are two remaining groups described above, these two groups may form a ring structure by binding to each other.

The compound (ZI-1) is, for example, a compound represented by the following General Formula (ZI-1A).

[Chem. 64]

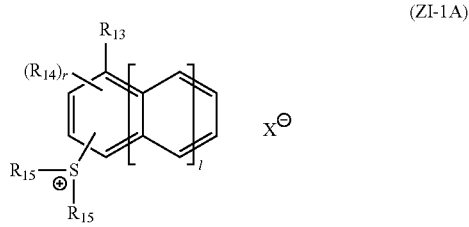

(ZI-1A)

In General Formula (ZI-1A), $R_{13}$ represents a hydrogen atom, a fluorine atom, a hydroxyl group, an alkyl group, a cycloalkyl group, an alkoxy group, a cycloalkyloxy group, or an alkoxycarbonyl group;

when there is a plurality of $R_{14}$s, each $R_{14}$ independently represents an alkyl group, a cycloalkyl group, an alkoxy group, an alkylsulfonyl group, or a cycloalkylsulfonyl group;

each $R_{15}$ independently represents an alkyl group or a cycloalkyl group, and two $R_{15}$s may form a ring structure by binding to each other;

l represents an integer of from 0 to 2;

r represents an integer of from 0 to 8; and $X^-$ represents a non-nucleophilic anion, and examples thereof include the same ones as described for $X^-$ in General Formula (ZI).

The alkyl group represented by $R_{13}$, $R_{14}$, or $R_{15}$ may be a linear or branched alkyl group. The alkyl group preferably has 1 to 10 carbon atoms, and examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group. Among these, a methyl group, an ethyl group, an n-butyl group, and a t-butyl group are particularly preferable.

Examples of the cycloalkyl group represented by $R_{13}$, $R_{14}$, or $R_{15}$ include a cyclic or polycyclic cycloalkyl group (preferably a cycloalkyl group having 3 to 20 carbon atoms). Examples thereof include cyclopropyl, cyclobutyl, cyclopentyl, cyclohexyl, cycloheptyl, cyclooctyl, cyclododecanyl, cyclopentenyl, cyclohexenyl, and cyclooctadienyl groups. Among these, cyclopropyl, cyclopentyl, cyclohexyl, cycloheptyl, and cyclooctyl groups are particularly preferable.

Examples of an alkyl group portion of the alkoxy group represented by $R_{13}$ or $R_{14}$ include those exemplified above as the alkyl group represented by $R_{13}$, $R_{14}$, or $R_{15}$. As the alkoxy group, a methoxy group, an ethoxy group, an n-propoxy group, and an n-butoxy group are particularly preferable.

Examples of a cycloalkyl group portion of the cycloalkyloxy group represented by $R_{13}$ include those exemplified above as the cycloalkyl group represented by $R_{13}$, $R_{14}$, or $R_{15}$. As the cycloalkyloxy group, a cyclopentyloxy group and a cyclohexyloxy group are particularly preferable.

Examples of an alkoxy group portion of the alkoxycarbonyl group represented by $R_{13}$ include those described above as the alkoxy group represented by $R_{13}$ or $R_{14}$. As the alkoxycarbonyl group, a methoxycarbonyl group, an ethoxycarbonyl group, and an n-butoxycarbonyl group are particularly preferable.

Examples of an alkyl group portion of the alkylsulfonyl group represented by $R_{14}$ include those described above as the alkyl group represented by $R_{13}$, $R_{14}$, or $R_{15}$. Examples of a cycloalkyl group portion of the cycloalkylsulfonyl group represented by $R_{14}$ include those described above as the cycloalkyl group represented by $R_{13}$, $R_{14}$, or $R_{15}$. As the alkylsulfonyl group or the cycloalkyl sulfonyl group, a methane sulfonyl group, an ethane sulfonyl group, an n-propane sulfonyl group, an n-butane sulfonyl group, a cyclopentane sulfonyl group, and a cyclohexane sulfonyl group are particularly preferable.

l is preferably 0 or 1 and more preferably 1. r is preferably from 0 to 2.

The respective groups represented by $R_{13}$, $R_{14}$, or $R_{15}$ may further have a substituent. Examples of the substituent include a halogen atom such as a fluorine atom, a hydroxyl group, a carboxyl group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, and a cycloalkyloxycarbonyloxy group.

The alkoxy group may be linear or branched. Examples of the alkoxy group include a methoxy group, an ethoxy group, an n-propoxy group, an i-propoxy group, an n-butoxy group, a 2-methylpropoxy group, a 1-methylpropoxy group, a t-butoxy group, and the like having 1 to 20 carbon atoms.

Examples of the cycloalkyloxy group include a cyclopentyloxy group, a cyclohexyloxy group, and the like having 3 to 20 carbon atoms.

The alkoxyalkyl group may be linear or branched. Examples of the alkoxyalkyl group include a methoxymethyl group, an ethoxymethyl group, a 1-methoxyethyl group, a 2-methoxyethyl group, a 1-ethoxyethyl group, a 2-ethoxyethyl group, and the like having 2 to 21 carbon atoms.

Examples of the cycloalkyloxyalkyl group include a cyclopentyloxyethyl group, a cyclopentyloxypentyl group, a cyclohexyloxyethyl group, a cyclohexyloxypentyl group, and the like having 4 to 21 carbon atoms.

The alkoxycarbonyl group may be linear or branched. Examples of the alkoxycarbonyl group include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, and the like having 2 to 21 carbon atoms.

Examples of the cycloalkyloxycarbonyl group include a cyclopentyloxycarbonyl group, a cyclohexyloxycarbonyl group, and the like having 4 to 21 carbon atoms.

The alkoxycarbonyloxy group may be linear or branched. Examples of the alkoxycarbonyloxy group include a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, and the like having 2 to 21 carbon atoms.

Examples of the cycloalkyloxycarbonyloxy group include a cyclopentyloxycarbonyloxy group, a cyclohexyloxycarbonyloxy group, and the like having 4 to 21 carbon atoms.

As the ring structure that the two $R_{15}$s may form by binding to each other, a structure that forms a 5- or 6-membered ring, particularly preferably a 5-membered ring (that is, a tetrahydrothiophene ring) together with an S atom in General Formula (ZI-1A) is preferable.

The ring structure may further have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. The substituent of the ring structure may exist in plural, and these substituents may from a ring (an aromatic or non-aromatic hydrocarbon ring, an aromatic or non-aromatic heterocycle, or a polycyclic condensed ring including a combination of two or more of these rings) by binding to each other.

As $R_{15}$, a methyl group, an ethyl group, and a divalent group in which two $R_{15}$s bind to each other and form a tetrahydrothiophene ring structure together with a sulfur atom are particularly preferable.

The alkyl group, the cycloalkyl group, the alkoxy group, and the alkoxycarbonyl group represented by $R_{13}$, and the alkyl group, the cycloalkyl group, the alkoxy group, the alkylsulfonyl group, and the cycloalkylsulfonyl group represented by $R_{14}$ may further have a substituent. As the substituent, a hydroxyl group, an alkoxy group, an alkoxycarbonyl group, and a halogen atom (particularly, a fluorine atom) are preferable.

Specific preferable examples of the cation in the compound represented by General Formula (ZI-1A) are shown below.

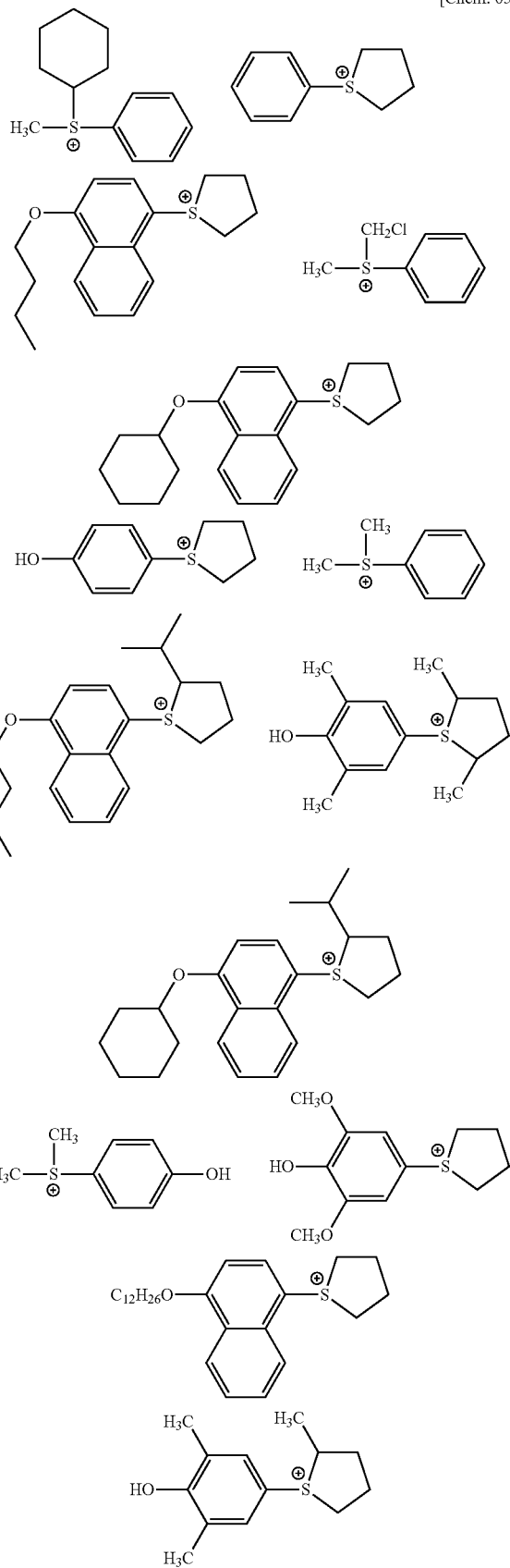

[Chem. 65]

-continued
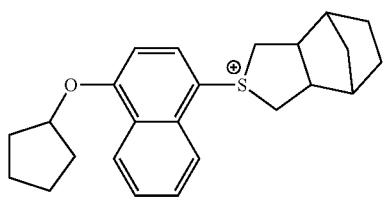
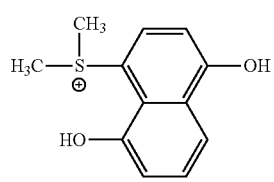
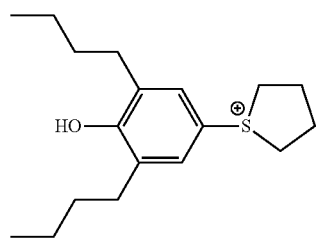
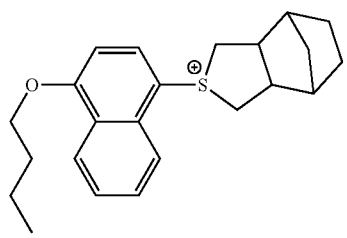
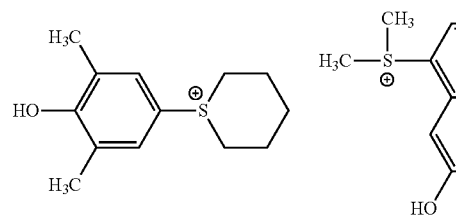
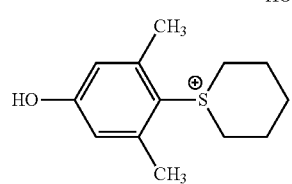
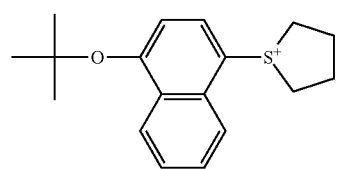
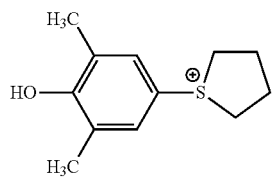
-continued
[Chem. 66]
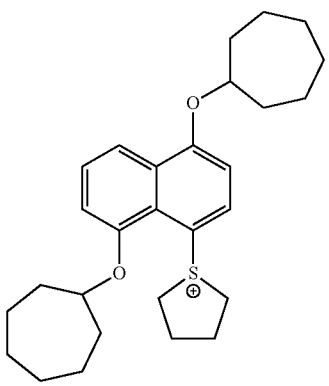
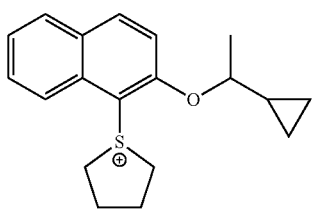
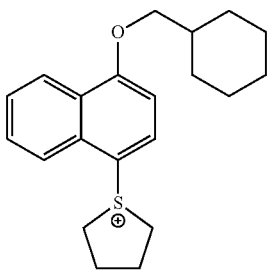
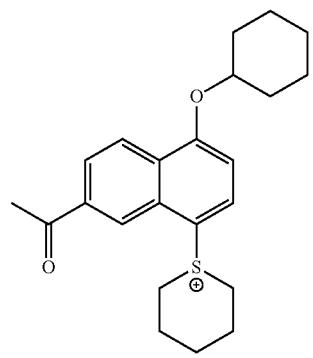
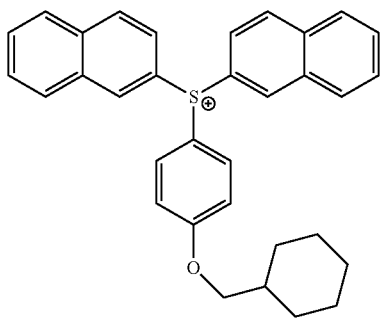

167
-continued
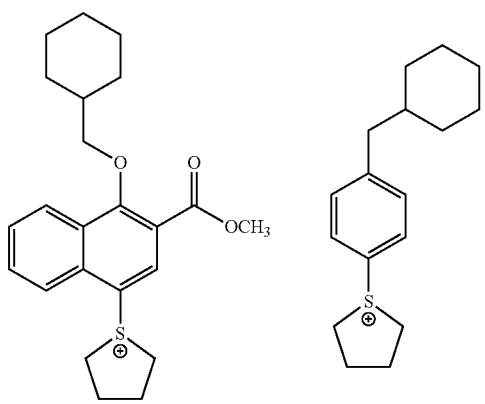
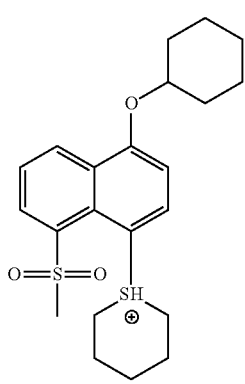
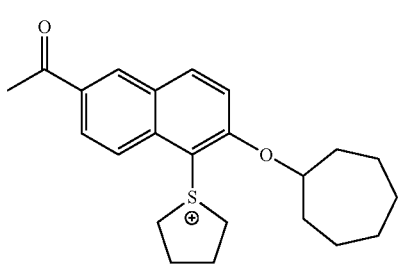
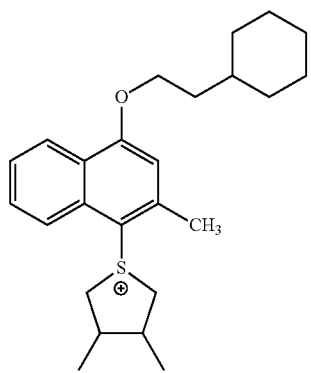
168
-continued
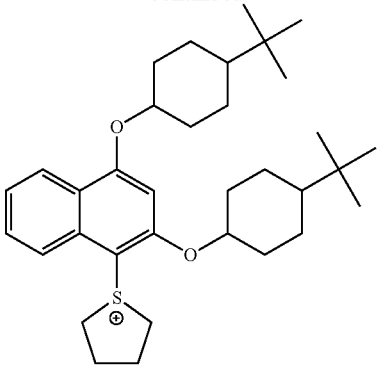
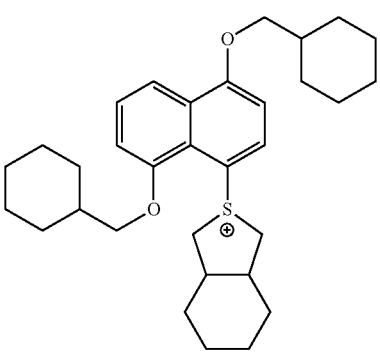
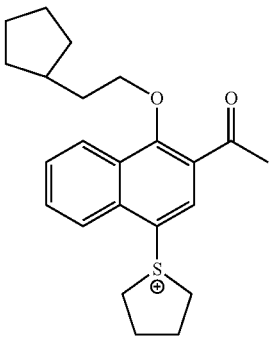
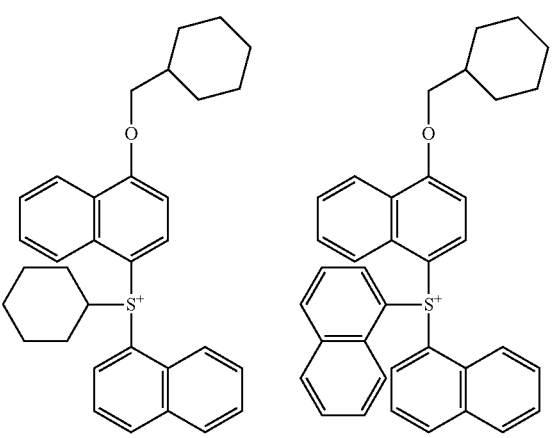

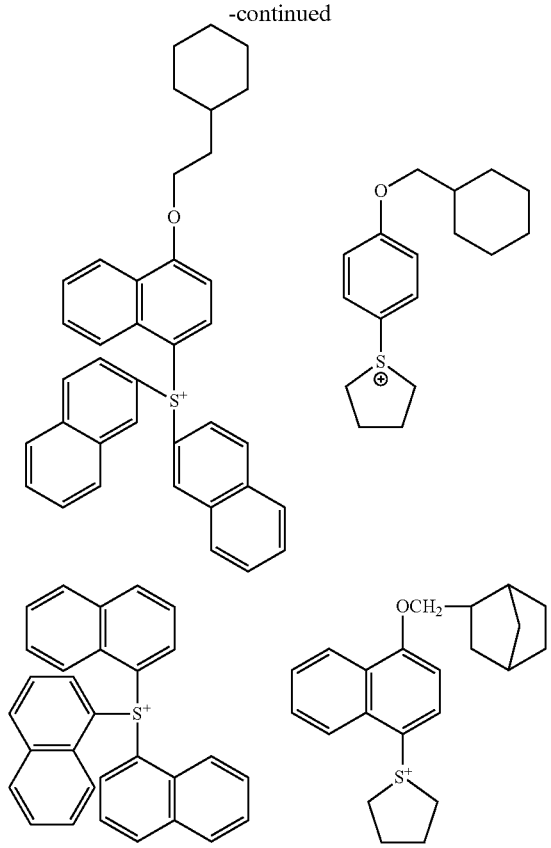

Next, the compound (ZI-2) will be described.

The compound (ZI-2) is a compound in which each of $R_{201}'$ to $R_{203}'$ in Formula (ZI) independently represents an organic group not containing an aromatic ring. The aromatic ring herein also includes an aromatic ring containing a hetero atom.

The organic group that is represented by $R_{201}'$ to $R_{203}'$ and does not contain an aromatic ring has, for example, 1 to 30 carbon atoms, and preferably has 1 to 20 carbon atoms.

Each of $R_{201}'$ to $R_{203}'$ preferably independently represents an alkyl group, a cycloalkyl group, a 2-oxoalkyl group, an alkoxycarbonyl methyl group, an allyl group, or a vinyl group. More preferably, each of $R_{201}'$ to $R_{203}'$ independently represents a linear, branched, or cyclic 2-oxoalkyl group or alkoxycarbonyl methyl group, and among these, a linear or branched 2-oxoalkyl group is particularly preferable.

Preferable examples of the alkyl group and the cycloalkyl group represented by $R_{201}'$ to $R_{203}'$ include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms.

The 2-oxoalkyl group represented by $R_{201}'$ to $R_{203}'$ may be linear, branched, or cyclic, and preferable examples thereof include a group having $>C=O$ in the second position of the above-described alkyl group.

Preferable examples of the alkoxy group in the alkoxycarbonyl methyl group represented by $R_{201}'$ to $R_{203}'$ include an alkoxy group (a methoxy group, an ethoxy group, a propoxy group, a butoxy group, or a pentoxy group) having 1 to 5 carbon atoms.

$R_{201}'$ to $R_{203}'$ may be further substituted with, for example, a halogen atom, an alkoxy group (having 1 to 5 carbon atoms for example), a hydroxyl group, a cyano group and/or a nitro group.

Two of $R_{201}'$ to $R_{203}'$ may form a ring structure by binding to each other. The ring structure may contain an oxygen atom, a sulfur atom, an ester bond, an amide bond and/or a carbonyl group in the ring. Examples of the group that two of $R_{201}'$ to $R_{203}'$ form by binding to each other include an alkylene group (for example, a butylene group or a pentylene group).

Examples of the ring structure include an aromatic or non-aromatic hydrocarbon ring, an aromatic or non-aromatic heterocycle, and a polycyclic condensed ring including a combination of two or more of these rings. Examples of the ring structure include 3- to 10-membered rings, and among these, 4- to 8-membered rings are preferable, and 5- to 6-membered rings are more preferable.

Next, the compound (ZI-3) will be described.

The compound (ZI-3) is a compound which is represented by the following General Formula (ZI-3) and has a phenacyl sulfonium salt structure.

[Chem. 67]

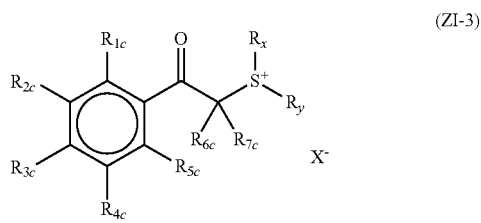

(ZI-3)

In the formula, each of $R_{1c}$ to $R_{5c}$ independently represents a hydrogen atom, an alkyl group, an alkoxy group, or a halogen atom, and the alkyl group and the alkoxy group preferably have 1 to 6 carbon atoms;

$R_{6c}$ and $R_{7c}$ represent a hydrogen atom or an alkyl group, and the alkyl group preferably has 1 to 6 carbon atoms; and each of $R_x$ and $R_y$ independently represents an alkyl group, a 2-oxoalkyl group, an alkoxycarbonyl methyl group, an allyl group, or a vinyl group, and these atomic groups preferably have 1 to 6 carbon atoms.

Any two of $R_{1c}$ to $R_{7c}$ may form a ring structure by binding to each other, and $R_x$ and $R_y$ may form a ring structure by binding to each other. These ring structures may contain an oxygen atom, a sulfur atom, an ester bond, and/or an amide bond.

$X^-$ in General Formula (ZI-3) has the same definition as $X^-$ in General Formula (ZI).

Specific examples of the compound (ZI-3) include compounds disclosed as example compounds in Paragraphs [0046] and [0047] in JP2004-233661 A or Paragraphs [0040] to [0046] in JP2003-35948A.

Next, the compound (ZI-4) will be described.

The compound (ZI-4) is a compound having a cation represented by the following General Formula (ZI-4). This compound (ZI-4) is effective for inhibiting outgassing.

[Chem. 68]

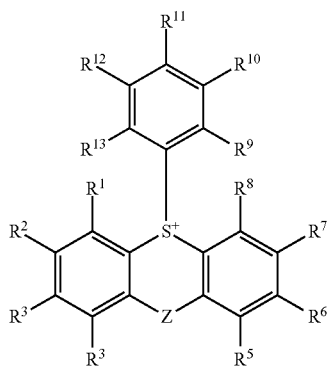

(ZI-4)

In General Formula (ZI-4), each of $R^1$ to $R^{13}$ independently represents a hydrogen atom or a substituent, at least one of $R^1$ to $R^{13}$ may be a substituent containing an alcoholic hydroxyl group, and the "alcoholic hydroxyl group" herein refers to a hydroxyl group binding to a carbon atom of an alkyl group; and Z represents a single bond or a divalent linking group.

When $R^1$ to $R^{13}$ are substituents containing an alcoholic hydroxyl group, $R^1$ to $R^{13}$ are preferably groups represented by —(W—Y). Herein, Y is an alkyl group substituted with a hydroxyl group, and W is a single bond or a divalent linking group.

Preferable examples of the alkyl group represented by Y include an ethyl group, a propyl group, and an isopropyl group. Y particularly preferably has a structure represented by —$CH_2CH_2OH$.

Though not particularly limited, the divalent linking group represented by W is preferably a divalent group obtained by substituting an arbitrary hydrogen atom in a single bond, an alkoxy group, an acyloxy group, an acylamino group, alkyl and arylsulfonylamino groups, an alkylthio group, an alkylsulfonyl group, an acyl group, an alkoxycarbonyl group, or a carbamoyl group with a single bond. The divalent linking group is more preferably a divalent group obtained by substituting an arbitrary hydrogen atom in a single bond, an acyloxy group, an alkylsulfonyl group, an acyl group, or an alkoxycarbonyl group with a single bond.

When $R^1$ to $R^{13}$ are substituents containing an alcoholic hydroxyl group, these substituents preferably have 2 to 10 carbon atoms, more preferably have 2 to 6 carbon atoms, and particularly preferably have 2 to 4 carbon atoms.

The substituents that are represented by $R^1$ to $R^{13}$ and contain an alcoholic hydroxyl group may have two or more alcoholic hydroxyl groups. The number of alcoholic hydroxyl groups included in the substituents that are represented by $R^1$ to $R^{13}$ and contain an alcoholic hydroxyl group is from 1 to 6, preferably from 1 to 3, and even more preferably 1.

In the compound represented by General Formula (ZI-4), the total number of alcoholic hydroxyl groups of all of $R^1$ to $R^{13}$ is from 1 to 10, preferably from 1 to 6, and even more preferably from 1 to 3.

When $R^1$ to $R^{13}$ do not contain an alcoholic hydroxyl group, examples of the substituents represented by $R^1$ to $R^{13}$ include a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, alkyl and arylsulfonylamino groups, a mercapto group, an alkylthio group, an arylthio group, a heterocyclic thio group, a sulfamoyl group, a sulfo group, alkyl and arylsulfinyl groups, alkyl and arylsulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group, a phosphono group, a silyl group, a hydrozino group, a ureide group, a boronic acid group [—$B(OH)_2$], a phosphate group [—$OPO(OH)_2$], a sulfate group (—$OSO_3H$), and other known substituents.

When $R^1$ to $R^{13}$ do not contain an alcoholic hydroxyl group, $R^1$ to $R^{13}$ are preferably hydrogen atoms, halogen atoms, alkyl groups, cycloalkyl groups, alkenyl groups, cycloalkenyl groups, alkynyl groups, aryl groups, cyano groups, carboxyl groups, alkoxy groups, aryloxy groups, acyloxy groups, carbamoyloxy groups, acylamino groups, aminocarbonylamino groups, alkoxycarbonylamino groups, aryloxycarbonylamino groups, sulfamoylamino groups, alkyl and arylsulfonylamino groups, alkylthio groups, arylthio groups, sulfamoyl groups, alkyl and arylsulfonyl groups, aryloxycarbonyl groups, alkoxycarbonyl groups, carbamoyl groups, imide groups, silyl groups, or ureide groups.

When $R^1$ to $R^{13}$ do not contain an alcoholic hydroxyl group, $R^1$ to $R^{13}$ are more preferably hydrogen atoms, halogen atoms, alkyl groups, cycloalkyl groups, cyano groups, alkoxy groups, acyloxy groups, acylamino groups, aminocarbonylamino groups, alkoxycarbonylamino groups, alkyl and aryl sulfonylamino groups, alkylthio groups, sulfamoyl groups, alkyl and arylsulfonyl groups, alkoxycarbonyl groups, or carbamoyl groups.

When $R^1$ to $R^{13}$ do not contain an alcoholic hydroxyl group, $R^1$ to $R^{13}$ are particularly preferably hydrogen atoms, alkyl groups, cycloalkyl groups, halogen atoms, or alkoxy groups.

Among $R^1$ to $R^{13}$, two adjacent groups may form a ring by binding to each other. This ring includes aromatic and non-aromatic hydrocarbon rings and heterocycles. These rings may form a condensed ring by being further combined.

The compound (ZI-4) preferably has a structure in which at least one of $R^1$ to $R^{13}$ contains an alcoholic hydroxyl group, and more preferably has a structure in which at least one of $R^9$ to $R^{13}$ has an alcoholic hydroxyl group.

As described above, Z represents a single bond or a divalent linking group. Examples of the divalent linking group include an alkylene group, an arylene group, a carbonyl group, a sulfonyl group, a carbonyloxy group, a carbonylamino group, a sulfonylamide group, an ether group, a thioether group, an amino group, a disulfide group, an acyl group, an alkylsulfonyl group, —CH=CH—, an aminocarbonylamino group, and an aminosulfonylamino group.

The divalent linking group may have substituents. Examples of the substituents include the same ones as exemplified above for $R^1$ to $R^{13}$.

Z is preferably a bond or a group that does not withdraw electrons, such as a single bond, an alkylene group, an arylene group, an ether group, a thioether group, an amino group, —CH=CH—, an aminocarbonylamino group, and an aminosulfonylamino group. Z is more preferably a single bond, an ether group, or a thioether group, and particularly preferably a single bond.

Hereinbelow, General Formulae (ZII) and (ZIII) will be described.

In General Formulae (ZII) and (ZIII), each of $R_{204}'$, $R_{205}'$, $R_{206}$, and $R_{207}$ independently represents an aryl group, an alkyl group, or a cycloalkyl group. This aryl group, this alkyl group, and this cycloalkyl group may have a substituent.

Preferable examples of the aryl group represented by $R_{204}'$, $R_{205}'$, $R_{206}$, and $R_{207}$ include the same groups as exemplified above for $R_{201}'$ to $R_{203}'$ in General Formula (ZI-1).

Preferable examples of the alkyl group and the cycloalkyl group represented by $R_{204}'$, $R_{205}'$, $R_{206}$, and $R_{207}$ include the linear or branched cycloalkyl groups exemplified above for $R_{201}'$ to $R_{203}'$ in General Formula (ZI-2).

The aryl group, the alkyl group, and the cycloalkyl group represented by $R_{204}'$, $R_{205}'$, $R_{206}$, and $R_{207}$ may have a substituent. Examples of the substituent that the aryl group, the alkyl group, and the cycloalkyl group represented by $R_{204}'$, $R_{205}'$, $R_{206}$, and $R_{207}$ may have include an alkyl group (having 1 to 15 carbon atoms for example), a cycloalkyl group (having 3 to 15 carbon atoms for example), an aryl group (having 6 to 15 carbon atoms for example), an alkoxy group (having 1 to 15 carbon atoms for example), a halogen atom, a hydroxyl group, a phenylthio group, and the like.

$X^-$ in General Formula (ZII) has the same definition as $X^-$ in General Formula (ZI).

Other preferable examples of the photoacid generator include compounds represented by the following General Formula (ZIV), (ZV), or (ZVI).

[Chem. 69]

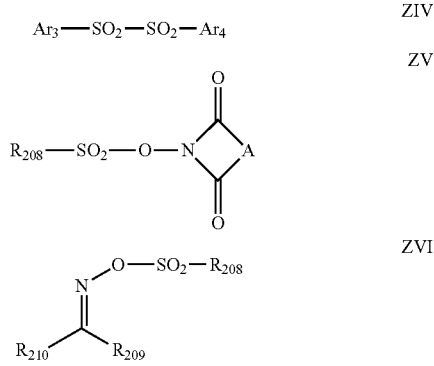

In General Formulae (ZIV) to (ZVI), each of $Ar_3$ and $Ar_4$ independently represents a substituted or unsubstituted aryl group;

$R_{208}$ independently represents an alkyl group, a cycloalkyl group, or an aryl group in each of General Formulae (ZV) and (ZVI), and this alkyl group, this cycloalkyl group, and this aryl group may be substituted or unsubstituted;

these groups are preferably substituted with a fluorine atom, and if so, the acidity of an acid generated by the photoacid generator can be increased; and each of $R_{209}$ and $R_{210}$ independently represents an alkyl group, a cycloalkyl group, an aryl group, or an electron-withdrawing group, this alkyl group, this cycloalkyl group, this aryl group, and this electron-withdrawing group may be substituted or unsubstituted, and examples of substituents that the alkyl group, the cycloalkyl group, the aryl group, and the electron-withdrawing group may have include a halogen atom, an alkoxy group (having 1 to 5 carbon atoms for example), a hydroxyl group, a cyano group, and a nitro group.

Preferable examples of $R_{209}$ include a substituted or unsubstituted aryl group.

Preferable examples of $R_{210}$ include an electron-withdrawing group. Preferable examples of the electron-withdrawing group include a cyano group and a fluoroalkyl group.

A represents an alkylene group, an alkenylene group, or an arylene group. This alkylene group, this alkenylene group, and this arylene group may have a substituent.

Specific examples of the aryl group represented by $Ar_3$, $Ar_4$, $R_{208}$, $R_{209}$, and $R_{210}$ include the same ones as the specific examples of the aryl group represented by $R_{201}'$, $R_{202}'$, and $R_{203}'$ in the General Formula (ZI-1).

Specific examples of the alkyl group and the cycloalkyl group represented by $R_{208}$, $R_{209}$, and $R_{210}$ respectively include the same ones as the specific examples of the alkyl group and the cycloalkyl group represented by $R_{201}'$, $R_{202}'$, and $R_{203}'$ in the General Formula (ZI-2).

Examples of the alkylene group represented by A include an alkylene group (for example, a methylene group, an ethylene group, a propylene group, an isopropylene group, a butylene group, an isobutylene group, or the like) having 1 to 12 carbon atoms, examples of the alkenylene group represented by A include an alkenylene group (for example, an ethynylene group, a propenylene group, a butenylene group, or the like) having 2 to 12 carbon atoms, and examples of the arylene group represented by A include an arylene group (for example, a phenylene group, a tolylene group, a naphthylene group, or the like) having 6 to 10 carbon atoms respectively.

As the photoacid generator, a compound having a plurality of structures represented by General Formula (ZVI) is also preferable. Examples of such a compound include a compound having a structure in which $R_{209}$ or $R_{210}$ of the compound represented by General Formula (ZVI) binds to $R_{209}$ or $R_{210}$ of another compound represented by General Formula (ZVI).

As the photoacid generator, compounds represented by General Formulae (ZI) to (ZIII) are more preferable, the compound represented by General Formula (ZI) is even more preferable, and compounds (ZI-1) to (ZI-3) are particularly preferable.

Specific examples of the photoacid generator will be shown below, but the scope of the present invention is not limited thereto.

[Chem. 70]

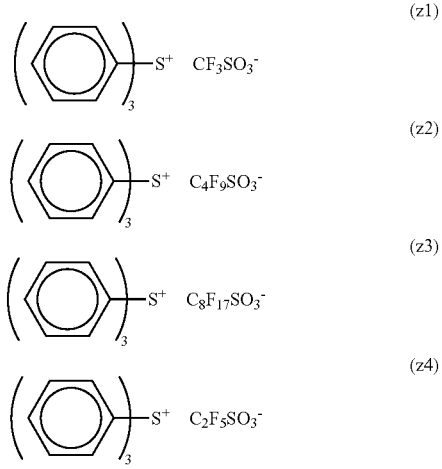

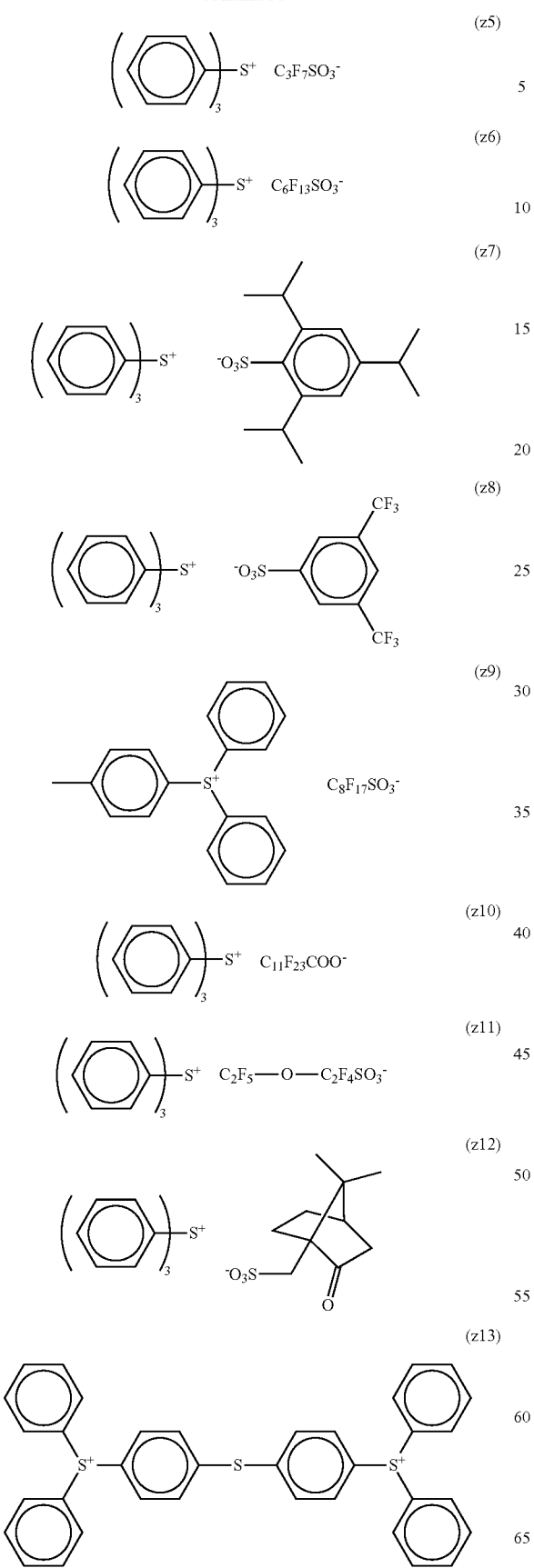
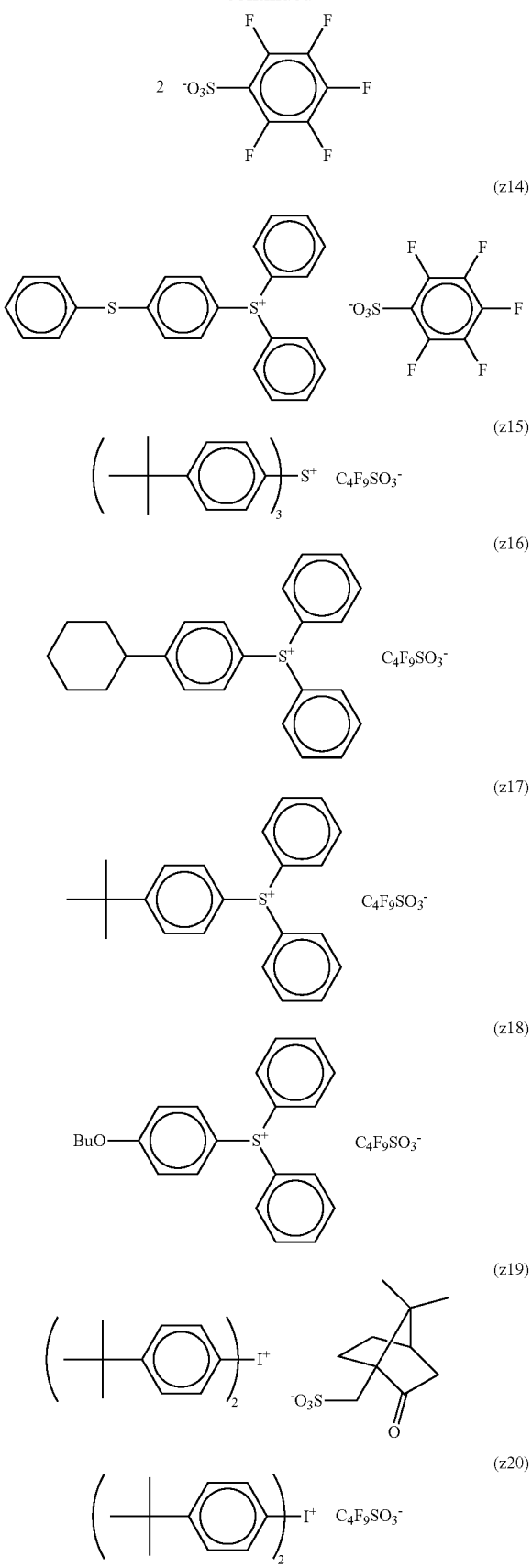

(z21) 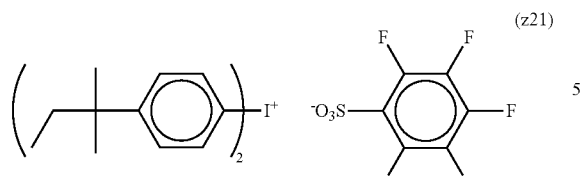
(z22) 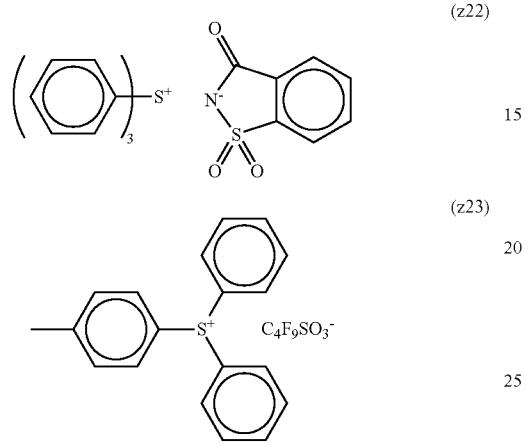
(z23)
[Chem. 71]
(z24) 
(z25) 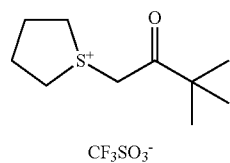
(z26) 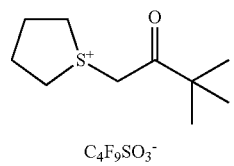
(z27) 
(z28) 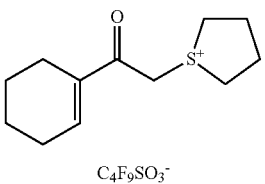
(z29) 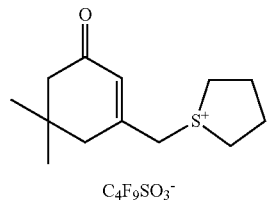
(z30) 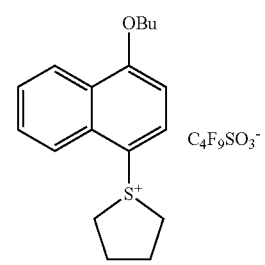
(z31) 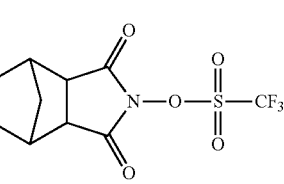
(z32) 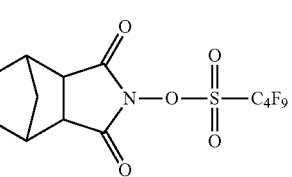
(z33) 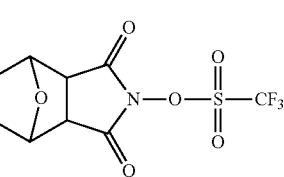
(z34) 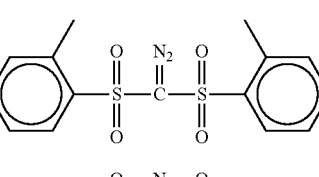
(z35) 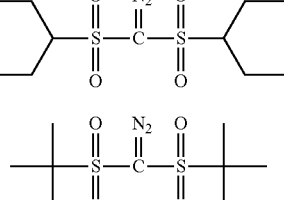
(z36)
(z37) 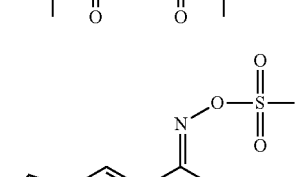

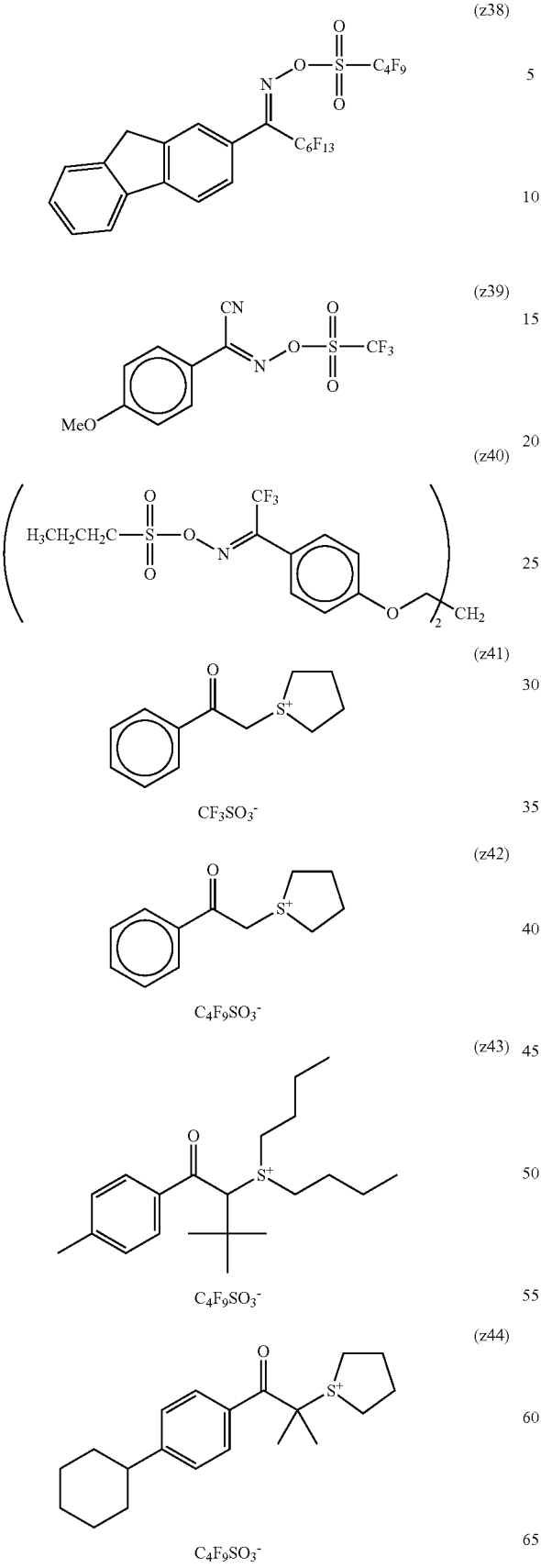
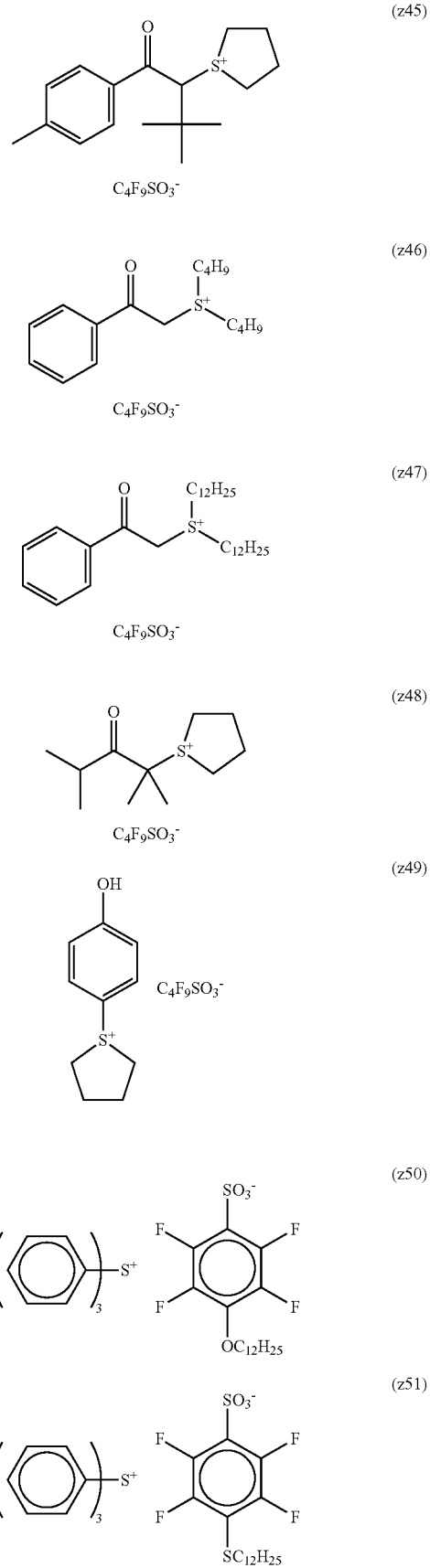

-continued
(z52) 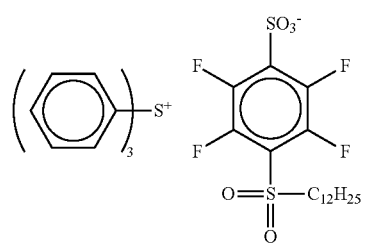
(z53) 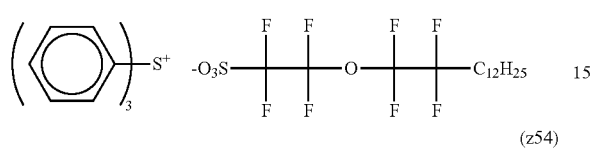
(z54) 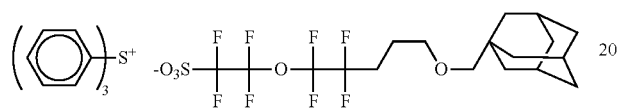
(z55) 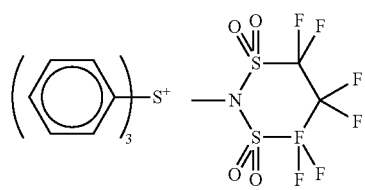
(z56) 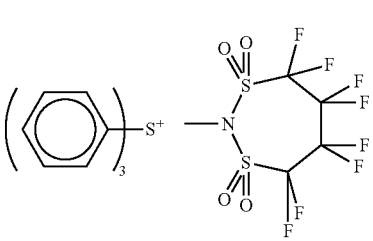
(z57) 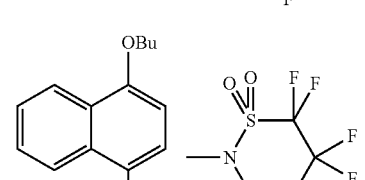
(z58) 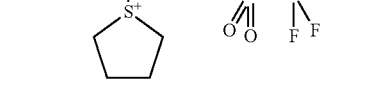
(z59) 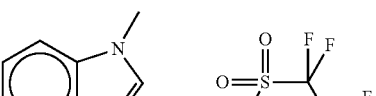
-continued
(z60) 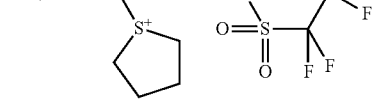
(z61) 
(z62) 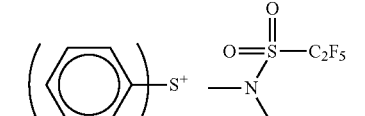
(z63) 
(z64) 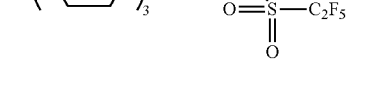
(z65) 
(z66) 
(z67) 
[Chem. 73]

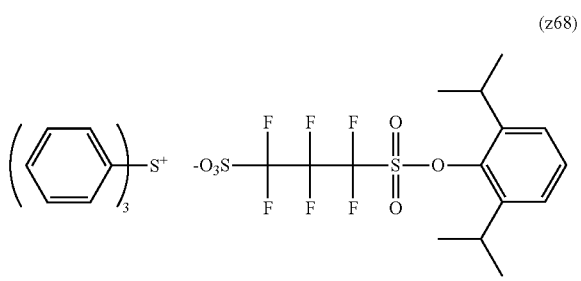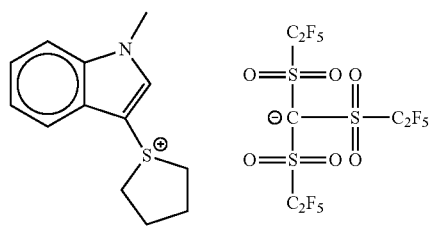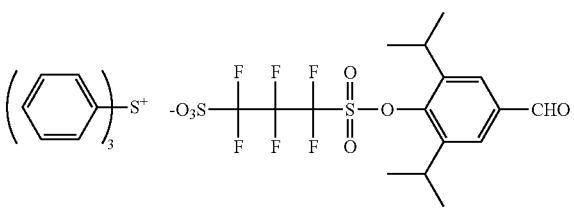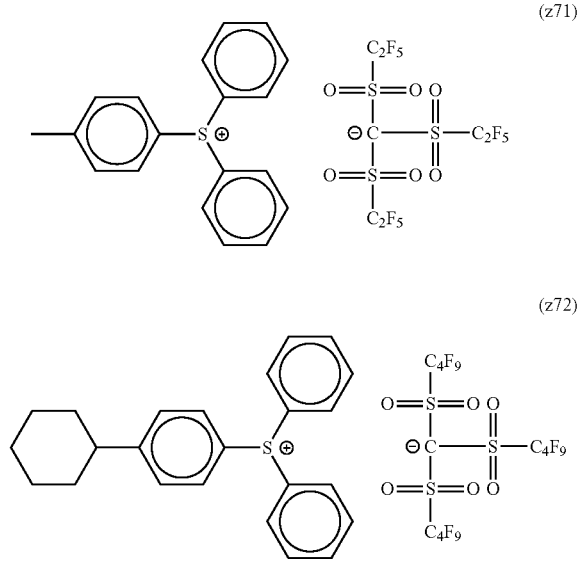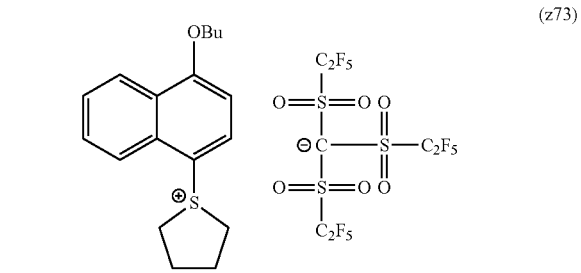

(z80) 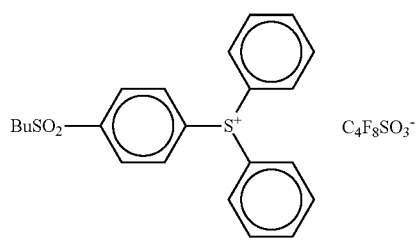 C4F8SO3−
[Chem. 75]
(z81) 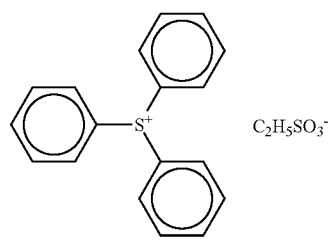 C2H5SO3−
(z82) 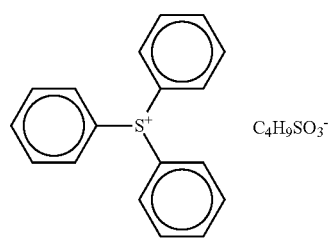 C4H9SO3−
(z83) 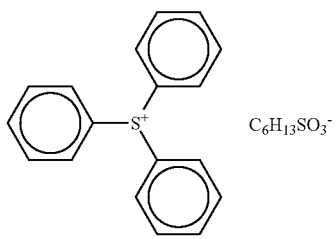 C6H13SO3−
(z84) 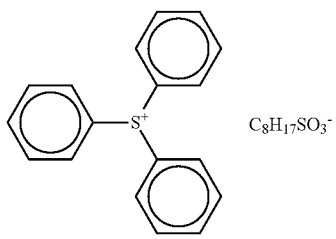 C8H17SO3−
(z85) 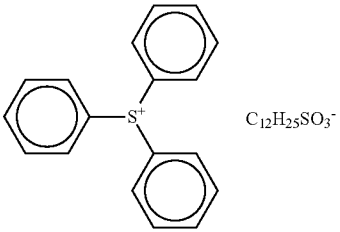 C12H25SO3−
(z86) 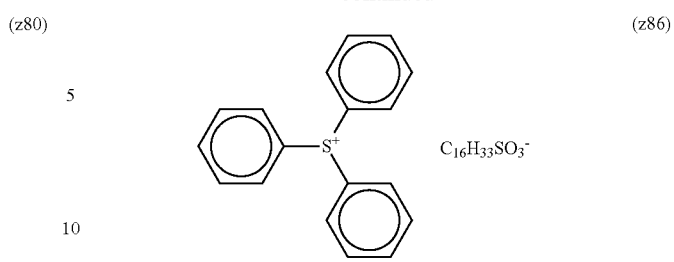 C16H33SO3−
(z87) 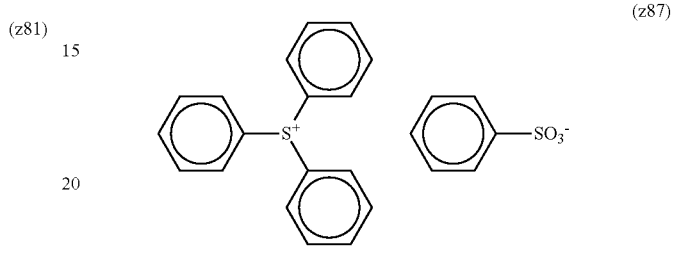
(z88) 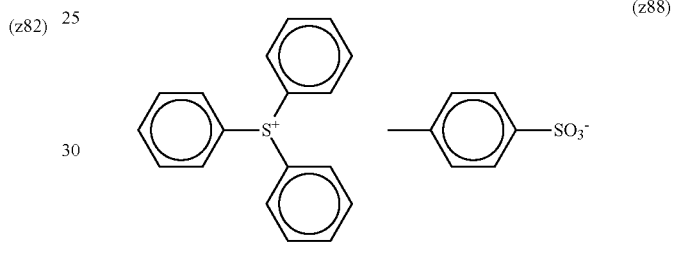
[Chem. 76]
(z89) 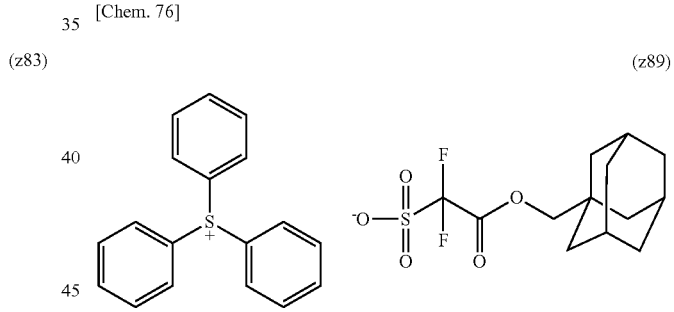
(z90) 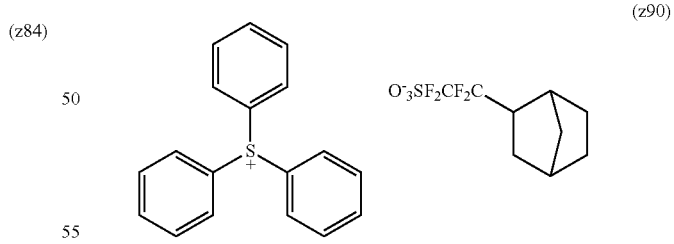
(z91) 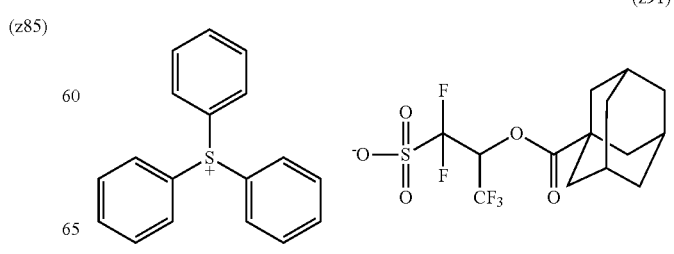

-continued
(z92)
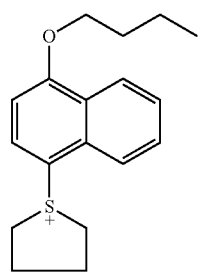 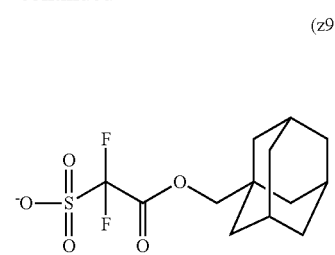
(z93)
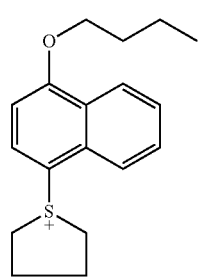 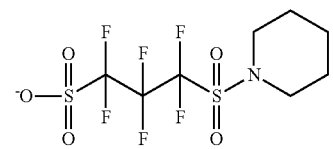
(z94)
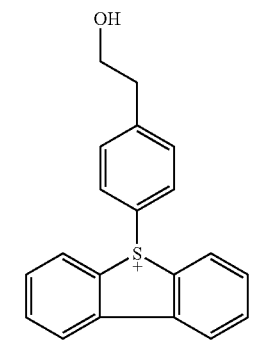 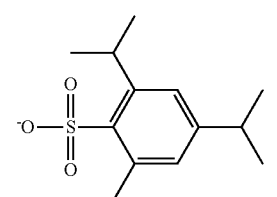
(z95)
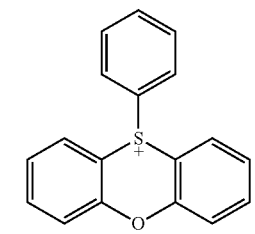 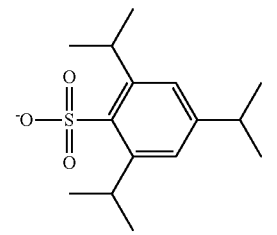
(z96)
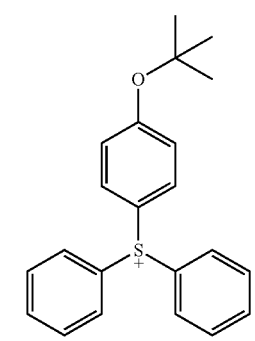 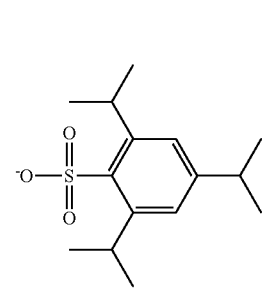
-continued
(z97)
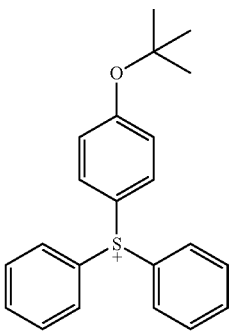 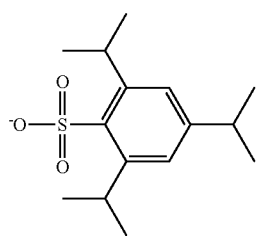
(z98)
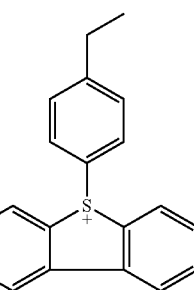 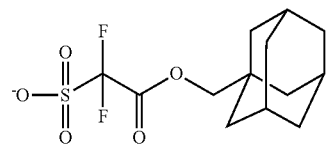
(z99)
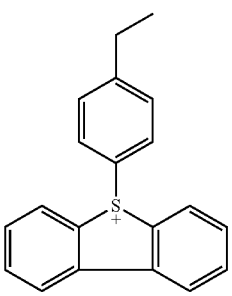 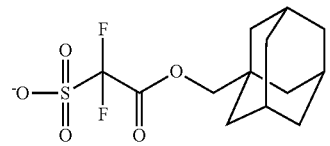
(z99)
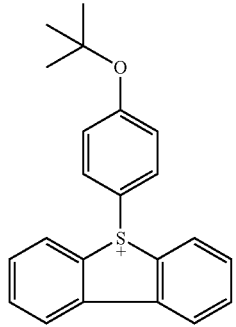 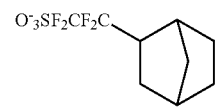
(z100)
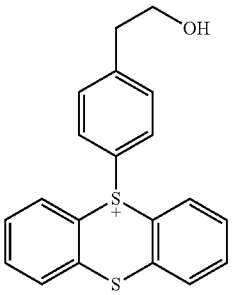 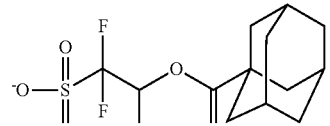

(z101) 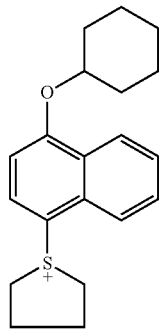
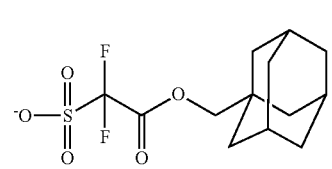

(z102) 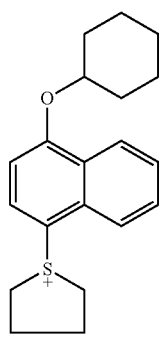
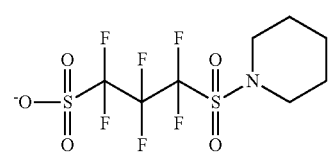

(z103) 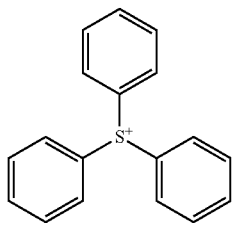
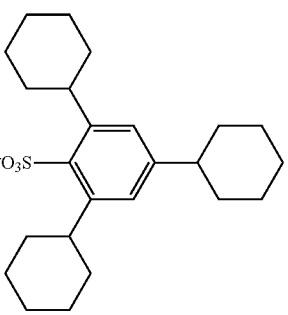

(z104) 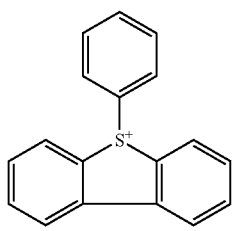
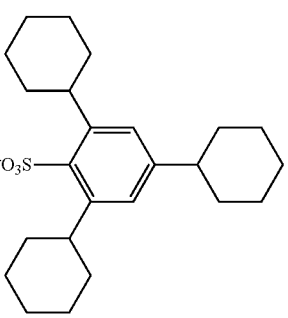

(z105) 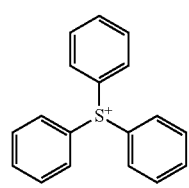
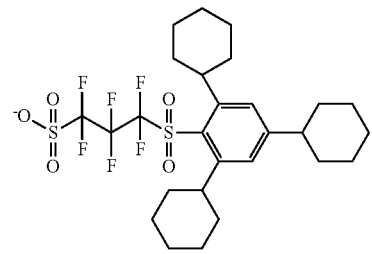

[Chem. 77]

(z106) 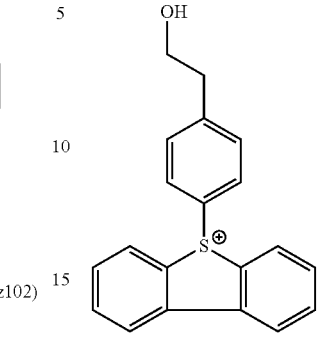 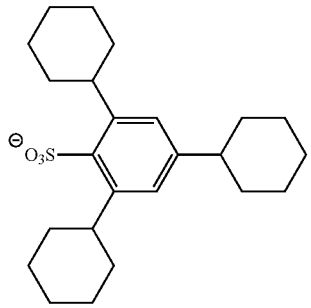

(z107) 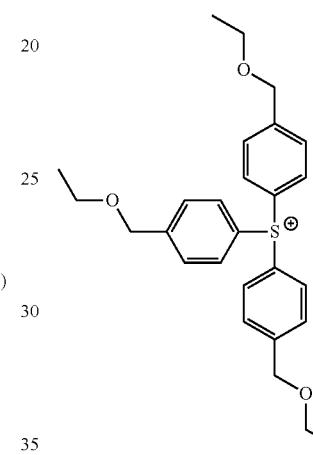 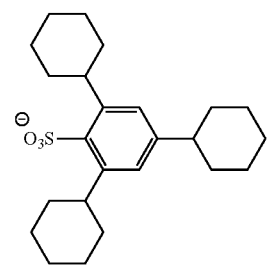

(z108) 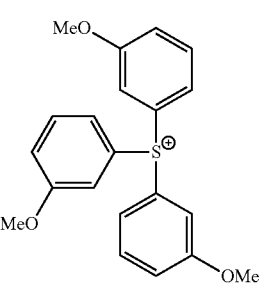

(z109) 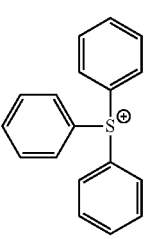 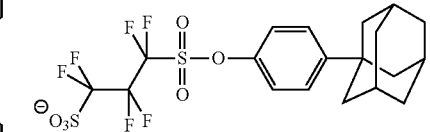

The photoacid generator may be used alone, or two or more kinds thereof may be used in combination. When two or more kinds of the photoacid generator are used in combination, it is preferable to combine compounds that generate two kinds of organic acids differing in the total number of atoms by 2 or more excluding hydrogen atoms.

It is preferable that the compound (P) of the present invention be used in combination with the compound (ZI-1) or (ZI-4) having the sulfonic acid anion represented by General Formula (SA1), since the acidity of the generated acid can be appropriately adjusted in this combination.

When the composition according to the present invention further contains the photoacid generator, the content of the photoacid generator is preferably from 0.1% by mass to 40% by mass, more preferably from 0.5% by mass to 30% by mass, and even more preferably from 1% by mass to 20% by mass, based on the total solid contents of the composition.

[5] Solvent

The composition according to the present invention preferably contains a solvent.

The solvent usable for preparing the composition is not particularly limited as long as the solvent dissolves the respective components. Examples of the solvent include an alkylene glycol monoalkyl ether carboxylate (propylene glycol monomethyl ether acetate (PGMEA, having another name of 1-methoxy-2-acetoxypropane) or the like), an alkylene glycol monoalkyl ether (propylene glycol monomethyl ether (PGME, having another name of 1-methoxy-2-propanol) or the like), an alkyl lactate ester (ethyl lactate, methyl lactate, or the like), a cyclic lactone (γ-butyrolactone or the like preferably having 4 to 10 carbon atoms), a chain-like or cyclic ketone (2-heptanone, cyclohexanone, or the like preferably having 4 to 10 carbon atoms), an alkylene carbonate (ethylene carbonate, propylene carbonate, or the like), an alkyl carboxylate (preferably an alkyl acetate such as butyl acetate), an alkyl alkoxy acetate (ethyl ethoxy propionate), and the like. Examples of other usable solvents include solvents disclosed from Paragraphs [0244] of US2008/0248425A1, and the like.

Among the above solvents, an alkylene glycol a monoalkyl ether carboxylate, an alkylene glycol monoalkyl ether, and ethyl lactate are particularly preferable.

These solvents may be used alone, or two or more kinds thereof may be used as a mixture. When two or more kinds of the solvent are used as a mixture, it is preferable to mix a solvent containing a hydroxyl group with a solvent not containing a hydroxyl group. The mass ratio of the solvent containing a hydroxyl group to the solvent not containing a hydroxyl group is generally from 1/99 to 99/1, preferably from 10/90 to 90/10, and even more preferably from 20/80 to 60/40.

As the solvent containing a hydroxyl group, an alkylene glycol monoalkyl ether or an alkyl lactate ester is preferable, and as the solvent not containing a hydroxyl group, an alkylene glycol monoalkyl ether carboxylate is preferable. It is particularly preferable to use a solvent in which the proportion of propylene glycol monomethyl ether is 50% by mass or more of the solvent.

The amount of the solvent used is determined such that the concentration of the total solid contents of the composition becomes preferably from 0.1% by weight to 10% by weight, more preferably from 2.0% by weight to 6.0% by weight, and even more preferably from 3.0% by weight to 5.0% by weight.

[6] Surfactant

The composition according to the present invention may further contain a surfactant. As the surfactant, a fluorosurfactant and/or a silicon surfactant are/is particularly preferable.

Examples of the surfactant include Megafac F176 and R08 manufactured by DIC CORPORATION, PF656 and 6320 manufactured by OMNOVA Solutions Inc., Troysol S-366 manufactured by Troy Chemical, Fluorad FC430 manufactured by Sumitomo 3M Inc., and a polysiloxane polymer KP-341 manufactured by Shin-Etsu Chemical Co., Ltd.

Surfactants other than the fluorosurfactant and/or the silicon surfactant can also be used. More specifically, polyoxyethylene alkyl ethers, polyoxyethylene alkyl aryl ethers, and the like can be exemplified.

In addition, known surfactants can be appropriately used. Examples of the usable surfactants include surfactants disclosed from Paragraph [0273] of US2008/0248425A1.

The surfactant may be used alone, or two or more kinds thereof may be used concurrently.

When the composition according to the present invention further contains a surfactant, the content of the surfactant is preferably from 0.0001% by mass to 2% by mass, more preferably from 0.001% by mass to 1% by mass, and even more preferably from 0.01 by mass to 0.1% by mass, based on the total solid contents of the composition.

[7] Dissolution Inhibiting Compound

The composition according to the present invention may further contain a dissolution inhibiting compound of which a dissolution rate in an alkaline developer is increased by the degradation of the compound caused by the action of an acid and which has a molecular weight of 3000 or less (hereinbelow, also referred to as a "dissolution inhibiting compound")

In order not to decrease permeability at 220 nm or less, alicyclic or aliphatic compounds containing an acid-degradable group, such as cholic acid derivatives containing an acid-degradable group disclosed in Proceedings of SPIE, 2724, 355 (1996), are preferable as the dissolution inhibiting compound. Examples of the acid-degradable group include the same groups as "OY$^1$" of General Formula (3) and "COOY$^2$" of General Formula (4) in the above resin (P).

When the composition according to the present invention is exposed with a KrF excimer laser or irradiated with an electron beam, a compound having a structure in which the phenolic hydroxyl group of a phenol compound is substituted with the acid-degradable group is preferable as the dissolution inhibiting compound. The phenol compound preferably contains 1 to 9 phenol structures, and more preferably contains 2 to 6 phenol structures.

The molecular weight of the dissolution inhibiting compound is 3000 or less, preferably from 300 to 3000, and more preferably from 500 to 2500.

When the composition according to the present invention contains the dissolution inhibiting compound, the amount of the dissolution inhibiting compound added is preferably from 0.0001% by mass to 20% by mass, and more preferably from 0.5% by mass to 10% by mass, based on the total solid contents of the composition.

Specific examples of the dissolution inhibiting compound shown below, but the present invention is not limited thereto.

[Chem. 78]

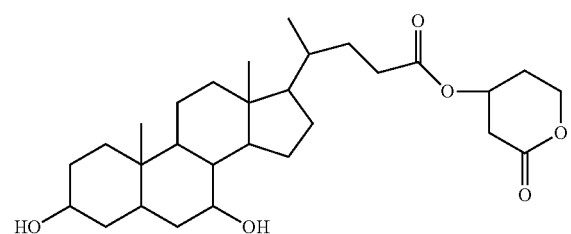

-continued

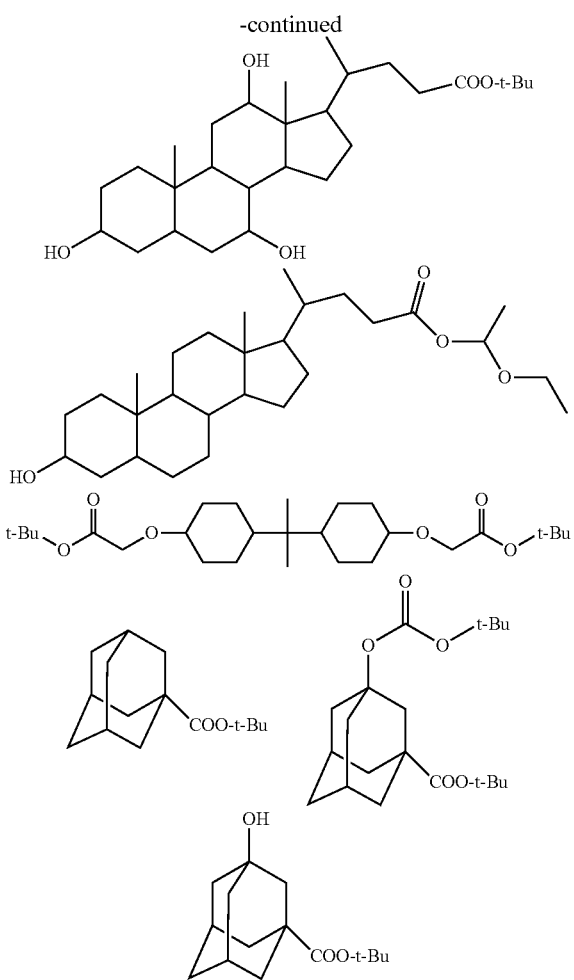

[8] Other Additives

The composition according to the present invention can optionally further contain, for example, a dye, a plasticizer, a photosensitizer, a light absorber, a compound accelerating dissolution in a developer (hereinbelow, also referred to as a dissolution accelerating compound), and the like. In addition, the compounds containing a proton acceptor functional group disclosed in JP2006-208781A and JP2007-286574A can be suitably used.

The dissolution accelerating compound is, for example, a low-molecular weight compound with a molecular weight of 1000 or less that has 2 or more phenolic hydroxyl groups or has 1 or more carboxyl groups. When the dissolution accelerating compound has carboxyl groups, the dissolution accelerating compound is preferably an alicyclic or aliphatic compound.

The amount of the dissolution accelerating compound added is preferably from 0% by mass to 50% by mass, and more preferably from 5% by mass to 30% by mass, based on the mass of the resin (P). The amount added is preferably 50% by mass or less, from the viewpoints of inhibiting development residues and preventing pattern deformation at the time of exposure.

The dissolution accelerating compound can be easily synthesized with reference to, for example, the methods disclosed in JP1992-122938A (JP-H04-122938A), JP1990-28531A (JP-H02-28531A), U.S. Pat. No. 4,916,210A, EP219294B, and the like.

[9] Pattern Forming Method

The composition according to the present invention is typically used as follows. That is, the composition according to the present invention is typically coated onto a supporter such as a substrate to form a film. The thickness of the film is preferably from 0.02 µm to 0.1 µm. As a method of coating the composition onto a substrate, spin coating is preferable, and the rotation frequency thereof is preferably from 1000 rpm to 3000 rpm.

For example, the composition is coated onto a substrate (for example, a substrate coated with silicon and silicon dioxide, a quartz substrate onto which silicon nitride and chromium are vapor-deposited, or the like) used for producing precision integrated circuit elements or the like through an appropriate coating method using a spinner or a coater. The substrate is then dried to obtain an actinic ray-sensitive or radiation-sensitive film (hereinbelow, also referred to as a resist film). Moreover, a known antireflection film can be coated in advance.

Subsequently, the resist film is irradiated with actinic rays or radiation (preferably, at least one of an electron beam, X-rays, and EUV light) and then preferably baked (generally at 80° C. to 150° C., more preferably at 90° C. to 130° C.), followed by developing. In this manner, an excellent pattern can be obtained. By using this pattern as a mask, etching and ion implantation are appropriately performed, whereby a fine semiconductor circuit, a mold structure for imprinting, and the like are prepared.

Regarding the detail of the process for preparing a mold for imprinting by using the composition of the present invention, for example, JP4109085B, JP2008-162101A, "Fundamentals of Nanoimprint and Technical Development/Application Deployment-Substrate Technique of Nanoimprint and Latest Application Deployment", edited by Yoshihiko Hirai (Frontier Publishing), and the like may be referenced. Particularly, regarding the method of producing a mold structure suitable for producing information recording media, for example, JP4109085B and JP2008-162101A may be referenced.

In the step of developing, an alkaline developer is used in general. As a developing method, known methods such as paddle formation, dipping, and dynamic dispensing are appropriately used. Various aqueous alkaline solutions can be used as the alkaline developer, but in general, an aqueous alkaline tetramethylammonium hydroxide solution is used. Alcohols and/or a surfactant may be added to the alkaline developer in an appropriate amount.

The concentration of the alkaline developer is generally from 0.1% by mass to 20% by mass, and the pH of the alkaline developer is generally from 10.0 to 15.0.

In the pattern forming method of the present invention, the resist film may be formed on mask blanks.

The mask blanks herein are materials for producing a photomask used in a step of producing a semiconductor. Generally, a light shielding film is provided onto a transparent substrate (preferably a glass substrate) to prepare the mask blanks. The method of forming a light shielding film onto a transparent substrate is not particularly limited, and for example, the light shielding film can be formed by chemically vapor-depositing materials constituting a light shielding materials onto a transparent substrate.

As the materials constituting the light shielding film, metals such as tantalum, chromium, molybdenum, titanium, zirconium, tin, gallium, and aluminum are used as a main component, and oxides, nitrides, oxynitrides of these metal elements are suitably used. Specific examples of the materials include chromium oxide, chromium nitride, chromium, tantalum oxide, tantalum nitride, tantalum, molybdenum silicide oxide, molybdenum silicide nitride, molybdenum silicide oxynitride, molybdenum, and the like.

The light shielding film may be a single layer, but more preferably, the light shielding film has a multilayer structure formed by coating a plurality of materials in layers. In a case of the multilayer structure, the film thickness of each layer is preferably from 5 nm to 100 nm, and more preferably from 10 nm to 80 nm, though the thickness is not particularly limited. Though not particularly limited, the total thickness of the light shielding film is preferably from 5 nm to 200 nm, and more preferably from 10 nm to 150 nm.

The resist film is formed on the mask blanks, followed by exposing and developing, whereby a photomask can be obtained.

EXAMPLES

Hereinbelow, the present invention will be described in more detail based on examples, but the content of the present invention is not limited thereto.

Reference Synthesis Example 1

Synthesis of Modified Polyhydroxystyrene Compound (PHS-M1)

Poly(p-hydroxystyrene) (VP-8000, manufactured by NIPPON SODA CO., LTD.) (30.0 g) as a polyhydroxystyrene compound was dissolved in 120 g of acetone, and 2.14 g of benzyl bromide and 3.45 g of potassium carbonate were added thereto, followed by refluxing for 4 hours. About half of the acetone was removed by distillation using an evaporator, and 200 mL of ethyl acetate and then 200 mL of 1N hydrochloric acid were added thereto under stirring. The resultant was transferred to a separatory funnel to remove the water layer, and then the organic layer was washed first with 200 mL of 1N hydrochloric acid and then with 200 mL of distilled water and concentrated by using an evaporator. In this manner, 5% benzylated poly(p-hydroxystyrene) was obtained.

Reference Synthesis Example 2

Synthesis of Modified Polyhydroxystyrene Compound (PHS-M2)

Poly(p-hydroxystyrene) (VP-2500, manufactured by NIPPON SODA CO., LTD.) (30.0 g) as a polyhydroxystyrene compound was dissolved in 170 g of tetrahydrofuran (THF), and 26.53 g of triethylamine was added thereto, followed by stirring in an ice water bath. A THF solution containing 2.34 g of 1-naphthoyl chloride was added dropwise to the reaction solution, followed by stirring for 4 hours, and distilled water was added thereto to stop the reaction. THF was removed by distillation under reduced pressure, and the reactant was dissolved in ethyl acetate. The obtained organic layer was washed 5 times with distilled water and concentrated by using an evaporator. In this manner, 5% naphthoylated poly(p-hydroxystyrene) was obtained.

Reference Synthesis Example 3

Synthesis of Modified Polyhydroxystyrene Compound (PHS-M3)

3% adamantanoylated poly(p-hydroxystyrene) was obtained in the same manner as in Reference Synthesis Example 2, except that 2.34 g of 1-naphthoyl chloride was changed to 1.49 g of 1-adamantanecarbonyl chloride.

Synthesis Example 1

Synthesis of Compound (P-1)

(Synthesis of Chloroether Compound)

1-Naphthol (30.0 g) was dissolved in 50 g of dimethylsulfoxide, and 27.2 g of chloroacetaldehyde dimethyl acetal, 43.2 g of potassium carbonate, and 3.45 g of potassium iodide were added thereto, followed by stirring at 140° C. for 20 hours. Ethyl acetate (400 mL) and 400 mL of distilled water were added to the reaction solution, and the resultant was transferred to a separatory funnel to remove the water layer. Thereafter, the resultant was washed 3 times with 300 mL of distilled water and once with 300 mL of saturated saline, and the organic layer was dried over magnesium sulfate and then concentrated by using an evaporator. Unreacted chloroacetaldehyde dimethyl acetal was removed under a condition of reduced pressure, thereby obtaining 44.4 g of the compound 1 shown below.

Subsequently, 27.94 g of benzyl alcohol and 1.0 g of camphorsulfonic acid were added to 20.0 g of the compound 1, followed by stirring in a water bath at 70° C. for 4 hours under a condition of reduced pressure. The temperature of the reaction solution was returned to room temperature, and then 2.18 g of triethylamine was added thereto, followed by stirring for 5 minutes. After being diluted with 300 mL of ethyl acetate, the reaction solution was washed 4 times with 300 mL of distilled water and once with 300 mL of saturated saline. The organic layer was dried over magnesium sulfate and then concentrated by using an evaporator, thereby obtaining 31.45 g of the compound 2 shown below.

Thereafter, 5.31 g of acetyl chloride and 5 mg of zinc chloride were added to 20.0 g of the compound 2, followed by stirring at 45° C. for 5 hours. The temperature of the reaction solution was returned to room temperature, and then unreacted acetyl chloride was removed under a condition of reduced pressure, thereby obtaining compound C1-1 shown below as a chloroether compound. From $^1$H-NMR, a mixture of the compound C1-1/1-naphthoxyacetaldehyde/benzyl acetate/benzylalcohol=1.00/0.08/1.12/0.17 (molar ratio) was obtained, and the concentration of the compound C1-1 in the mixture was 60.8% in terms of % by mass.

[Chem. 79]

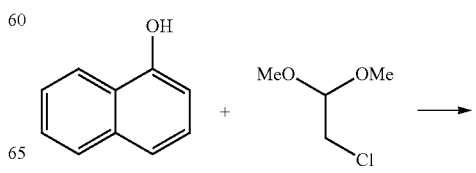

-continued

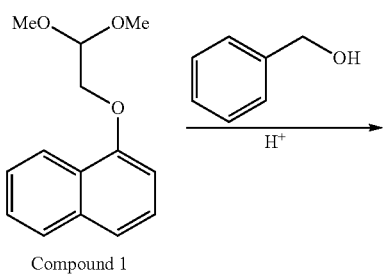

Compound 1

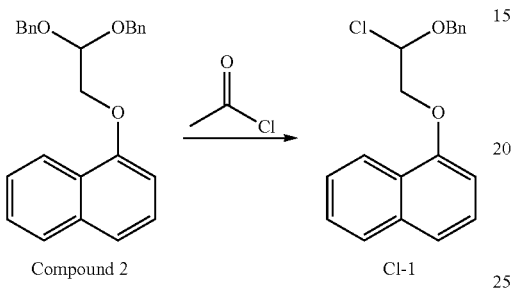

Compound 2    Cl-1

(Synthesis of Compound (P-1))

Poly(p-hydroxystyrene) (VP-2500, manufactured by NIPPON SODA CO., LTD.) (10.0 g) as a polyhydroxystyrene compound was dissolved in 50 g of tetrahydrofuran (THF), and 8.85 g of triethylamine was added thereto, followed by stirring in an ice water bath. The mixed solution (6.64 g) containing the compound C1-1 obtained as above was added dropwise to the reaction solution, and the temperature thereof was returned to room temperature, followed by stirring for 4 hours. A small amount of the reaction solution was collected to be measured by $^1$H-NMR, and the amount substituted with the compound C1-1 was measured to be 14.2 mol %. Subsequently, a mixed solution containing a small amount of the compound C1-1 was added thereto, followed by stirring for an hour, and the operation for $^1$H-NMR measurement was repeated. At a point of time when the amount substituted with the compound C1-1 exceeded 15.0 mol % as a target, distilled water was added to stop the reaction. THF was removed by distillation under reduced pressure, and the reactant was dissolved in ethyl acetate. The obtained organic layer was washed 5 times with distilled water, and then the organic layer was added dropwise to 1.5 L of hexane. The obtained precipitate was filtered and washed with a small amount of hexane, followed by dissolving in 35 g of propylene glycol monomethyl ether acetate (PGMEA). A low-boiling point solvent was removed from the obtained solution by using an evaporator, thereby obtaining 42.3 g of a PGMEA solution (23.0% by mass) of a compound (P-1)

The compositional ratio (molar ratio) of the obtained compound (P-1) was calculated by the $^1$H-NMR measurement. In addition, by a GPC (solvent: THF) measurement, a weight average molecular weight (Mw: expressed in terms of polystyrene), a number average molecular weight (Mn: expressed in terms of polystyrene), and dispersity (Mw/Mn, also referred to as "PDI" hereinbelow) of the compound (P-1) were calculated. The results are shown in the following chemical formula.

[Chem. 80]

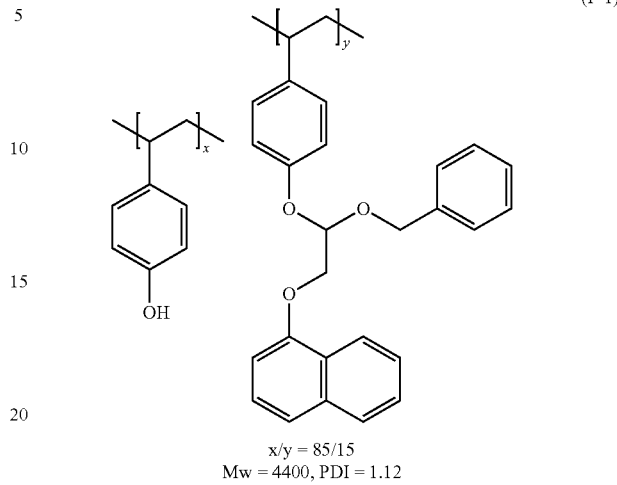

(P-1)

x/y = 85/15
Mw = 4400, PDI = 1.12

Synthesis Examples 2 to 16

Synthesis of Compounds (P-2) to (P-16)

Compounds (P-2) to (P-16) were synthesized in the same manner as in Synthesis Example 1, except that the polyhydroxystyrene compound and the chloroether compound used were appropriately changed. The polyhydroxystyrene compound and the chloroether compound used for the synthesis are shown below. The chloroether compound used was synthesized in the same manner as in Synthesis Example 1.

TABLE 1

|  | Synthesized compound | Polyhydroxystyrene compound | Chloroether compound |
| --- | --- | --- | --- |
| Synthesis Example 2 | P-2 | VP-2500 | Cl-2 |
| Synthesis Example 3 | P-3 | VP-2500 | Cl-3 |
| Synthesis Example 4 | P-4 | VP-8000 | Cl-4 |
| Synthesis Example 5 | P-5 | VP-2500 | Cl-5 |
| Synthesis Example 6 | P-6 | VP-2500 | Cl-6 |
| Synthesis Example 7 | P-7 | VP-2500 | Cl-6 |
| Synthesis Example 8 | P-8 | VP-2500 | Cl-7 |
| Synthesis Example 9 | P-9 | VP-2500 | Cl-7 |
| Synthesis Example 10 | P-10 | VP-2500 | Cl-8 |
| Synthesis Example 11 | P-11 | VP-2500 | Cl-9 |
| Synthesis Example 12 | P-12 | VP-2500 | Cl-10 |
| Synthesis Example 13 | P-13 | PHS-M1 | Cl-2 |
| Synthesis Example 14 | P-14 | PHS-M3 | Cl-5 |
| Synthesis Example 15 | P-15 | PHS-M3 | Cl-5 |
| Synthesis Example 16 | P-16 | PHS-M2 | Cl-6 |

[Chem. 81]

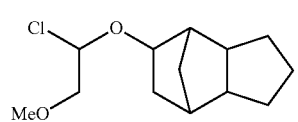

Cl-2

Cl-3 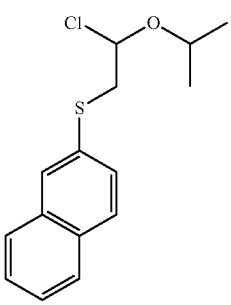
Cl-4 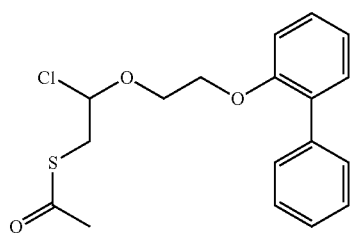
Cl-5 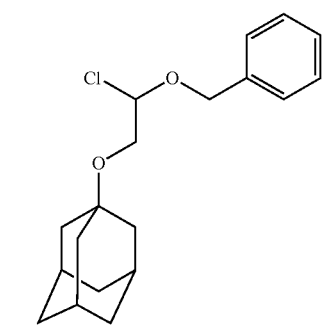
Cl-6 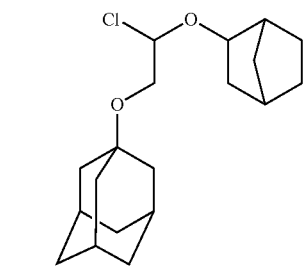
Cl-7 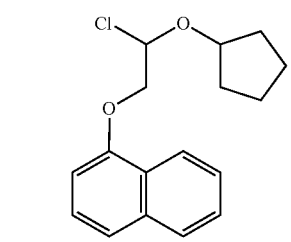
Cl-8 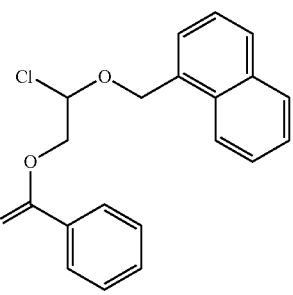
Cl-9 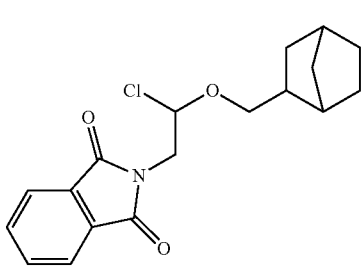
Cl-10 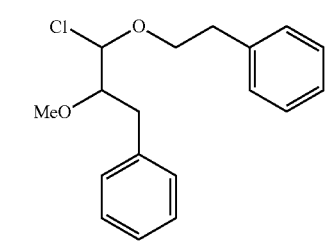
[Chem. 82]
(P-2) 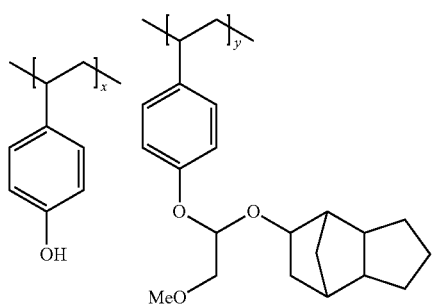
$x/y = 78/22$
Mw = 4900, PDI = 1.13

-continued
(P-3)
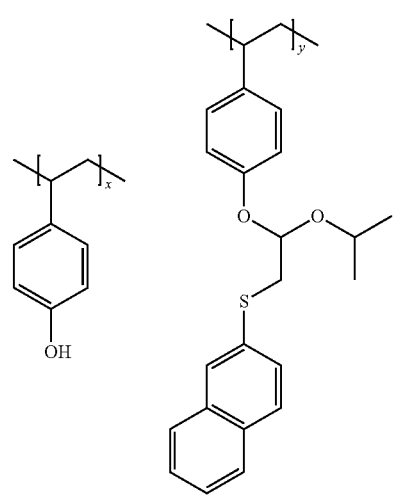
x/y = 83/17
Mw = 4500, PDI = 1.13
(P-4)
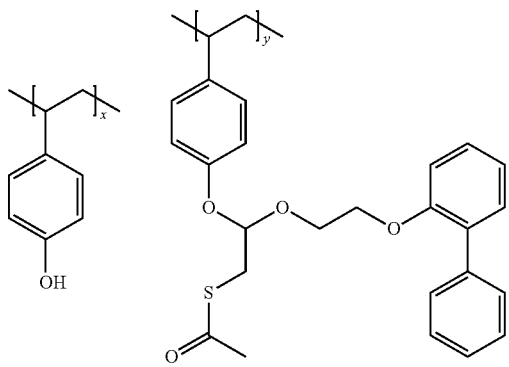
x/y = 84/16
Mw = 12300, PDI = 1.08
(P-5)
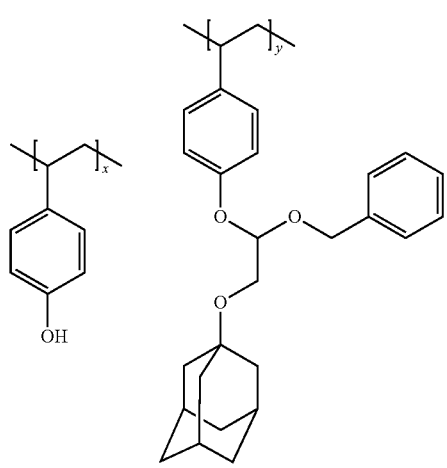
x/y = 83/17
Mw = 4600, PDI = 1.11
-continued
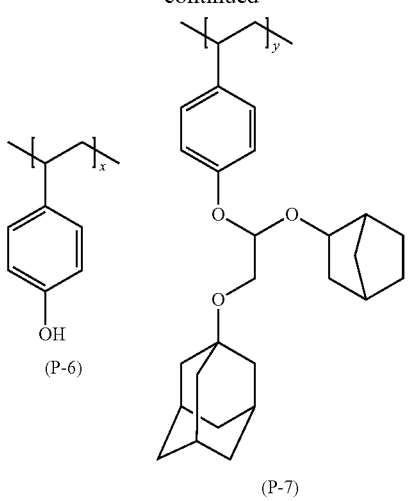
(P-6)
(P-7)
(P-6) x/y = 81/19
Mw = 4600, PDI = 1.12
(P-7) x/y = 78/22
Mw = 4900, PDI = 1.12
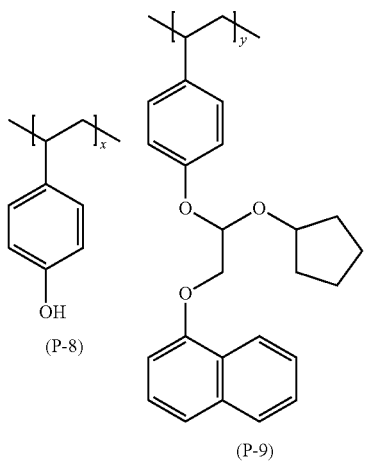
(P-8)
(P-9)
(P-8) x/y = 84/16
Mw = 4500, PDI = 1.12
(P-9) x/y = 78/27
Mw = 5200, PDI = 1.13
(P-10)
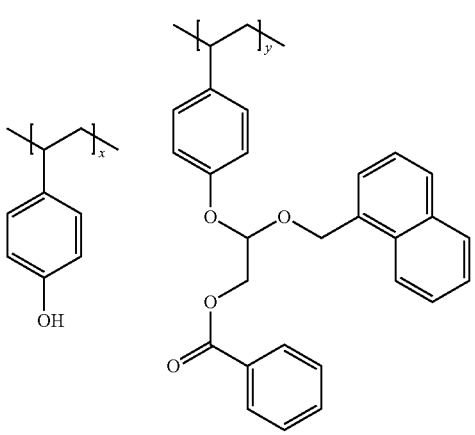
x/y = 86/14
Mw = 4500, PDI = 1.12

(P-11)

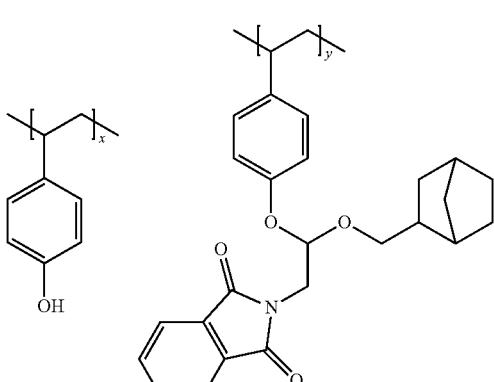

x/y = 80/20
Mw = 4700, PDI = 1.12

(P-12)

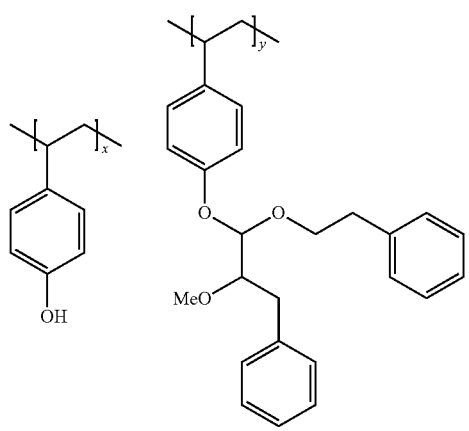

x/y = 84/16
Mw = 4400, PDI = 1.13

(P-13)

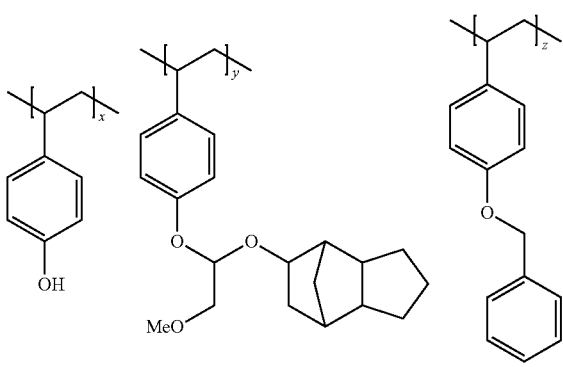

x/y/z = 76/19/5
Mw = 12400, PDI = 1.08

(P-14)

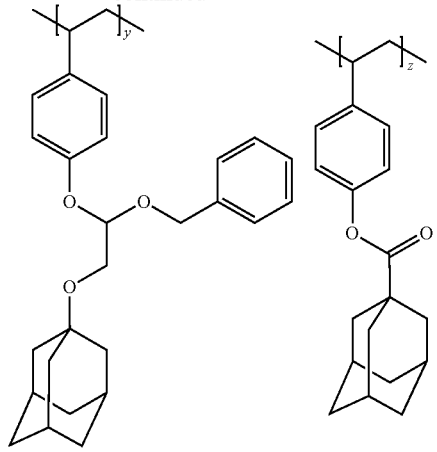

(P-15)

(P-14) x/y/z = 83/14/3
Mw = 4600, PDI = 1.11
(P-15) x/y/z = 76/21/3
Mw = 5200, PDI = 1.12

(P-16)

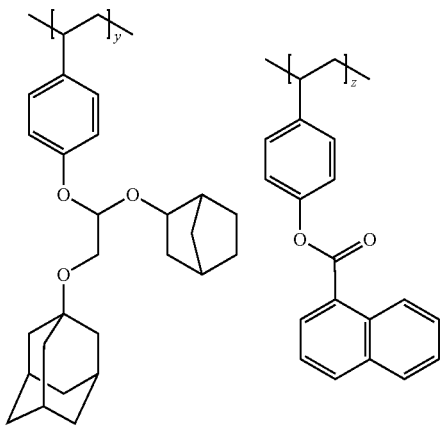

x/y/z = 81/14/15
Mw = 4400, PDI = 1.12

Synthesis Example 17

Synthesis of Compound (P-17)

VP-2500 (10.0 g) was used as a polyhydroxystyrene compound, and C1-1 was used as a chloroether compound, the substitution reaction was carried out so that the amount substituted with the compound C1-1 was 17 mol % in the same manner as in Synthesis Example 1. Distilled water was added thereto to stop the reaction. THF was removed by distillation under reduced pressure, and the reactant was dissolved in ethyl acetate. The obtained organic layer was washed 5 times with distilled water, followed by concentration and drying.

The obtained polymer was dissolved in 40 g of N,N-dimethylformamide (DMF), and 6.58 g of pyridine, 0.92 g of 2-sulfobenzoic anhydride as a sulfonating agent (hereinbelow, abbreviated to SN-1), and 122 mg of N,N-dimethylaminopyridine were added thereto, followed by stirring at room temperature for 5 hours. The reaction solution was transferred to a separatory funnel containing 100 mL of ethyl acetate, the organic layer was washed 5 times with 100 mL of saturated saline and concentrated by using an evaporator, and the ethyl acetate was removed.

The obtained polymer was dissolved in 30 mL of tetrahydrofuran (THF) and 10 mL of methanol, and 1.72 g of triphenylsulfonium bromide as a PAG precursor (hereinbelow, abbreviated to PG-1) was added thereto, followed by stirring at room temperature for 3 hours. The reaction solution was concentrated by using an evaporator and then dissolved again in 100 mL of ethyl acetate, and the organic layer was washed 5 times with 100 mL of distilled water. The organic layer was concentrated and dissolved in 50 mL of acetone, followed by dropwise addition to 700 mL of a mixed solution containing distilled water:methanol=15:1 (volume ratio). The solid obtained by removing the supernatant solution was dissolved in 50 mL of ethyl acetate and added dropwise to 700 mL of hexane. The precipitate obtained by removing the supernatant was dissolved in 32 g of PGMEA. A low boiling point solvent was removed from the obtained solution by using an evaporator, thereby obtaining 44.7 g of a PGMEA solution (25.2% by mass) of the compound (P-17).

[Chem. 83]

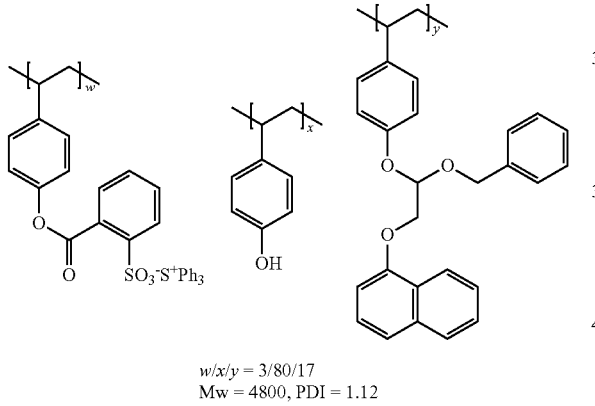

(P-17)

w/x/y = 3/80/17
Mw = 4800, PDI = 1.12

Synthesis Examples 18 and 19

Synthesis of Compounds (P-18) and (P-19)

Compounds (P-18) and (P-19) were synthesized in the same manner as Synthesis Example 17, except that the polyhydroxystyrene compound, the chloroether compound, and the PAG precursor used were appropriately changed. Reagents used for the synthesis are shown below.

TABLE 2

| Synthesized compound | Polyhydroxystyrene compound | Chloroether compound | PAG precursor |
|---|---|---|---|
| Synthesis Example 18 | P-18 | VP-2500 | Cl-1 | PG-2 |
| Synthesis Example 19 | P-19 | PHS-M3 | Cl-5 | PG-1 |

[Chem. 84]

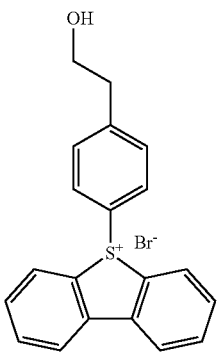

PG-2

[Chem. 85]

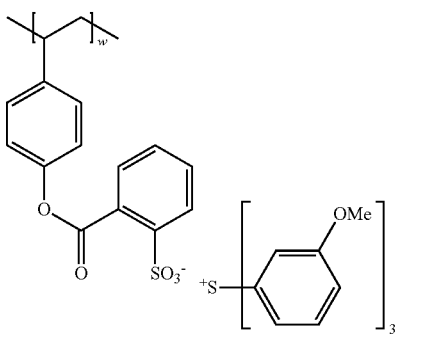

(P-18)

w/x/y = 3/73/24
Mw = 5300, PDI = 1.14

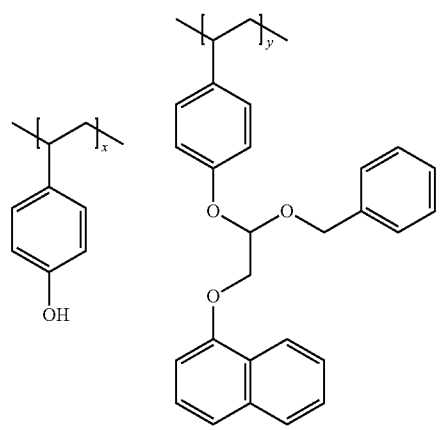

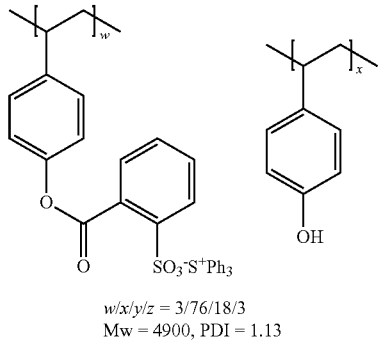

(P-19)

w/x/y/z = 3/76/18/3
Mw = 4900, PDI = 1.13

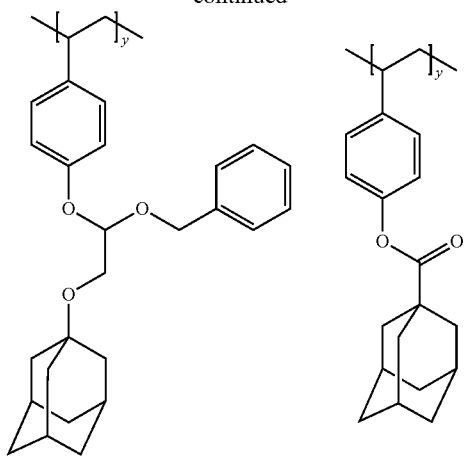

Synthesis Example 20

Synthesis of Compound (P-20)

1-Methoxy-2-propanol (15.37 g) was heated at 70° C. under a nitrogen gas flow. While this solution was stirred, a mixed solution that contained 10.33 g of a monomer (M-1), 4.54 g of a monomer (M-2), and 0.89 g of a monomer (M-3) shown below as well as 61.47 g of 1-methoxy-2-propanol and 3.45 g of dimethyl 2,2'-azobisisobutyrate (V-601, manufactured by Wako Pure Chemical Industries, Ltd.) was added dropwise thereto for 2 hours. After the dropwise addition was completed, the resultant was further stirred at 70° C. for 4 hours. After being cooled, the reaction solution was precipitated again with a large amount of hexane/ethyl acetate, followed by vacuum drying, thereby obtaining 8.84 g of a polymer compound (P-20) of the present invention.

[Chem. 86]

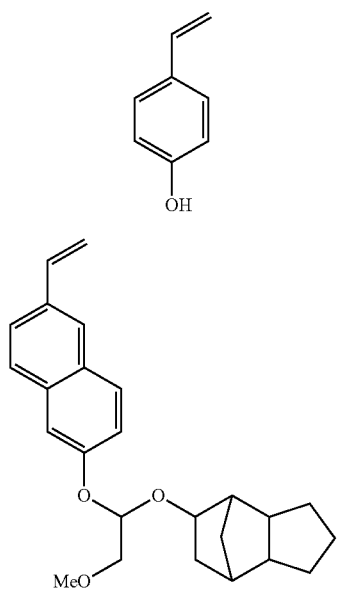

M-1

M-2

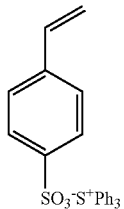

M-3

[Chem. 87]

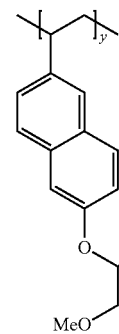

(P-20)

w/x/y = 3/83/14
Mw = 6100, PDI = 1.38

Synthesis Examples 21 to 24

Synthesis of Compounds (P-21) to (P-24)

Based on the Synthesis Example 20, the types of monomers used were appropriately changed, thereby obtaining polymer compounds (P-21) to (P-24) of the present invention.

[Chem. 88]

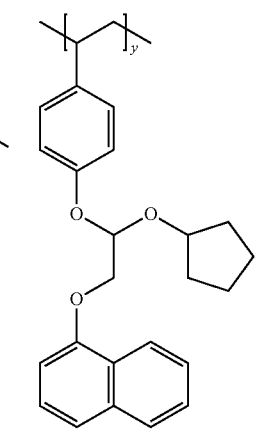

(P-21)

209
-continued

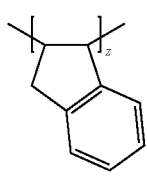

w/x/y/z/ = 3/68/21/8
Mw = 5800, PDI = 1.34

(P-22)

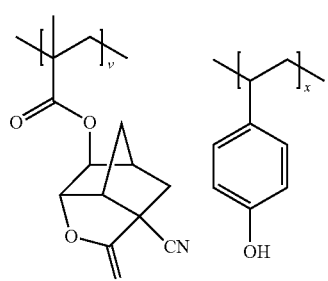

v/x/y = 10/66/24
Mw = 6400, PDI = 1.33

(P-23)

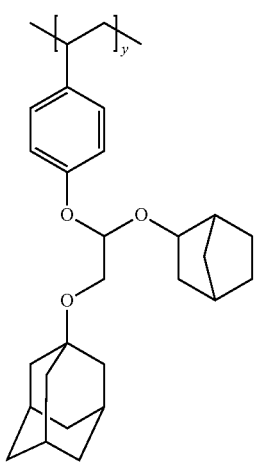

210
-continued

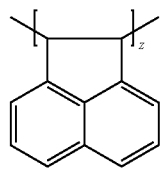

x/y/z = 61/27/12
Mw = 4900, PDI = 1.24

(P-24)

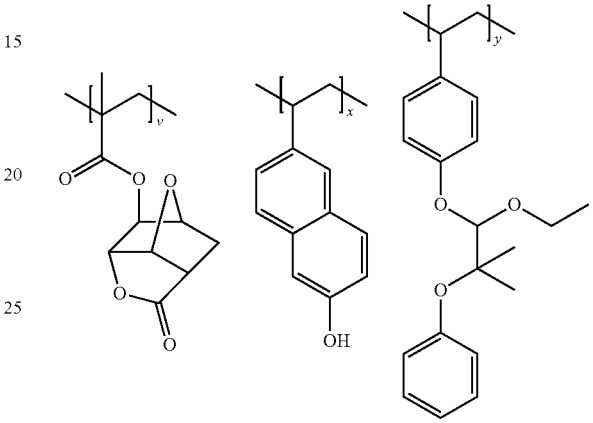

v/x/y = 16/66/18
Mw = 5000, PDI = 1.34

Synthesis Examples 25 and 26

Synthesis of Compounds (P-25) and (P-26)

Polymers (P-25) and (P-26) of the present invention were synthesized in the same manner as in Synthesis Example 5, except that the polyhydroxystyrene compound was changed to 4-tert-butylcalix[8]arene (Synthesis Example 25) and 1,3, 5-tri(1',1'-di(4-hydroxyphenyl)ethyl)benzene (Synthesis Example 26).

[Chem. 89]

(P-26)
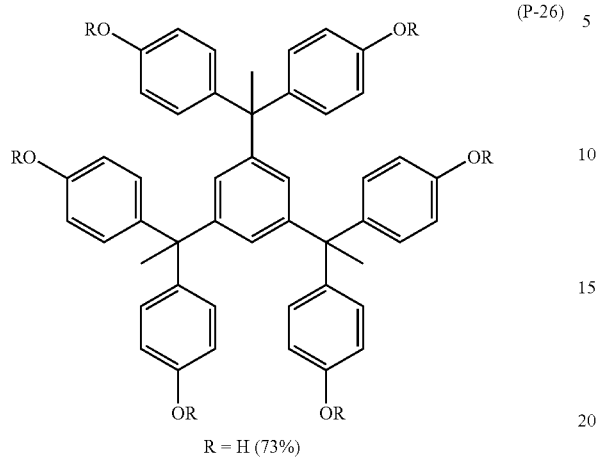
R = H (73%)
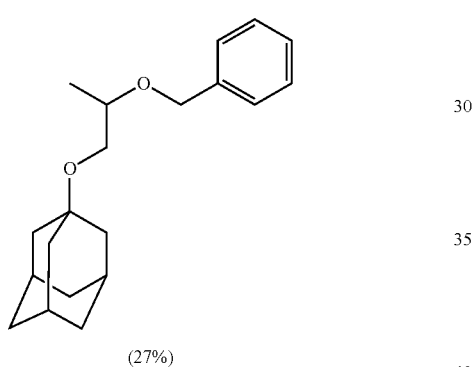
(27%)
(Compounds for Comparison)
The following compounds were used for comparison. All of the compositional ratios, weight average molecular weights, and dispersities are shown below.
[Chem. 90]
(R-1)
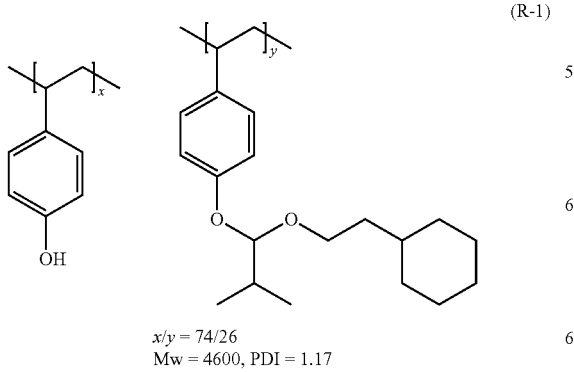
x/y = 74/26
Mw = 4600, PDI = 1.17
(R-2)
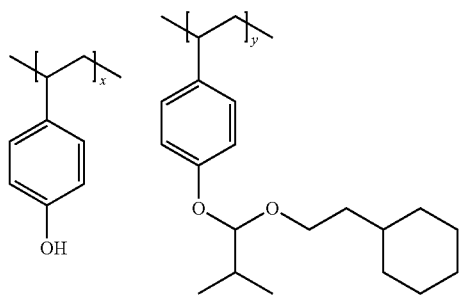
x/y/z = 76/19/5
Mw = 4700, PDI = 1.17
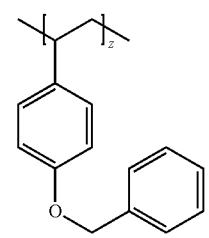
(R-3)
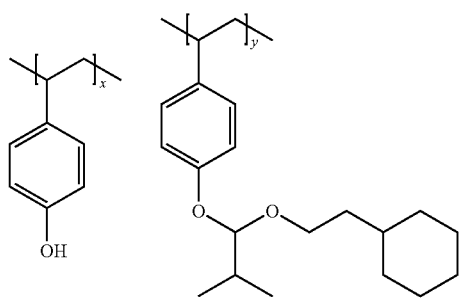
x/y/w = 75/22/3
Mw = 4500, PDI = 1.17
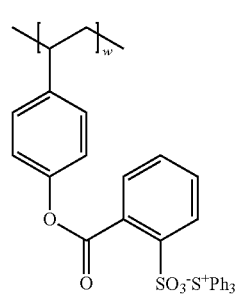

-continued
(R-4)
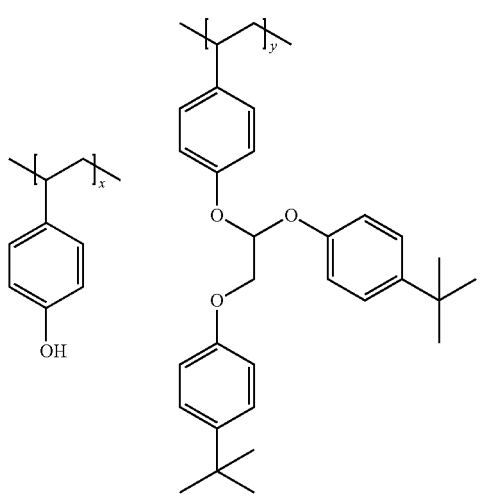
x/y = 75/15
Mw = 4900, PDI = 1.14
(R-5)
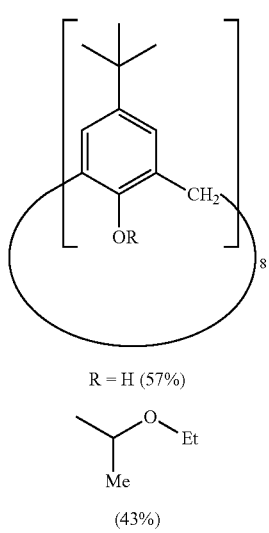
[Photoacid Generator]
Compounds represented by the following formulae were used as photoacid generators.
[Chem. 91]
PAG-1
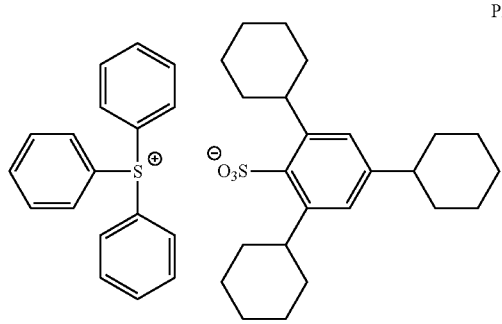
-continued
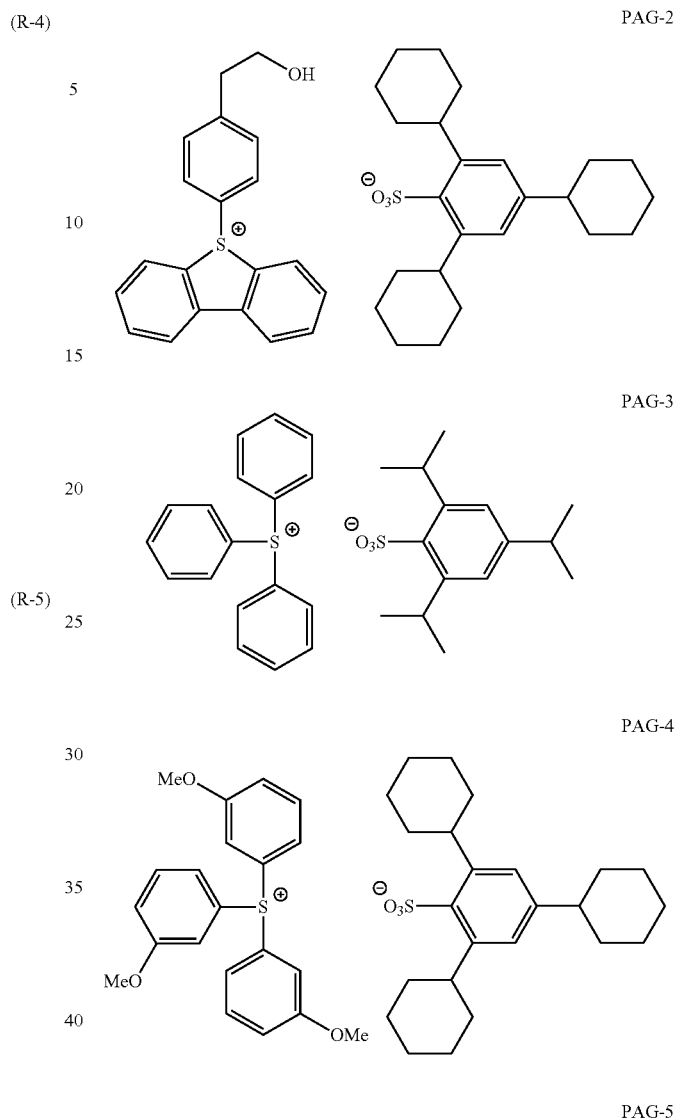
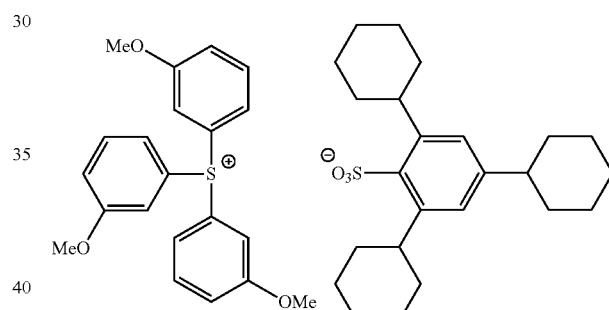
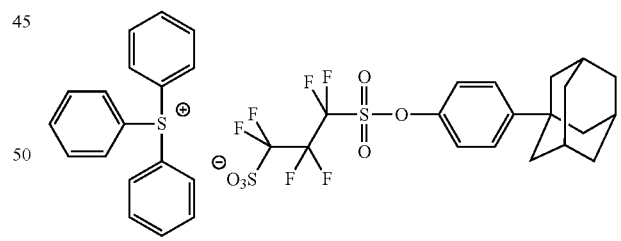
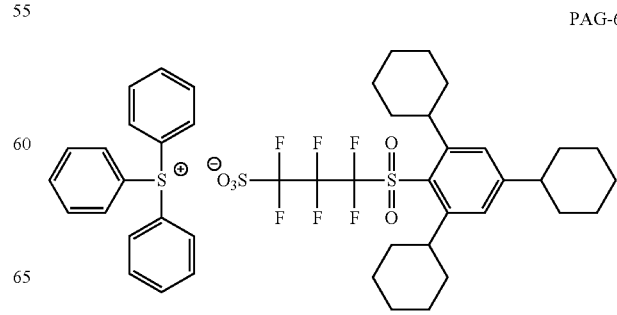

PAG-7

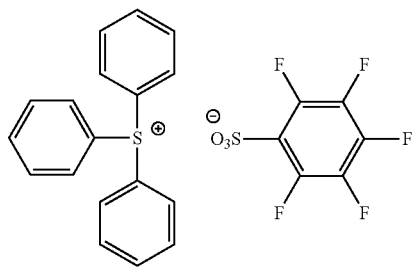

PAG-8

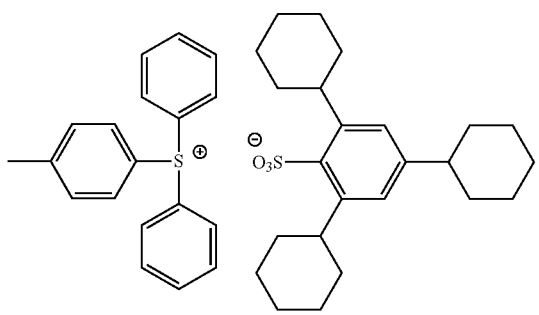

Synthesis Example

PAG-1

(Synthesis of Tricyclohexylbenzene)

Aluminum chloride (6.38 g) was added to 20.0 g of benzene, followed by stirring under cooling at 3° C., and 40.4 g of cyclohexyl chloride was slowly added dropwise thereto. After the dropwise addition, the resultant was stirred at room temperature for 5 hours, and the obtained reaction solution was added to ice water. The organic layer was extracted by using ethyl acetate, and the obtained organic layer was removed by distillation at 40° C. under reduced pressure. The resultant was further removed by distillation at 170° C. under reduced pressure and then cooled to room temperature, and 50 ml of acetone was added thereto to cause recrystallization. The precipitated crystals were collected through filtering, thereby obtaining 14 g of tricyclohexylbenzene.

(Synthesis of Sodium Tricyclohexylbenzene Sulfonate>

Tricyclohexylbenzene (30 g) was dissolved in 50 ml of methylene chloride, followed by stirring under cooling at 3° C., and 15.2 g of chlorosulfonic acid was slowly added dropwise thereto. After the dropwise addition, the resultant was stirred at room temperature for 5 hours, and 10 g of ice was added thereto. Subsequently, 40 g of 50% aqueous sodium hydroxide solution was added thereto, and 20 g of ethanol was further added thereto. The resultant was stirred at 50° C. for an hour, the insoluble fraction was then removed by filtering, and the resultant was removed by distillation under reduced pressure at 40° C. The precipitated crystals were collected through filtering and washed with hexane, thereby obtaining 30 g of sodium 1,3,5-tricyclohexylbenzene sulfonate.

(Synthesis of PAG-1)

Triphenyl sulfonium bromide (4.0 g) was dissolved in 20 ml of methanol, and 5.0 g of sodium 1,3,5-tricyclohexylbenzene sulfonate dissolved in 20 ml of methanol was added thereto. The resultant was stirred at room temperature for 2 hours, and 50 ml of ion exchange water was added thereto, followed by extraction by using chloroform. The obtained organic layer was washed with water and then removed by distillation under reduced pressure at 40° C., and the obtained crystals were recrystallized by using a solution of methanol and ethyl acetate. In this manner, 5.0 g of a compound PAG-1 was obtained.

$^1$H-NMR (400 MHz, CDCl$_3$) δ=7.85 (d, 6H), 7.68 (t, 3H), 7.59 (t, 6H), 6.97 (s, 2H), 4.36-4.27 (m, 2H), 2.48-2.38 (m, 1H), 1.97-1.16 (m, 30H). PAG-2 to PAG-8 were synthesized in the same manner.

[Basic Compound]

Compounds represented by the following formulae were used as basic compounds.

[Chem. 92]

BASE-1

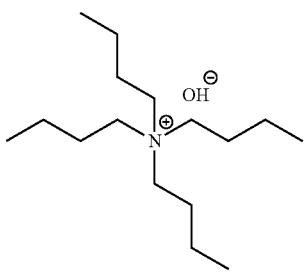

BASE-2

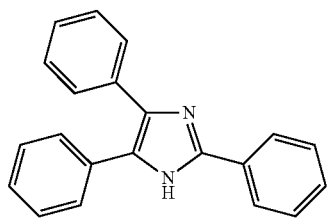

BASE-3

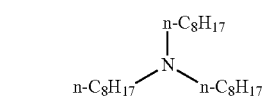

[Surfactant and Solvent]

The following were used as surfactants.

W-1: Megafac F176 (based on fluorine, manufactured by DIC CORPORATION)

W-2: Megafac R08 (based on fluorine and silicon, manufactured by DIC CORPORATION)

W-3: PF6320 (based on fluorine, manufactured by OMNOVA Solutions Inc.)

The following were used as solvents.

S1: propylene glycol monomethyl ether acetate (PGMEA)

S2: propylene glycol monomethyl ether (PGME)

Examples 1 to 6 and Comparative Examples 1 to 4

The respective components shown in the following Table 3 were dissolved in solvents shown in the same table. The resultants were filtered through a polytetrafluoroethylene filter having a pore size of 0.1 μm. In this manner, positive resist solutions having the total solid content concentration shown in Table 3 were prepared. The concentrations of the respective components shown in Table 3 are mass concentrations based on the mass of the total solid contents.

<Resist Evaluation>

The prepared positive resist solution was uniformly coated onto a silicon substrate treated with hexamethyl disilazane by using a spin coater. Subsequently, the substrate was baked and dried at 130° C. for 90 seconds by using a hot plate. In this manner, a resist film having a film thickness of 100 nm was formed.

The resist film was irradiated with an electron beam by using an electron beam irradiation instrument (HL 750 manufactured by Hitachi, Ltd.; accelerating voltage of 50 keV). Immediately after the irradiation, the resist film was baked on a hot plate at 120° C. for 90 seconds. Thereafter, the film was developed at 23° C. for 60 seconds by using an aqueous tetramethylammonium hydroxide solution having a concentration of 2.38% by mass, and rinsed with pure water for 30 seconds, followed by drying. In this manner, a line and space pattern (line:space=1:1) and an independent line pattern (line:space=1:>100) were formed. In the following description, the line and space pattern is abbreviated to L&S, and the independent line pattern is abbreviated to IL in some cases.

[Shape]

The cross-sectional shapes of the obtained respective patterns were observed with a scanning electron microscope (S-4800 manufactured by Hitachi, Ltd.). For the pattern shape, the shape of the IL pattern of 100 nm was observed. A shape close to a rectangle was marked as A, a shape showing slight film reduction was marked as B, and a tapered shape was marked as C.

[Resolution]

Limit resolution (a minimum line width at which a line and a space are separately resolved) was taken as resolution (nm).

[Line Edge Roughness (LER)]

For an arbitrary 30 points in a longitudinal direction of 50 μm of the L&S pattern with a line width of 100 nm in the irradiation amount at which the above sensitivity was exhibited, a distance from a base line where the edge was supposed to be present was measured using a scanning electron microscope (S-4800 manufactured by Hitachi, Ltd.), and the standard deviation and 3σ were calculated. The smaller the value, the better the line edge roughness.

TABLE 3

| Example | Compound (P) (% by mass) | Photoacid generator (% by mass) | Basic compound (% by mass) | Solvent (mass ratio) | Surfactant (% by mass) | Total solid content concentration (% by mass) | L&S resolution (nm) | IL resolution (nm) | IL shape | LER (nm) |
|---|---|---|---|---|---|---|---|---|---|---|
| Example 1 | P-1 (93.85) | PAG-1 (5.5) | BASE-1 (0.6) | S1/S2 (80/20) | W-3 (0.05) | 4 | 37.5 | 37.5 | A | 4.3 |
| Example 2 | P-1 (93.50) | PAG-2 (5.85) | BASE-1 (0.6) | S1/S2 (80/20) | W-3 (0.05) | 4 | 37.5 | 37.5 | A | 4.7 |
| Example 3 | P-1 (94.35) | PAG-1 (2.75) PAG-3 (2.25) | BASE-1 (0.6) | S1/S2 (80/20) | W-3 (0.05) | 4 | 37.5 | 37.5 | A | 5.3 |
| Example 4 | P-3 (93.85) | PAG-1 (5.5) | BASE-1 (0.6) | S1/S2 (80/20) | W-3 (0.05) | 4 | 37.5 | 37.5 | A | 4.8 |
| Example 5 | P-5 (93.85) | PAG-1 (5.5) | BASE-1 (0.6) | S1/S2 (80/20) | W-3 (0.05) | 4 | 37.5 | 37.5 | A | 4.6 |
| Example 6 | P-8 (93.10) | PAG-4 (6.25) | BASE-1 (0.6) | S1/S2 (80/20) | W-3 (0.05) | 4 | 37.5 | 37.5 | A | 4.4 |
| Example 7 | P-17 (99.35) | — | BASE-1 (0.6) | S1/S2 (60/40) | W-3 (0.05) | 4 | 25.0 | 37.5 | A | 3.9 |
| Example 8 | P-25 (93.85) | PAG-1 (5.5) | BASE-1 (0.6) | S1/S2 (80/20) | W-3 (0.05) | 4 | 37.5 | 37.5 | A | 4.5 |
| Comparative Example 1 | R-1 (93.85) | PAG-1 (5.5) | BASE-1 (0.6) | S1/S2 (80/20) | W-3 (0.05) | 4 | 37.5 | 50 | C | 6.6 |
| Comparative Example 2 | R-2 (93.85) | PAG-1 (5.5) | BASE-1 (0.6) | S1/S2 (80/20) | W-3 (0.05) | 4 | 37.5 | 50 | C | 6.2 |
| Comparative Example 3 | R-3 (99.35) | — | BASE-1 (0.6) | S1/S2 (70/30) | W-3 (0.05) | 4 | 37.5 | 37.5 | B | 5.3 |
| Comparative Example 4 | R-4 (93.85) | PAG-1 (5.5) | BASE-1 (0.6) | S1/S2 (80/20) | W-3 (0.05) | 4 | 62.5 | 75 | C | 5.5 |
| Comparative Example 5 | R-5 (93.85) | PAG-1 (5.5) | BASE-1 (0.6) | S1/S2 (80/20) | W-3 (0.05) | 4 | 50.0 | 50 | B | 5.4 |

As shown in Table 3, the compositions of the present invention according to Examples 1 to 8 were superior in the IL resolution, the IL pattern shape, and the LER, compared to the compositions according to Comparative Examples 1 to 5.

Examples 9 to 30 and Comparative Examples 6 to 9

Positive resist solutions were prepared, resist films were formed, and resist evaluation was performed in the same manner as in Examples 1 to 8, except that (1) the silicon substrate treated with hexamethyl disilazane was changed to a glass substrate on which a chromium oxide film (light shielding film) having a thickness of 100 nm was provided by chemical vapor-deposition, (2) the baking conditions after the resist solution coating were changed from 130° C. and 90 seconds to 130° C. and 600 seconds, and (3) the baking conditions after the electron beam irradiation were changed from 120° C. and 90 seconds to 120° C. and 600 seconds, so as to confirm the performance of the resist film in mask blanks. The results are shown in Table 4.

TABLE 4

| Example | Compound (P) (% by mass) | Photoacid generator (% by mass) | Basic compound (% by mass) | Solvent (mass ratio) | Surfactant (% by mass) | Total solid content concentration (% by mass) | L&S resolution (nm) | IL resolution (nm) | IL shape | LER (nm) |
|---|---|---|---|---|---|---|---|---|---|---|
| Example 9 | P-2 (93.35) | PAG-1 (5.5) | BASE-2 (1.1) | S1/S2 (80/20) | W-3 (0.05) | 4 | 37.5 | 37.5 | A | 4.8 |
| Example 10 | P-2 (91.95) | PAG-6 (7.4) | BASE-1 (0.6) | S1/S2 (80/20) | W-2 (0.05) | 4 | 37.5 | 37.5 | A | 4.9 |
| Example 11 | P-2 (93.55) | PAG-1 (5.5) | BASE-3 (0.9) | S1/S2 (80/20) | W-1 (0.05) | 4 | 37.5 | 37.5 | B | 4.5 |
| Example 12 | P-2 (92.75) | PAG-5 (6.6) | BASE-1 (0.6) | S1/S2 (80/20) | W-3 (0.05) | 4 | 37.5 | 50 | A | 4.1 |
| Example 13 | P-3 (93.85) | PAG-1 (5.5) | BASE-1 (0.6) | S1/S2 (80/20) | W-3 (0.05) | 4 | 37.5 | 37.5 | A | 5.1 |
| Example 14 | P-4 (93.85) | PAG-1 (5.5) | BASE-1 (0.6) | S1/S2 (80/20) | W-3 (0.05) | 4 | 37.5 | 50 | A | 3.9 |
| Example 15 | P-5 (87.55) | PAG-8 (11.2) | BASE-1 (1.2) | S1/S2 (80/20) | W-3 (0.05) | 4 | 37.5 | 37.5 | A | 3.6 |
| Example 16 | P-6 (46.90) P-7 (46.95) | PAG-1 (5.5) | BASE-1 (0.6) | S1/S2 (80/20) | W-3 (0.05) | 4 | 37.5 | 37.5 | A | 4.4 |
| Example 17 | R-8 (93.85) | PAG-1 (5.5) | BASE-1 (0.6) | S1/S2 (80/20) | W-3 (0.05) | 4 | 37.5 | 37.5 | A | 3.9 |
| Example 18 | R-10 (93.85) | PAG-1 (5.5) | BASE-1 (0.6) | S1/S2 (80/20) | W-3 (0.05) | 4 | 37.5 | 37.5 | A | 4.0 |
| Example 19 | P-11 (93.15) | PAG-1 (6.2) | BASE-1 (0.6) | S1/S2 (80/20) | W-3 (0.05) | 4 | 37.5 | 37.5 | A | 3.9 |
| Example 20 | P-12 (93.85) | PAG-1 (5.5) | BASE-1 (0.6) | S1/S2 (80/20) | W-3 (0.05) | 4 | 37.5 | 50 | A | 4.4 |
| Example 21 | P-13 (93.85) | PAG-1 (5.5) | BASE-1 (0.6) | S1/S2 (80/20) | W-3 (0.05) | 4 | 37.5 | 37.5 | A | 4.7 |
| Example 22 | P-14 (92.95) | PAG-4 (6.4) | BASE-1 (0.6) | S1/S2 (80/20) | W-3 (0.05) | 4 | 37.5 | 37.5 | A | 3.9 |
| Example 23 | P-16 (93.75) | PAG-8 (5.6) | BASE-1 (0.6) | S1/S2 (80/20) | W-3 (0.05) | 4 | 37.5 | 37.5 | A | 4.2 |
| Example 24 | P-17 (99.35) | — | BASE-1 (0.6) | S1/S2 (80/20) | W-3 (0.05) | 4 | 37.5 | 37.5 | A | 3.8 |
| Example 25 | P-19 (99.35) | — | BASE-1 (0.6) | S1/S2 (80/20) | W-3 (0.05) | 4 | 37.5 | 37.5 | A | 4.0 |
| Example 26 | P-20 (99.35) | — | BASE-1 (0.6) | S1/S2 (80/20) | W-3 (0.05) | 4 | 37.5 | 37.5 | B | 4.3 |
| Example 27 | P-21 (99.35) | — | BASE-1 (0.6) | S1/S2 (80/20) | W-3 (0.05) | 4 | 37.5 | 37.5 | A | 4.4 |
| Example 28 | P-22 (93.75) | PAG-8 (5.6) | BASE-1 (0.6) | S1/S2 (80/20) | W-3 (0.05) | 4 | 37.5 | 37.5 | A | 4.3 |
| Example 29 | P-25 (93.85) | PAG-1 (5.5) | BASE-1 (0.6) | S1/S2 (80/20) | W-3 (0.05) | 4 | 37.5 | 37.5 | A | 3.9 |
| Example 30 | P-26 (93.85) | PAG-1 (5.5) | BASE-1 (0.6) | S1/S2 (80/20) | W-3 (0.05) | 4 | 37.5 | 37.5 | A | 4.0 |
| Comparative Example 6 | R-2 (93.85) | PAG-1 (5.5) | BASE-1 (0.6) | S1/S2 (80/20) | W-3 (0.05) | 4 | 37.5 | 50 | C | 5.4 |
| Comparative Example 7 | R-3 (99.35) | — | BASE-1 (0.6) | S1/S2 (80/20) | W-3 (0.05) | 4 | 37.5 | 50 | B | 5.2 |
| Comparative Example 8 | R-4 (93.85) | PAG-1 (5.5) | BASE-1 (0.6) | S1/S2 (80/20) | W-3 (0.05) | 4 | 62.5 | 62.5 | C | 5.8 |
| Comparative Example 9 | R-5 (93.85) | PAG-1 (5.5) | BASE-1 (0.6) | S1/S2 (80/20) | W-3 (0.05) | 4 | 37.5 | 50 | C | 5.0 |

As shown in Table 4, the compositions of the present invention according to Examples 9 to 30 are superior in the IL resolution, the IL pattern shape, and the LER, compared to the compositions according to Comparative Examples 6 to 9.

By exposing and developing mask blanks on which a resist film was formed by using the compositions of the present invention, photo masks suitable for producing semiconductors are obtained.

Examples 31 to 43 and Comparative Examples 10 and 11

Positive resist films were formed in the same manner as in Examples 1 to 8, except that the thickness of the resist film was changed to 50 nm from 100 nm so as to confirm the performance of the resist film in EUV exposure.

The resist film was irradiated with EUV light by using an EUV exposure instrument (wavelength=13.5 nm, Na=0.3). Immediately after the irradiation, the resist film was baked on a hot plate at 110° C. for 90 seconds. Thereafter, the film was developed at 23° C. for 30 seconds by using an aqueous tetramethylammonium hydroxide solution having a concentration of 2.38% by mass and rinsed with pure water for 30 seconds, followed by drying. In this manner, a line and space pattern (line:space=1:1) was formed.

(Sensitivity)

First, the cross-sectional shape of the obtained line and space pattern was observed with a scanning electron microscope (S-9380 manufactured by Hitachi, Ltd.). Then the exposure amount at the time of resolving a line (line:space=1:1) having a width of 35 nm was taken as sensitivity ($E_{opt}$).

(Pattern Shape)

The cross-sectional shape of a 35 nm line pattern (line:space=1:1) in the irradiation amount at which the above sensitivity was exhibited was observed with a scanning electron microscope (S-4800 manufactured by Hitachi, Ltd.). Then the shape was evaluated based on criteria including a rectangle, a reverse-tapered shape, and a tapered shape.

(Roughness Characteristics: LWR)

The above 35 nm line pattern (line:space=1:1) was observed with a scanning electron microscope (S-9380 manufactured by Hitachi, Ltd.). For an arbitrary 50 points placed at the same interval that were included within 2 μm in the longitudinal direction of the pattern, a distance between a base line where the edge was supposed to be present and the actual edge was measured. The standard deviation of the distance and 3σ were calculated, and the 3σ was taken as "LWR (nm)". The smaller the value, the better the roughness characteristics.

The results or the evaluation are shown in the following Table 5.

TABLE 5

| Example | Compound (P) (% by mass) | Photoacid generator (% by mass) | Basic compound (% by mass) | Solvent (mass ratio) | Surfactant (% by mass) | Total solid content concentration (% by mass) | Sensitivity (mJ/cm2) | Pattern shape | LWR (nm) |
|---|---|---|---|---|---|---|---|---|---|
| Example 31 | P-9 (85.95) | PAG-4 (12.8) | BASE-1 (1.2) | S1/S2 (80/20) | W-3 (0.05) | 4 | 22.3 | Rectangle | 4.9 |
| Example 32 | P-9 (85.55) | PAG-2 (13.2) | BASE-1 (1-2) | S1/S2 (80/20) | W-3 (0.05) | 4 | 21.8 | Rectangle | 5 |
| Example 33 | P-9 (85.25) | PAG-4 (12.8) | BASE-2 (1.9) | S1/S2 (80/20) | W-3 (0.05) | 4 | 22.4 | Rectangle | 4.7 |
| Example 34 | P-9 (84.85) | PAG-4 (12.8) | BASE-3 (2.3) | S1/S2 (80/20) | W-3 (0.05) | 4 | 23.0 | Rectangle | 4.9 |
| Example 35 | P-9 (89.05) | PAG-7 (8.6) | BASE-3 (2.3) | S1/S2 (80/20) | W-3 (0.05) | 4 | 23.1 | Rectangle | 5.1 |
| Example 36 | P-15 (77.25) | PAG-4 (19.2) | BASE-3 (3.5) | S1/S2 (80/20) | W-3 (0.05) | 4 | 22.8 | Rectangle | 4.3 |
| Example 37 | P-18 (97.65) | — | BASE-3 (2.3) | S1/S2 (50/50) | W-3 (0.05) | 4 | 23.0 | Rectangle | 4.3 |
| Example 38 | P-21 (97.65) | — | BASE-3 (2.3) | S1/S2 (50/50) | W-3 (0.05) | 4 | 21.9 | Rectangle | 4.6 |
| Example 39 | P-22 (77.25) | PAG-4 (19.2) | BASE-3 (3.5) | S1/S2 (80/20) | W-3 (0.05) | 4 | 23.4 | Rectangle | 4.1 |
| Example 40 | P-23 (84.85) | PAG-2 (13.2) | BASE-1 (1.2) | S1/S2 (80/20) | W-3 (0.05) | 4 | 22.0 | Rectangle | 4.7 |
| Example 41 | P-24 (97.65) | PAG-4 (12.8) | BASE-2 (1.9) | S1/S2 (80/20) | W-3 (0.05) | 4 | 22.1 | Rectangle | 4.8 |
| Example 42 | P-25 (84.85) | PAG-4 (12.8) | BASE-3 (2.3) | S1/S2 (80/20) | W-3 (0.05) | 4 | 22.3 | Rectangle | 4.6 |
| Example 43 | P-26 (84.85) | PAG-4 (12.8) | BASE-3 (2.3) | S1/S2 (80/20) | W-3 (0.05) | 4 | 22.8 | Rectangle | 4.5 |
| Comparative Example 10 | R-1 (84.85) | PAG-4 (12.8) | BASE-3 (2.3) | S1/S2 (80/20) | W-3 (0.05) | 4 | 26.4 | Tapered | 6.7 |
| Comparative Example 11 | R-5 (84.85) | PAG-4 (12.8) | BASE-3 (2.3) | S1/S2 (80/20) | W-3 (0.05) | 4 | 25.9 | Tapered | 5.5 |

As shown in Table 5, the compositions of examples are superior in the sensitivity, the pattern shape, and the LWR, compared to the compositions of the comparative examples.

What is claimed is:

1. An actinic ray-sensitive or radiation-sensitive resin composition comprising:

a compound (P) that contains at least one phenolic hydroxyl group and at least one group in which a hydrogen atom of a phenolic hydroxyl group is substituted with a group represented by the following General Formula (1),

[Chem. 1]

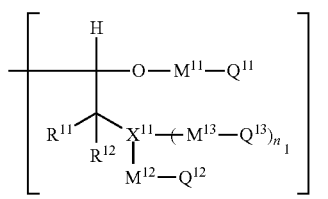
(1)

wherein in the formula, each of $R^{11}$ and $R^{12}$ independently represents a hydrogen atom, an alkyl group, a cycloalkyl group, an aryl group, or an aralkyl group;

$n_1$ represents 0 or 1;

$X^{11}$ represents an oxygen atom or a sulfur atom when $n_1$ is 0, and represents a nitrogen atom when $n_1$ is 1;

$M^{11}$ represents a single bond, an alkylene group, a cycloalkylene group, —S—, —O—, —CO—, —CS—, —$SO_2$—, —N($R_0$)—, or a combination of two or more kinds of the same, herein, $R_0$ represents a hydrogen atom or an alkyl group;

each of $M^{12}$ and $M^{13}$ independently represents a single bond or a divalent linking group;

$Q^{11}$ represents an alkyl group, an aralkyl group, a cycloalkyl group, or an aryl group when $M^{11}$ is a group other than a single bond, and represents an alkyl group, an aralkyl group, or a cycloalkyl group when $M^{11}$ is a single bond;

$Q^{12}$ represents an organic group;

$Q^{13}$ represents an organic group or a hydrogen atom; and at least two of $R^{11}$, $R^{12}$, $Q^{12}$, and $Q^{13}$ may form a ring by binding to each other.

2. The composition according to claim 1,
wherein the compound (P) is a polymer compound containing a repeating unit represented by the following General Formula (2),

[Chem. 2]

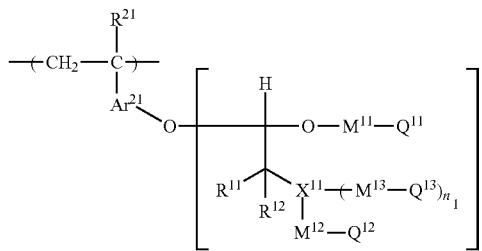
(2)

wherein in the formula, $R^{21}$ represents a hydrogen atom or a methyl group;

$Ar^{12}$ represents an arylene group;

each of $R^{11}$ and $R^{12}$ independently represents a hydrogen atom, an alkyl group, a cycloalkyl group, an aryl group, or an aralkyl group;

$n_1$ represents 0 or 1;

$X^{11}$ represents an oxygen atom or a sulfur atom when $n_1$ is 0, and represents a nitrogen atom when $n_1$ is 1;

$M^{11}$ represents a single bond, an alkylene group, a cycloalkylene group, —S—, —O—, —CO—, —CS—, —$SO_2$—, —N($R_0$)—, or a combination of two or more kinds of the same, herein, $R_0$ represents a hydrogen atom or an alkyl group;

each of $M^{12}$ and $M^{13}$ independently represents a single bond or a divalent linking group;

$Q^{11}$ represents an alkyl group, an aralkyl group, a cycloalkyl group, or an aryl group when $M^{11}$ is a group other than a single bond, and represents an alkyl group, an aralkyl group, or a cycloalkyl group when $M^{11}$ is a single bond;

$Q^{12}$ represents an organic group;

$Q^{13}$ represents an organic group or a hydrogen atom; and at least two of $R^{11}$, $R^{12}$, $Q^{12}$, and $Q^{13}$ may form a ring by binding to each other.

3. The composition according to claim 2,
wherein $Ar^{21}$ is a phenylene group.

4. The composition according to claim 1,
wherein at least one of $Q^{11}$, $Q^{12}$, and $Q^{13}$ is a group having at least one cyclic structure.

5. The composition according to claim 1,
wherein $Q^{12}$ is a methyl group, an ethyl group, an isopropyl group, a phenyl group, a naphthyl group, or an adamantyl group.

6. The composition according to claim 1,
wherein a group represented by -$M^{11}$-$Q^{11}$ is an alkyl group, an alkyl group substituted with a cycloalkyl group, a cycloalkyl group, an aralkyl group, or an aryloxyalkyl group.

7. The composition according to claim 2,
wherein the compound (P) contains a repeating unit represented by the following General rmula (5),

[Chem. 3]

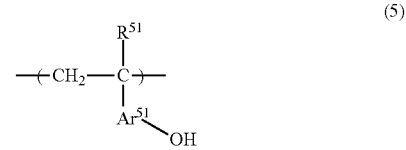
(5)

where in the formula, $R^{51}$ represents a hydrogen atom or a methyl group; and $Ar^{51}$ represents an arylene group.

8. The composition according to claim 2,
wherein the compound (P) further contains a non-degradable repeating unit represented by the following General Formula (3),

[Chem. 4]

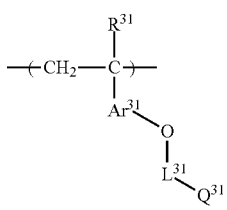

(3)

wherein in the formula,
$R^{31}$ represents a hydrogen atom or a methyl group;
$Ar^{31}$ represents an arylene group;
$L^{31}$ represents a single bond or a divalent linking group; and
$Q^{31}$ represents a cycloalkyl group or an aryl group.

9. The composition according to claim 2, wherein the compound (P) further contains a repeating unit represented by the following General Formula (4),

[Chem. 5]

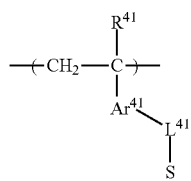

(4)

wherein in the formula,
$R^{41}$ represents a hydrogen atom or a methyl group;
$Ar^{41}$ represents an arylene group;
$L^{41}$ represents a single bond or a divalent linking group; and
S represents a structural moiety that generates an acid on a side chain by being degraded by actinic ray irradiation or radiation irradiation.

10. The composition according to claim 1, which is sensitive to at least one of an electron beam, X-rays, and EUV light.

11. An actinic ray-sensitive or radiation-sensitive film formed using the composition according to claim 1.

12. Mask blanks comprising the film of claim 11.

13. A mask for producing semiconductors that is obtained by exposing and developing the mask blanks according to claim 12.

14. A pattern forming method comprising:
exposing the film according to claim 11; and
developing the exposed film.

15. A pattern forming method comprising:
exposing the mask blanks according to claim 12; and
developing the exposed mask blanks.

16. The method according to claim 14,
wherein the exposing is performed using at least one of an electron beam, X-rays, and EUV light.

17. The method according to claim 15,
wherein the exposing is performed using at least one of an electron beam, X-rays, and EUV light.

* * * * *